(12) United States Patent
Kameshima et al.

(10) Patent No.: US 12,080,745 B2
(45) Date of Patent: *Sep. 3, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Takatoshi Kameshima, Kanagawa (JP); Hideto Hashiguchi, Kanagawa (JP); Ikue Mitsuhashi, Kanagawa (JP); Hiroshi Horikoshi, Tokyo (JP); Reijiroh Shohji, Tokyo (JP); Minoru Ishida, Tokyo (JP); Tadashi Iijima, Kanagawa (JP); Masaki Haneda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/814,651

(22) Filed: Jul. 25, 2022

(65) Prior Publication Data
US 2022/0359603 A1 Nov. 10, 2022

Related U.S. Application Data

(63) Continuation of application No. 16/495,335, filed as application No. PCT/JP2018/011571 on Mar. 23, 2018, now Pat. No. 11,411,036.

(30) Foreign Application Priority Data

Apr. 4, 2017 (JP) .............................. 2017-074805
Jul. 3, 2017 (JP) .............................. 2017-130385

(51) Int. Cl.
*H01L 27/146* (2006.01)
*H01L 23/64* (2006.01)
(Continued)

(52) U.S. Cl.
CPC ...... *H01L 27/14636* (2013.01); *H01L 23/642* (2013.01); *H01L 27/14634* (2013.01);
(Continued)

(58) Field of Classification Search
CPC ......... H01L 27/14636; H01L 27/14634; H01L 25/0657; H01L 2224/08121;
(Continued)

(56) References Cited

U.S. PATENT DOCUMENTS 10,049,915 B2* 8/2018 Fong ...................... H01L 25/50
10,074,618 B1* 9/2018 Chen ...................... H01L 24/19
(Continued)

FOREIGN PATENT DOCUMENTS

JP 2014-099582 A 5/2014
JP 2015-135938 A 7/2015
(Continued)

OTHER PUBLICATIONS

Restriction Requirement issued in U.S. Appl. No. 16/495,335 on Mar. 19, 2021.
(Continued)

*Primary Examiner* — Jarrett J Stark
(74) *Attorney, Agent, or Firm* — CHIP LAW GROUP

(57) ABSTRACT

A solid-state imaging device is provided that comprises a first substrate that includes a first multi-layered wiring layer stacked on a first semiconductor substrate, a second substrate that includes a second multi-layered wiring layer and an insulating layer stacked on a second semiconductor substrate, and a third substrate that includes a third multi-layered wiring layer stacked on a third semiconductor sub-
(Continued)

strate. A first coupling structure electrically couples the first and second substrates to each other. A second coupling structure exists on bonding surfaces of the second and third substrates, and includes an electrode junction structure in which electrodes formed on respective bonding surfaces are in direct contact with each other. A first via penetrates the second semiconductor substrate and electrically couples a first electrode to a wiring in the second multi-layered wiring layer. A second via electrically couples the second electrode to another wiring in the third multi-layered wiring layer.

23 Claims, 71 Drawing Sheets

(51) Int. Cl.
　　H01L 21/822　　(2006.01)
　　H01L 25/065　　(2023.01)
　　H01L 27/06　　(2006.01)
(52) U.S. Cl.
　　CPC ...... H01L 21/8221 (2013.01); H01L 25/0657 (2013.01); H01L 27/0688 (2013.01)
(58) Field of Classification Search
　　CPC . H01L 2224/08147; H01L 2225/06548; H01L 23/522; H01L 21/8221; H01L 27/0688
　　See application file for complete search history.

(56) References Cited

U.S. PATENT DOCUMENTS

| | | | | |
|---|---|---|---|---|
| 10,573,627 | B2* | 2/2020 | Fong | H01L 25/105 |
| 10,879,292 | B2* | 12/2020 | Jang | H01L 27/14687 |
| 11,764,189 | B2* | 9/2023 | Gao | H01L 23/3135 |
| | | | | 257/774 |
| 2011/0049336 | A1* | 3/2011 | Matsunuma | H01L 27/14692 |
| | | | | 257/431 |
| 2012/0241961 | A1* | 9/2012 | Kagawa | H01L 24/94 |
| | | | | 257/773 |
| 2012/0241981 | A1* | 9/2012 | Hirano | H01L 23/562 |
| | | | | 257/777 |
| 2012/0248580 | A1* | 10/2012 | Matsugai | H01L 27/1469 |
| | | | | 257/621 |
| 2013/0112849 | A1* | 5/2013 | Shimotsusa | H01L 27/1469 |
| | | | | 250/206 |
| 2013/0221473 | A1* | 8/2013 | Shimotsusa | H01L 27/14687 |
| | | | | 257/431 |
| 2013/0284885 | A1* | 10/2013 | Chen | H01L 27/14618 |
| | | | | 250/208.1 |
| 2015/0035109 | A1* | 2/2015 | Kataoka | H01L 24/06 |
| | | | | 257/443 |
| 2015/0076649 | A1* | 3/2015 | Kim | H01L 27/14634 |
| | | | | 257/446 |
| 2015/0194455 | A1 | 7/2015 | Ho et al. | |
| 2015/0221694 | A1* | 8/2015 | Baba | H01L 27/14636 |
| | | | | 257/443 |
| 2015/0235949 | A1* | 8/2015 | Yu | H01L 25/0652 |
| | | | | 257/774 |
| 2015/0243643 | A1* | 8/2015 | Li | H01L 25/50 |
| | | | | 438/109 |
| 2015/0270307 | A1* | 9/2015 | Umebayashi | H01L 27/14621 |
| | | | | 257/292 |
| 2015/0380377 | A1* | 12/2015 | Uzoh | B81C 1/0023 |
| | | | | 257/773 |
| 2016/0020235 | A1* | 1/2016 | Yamashita | H01L 27/14634 |
| | | | | 250/206 |
| 2016/0141282 | A1* | 5/2016 | Jang | H01L 25/50 |
| | | | | 438/455 |
| 2016/0233264 | A1* | 8/2016 | Kagawa | H01L 27/1464 |
| 2016/0284753 | A1* | 9/2016 | Komai | H01L 23/481 |
| 2017/0179181 | A1* | 6/2017 | Kwon | H01L 25/0657 |
| 2017/0263665 | A1* | 9/2017 | Komai | H01L 27/14645 |
| 2018/0114807 | A1* | 4/2018 | Yamagishi | H01L 23/5286 |
| 2018/0114808 | A1* | 4/2018 | Endo | H01L 27/14632 |
| 2018/0130743 | A1* | 5/2018 | Shigetoshi | H10B 53/50 |
| 2018/0138225 | A1* | 5/2018 | Kim | H04N 25/75 |
| 2018/0145104 | A1* | 5/2018 | Kim | H01L 27/14638 |
| 2019/0067244 | A1* | 2/2019 | Chen | H01L 24/05 |
| 2020/0035691 | A1* | 1/2020 | Reznicek | H01L 29/105 |
| 2020/0035736 | A1* | 1/2020 | Nagahama | H01L 21/76843 |
| 2020/0091217 | A1* | 3/2020 | Horikoshi | H04N 25/70 |
| 2020/0098815 | A1* | 3/2020 | Kameshima | H01L 27/1469 |
| 2020/0105813 | A1* | 4/2020 | Hashiguchi | H01L 27/00 |
| 2020/0105814 | A1* | 4/2020 | Hashiguchi | H01L 27/14636 |
| 2020/0243591 | A1* | 7/2020 | Iijima | H01L 27/14634 |
| 2020/0328186 | A1* | 10/2020 | Liu | H01L 24/83 |
| 2021/0104570 | A1* | 4/2021 | Mitsuhashi | H01L 27/00 |
| 2021/0327838 | A1* | 10/2021 | Hou | H01L 24/03 |

FOREIGN PATENT DOCUMENTS

| | | |
|---|---|---|
| WO | 2013/137049 A1 | 9/2013 |
| WO | 2016/105658 A1 | 6/2016 |

OTHER PUBLICATIONS

Non-Final Office Action issued in U.S. Appl. No. 16/495,335 on Jun. 8, 2021.
Final Office Action issued in U.S. Appl. No. 16/495,335 on Sep. 20, 2021.
Advisory Action issued in U.S. Appl. No. 16/495,335 on Nov. 23, 2021.
Non-Final Office Action issued in U.S. Appl. No. 16/495,335 on Dec. 29, 2021.
Notice of Allowance issued in U.S. Appl. No. 16/495,335 on Apr. 6, 2022.

\* cited by examiner

[FIG. 1]
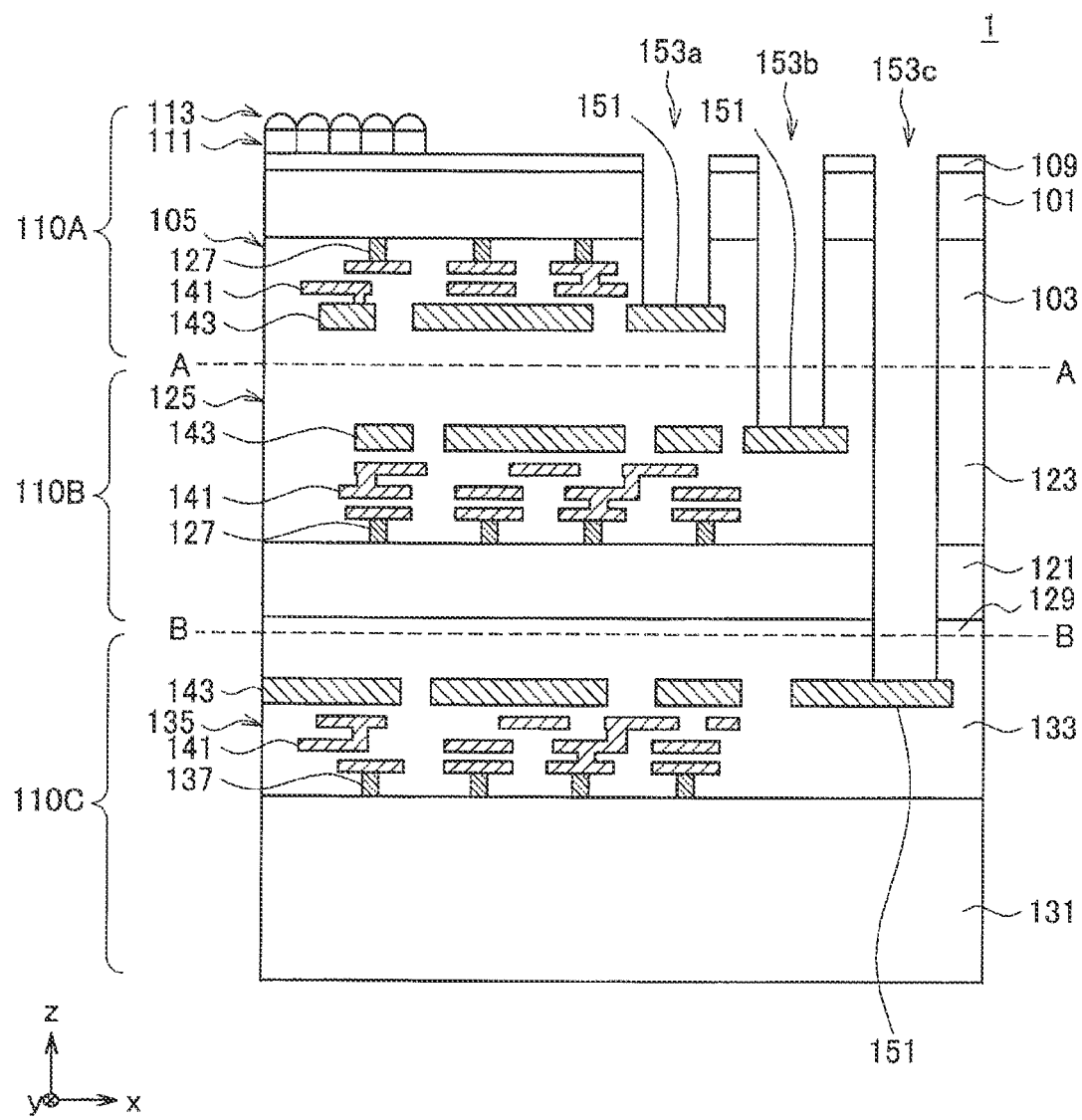

[FIG. 2A]
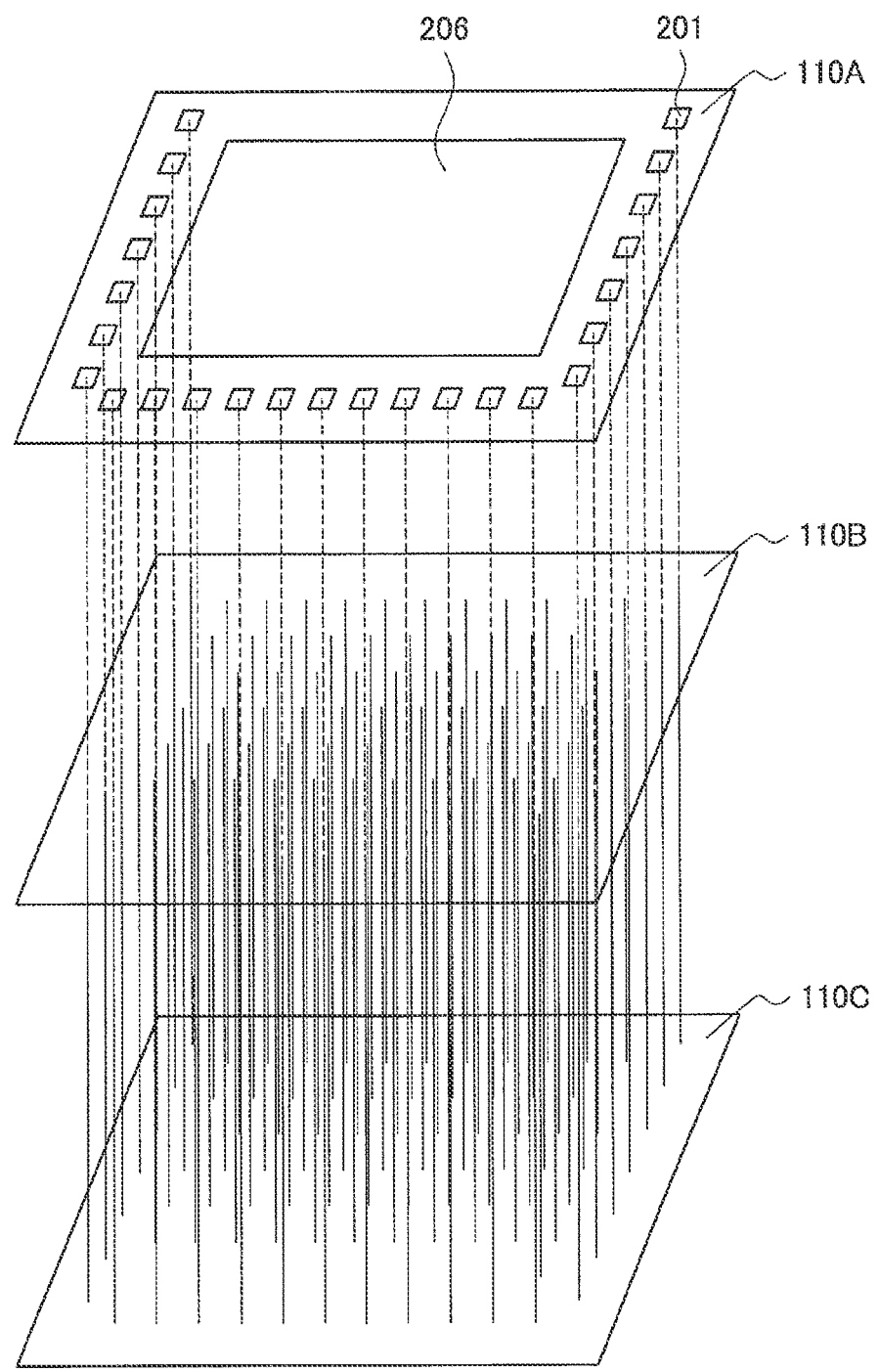

[FIG. 2B]
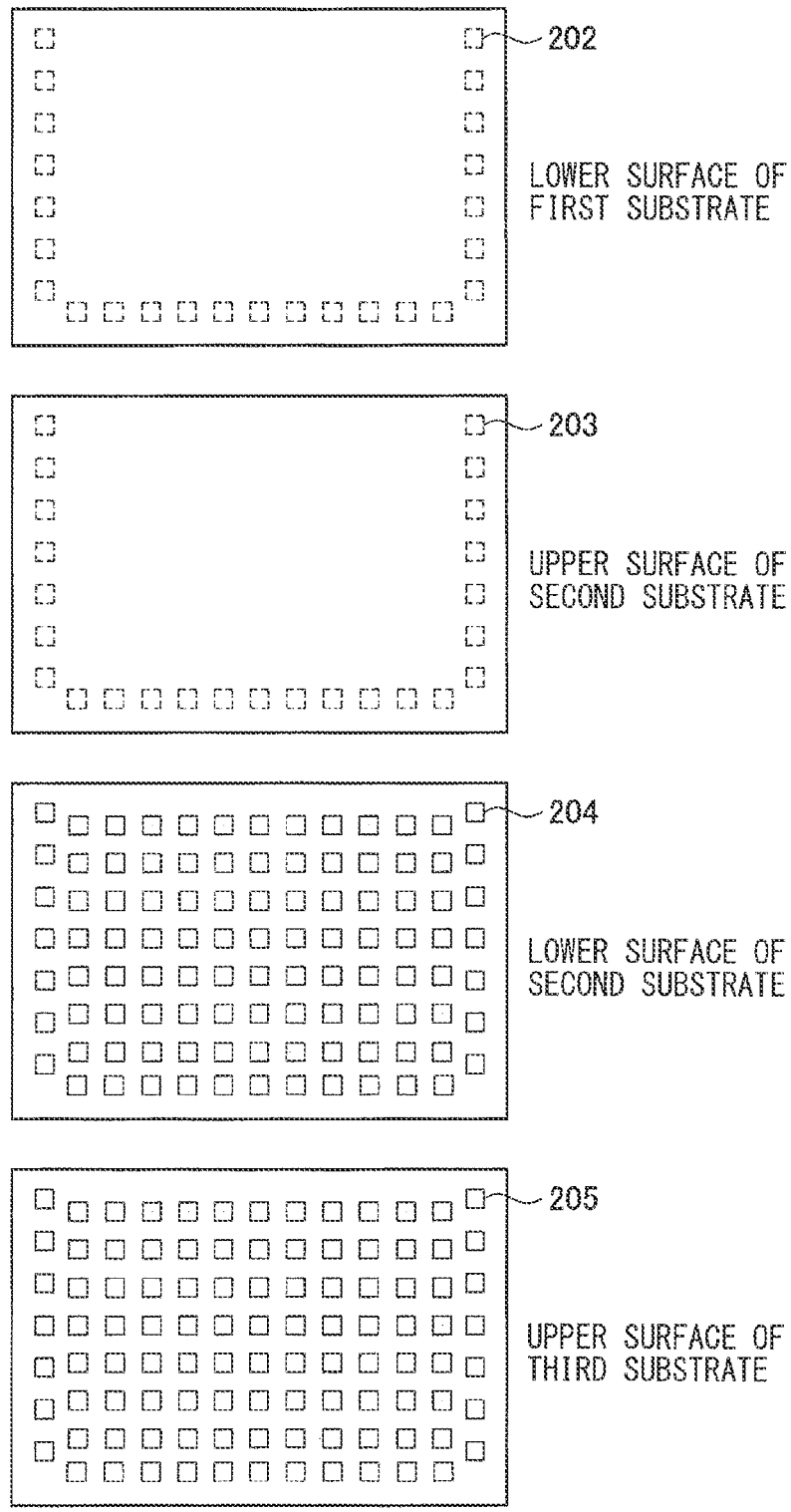

[FIG. 2C]
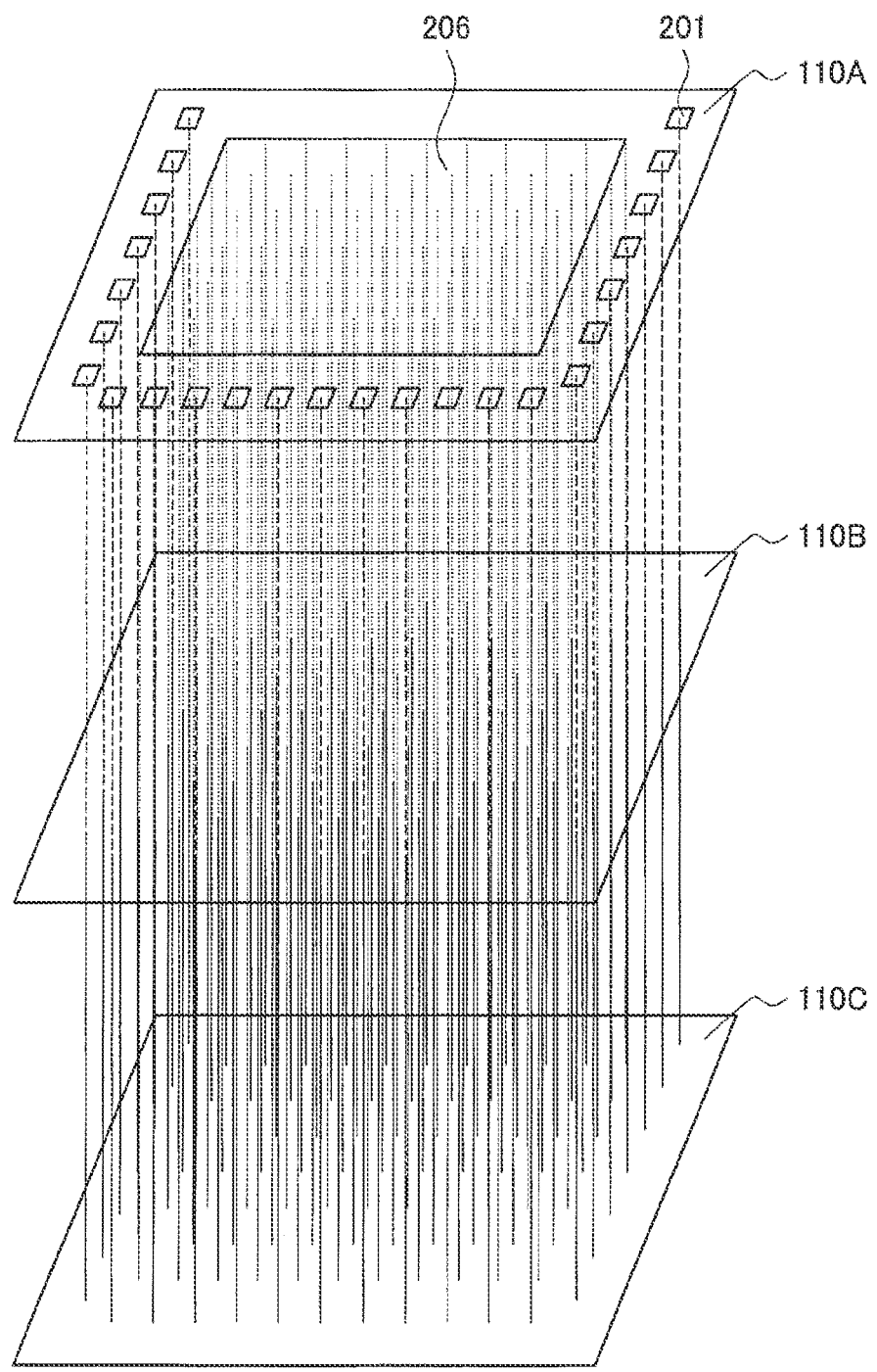

[FIG. 2D]
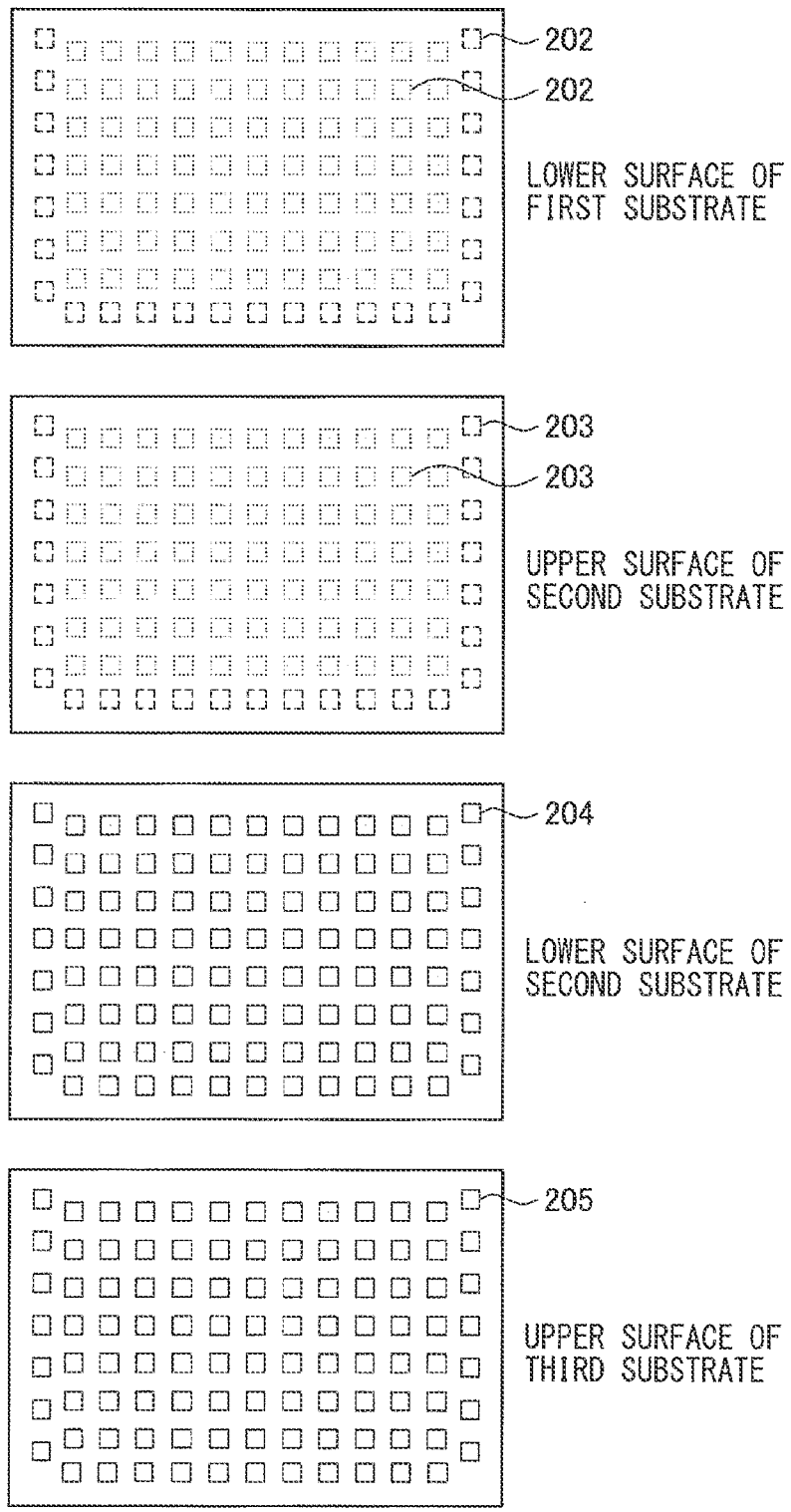

[ FIG. 2E ]
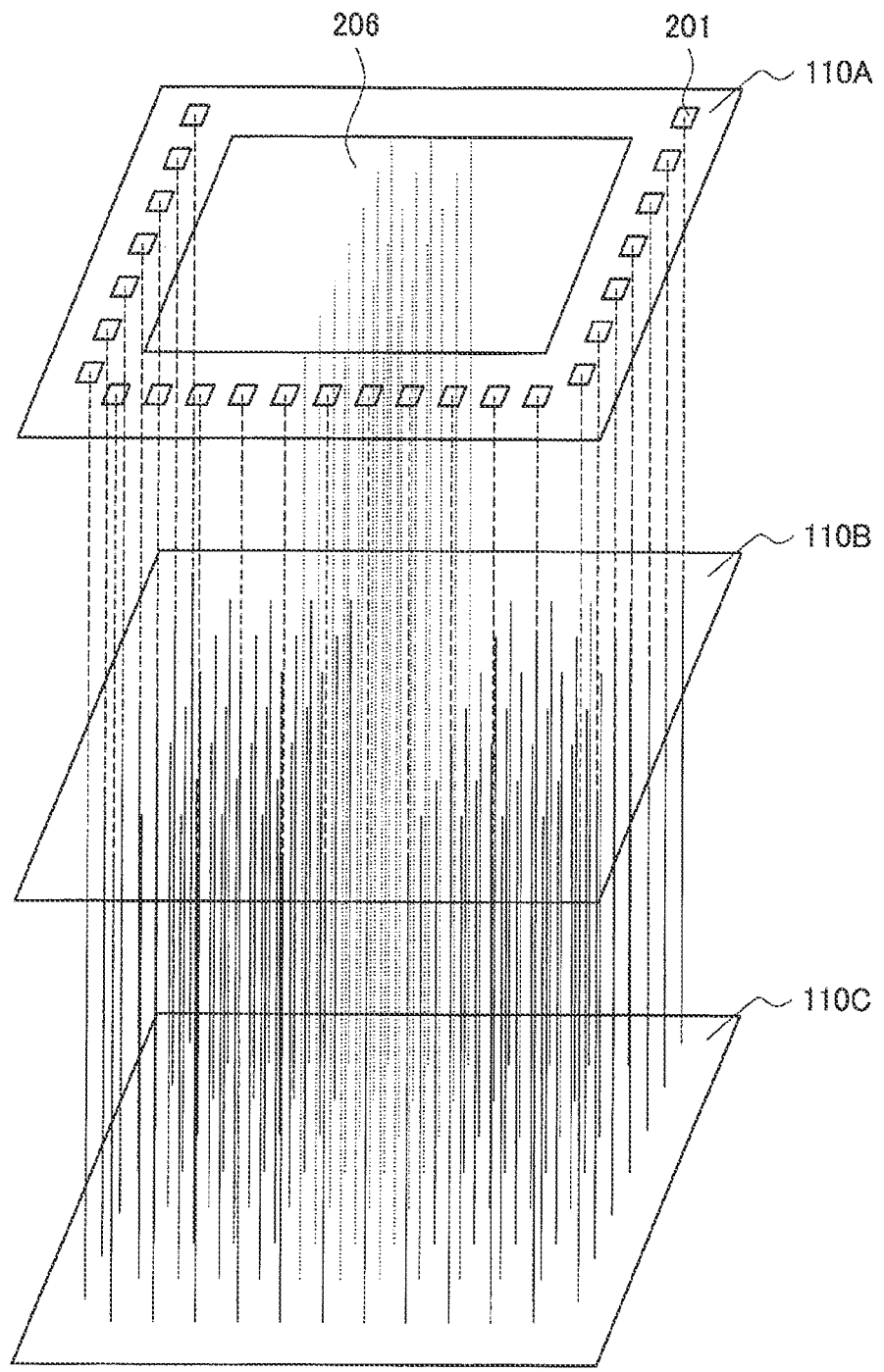

[FIG. 2F]
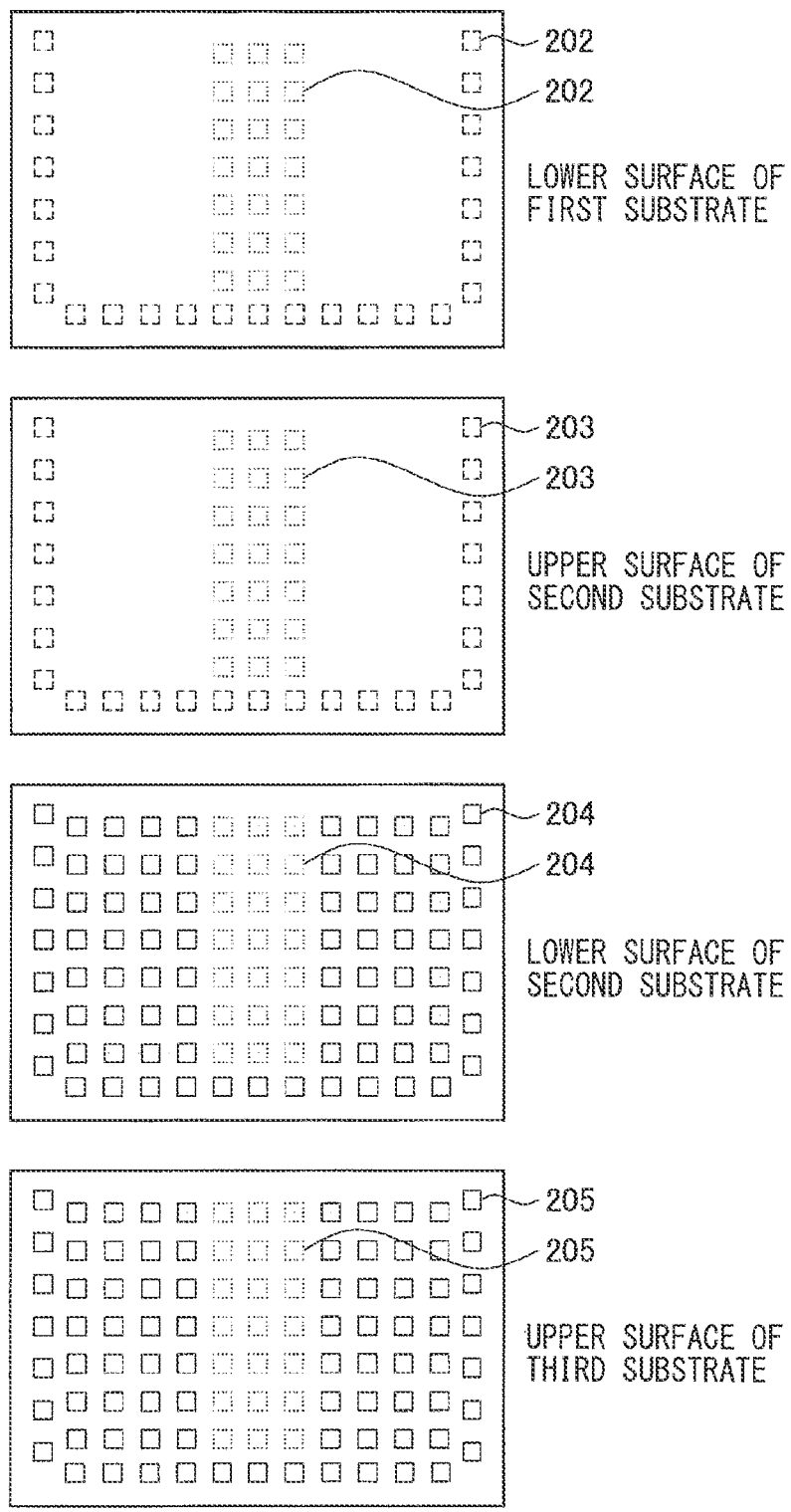

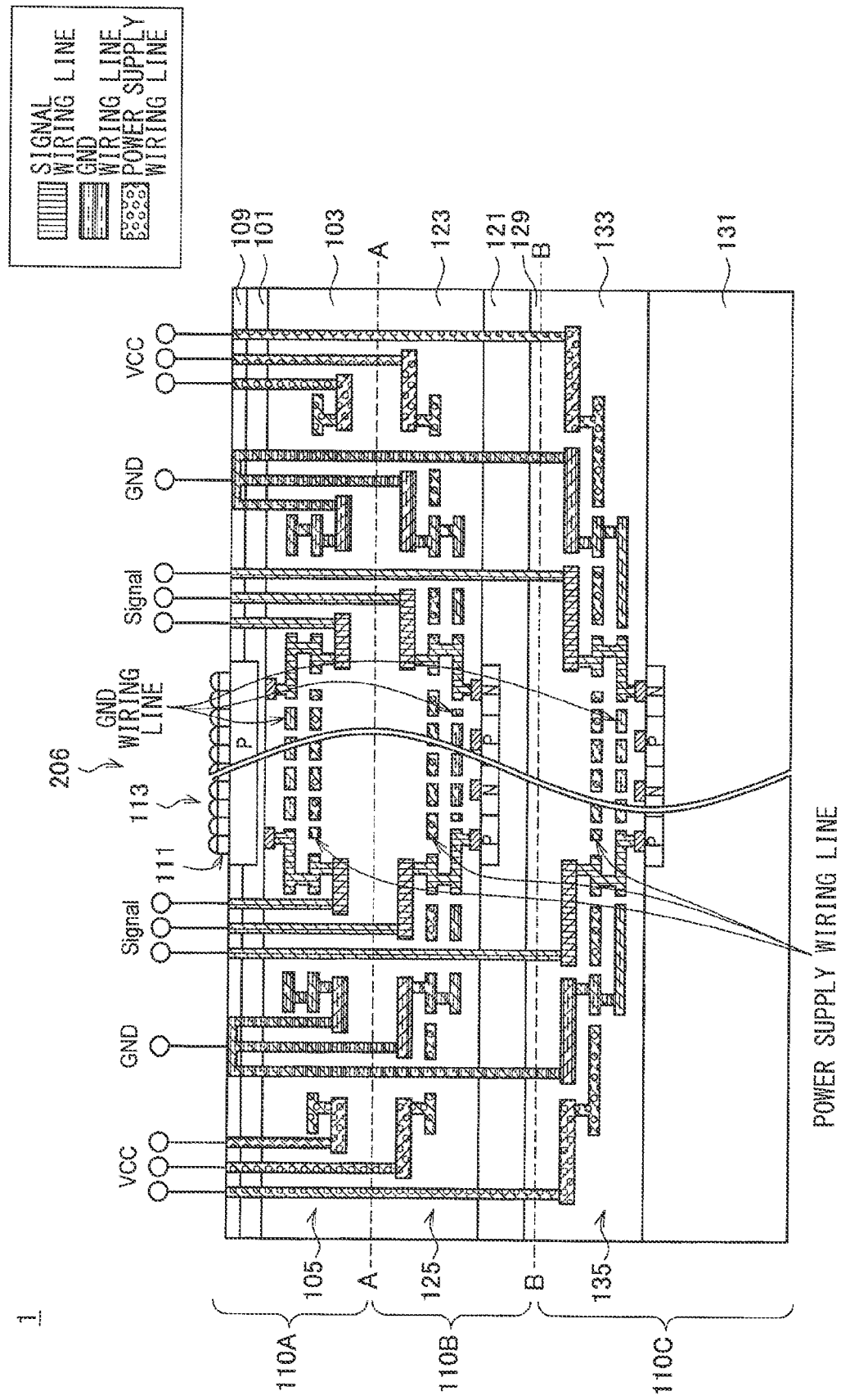
[FIG. 3A]

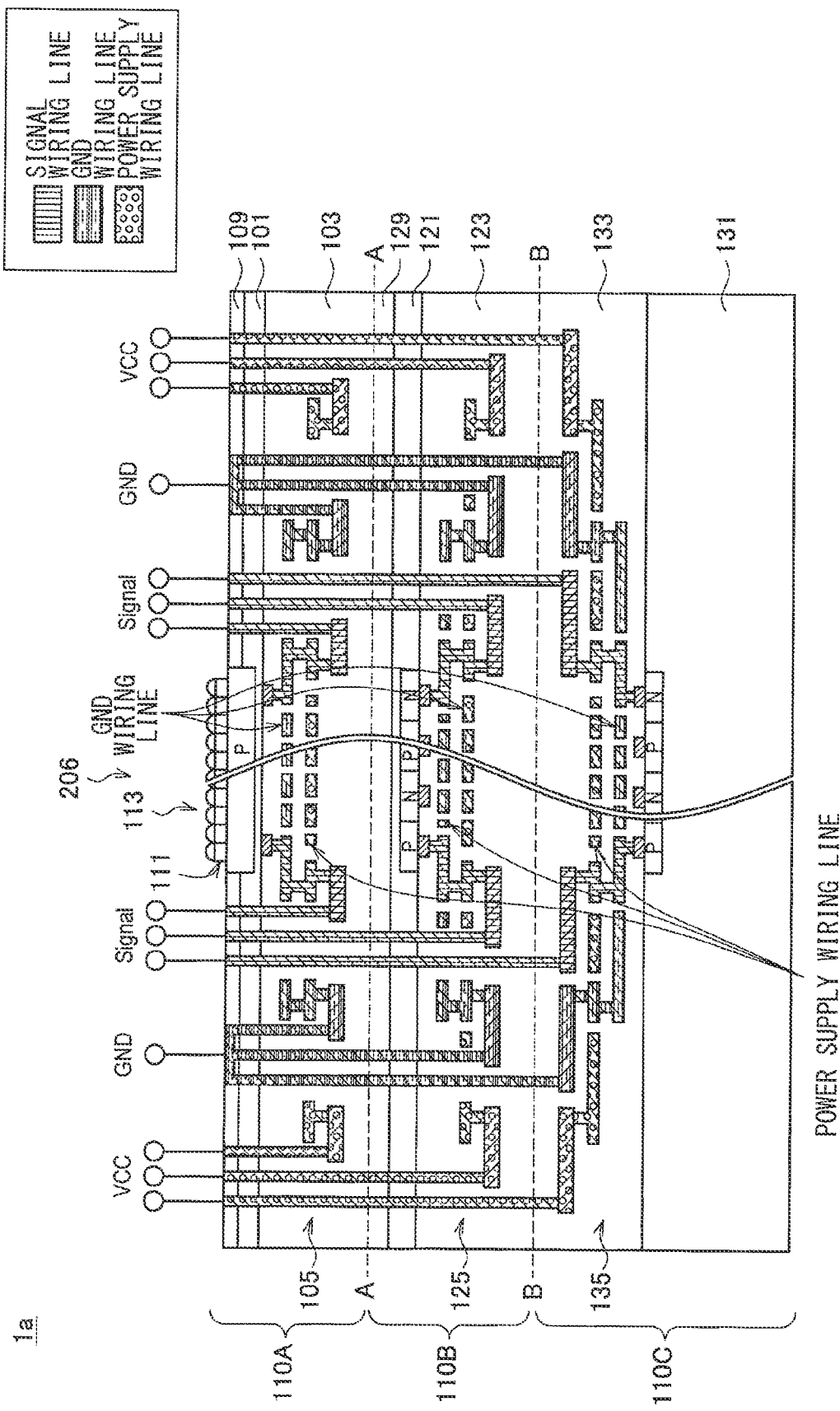
[FIG. 3B]

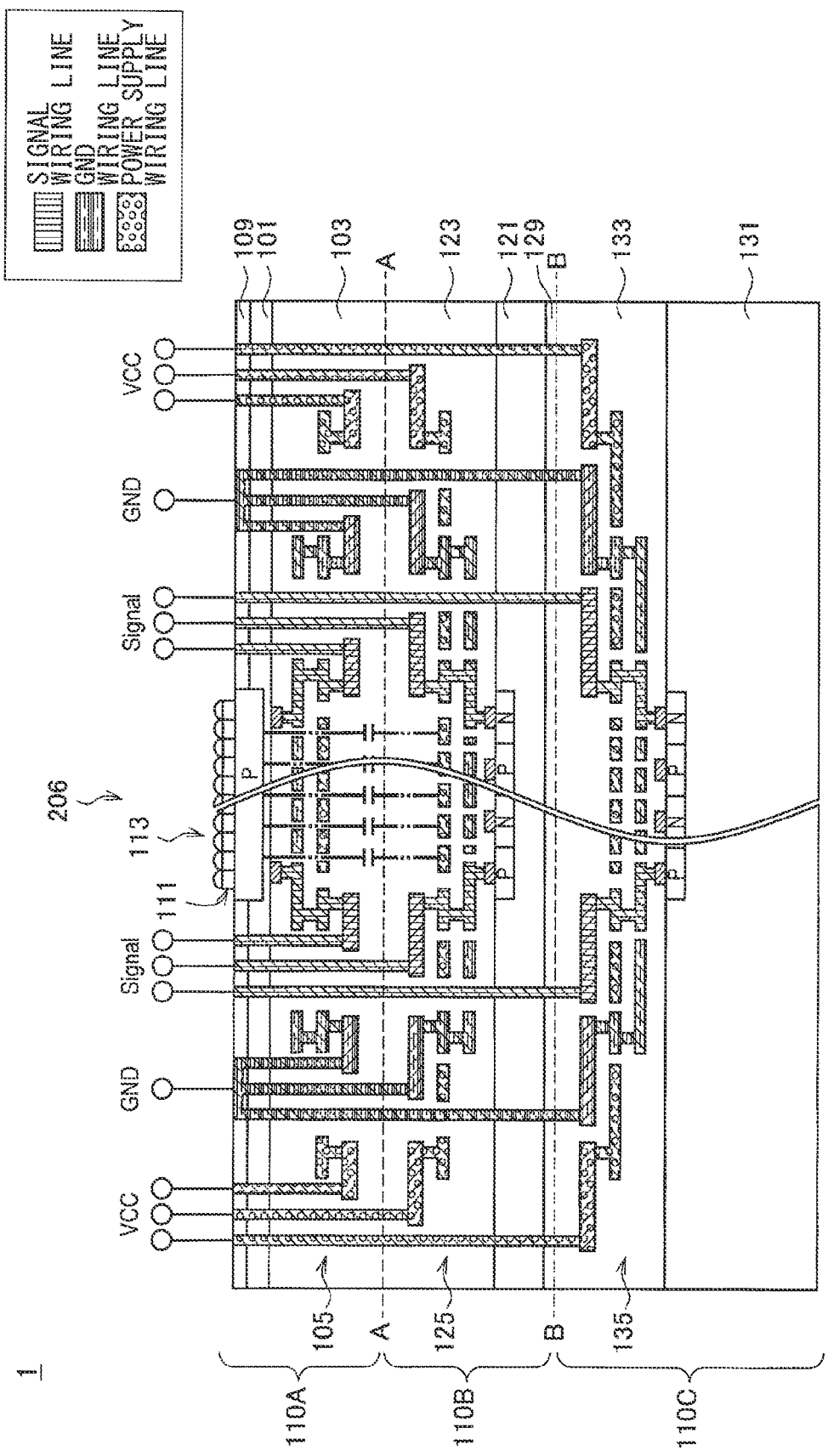
[FIG. 4A]

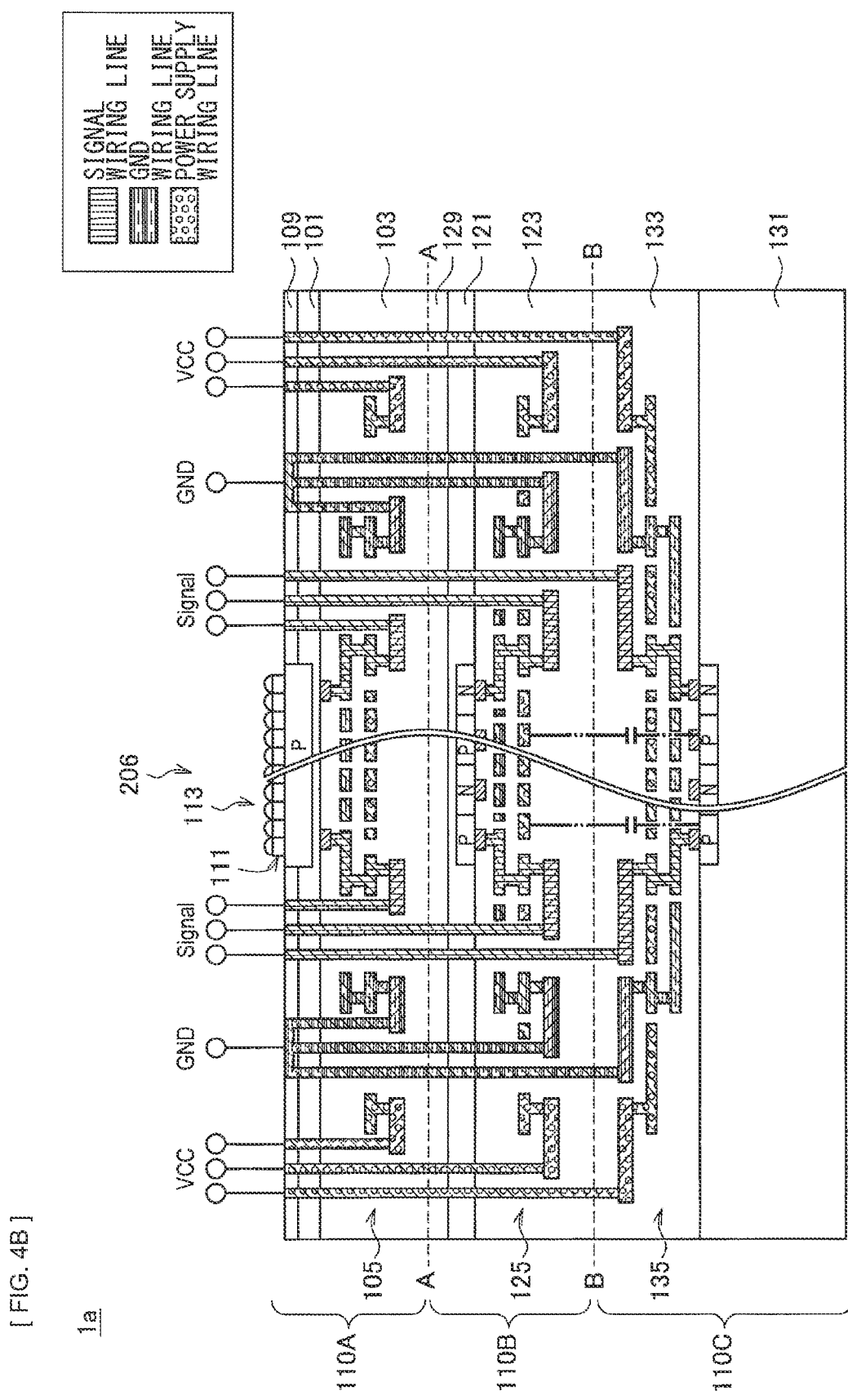

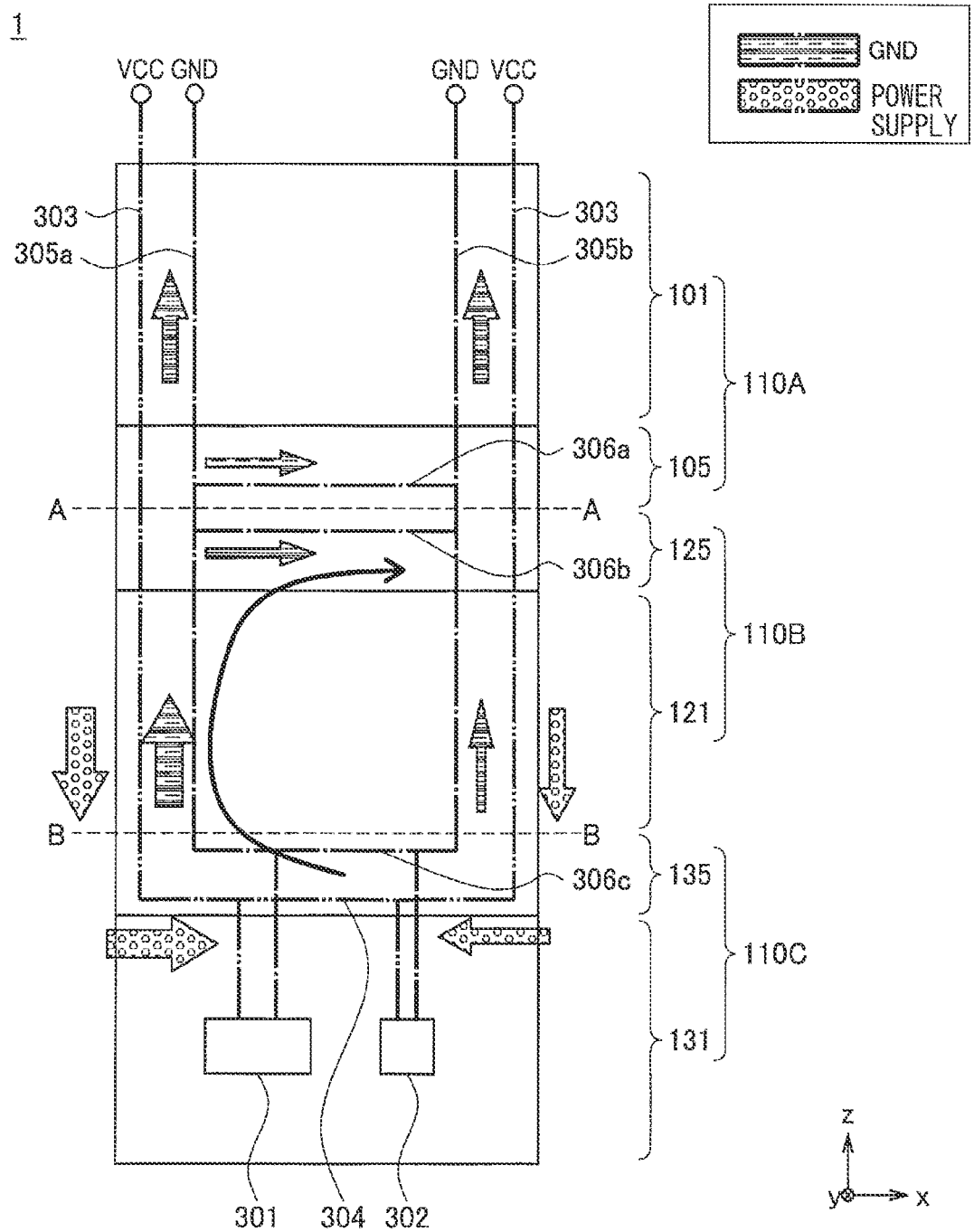
[FIG. 5A]

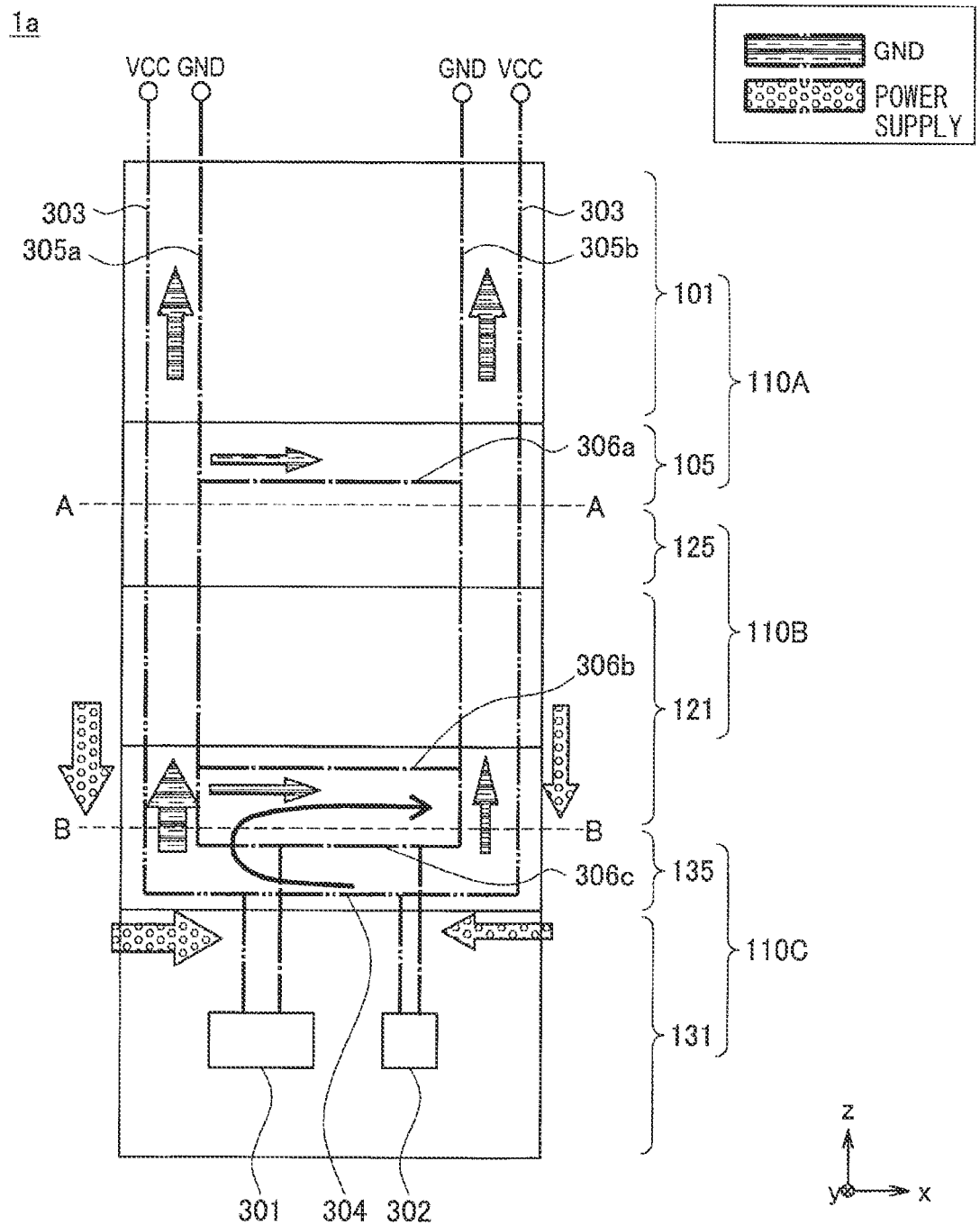
[FIG. 5B]

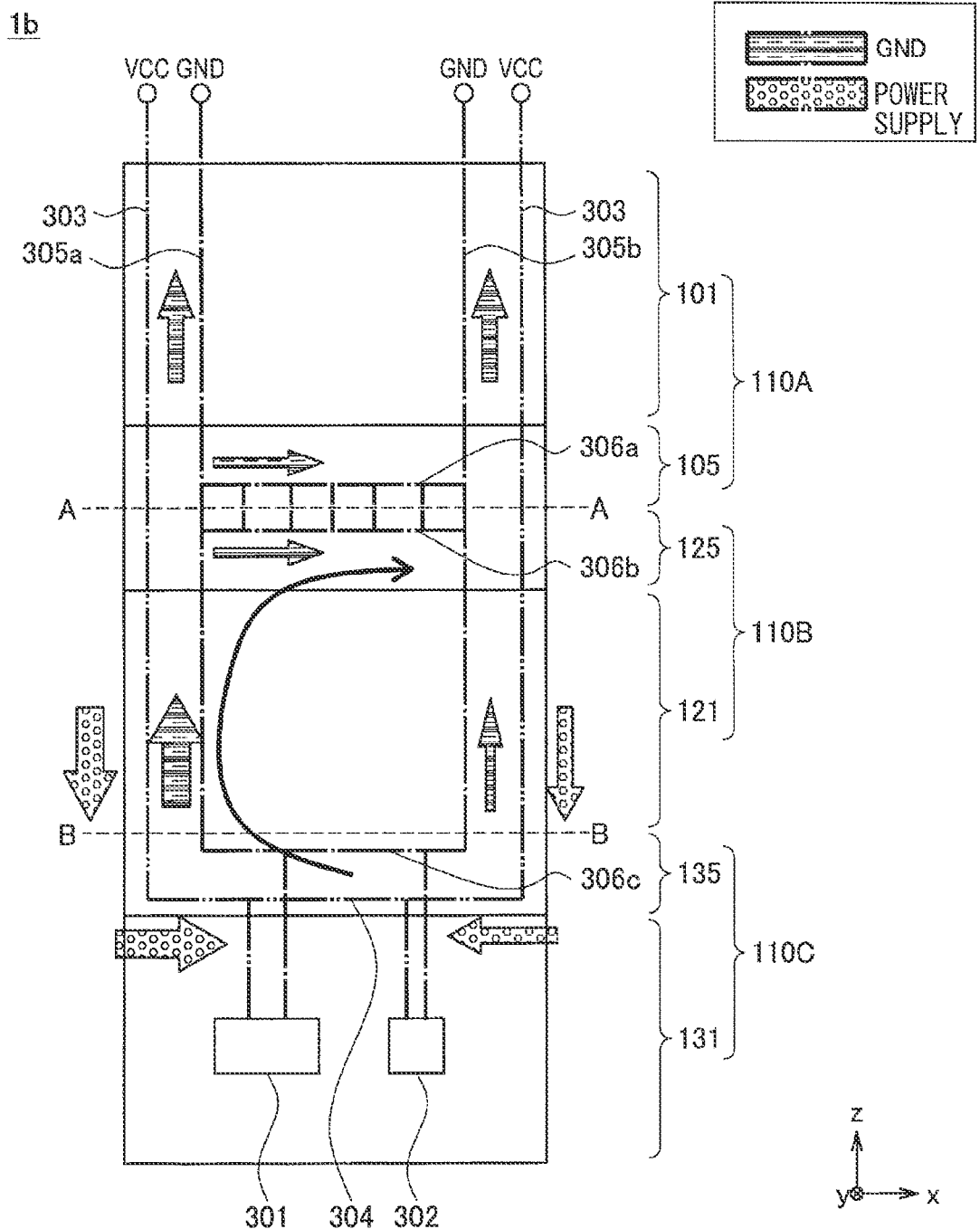
[FIG. 5C]

[FIG. 6A]
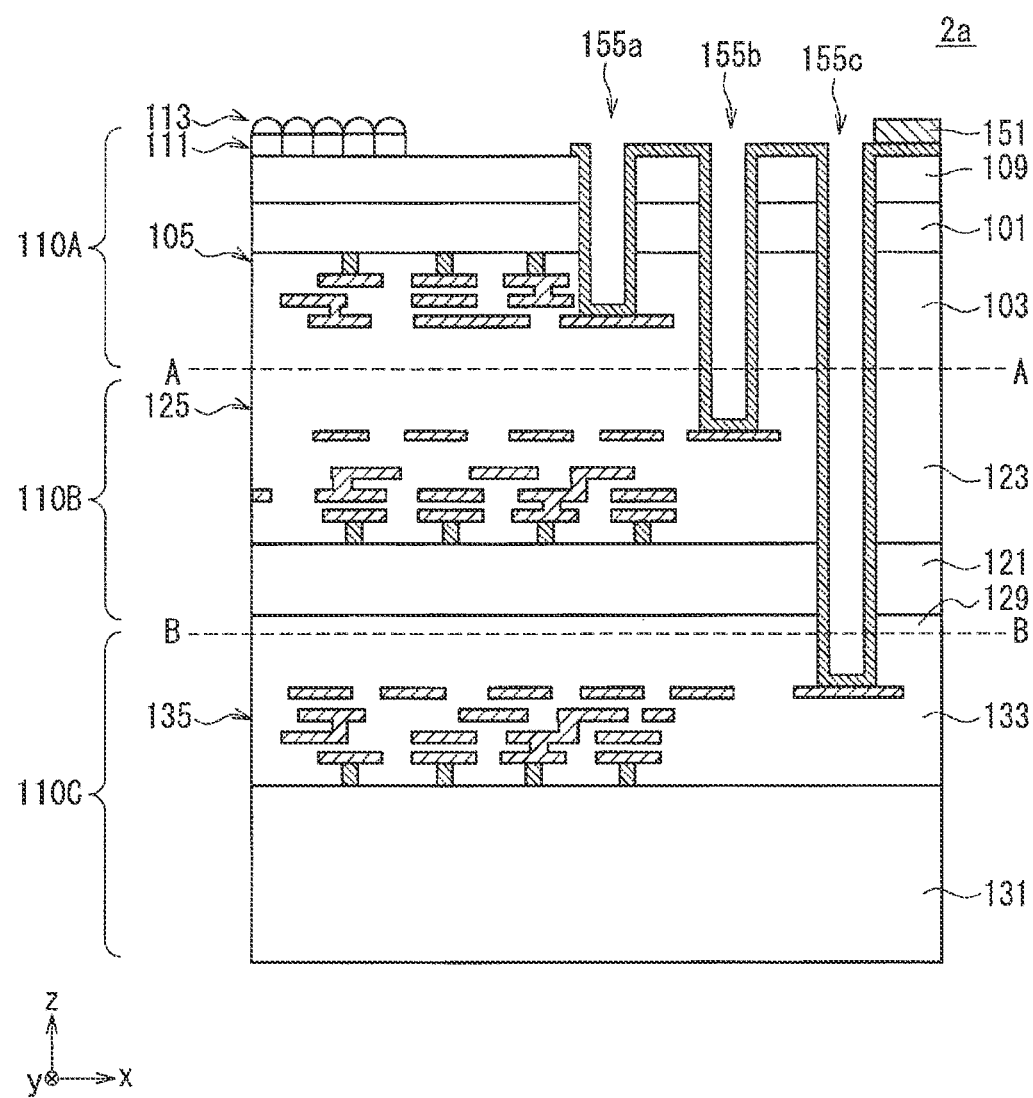

[FIG. 6B]
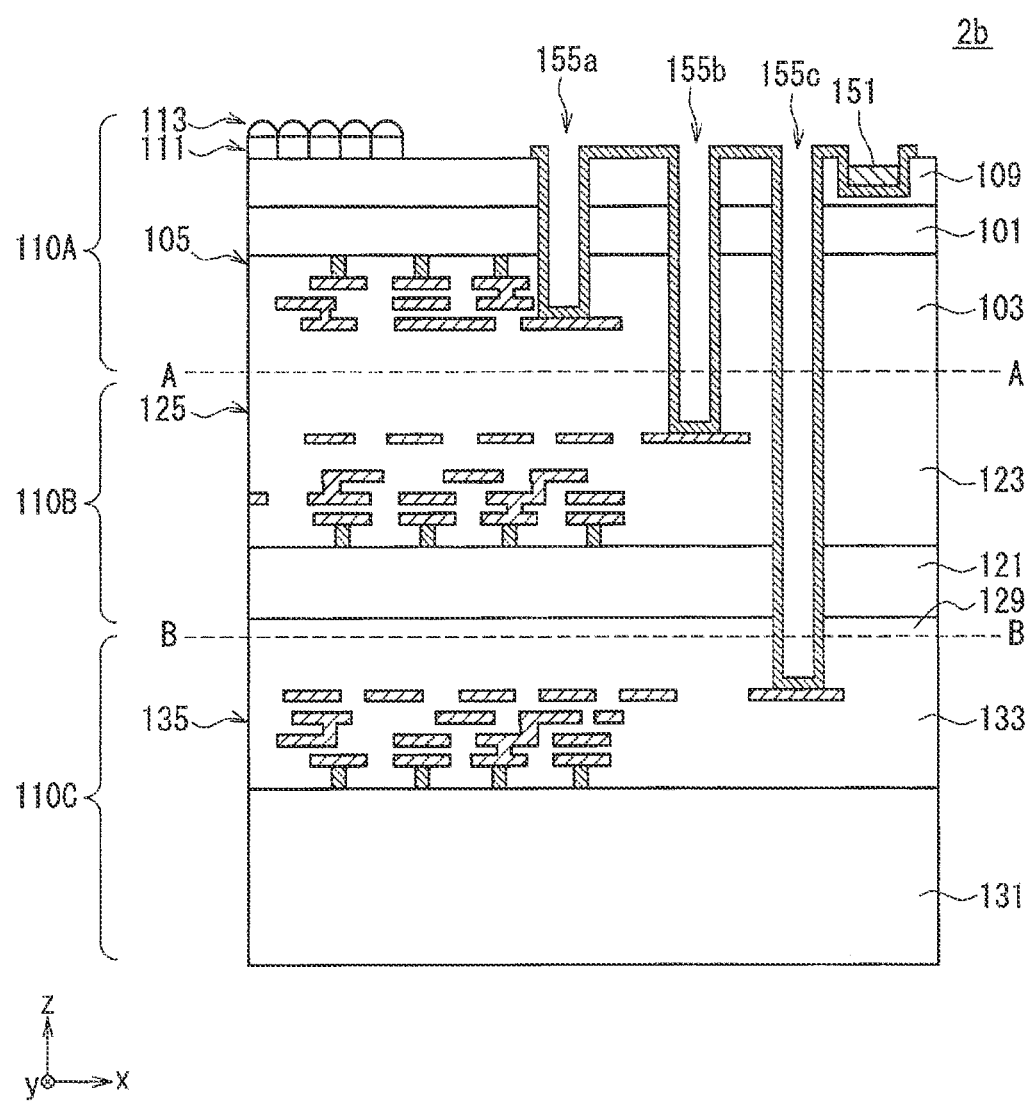

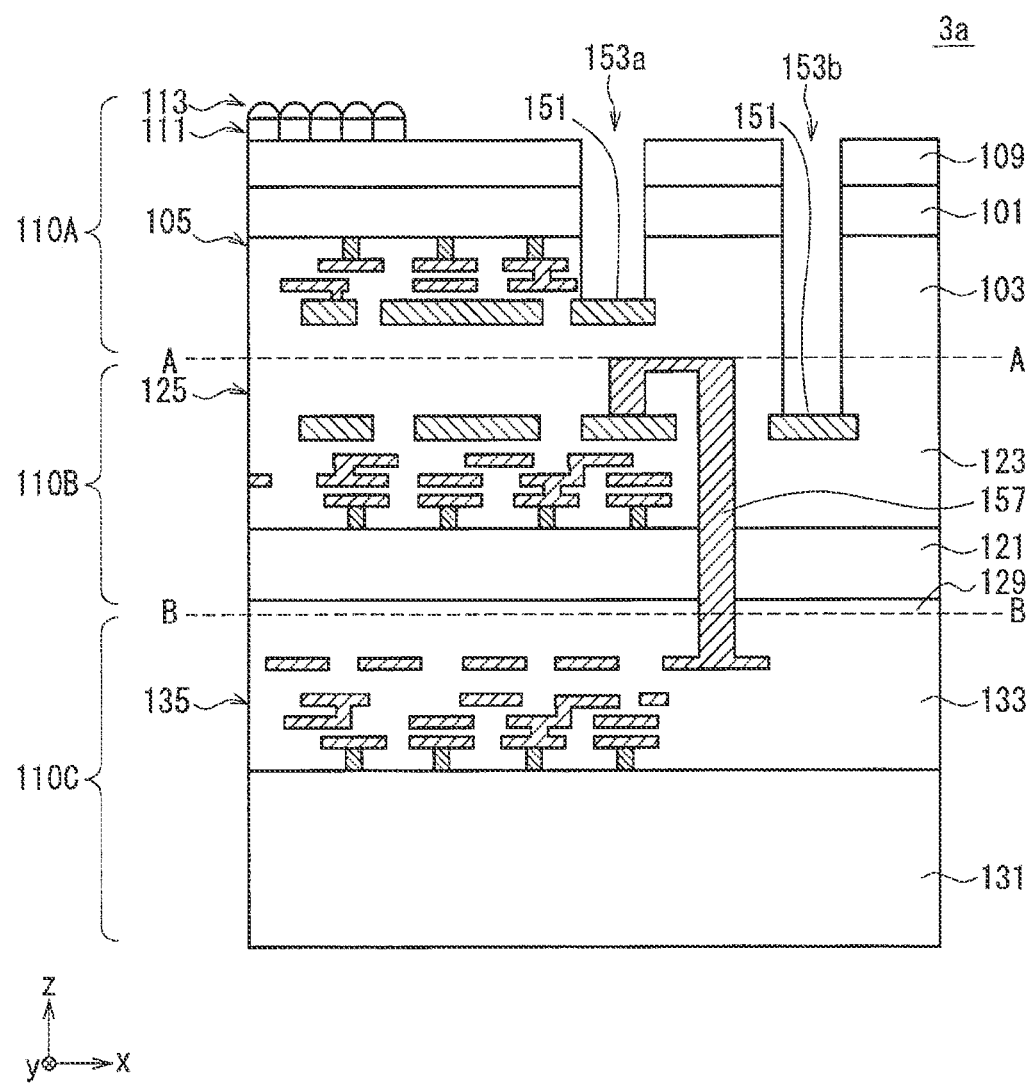
[FIG. 7A]

[FIG. 7B]
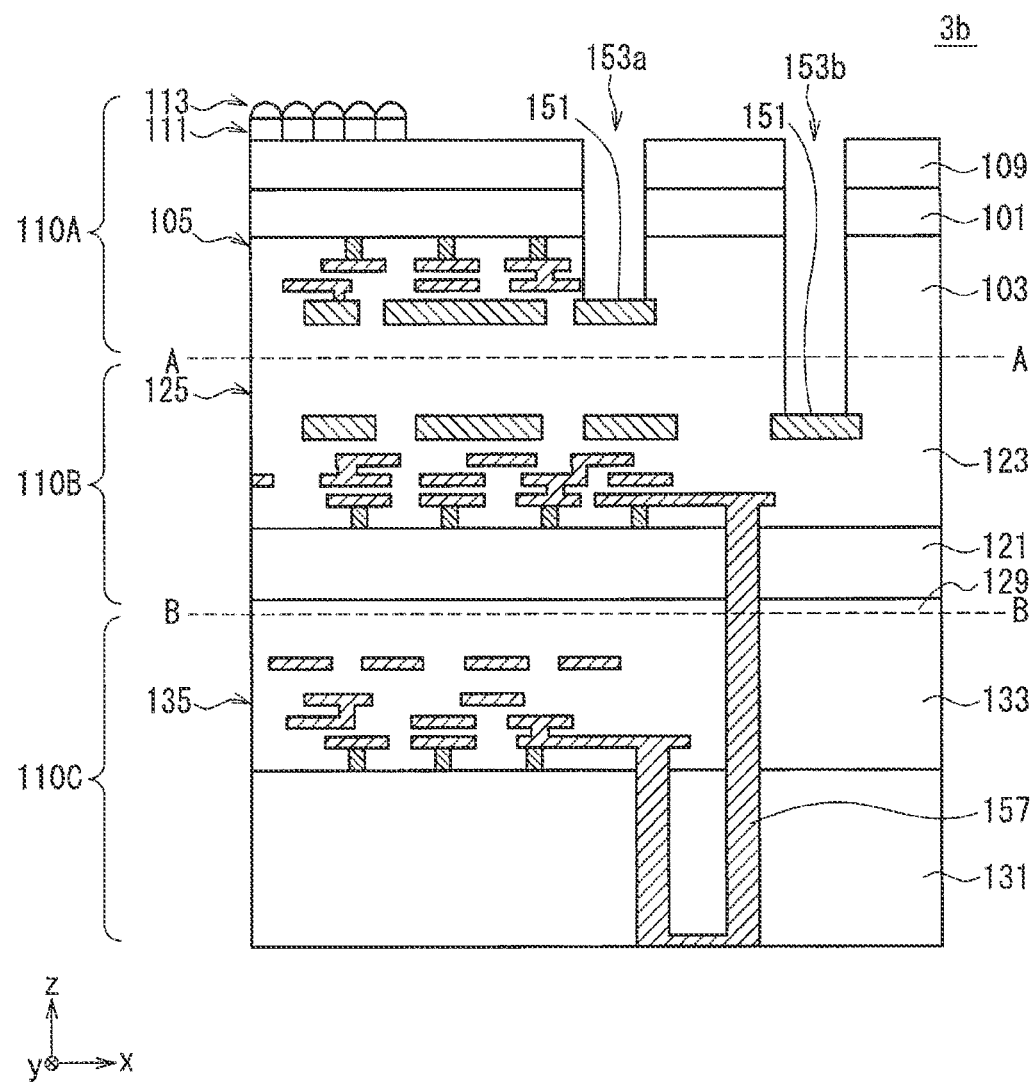

[FIG. 7C]
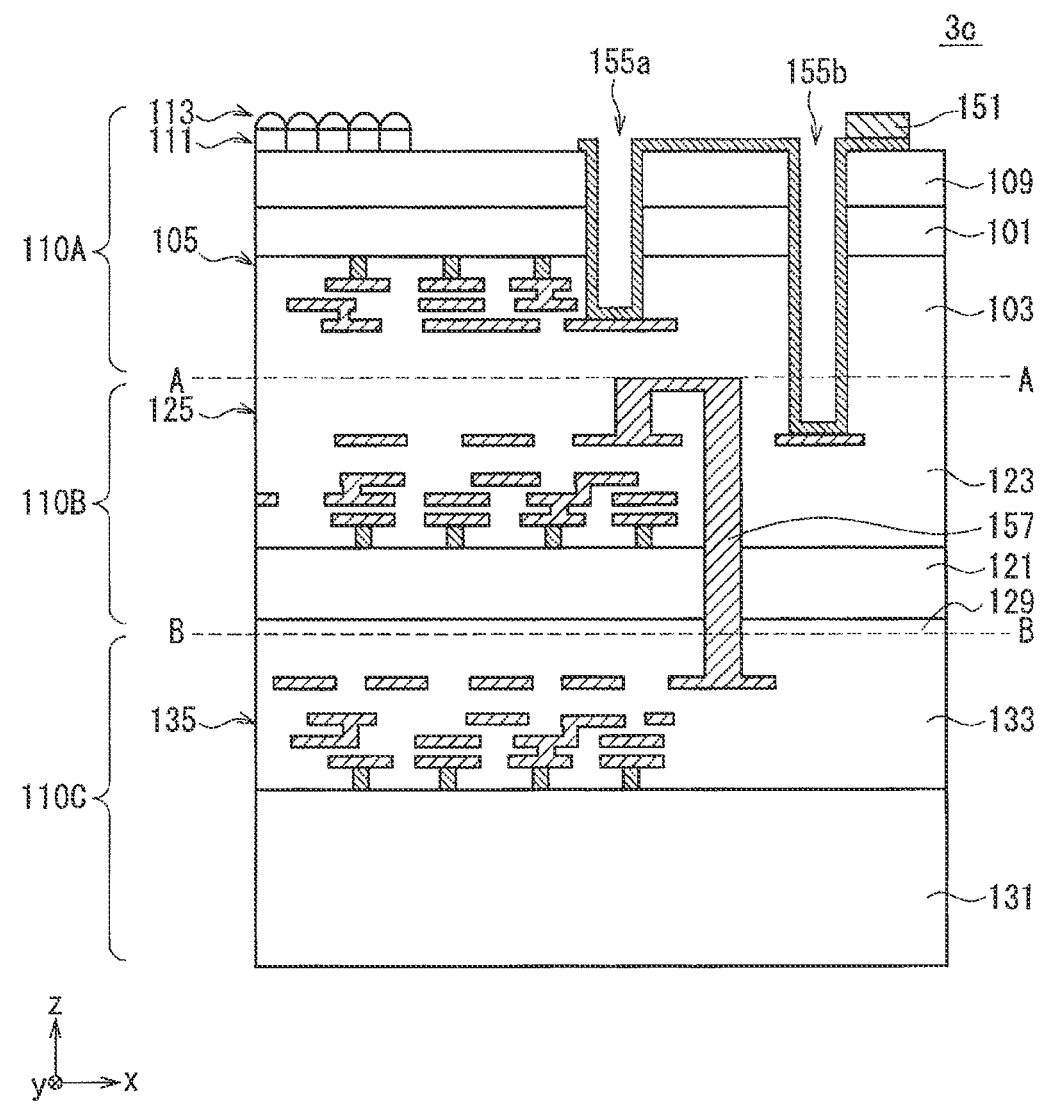

[FIG. 7D]
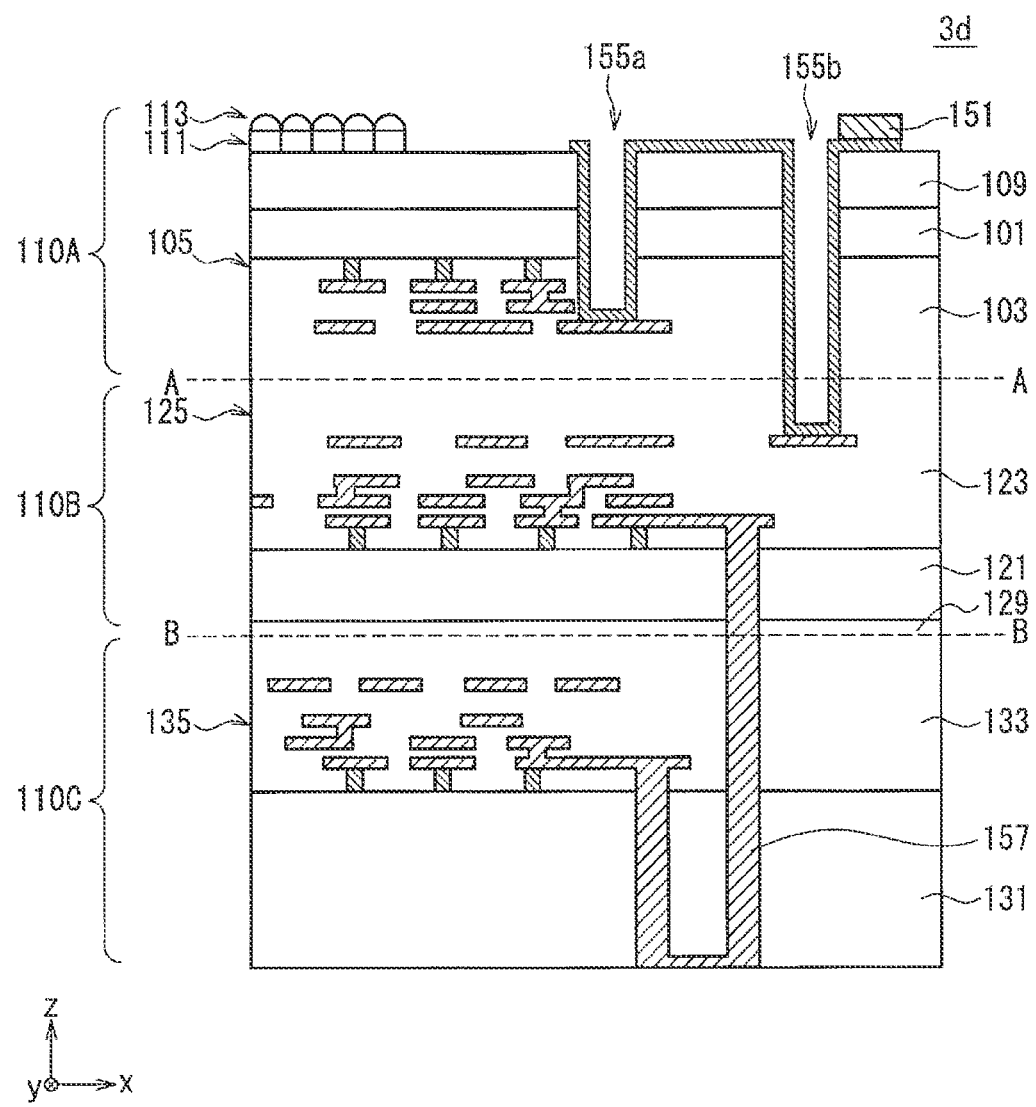

[FIG. 7E]
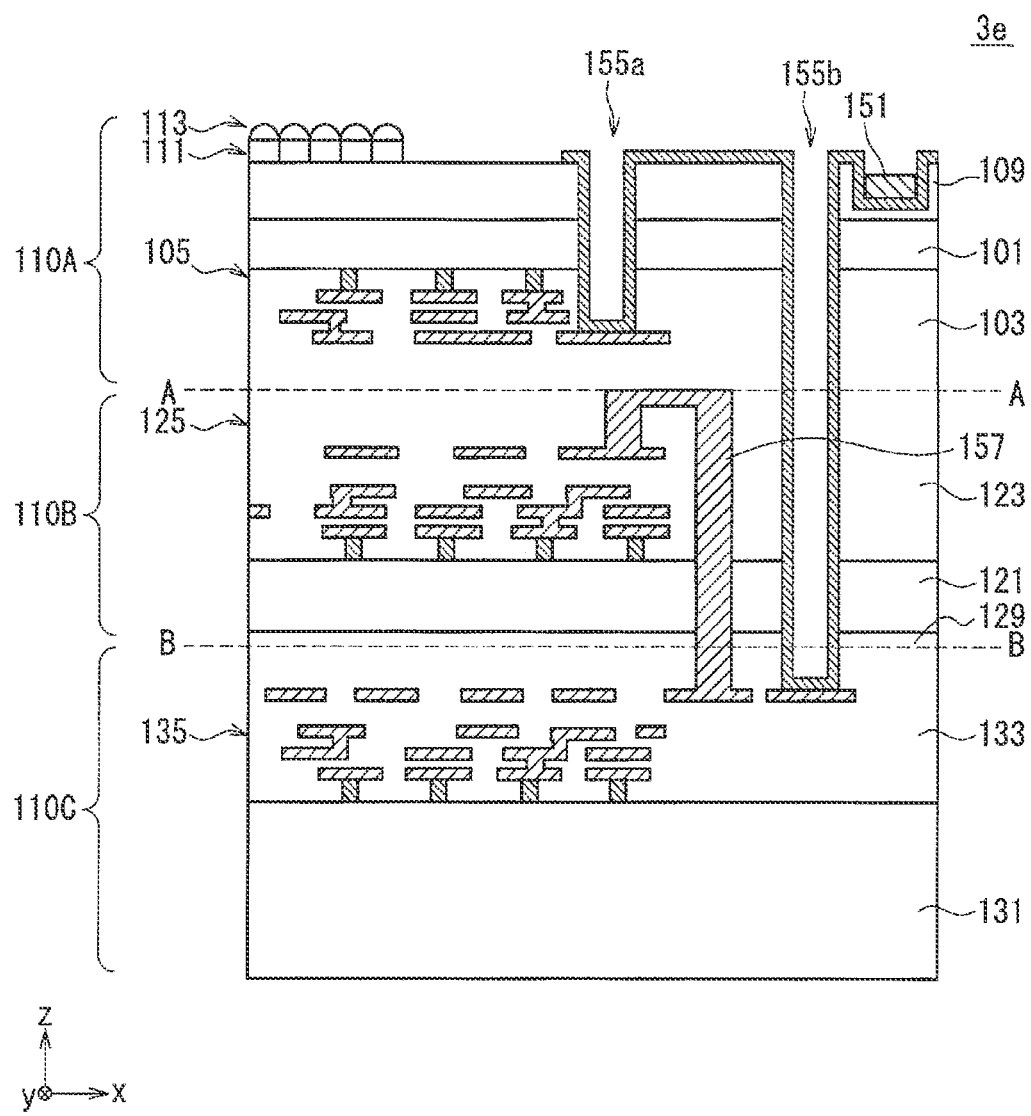

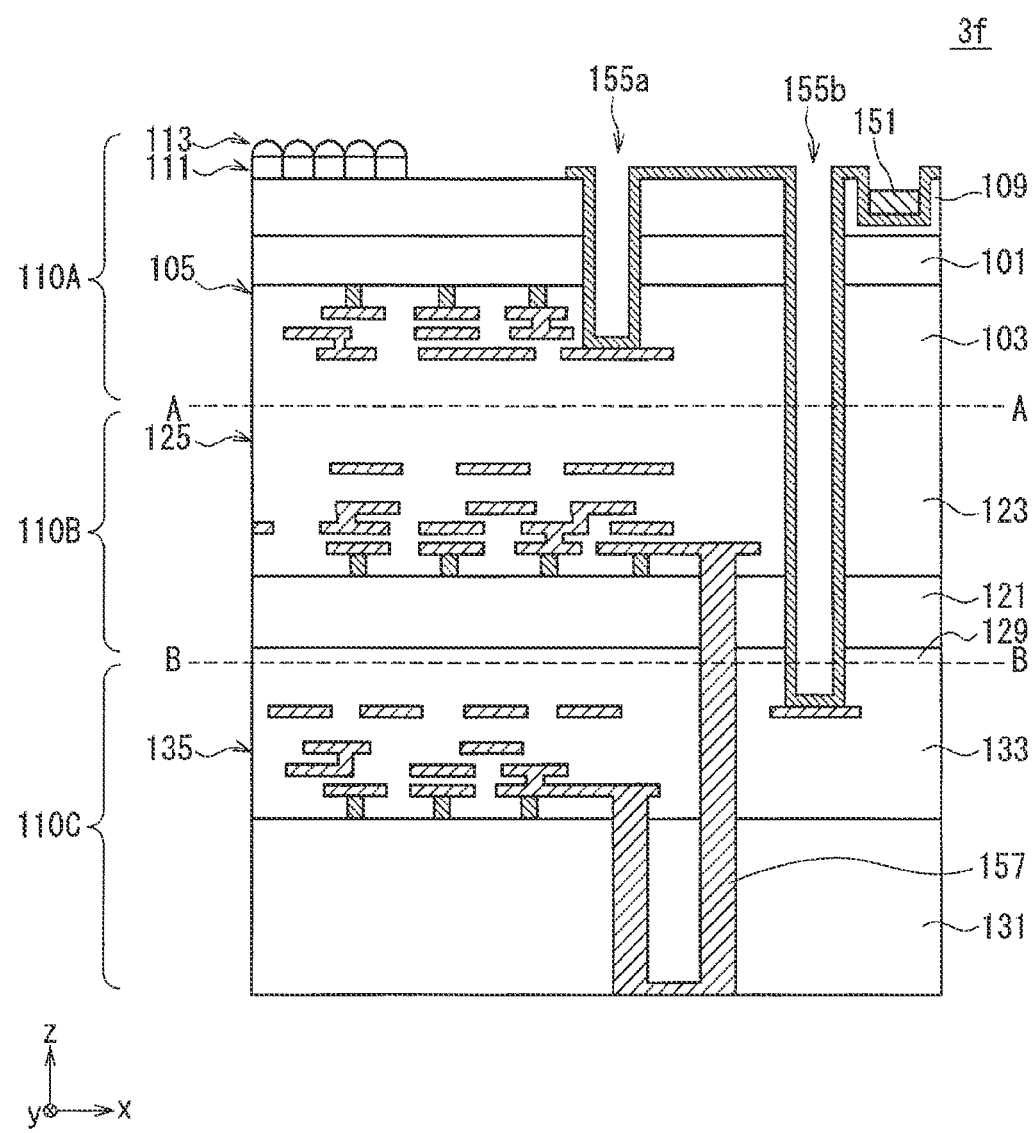
[FIG. 7F]

[FIG. 8A]
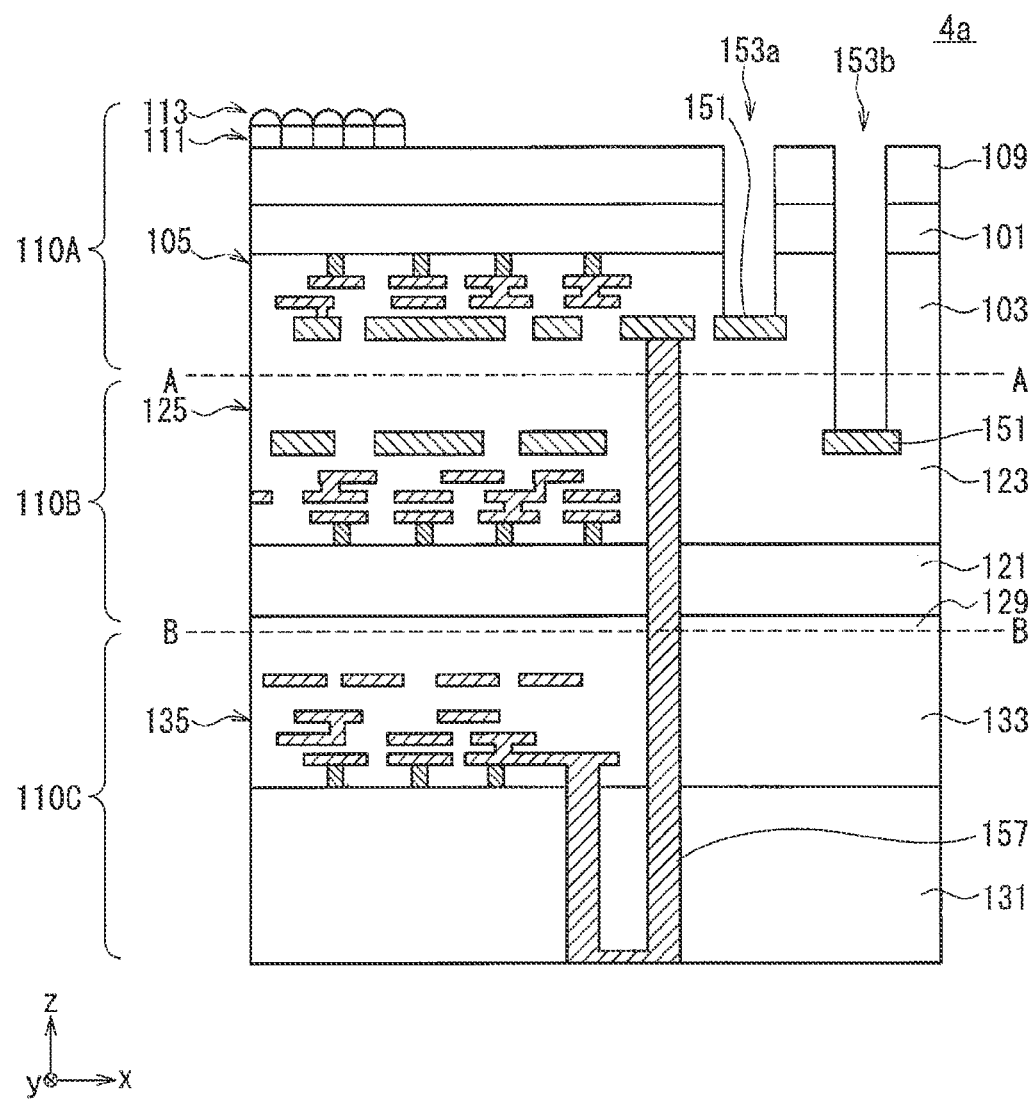

[FIG. 8B]
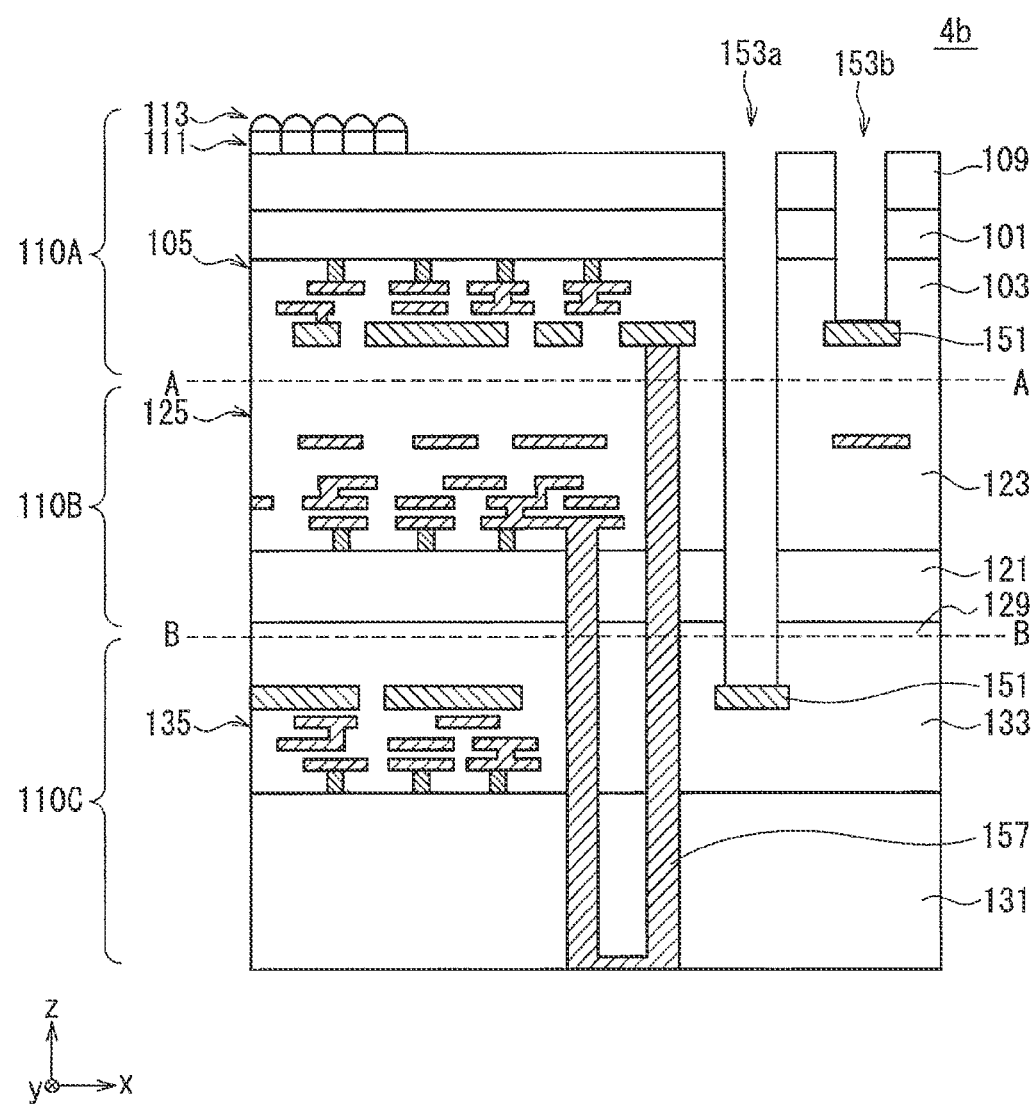

[FIG. 8C]
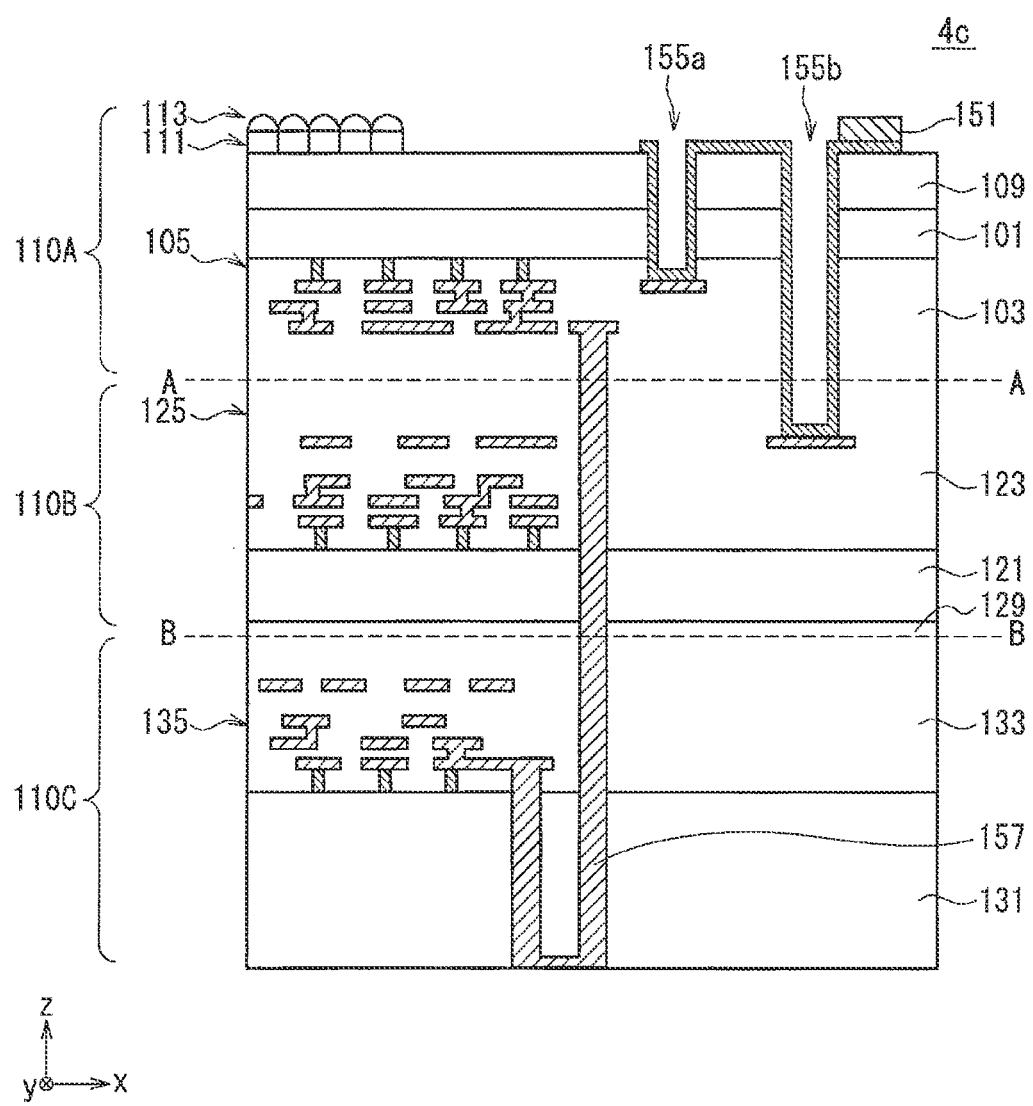

[FIG. 8D]
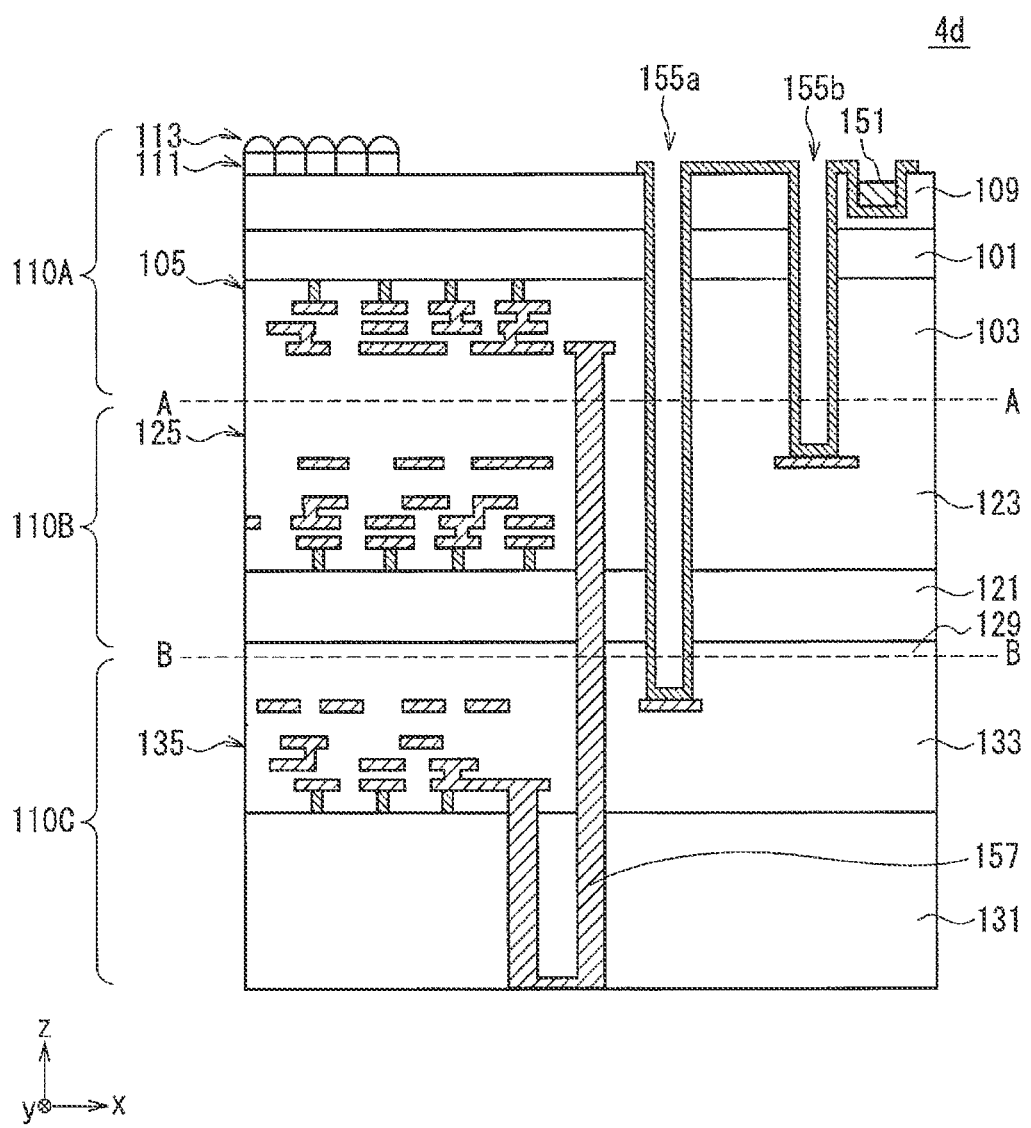

[FIG. 9A]
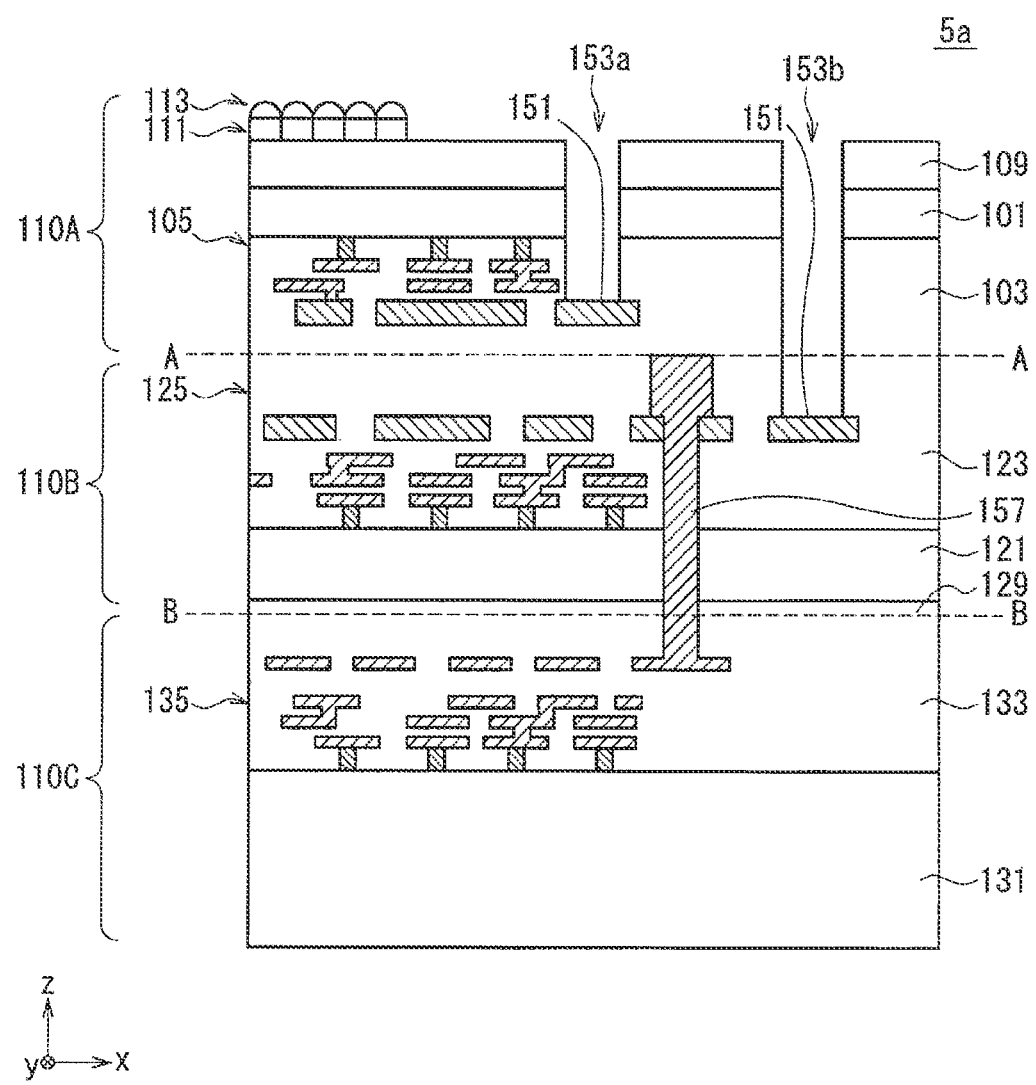

[FIG. 9B]
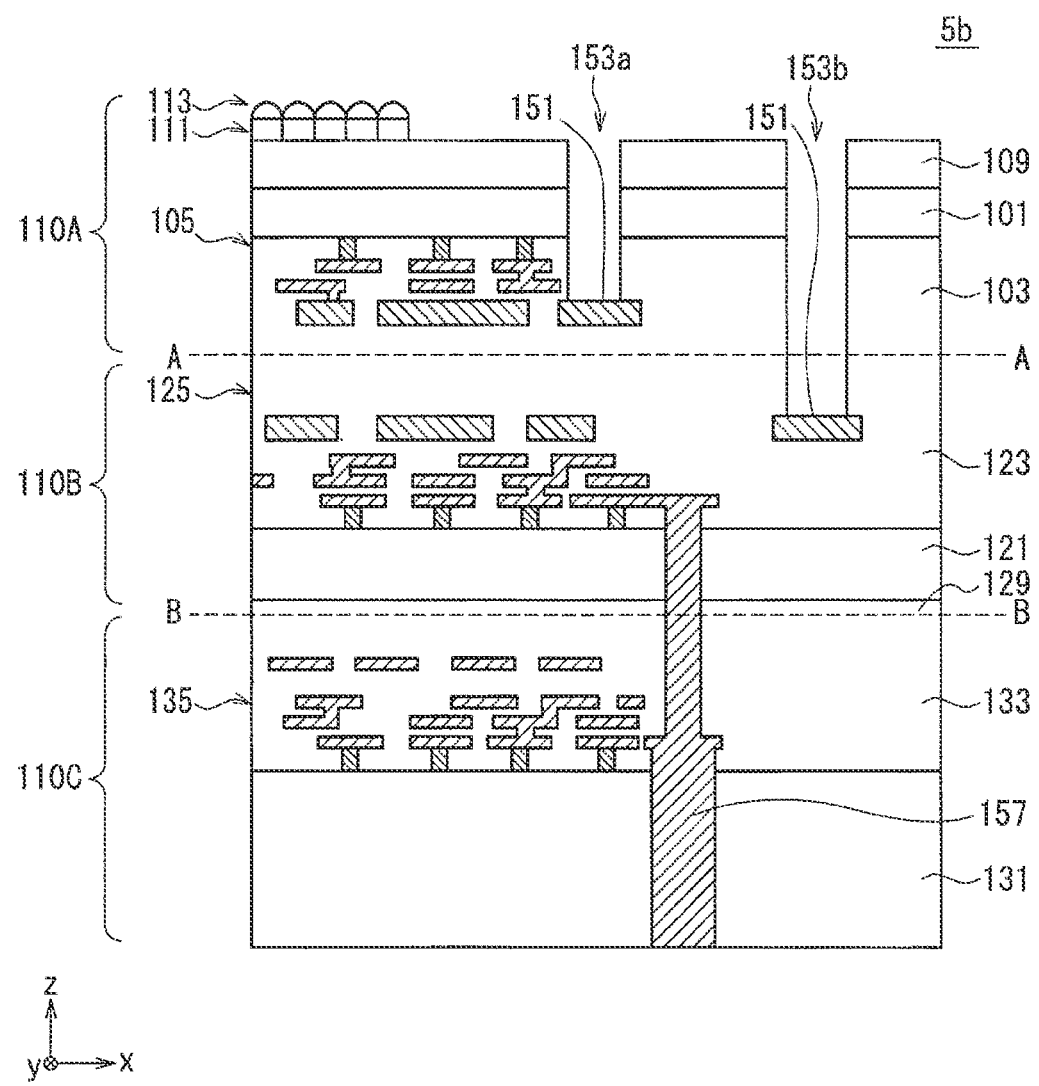

[FIG. 9C]
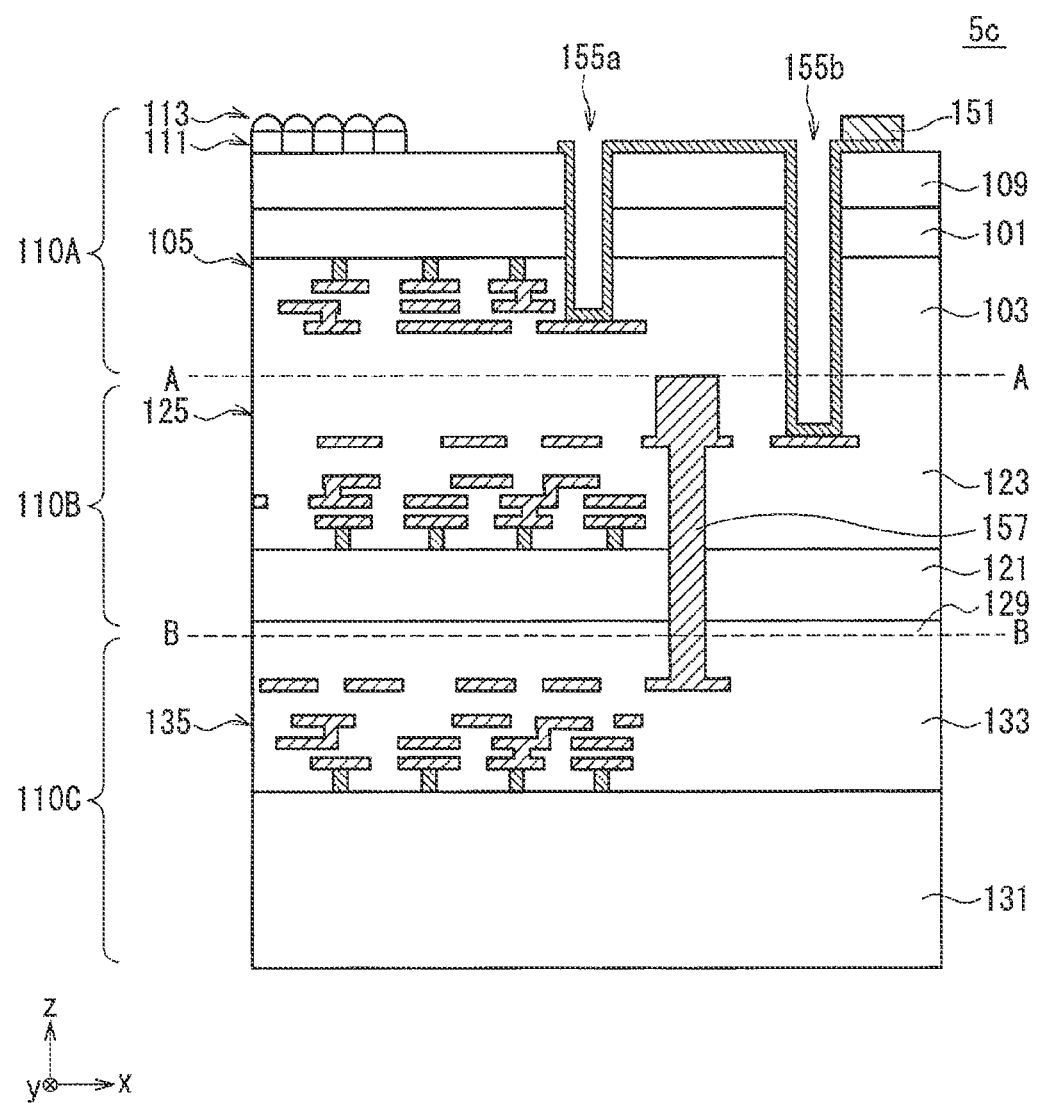

[FIG. 9D]
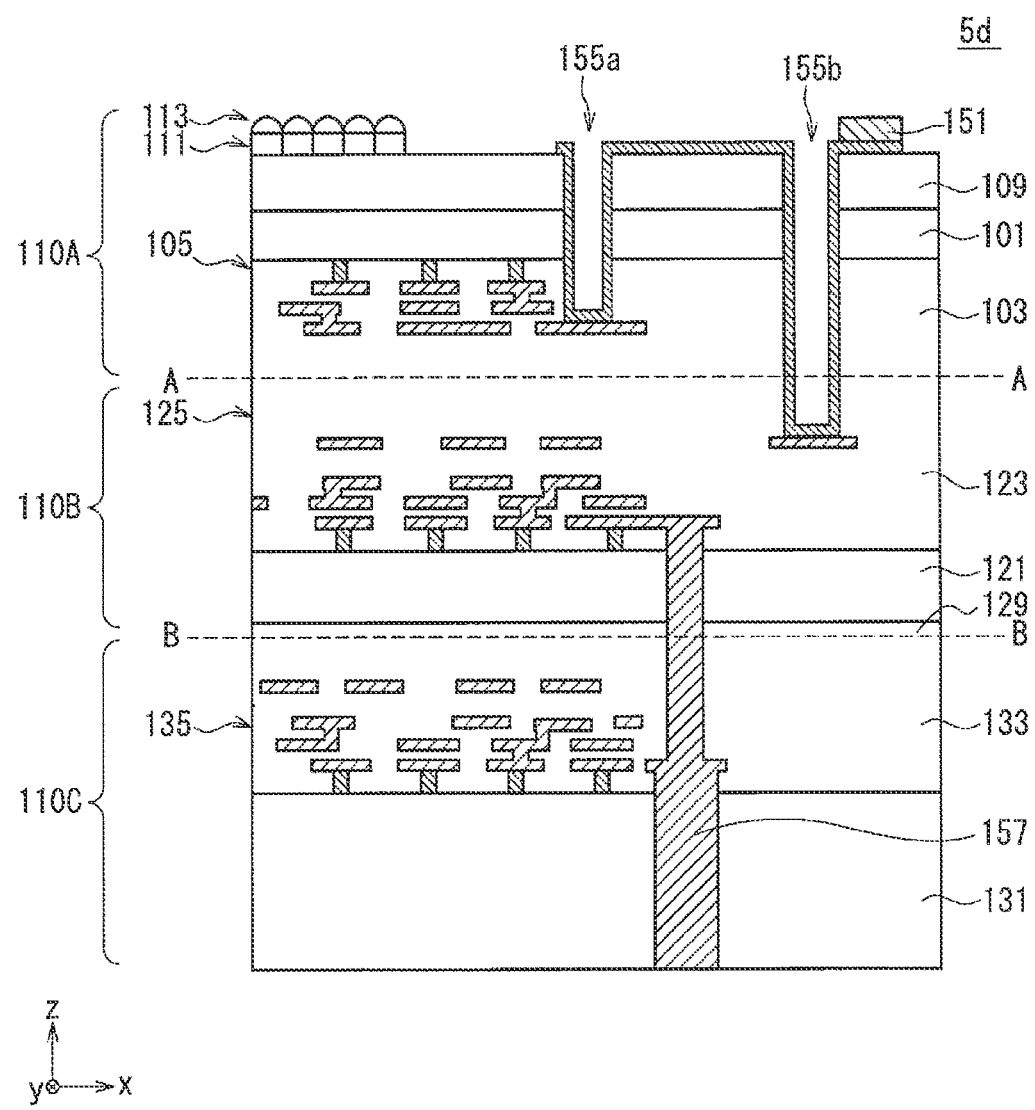

[FIG. 9E]
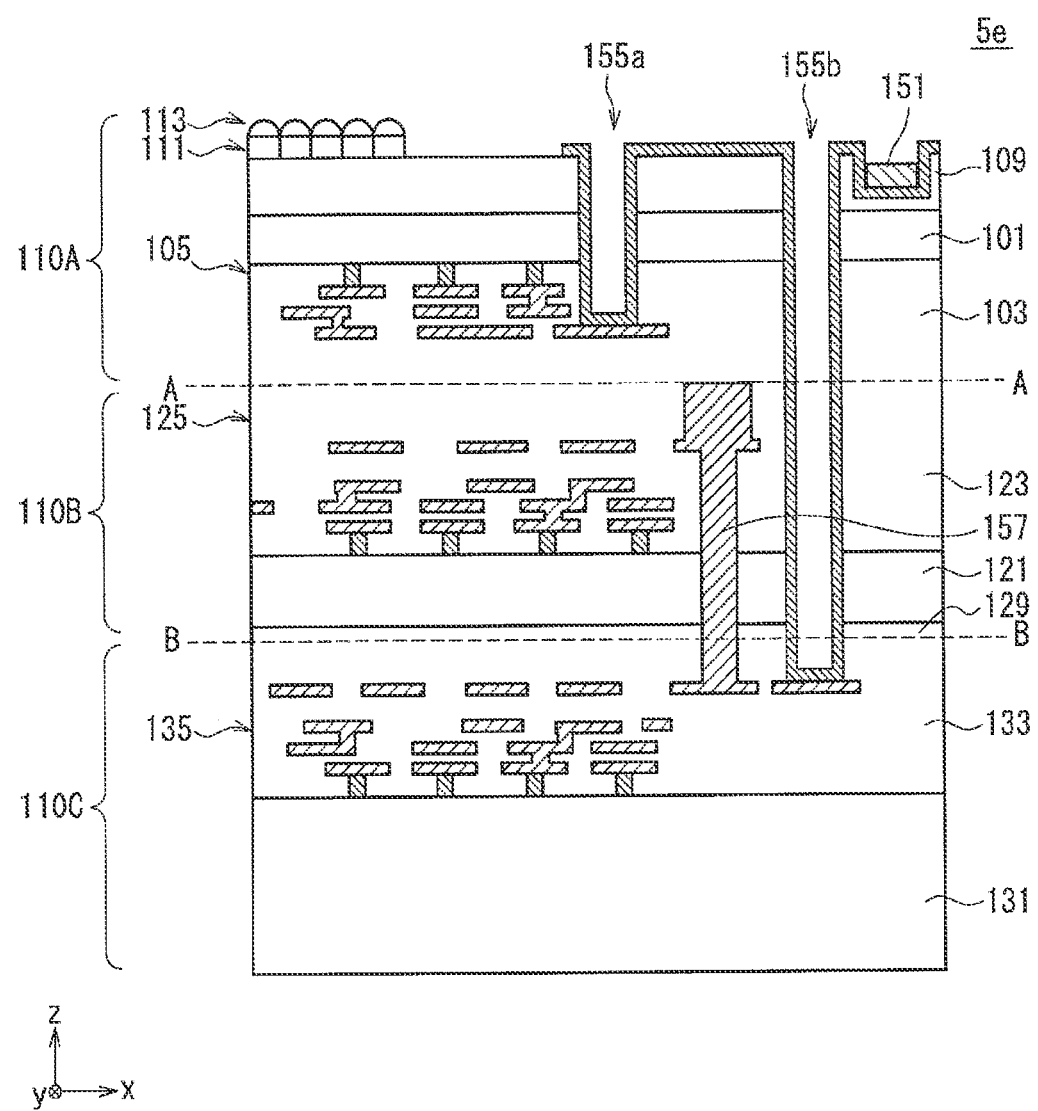

[FIG. 9F]
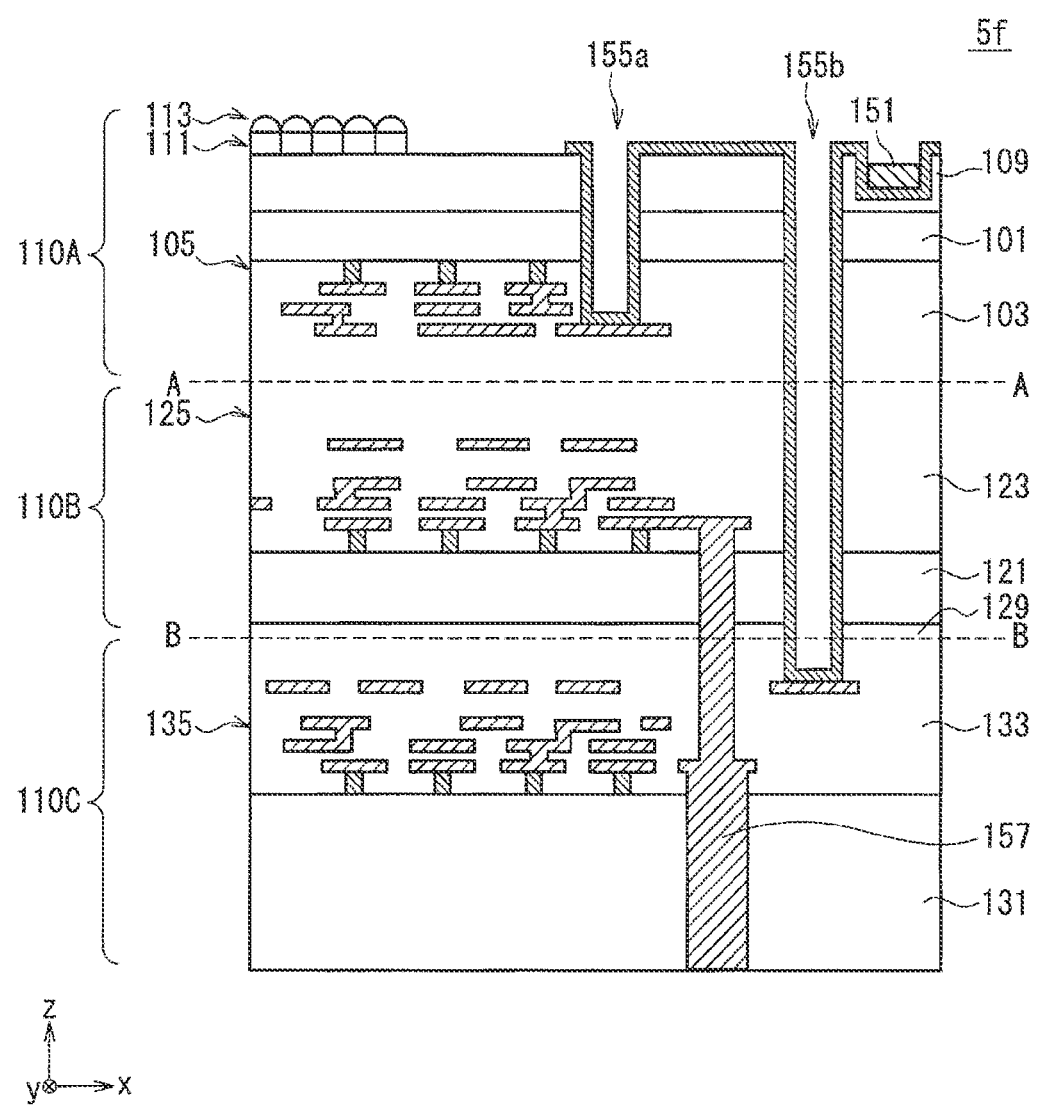

[FIG. 10A]
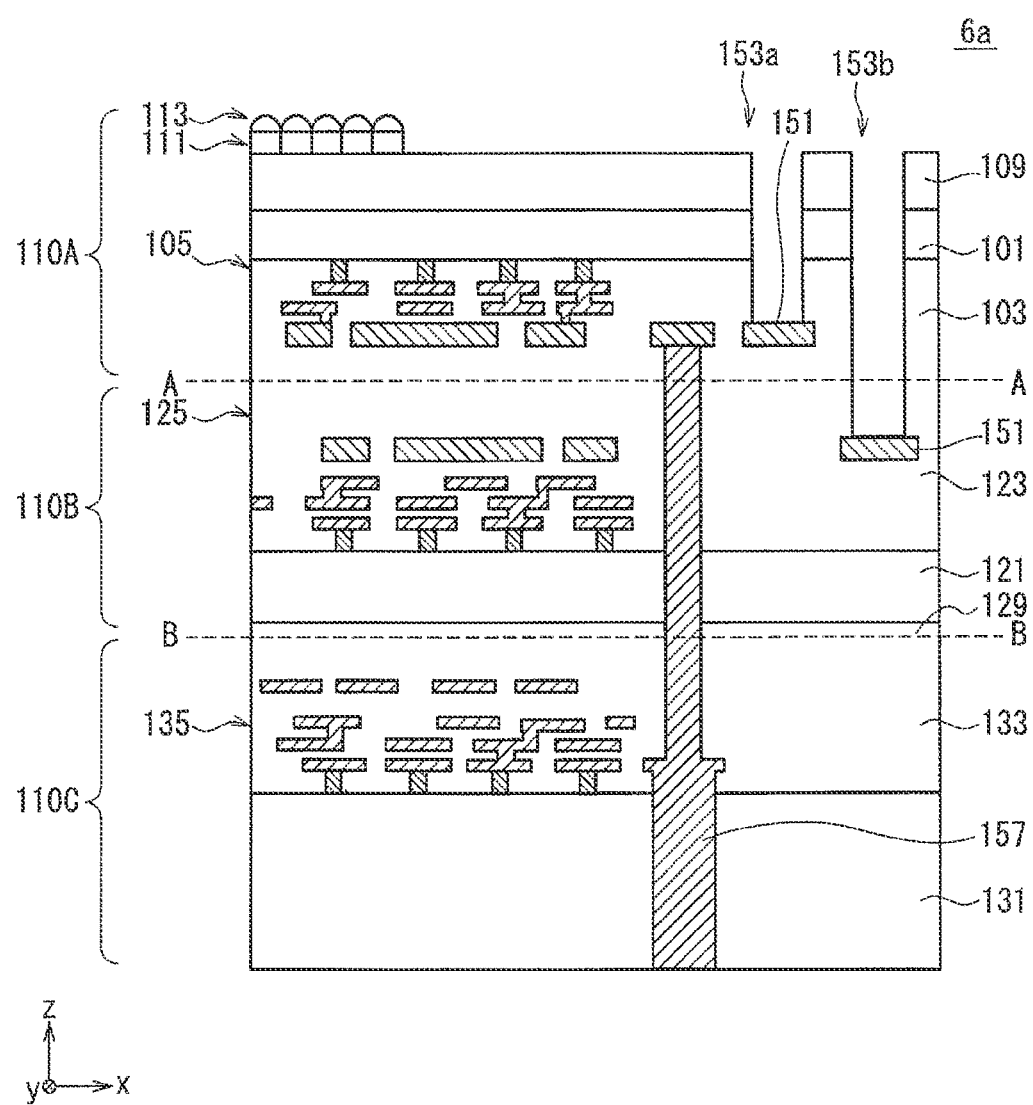

[FIG. 10B]
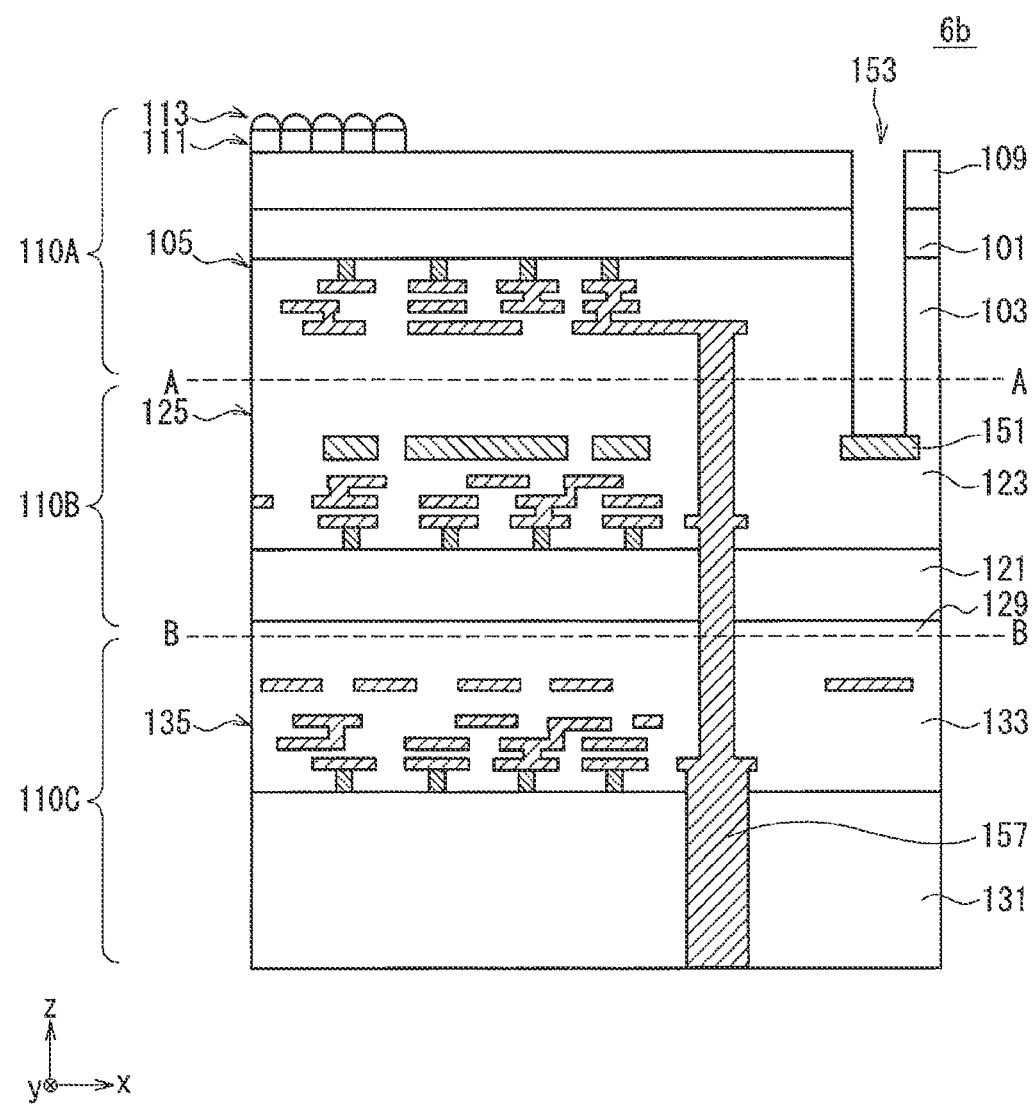

[FIG. 10C]
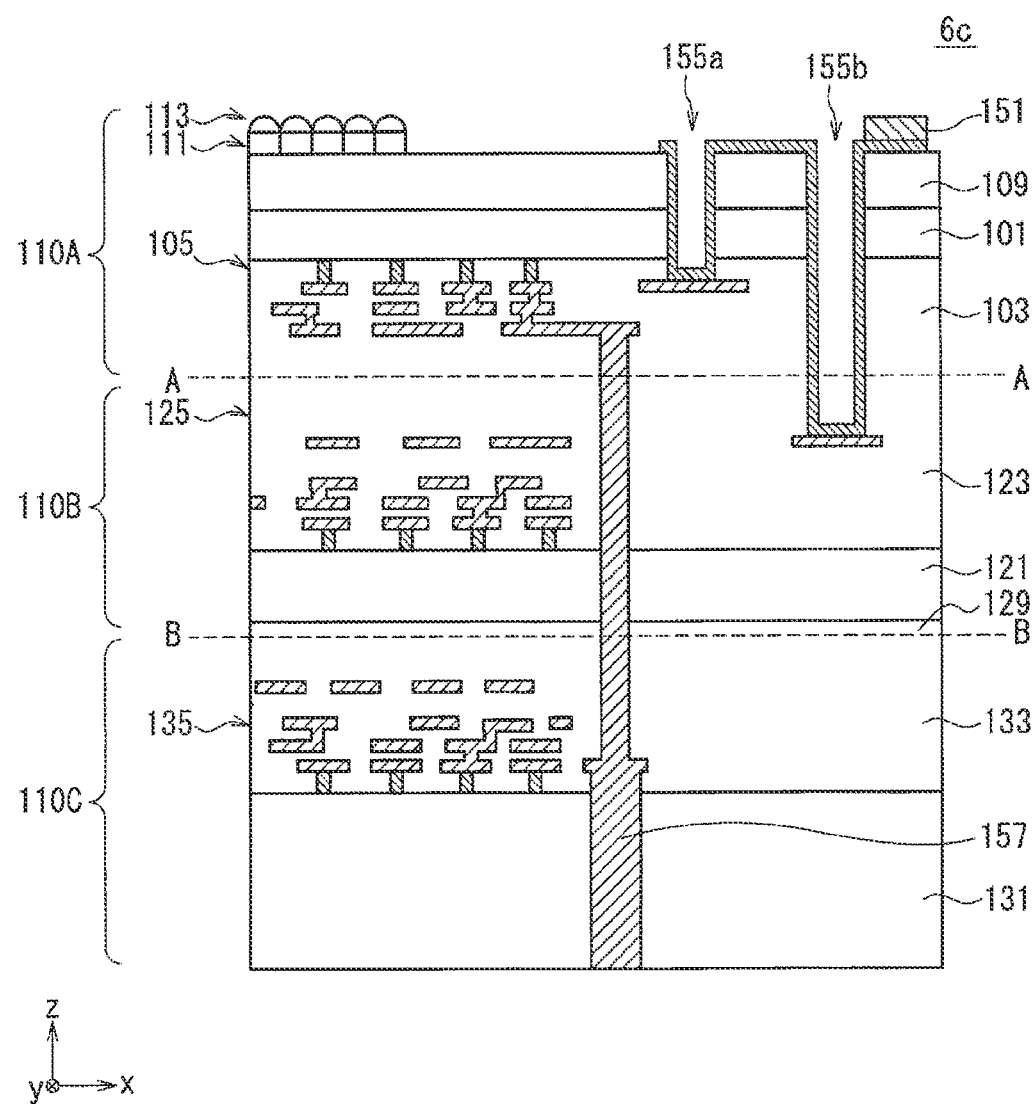

[FIG. 10D]
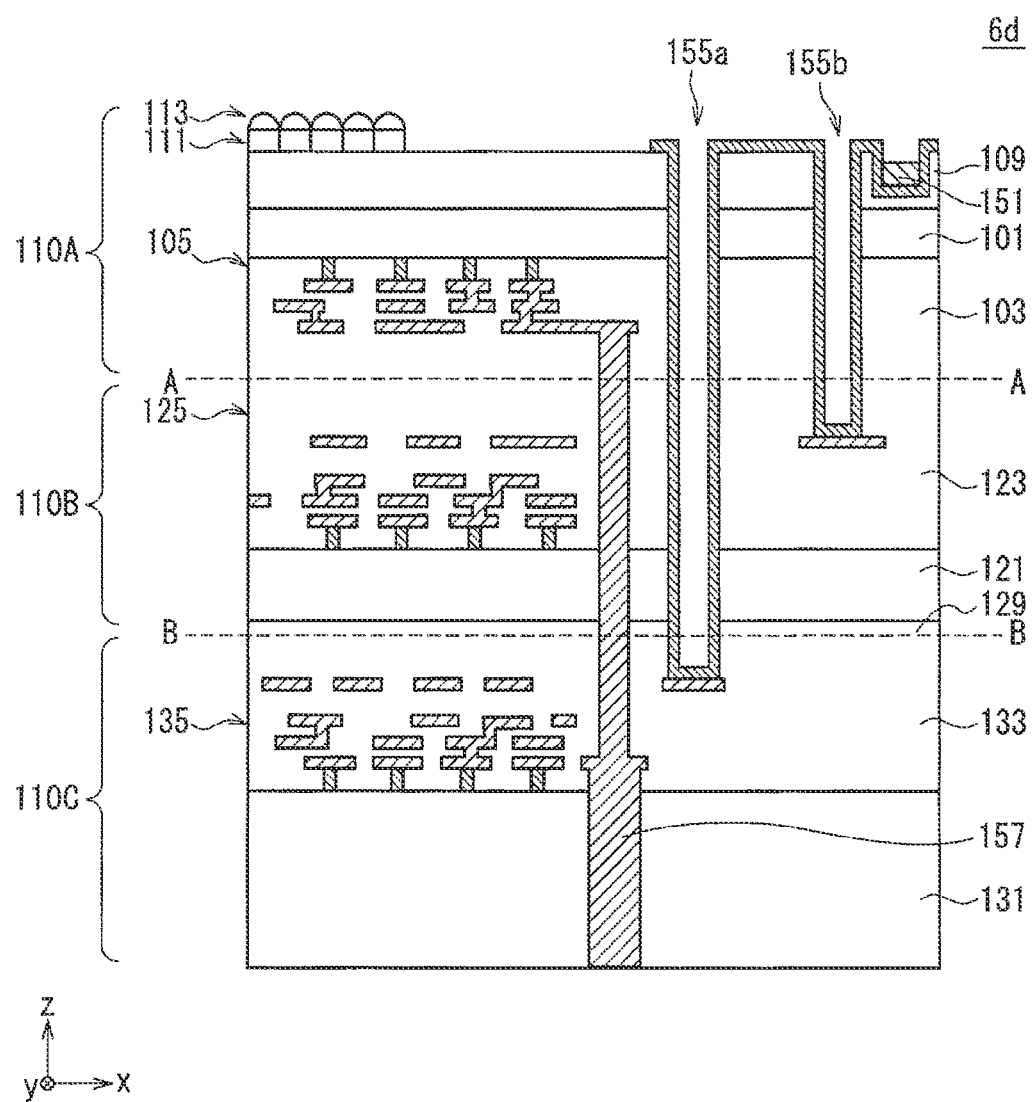

[FIG. 11A]
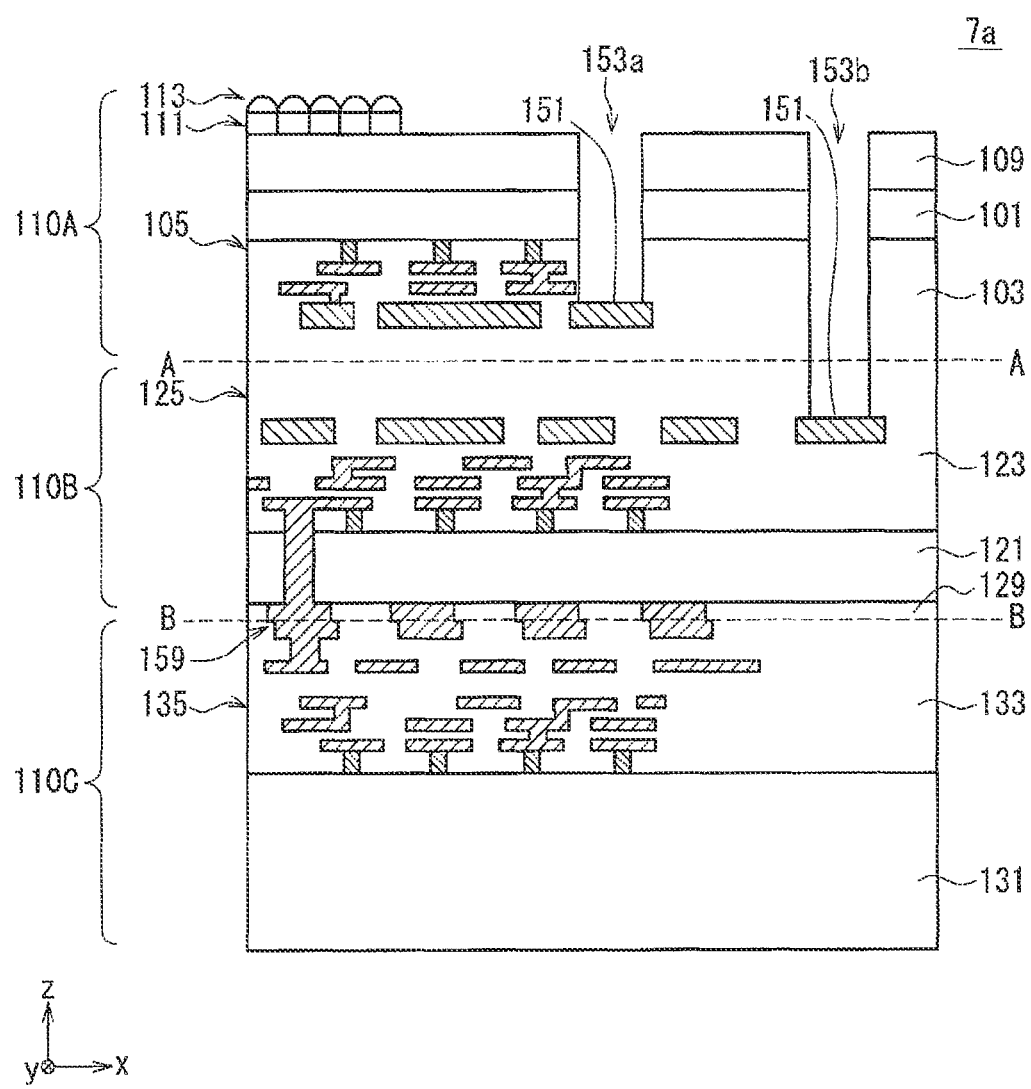

[FIG. 11B]
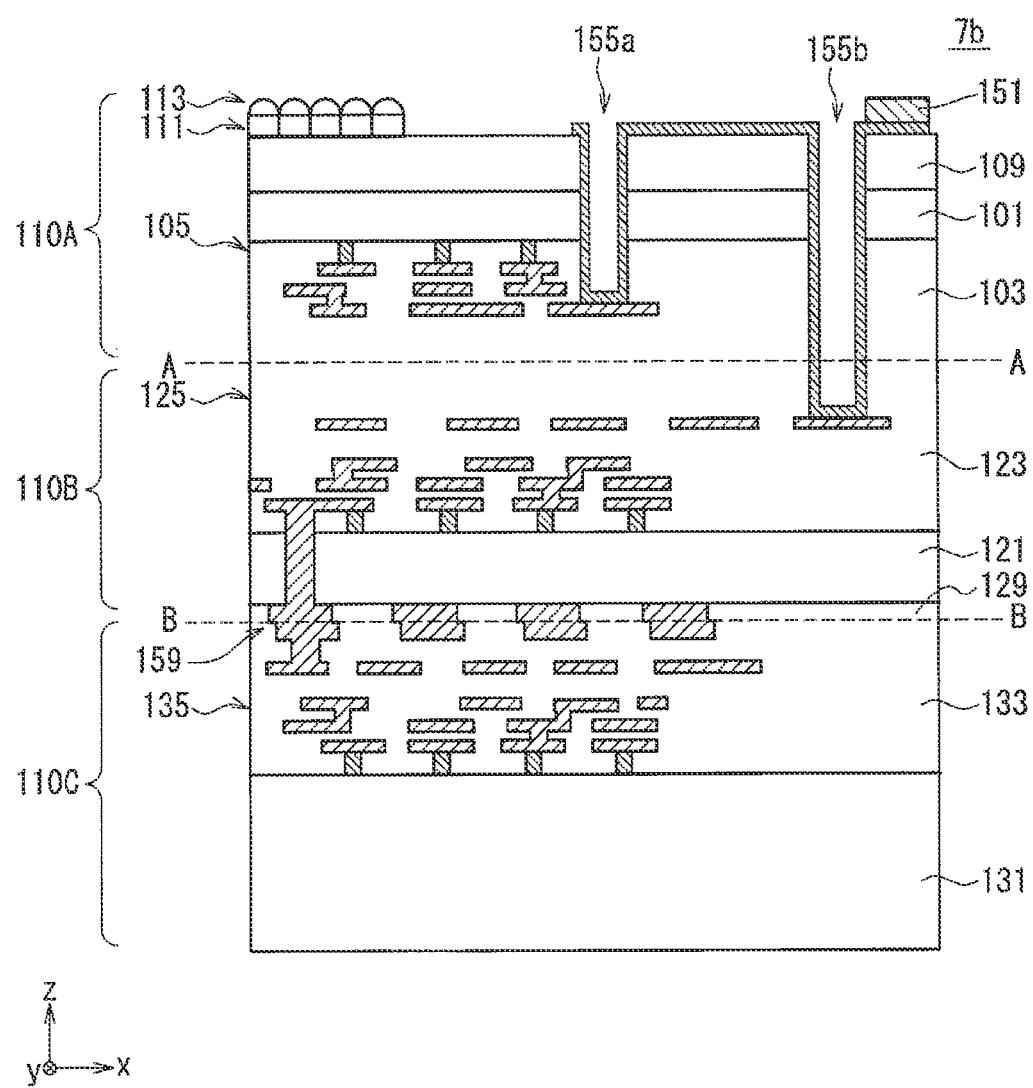

[FIG. 11C]
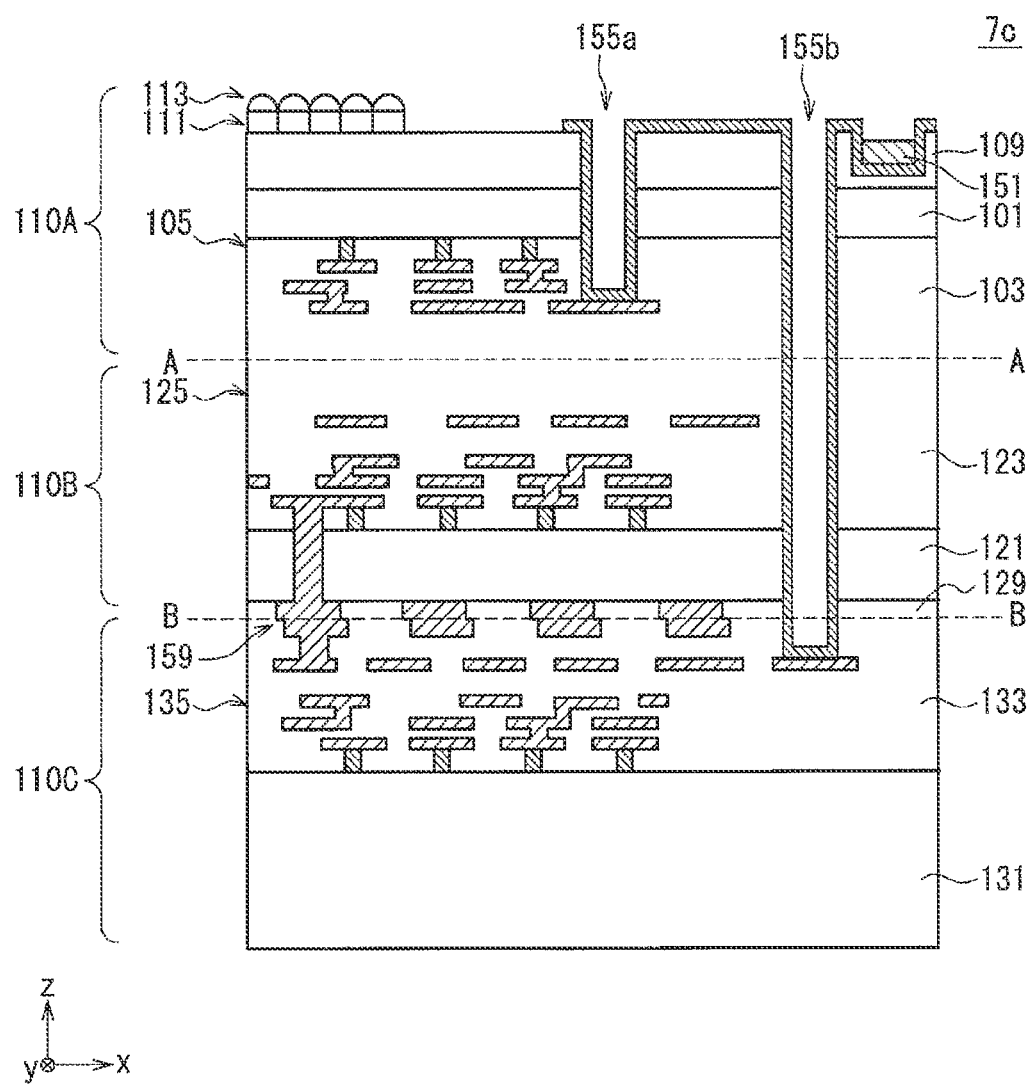

[FIG. 12A]
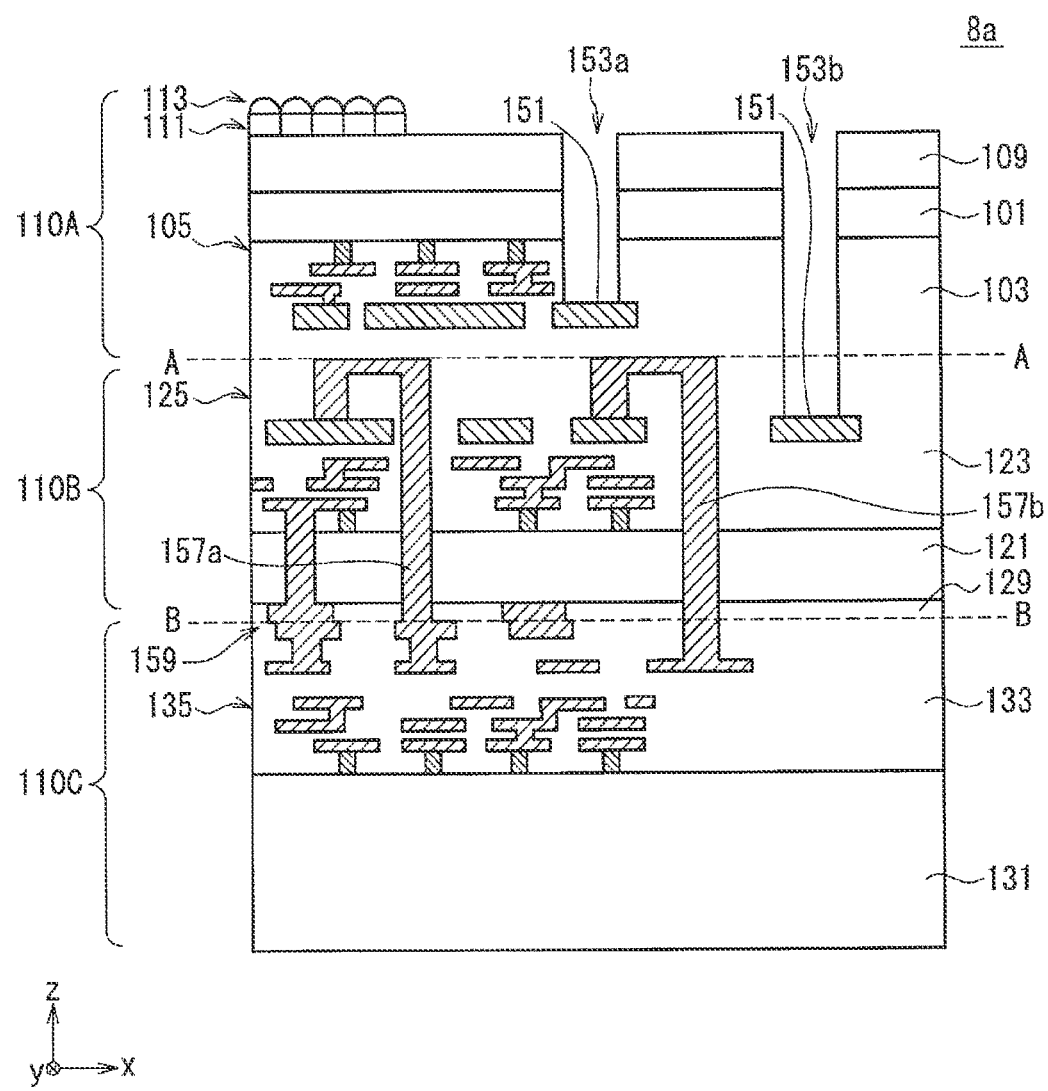

[FIG. 12B]
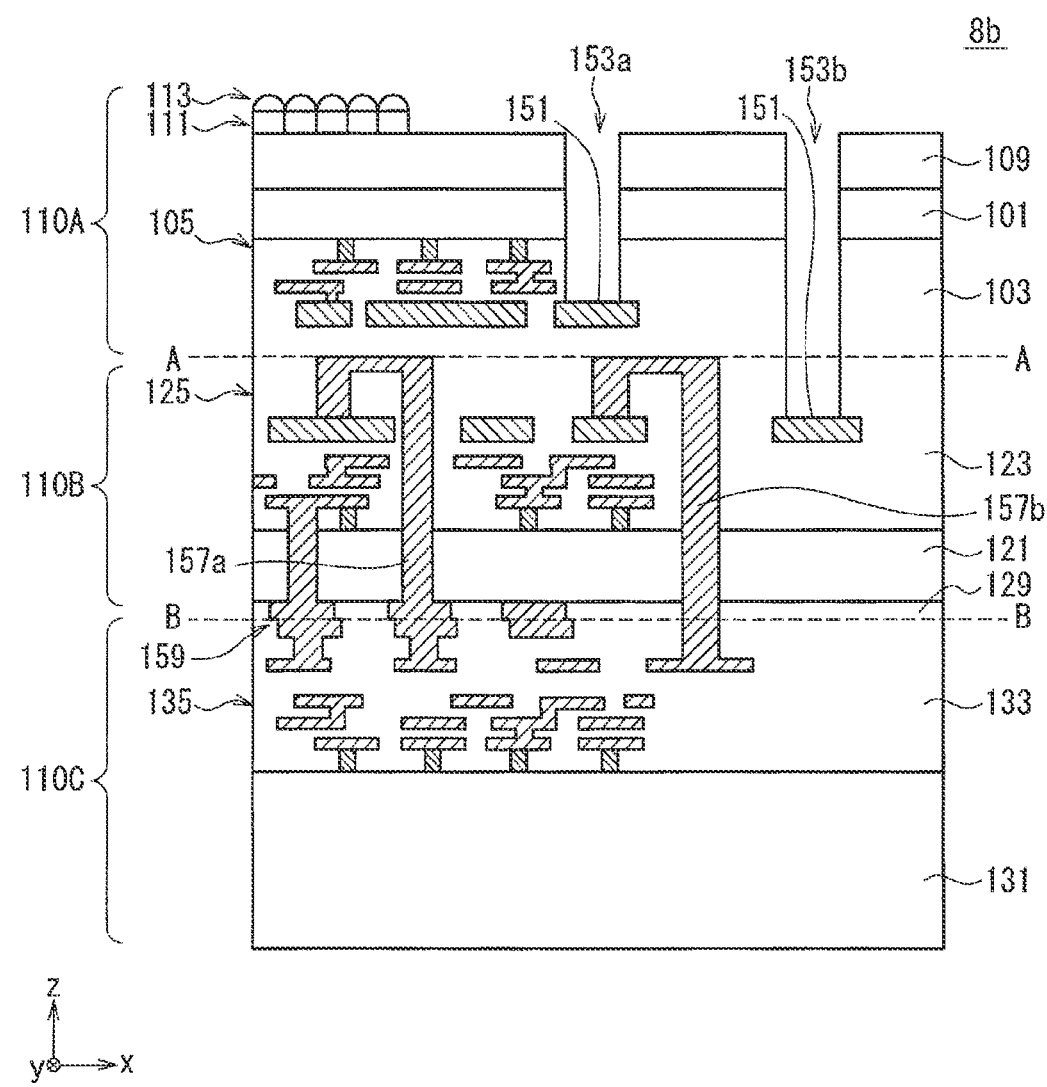

[FIG. 12C]
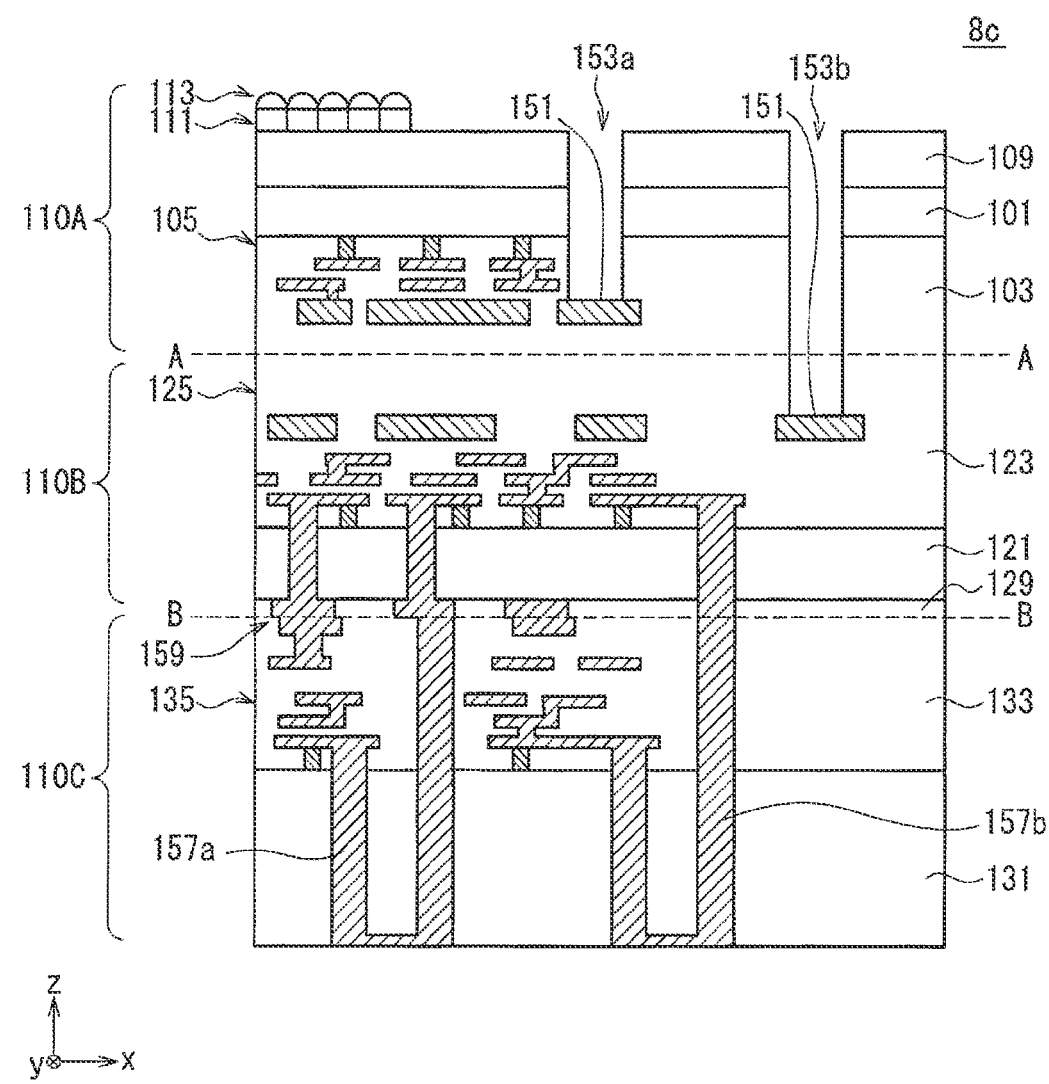

[FIG. 12D]
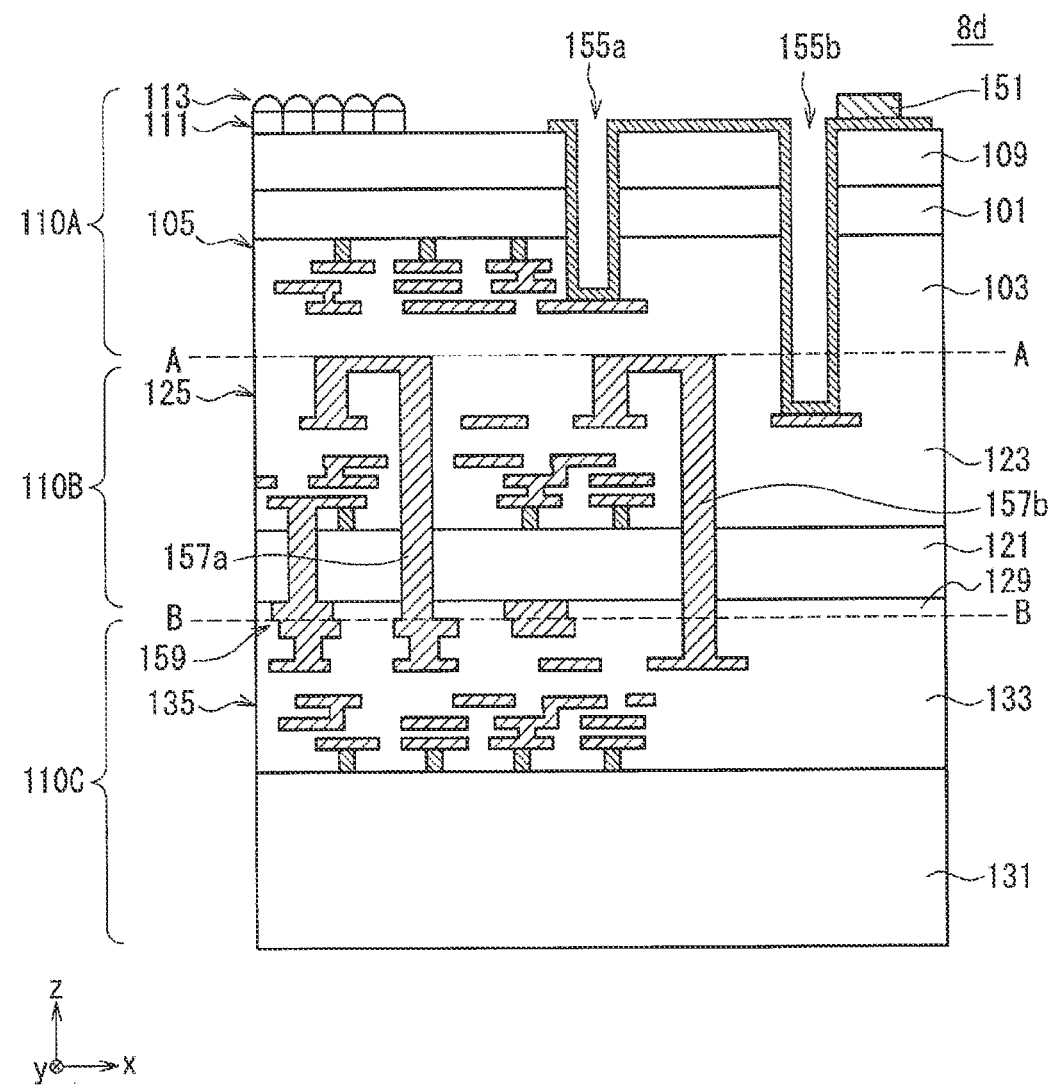

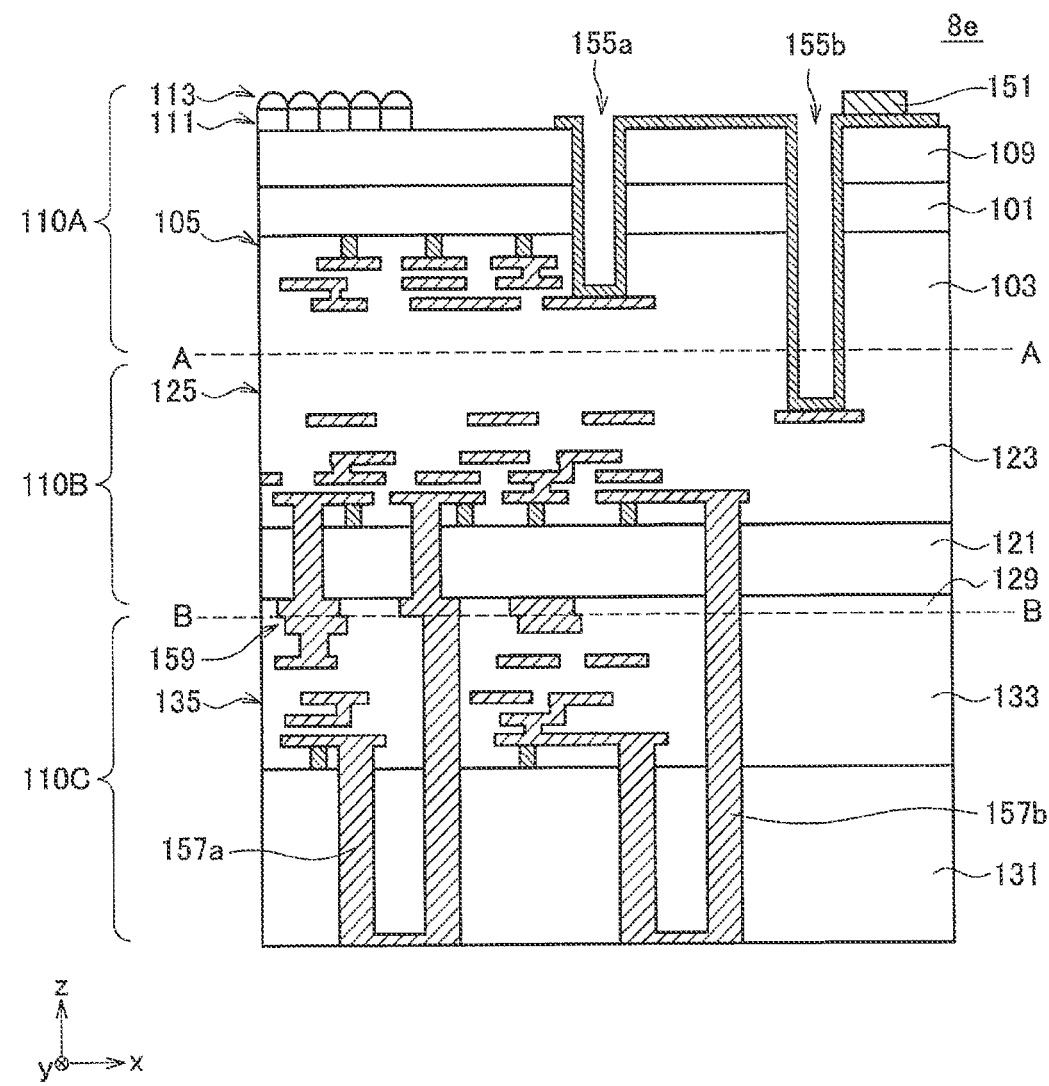
[FIG. 12E]

[FIG. 12F]
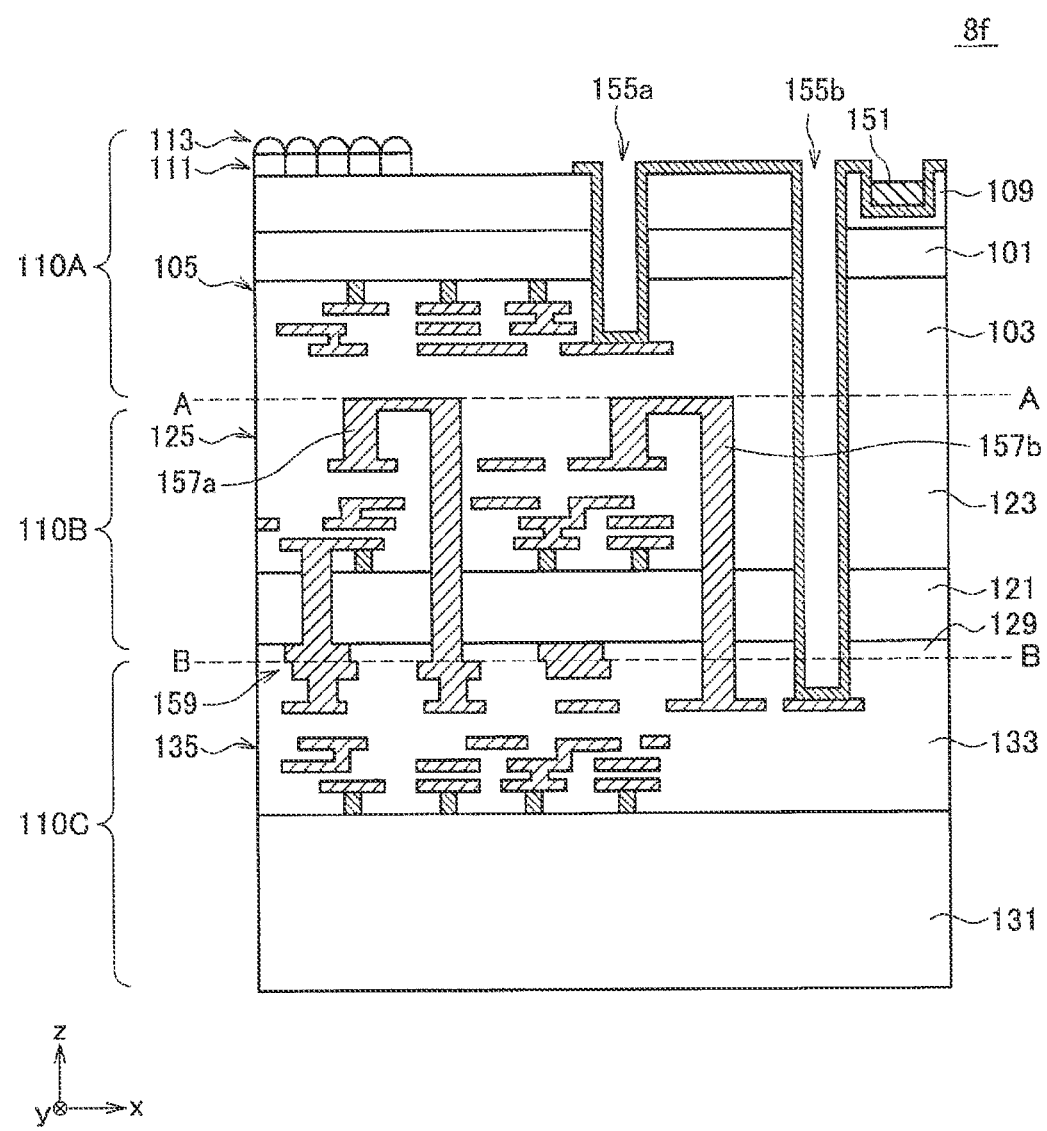

[FIG. 12G]
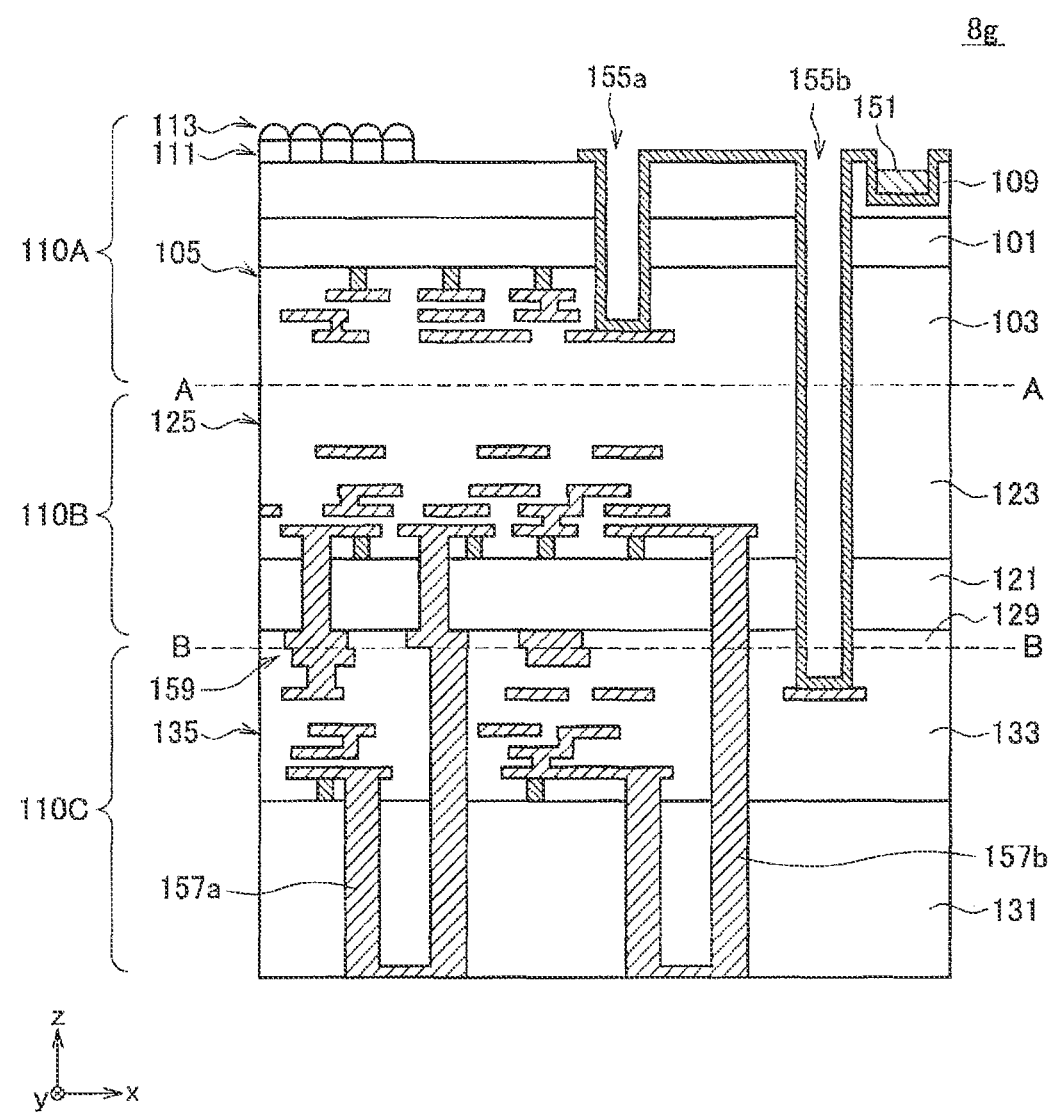

[FIG. 13A]
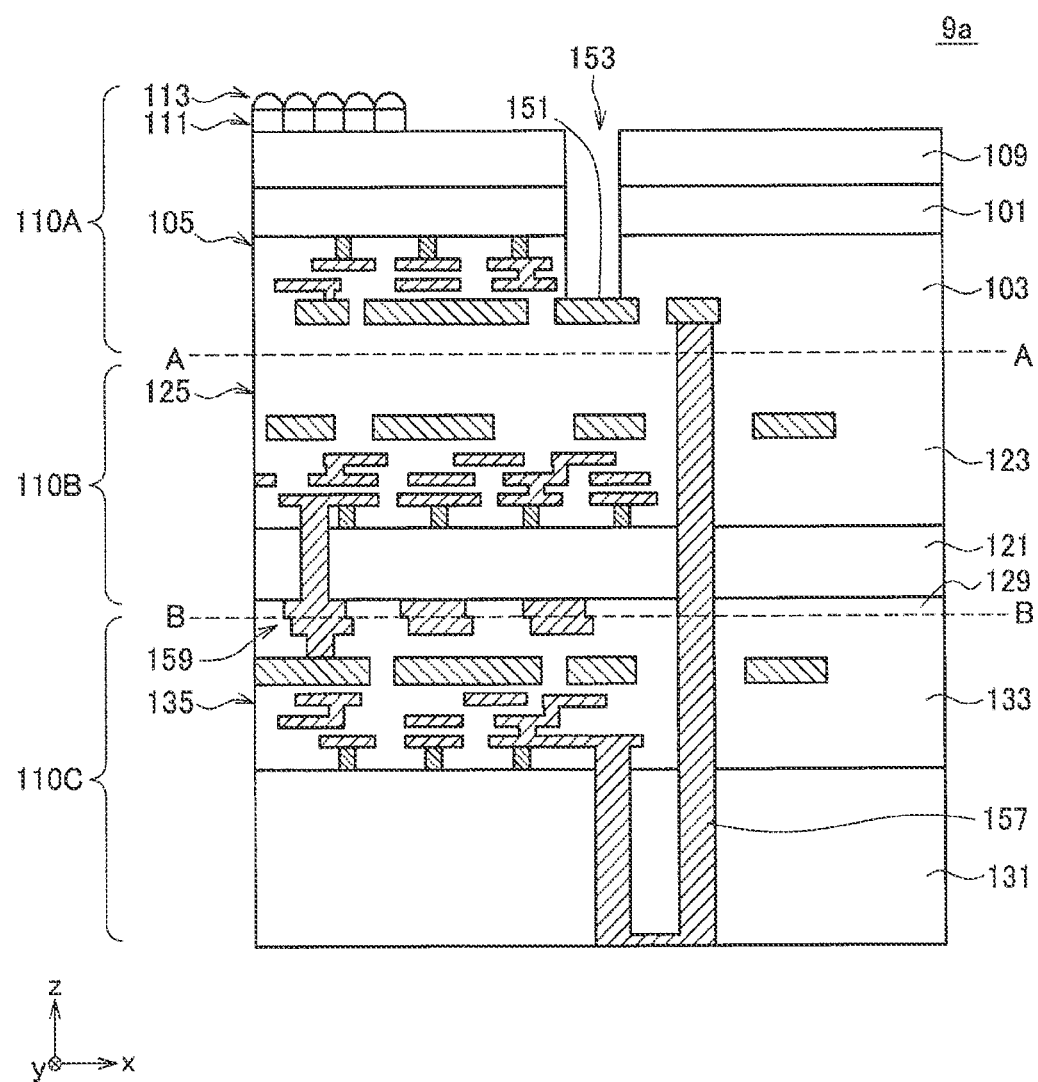

[ FIG. 13B ]
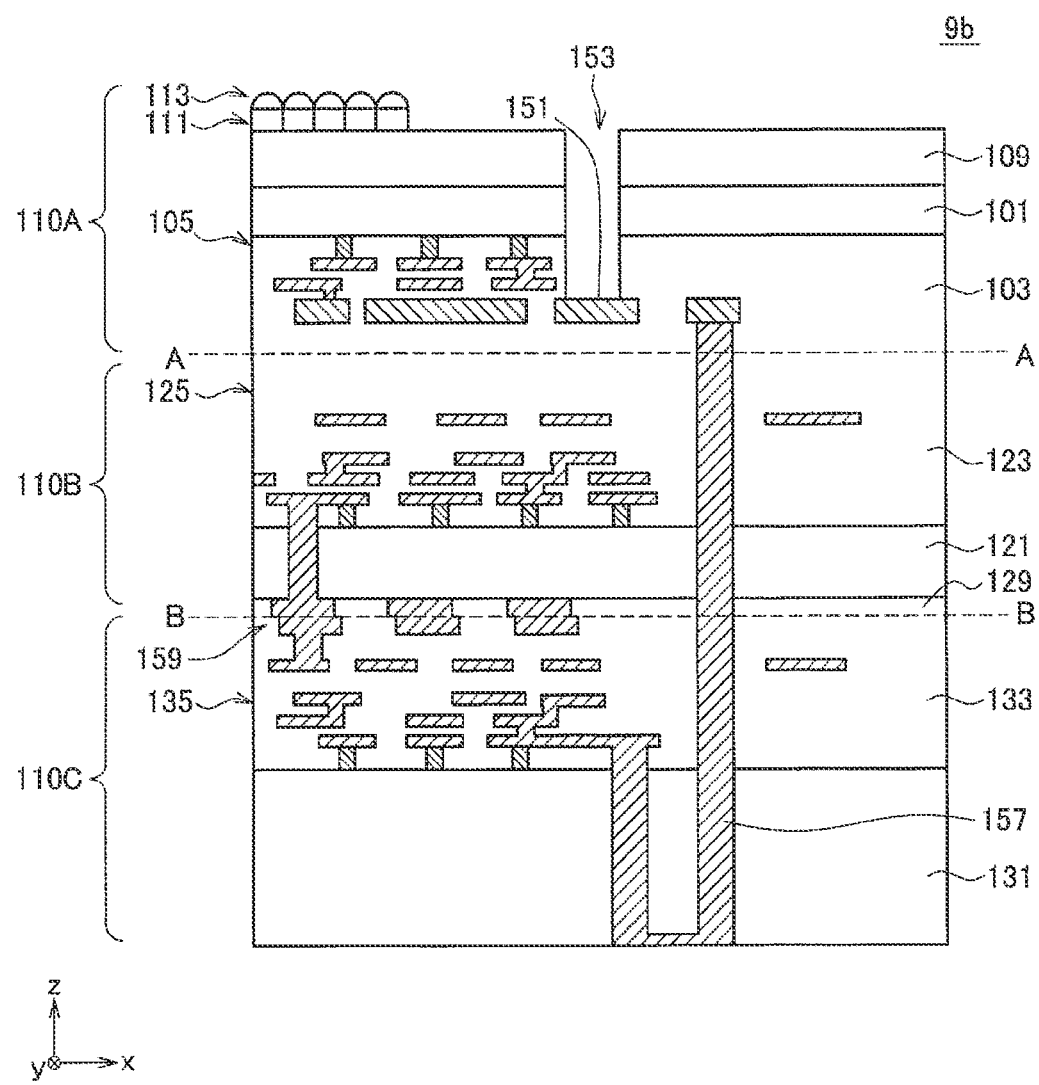

[FIG. 13C]
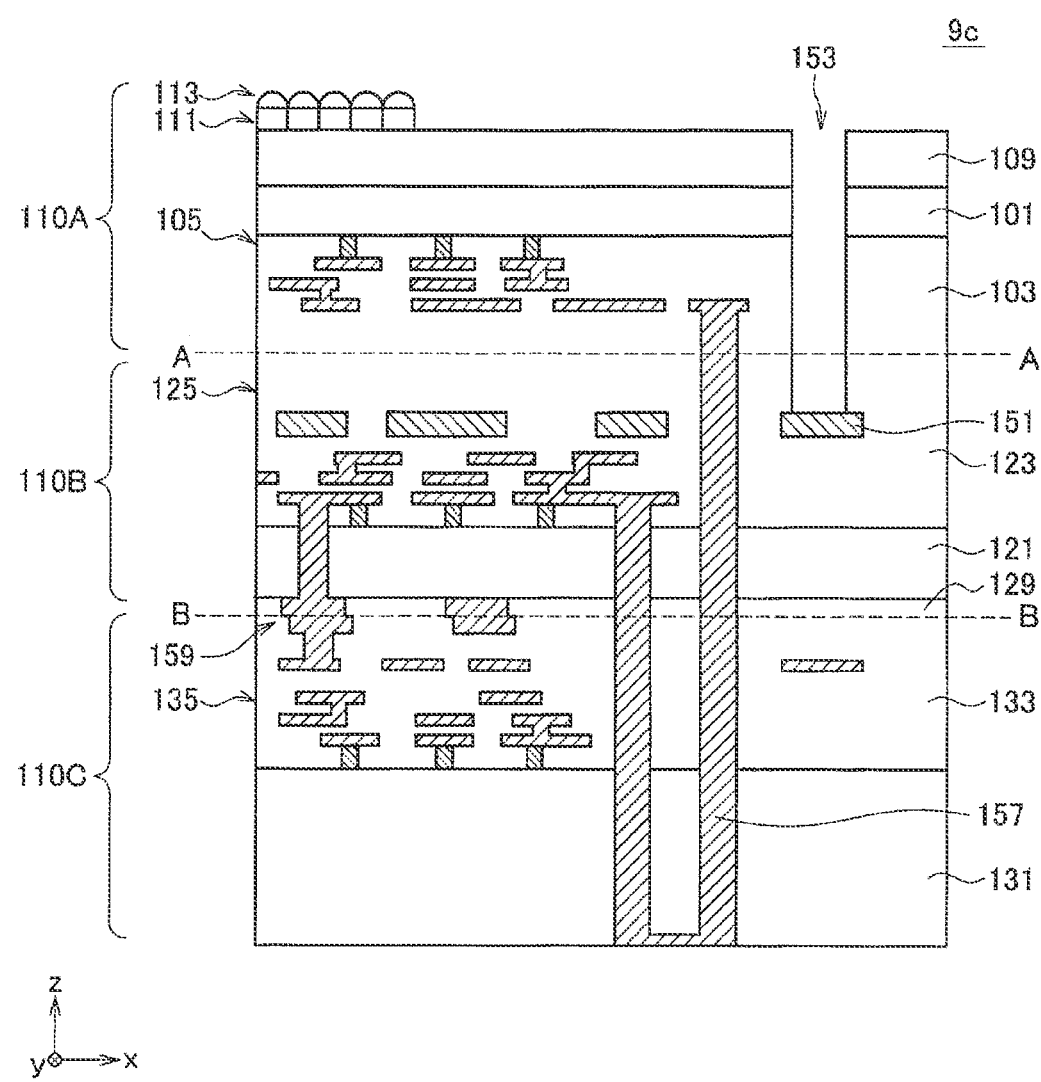

[FIG. 13D]
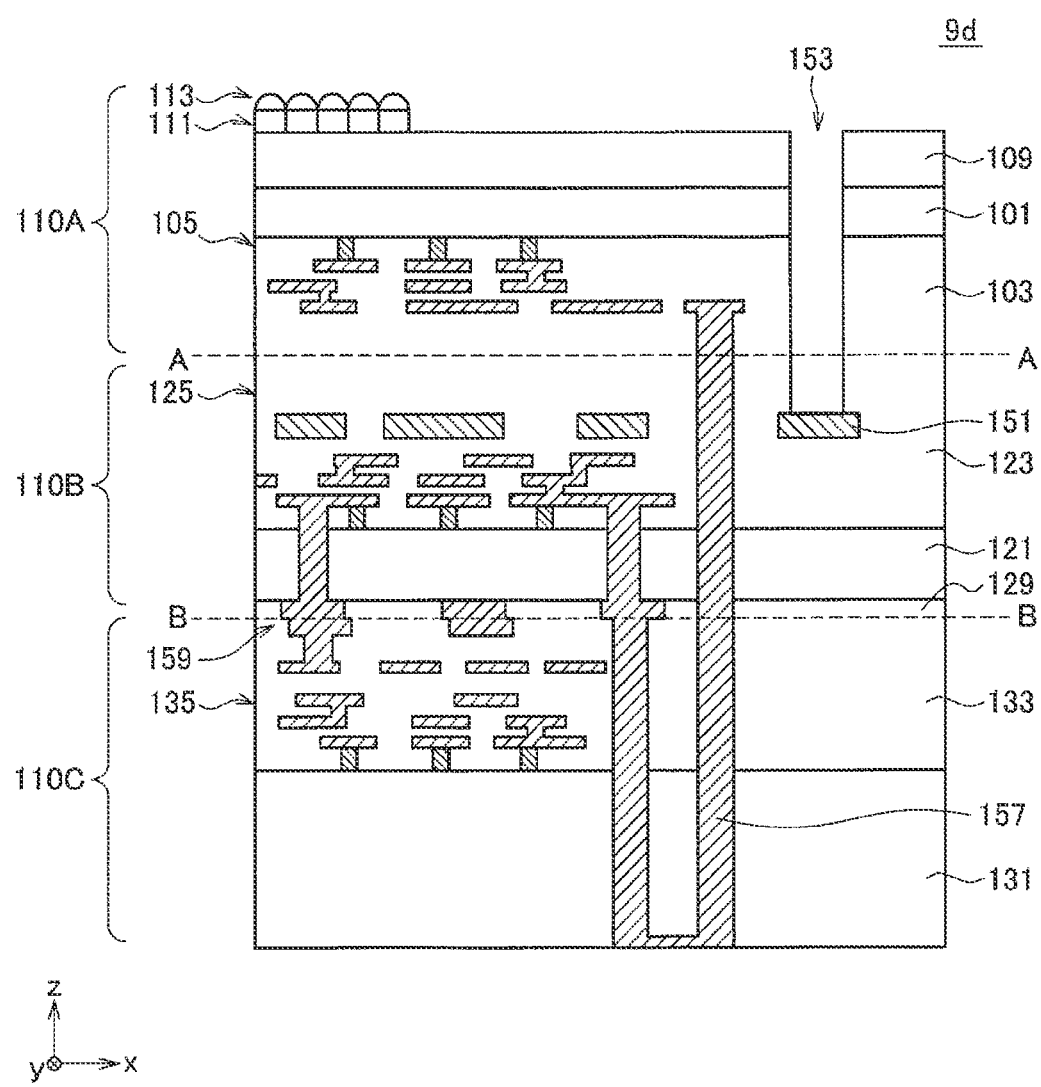

[FIG. 13E]
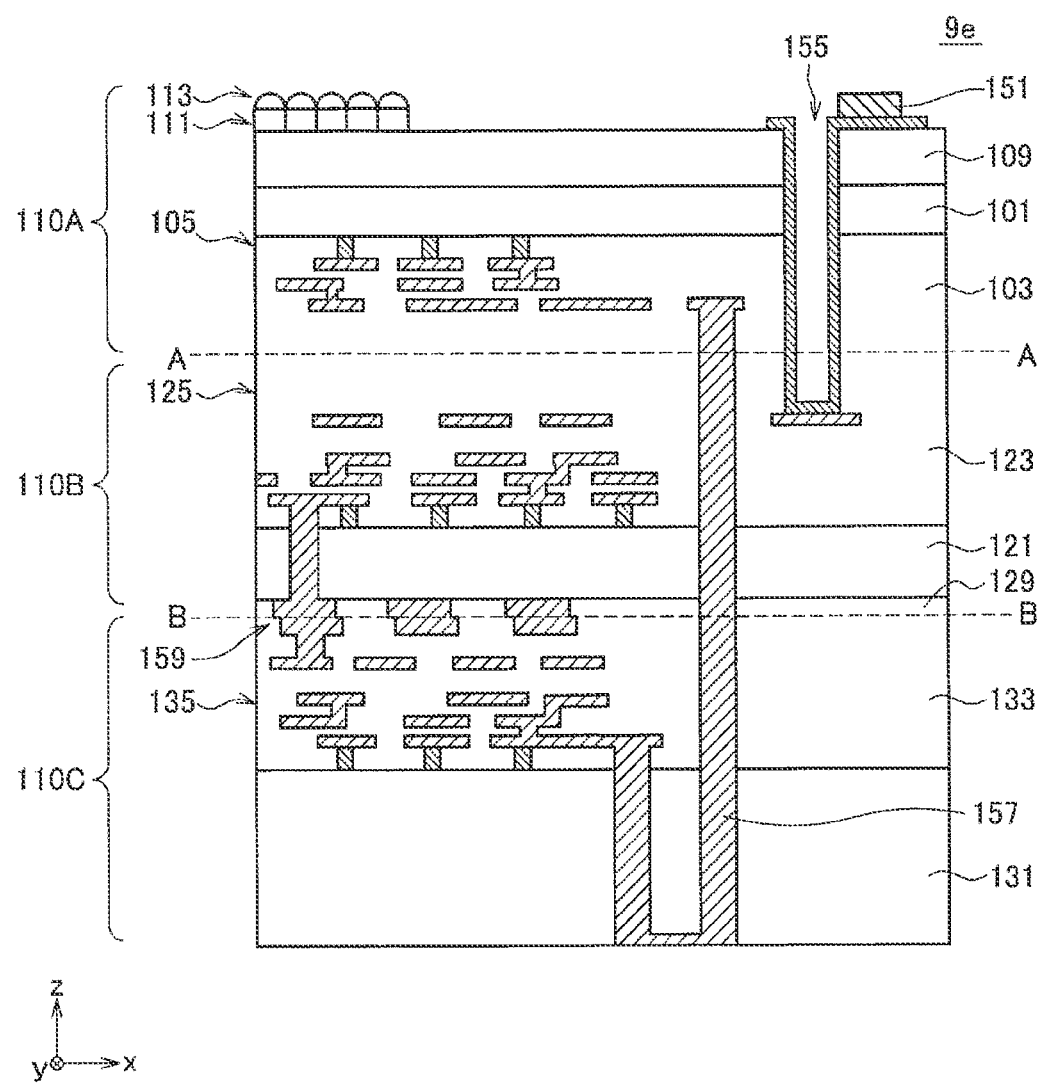

[FIG. 13F]
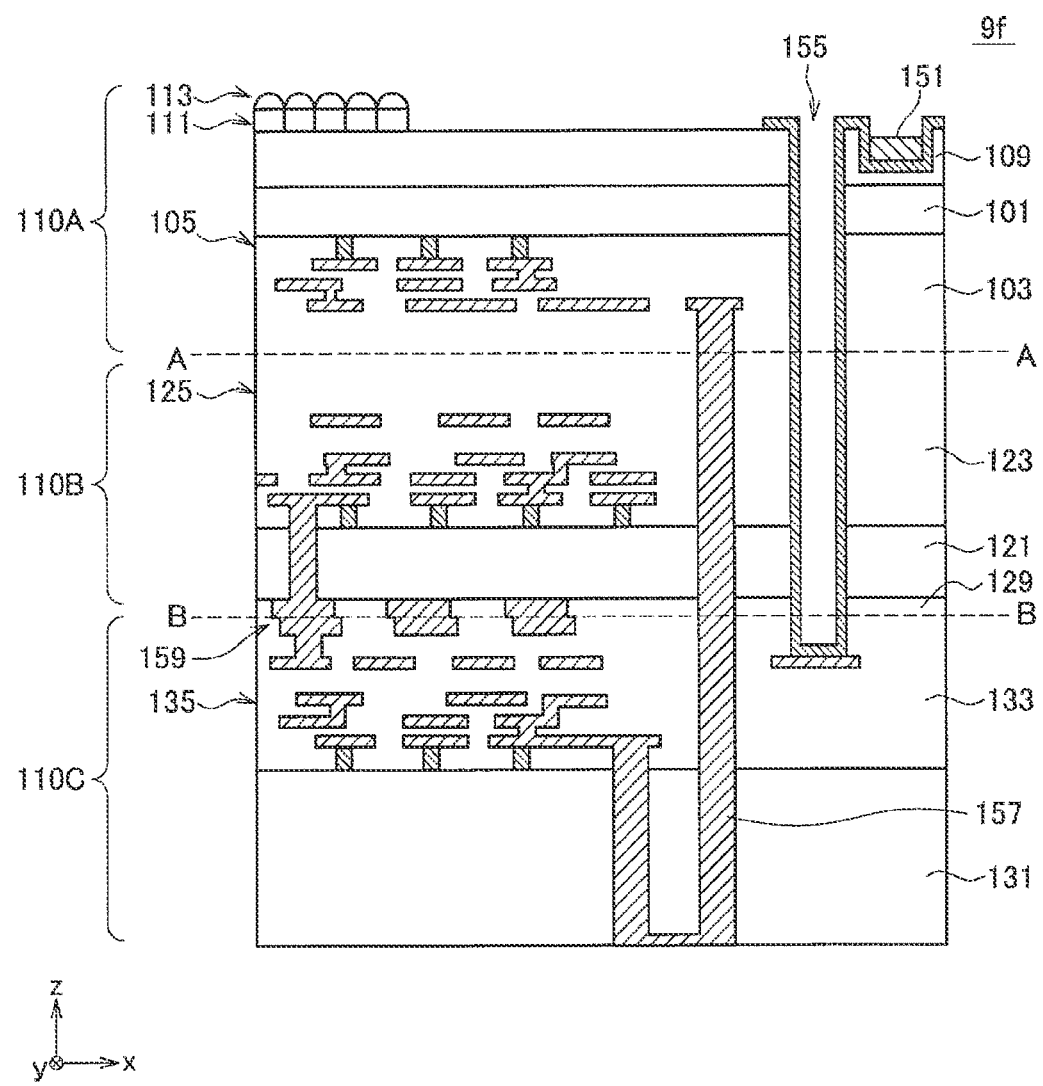

[FIG. 14A]
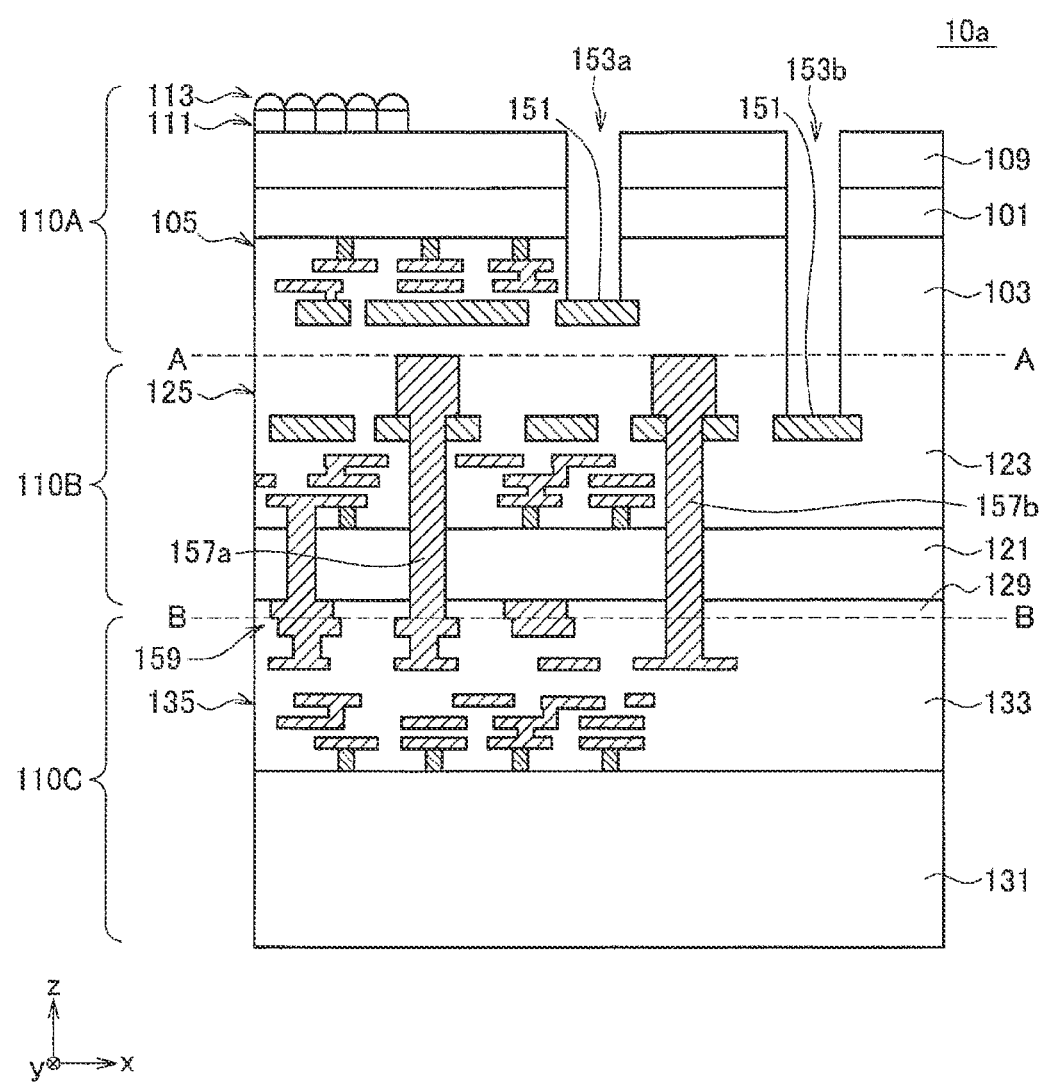

[FIG. 14B]
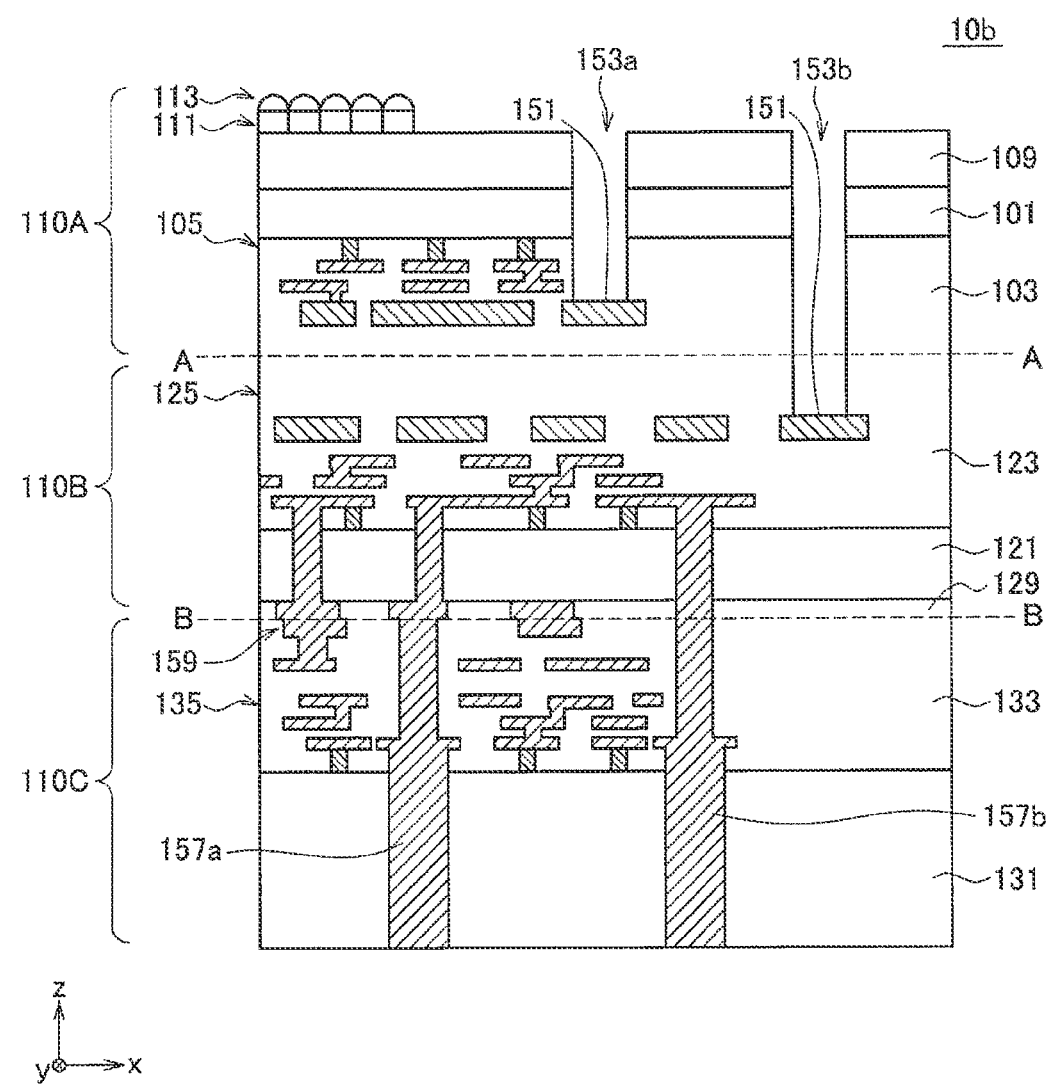

[FIG. 14C]
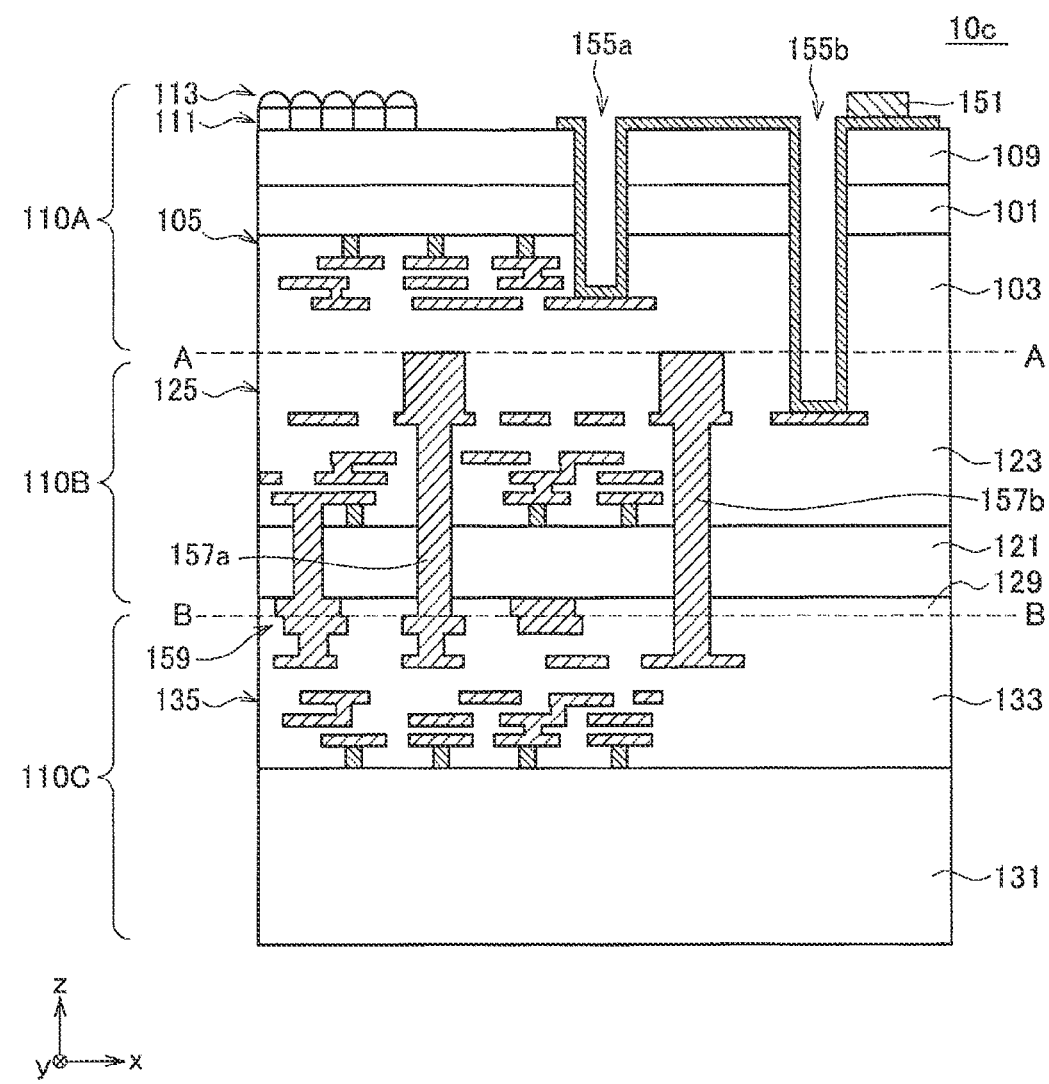

[FIG. 14D]
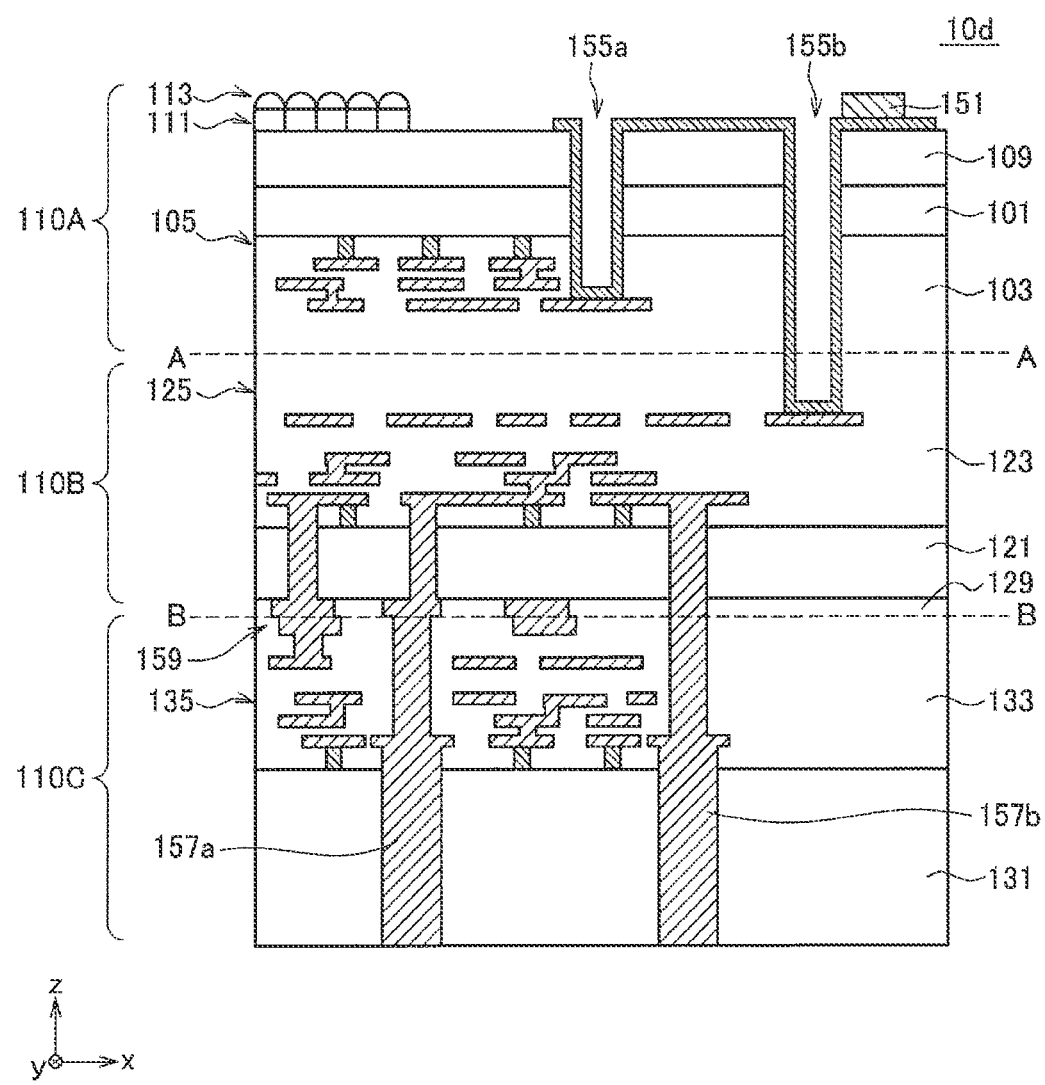

[FIG. 14E]
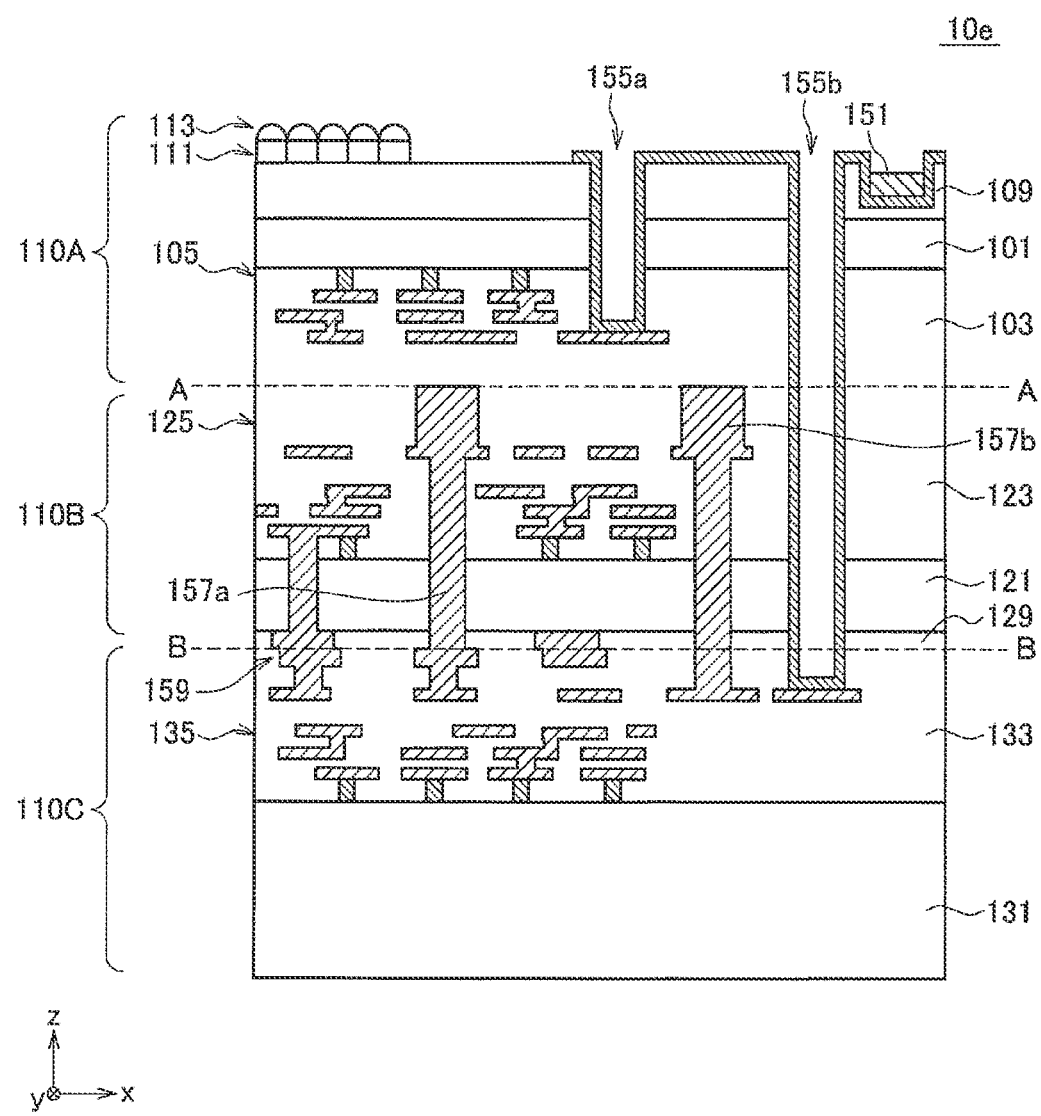

[FIG. 14F]
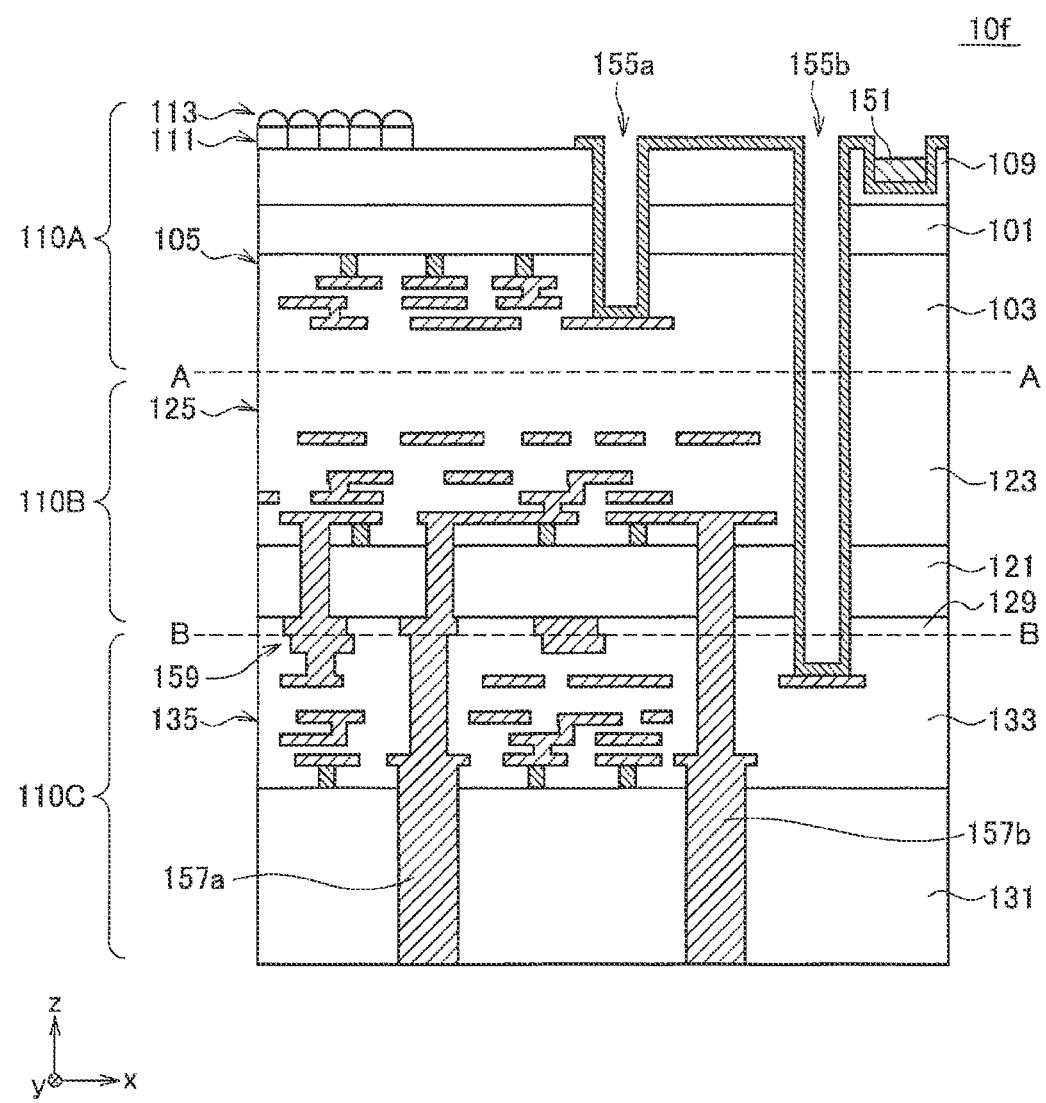

[FIG. 15A]
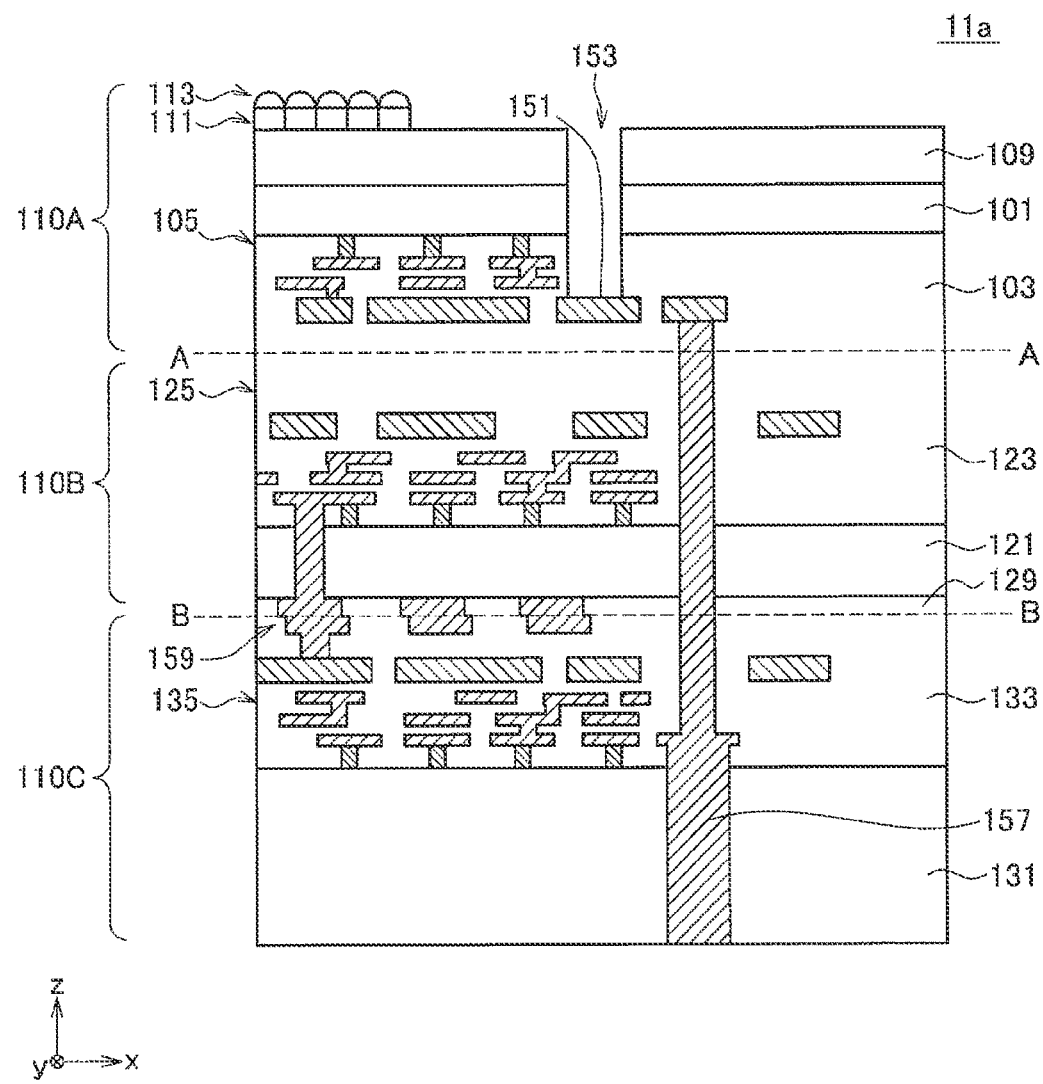

[FIG. 15B]
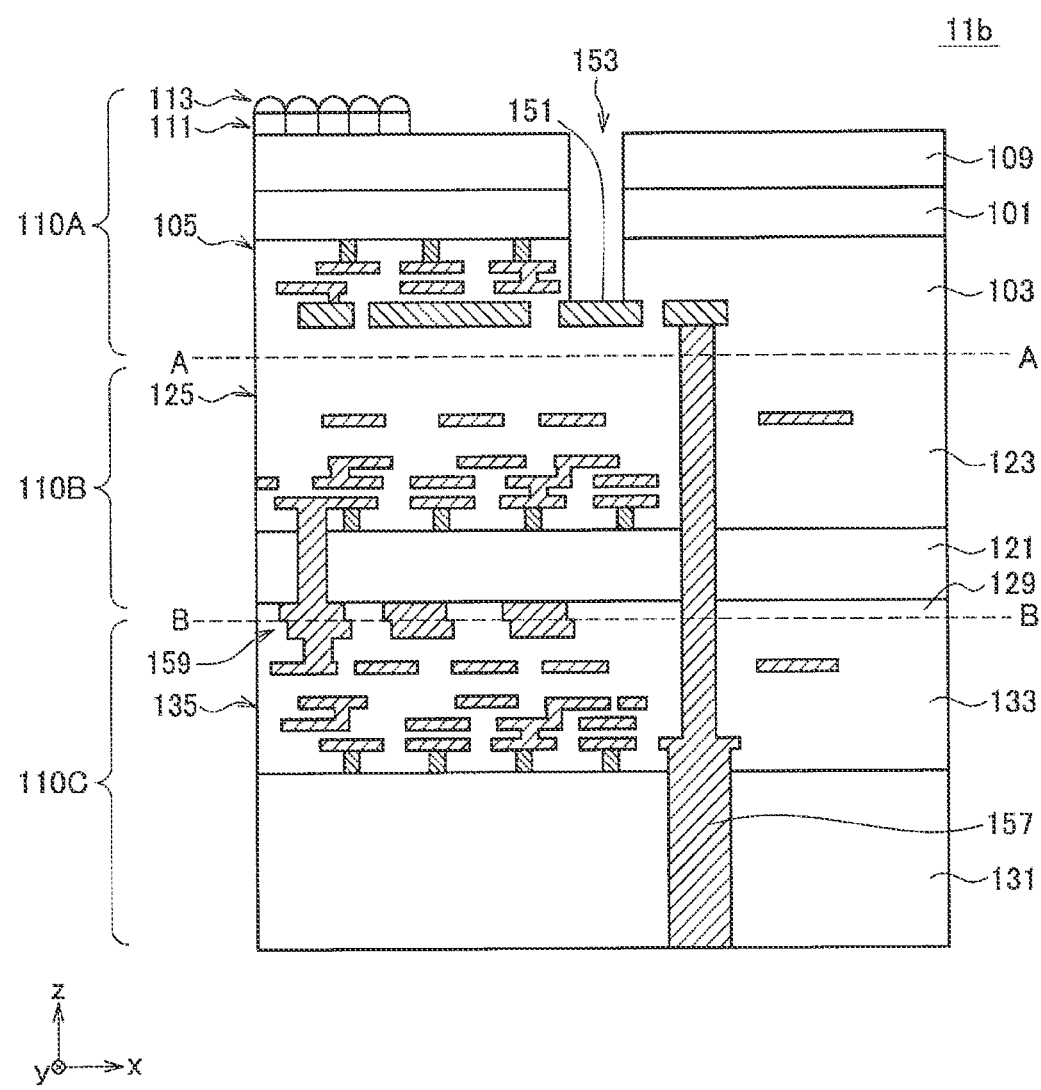

[FIG. 15C]
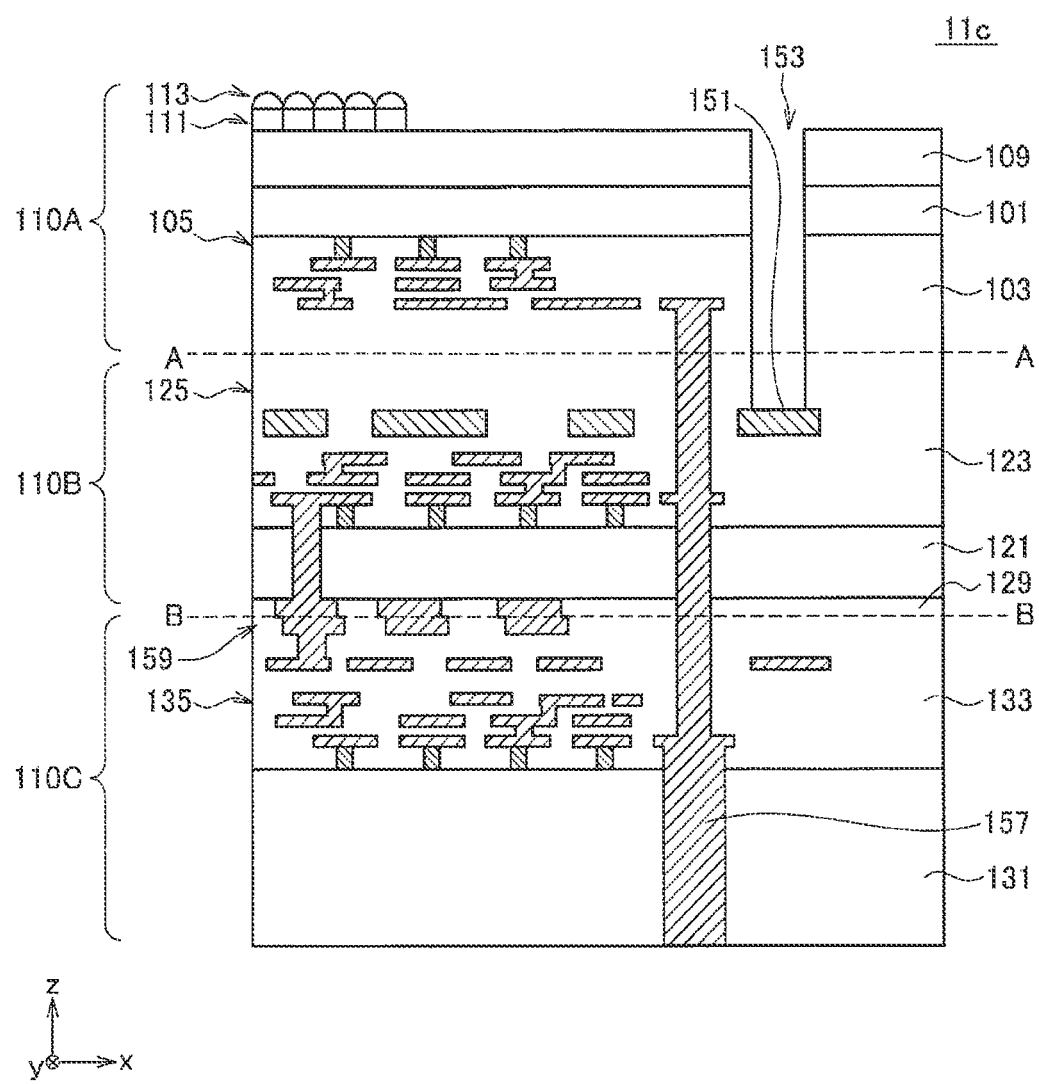

[FIG. 15D]
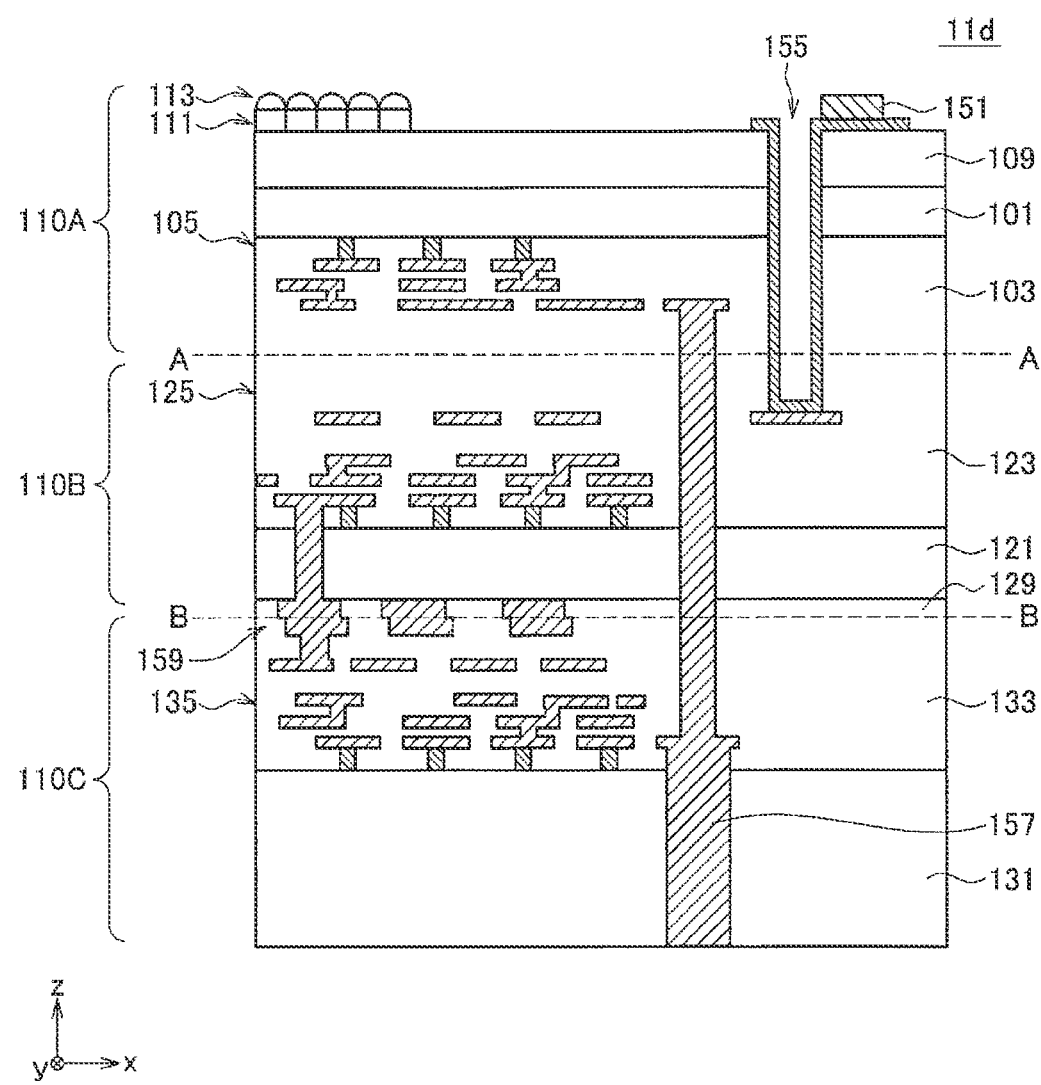

[FIG. 15E]
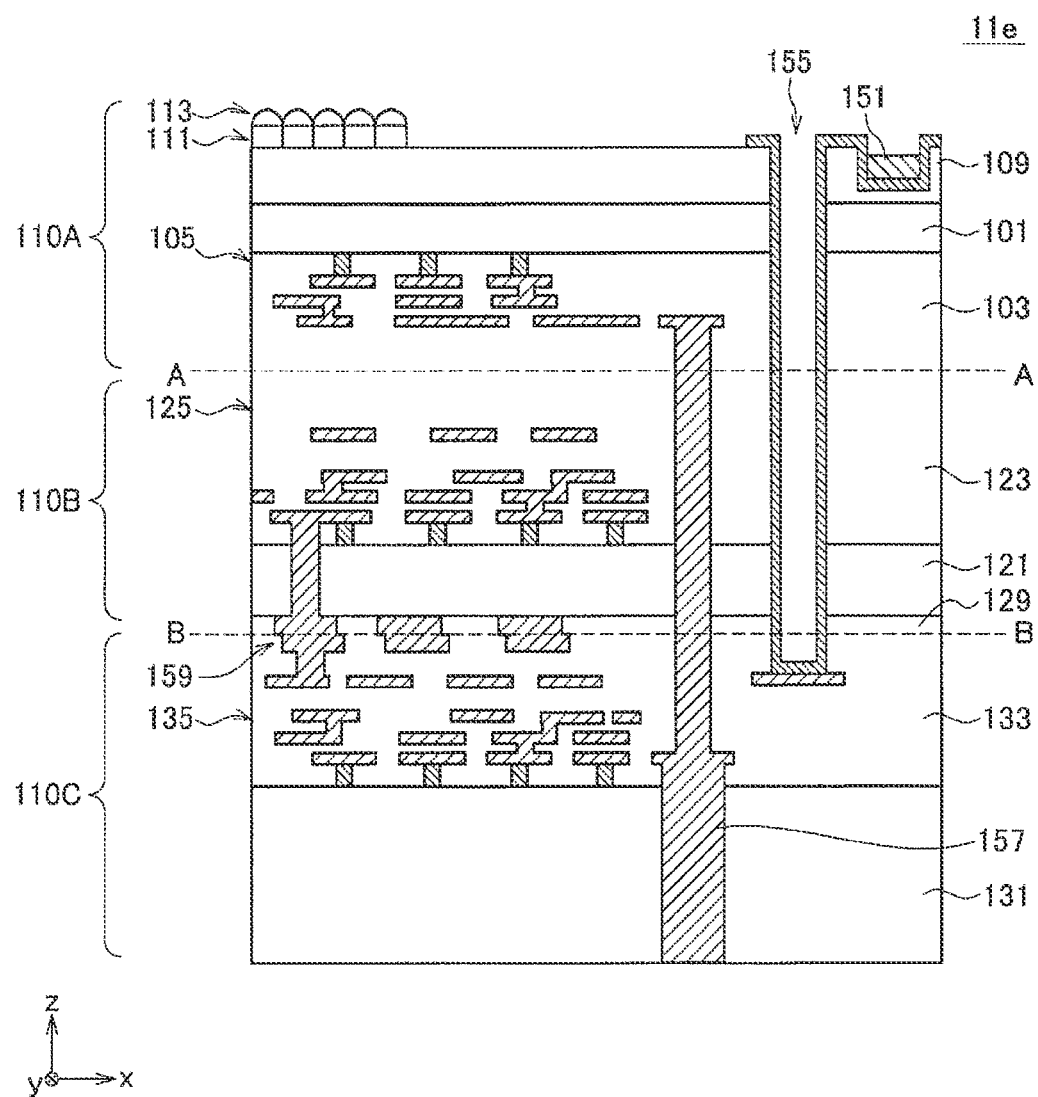

[ FIG. 16A ]
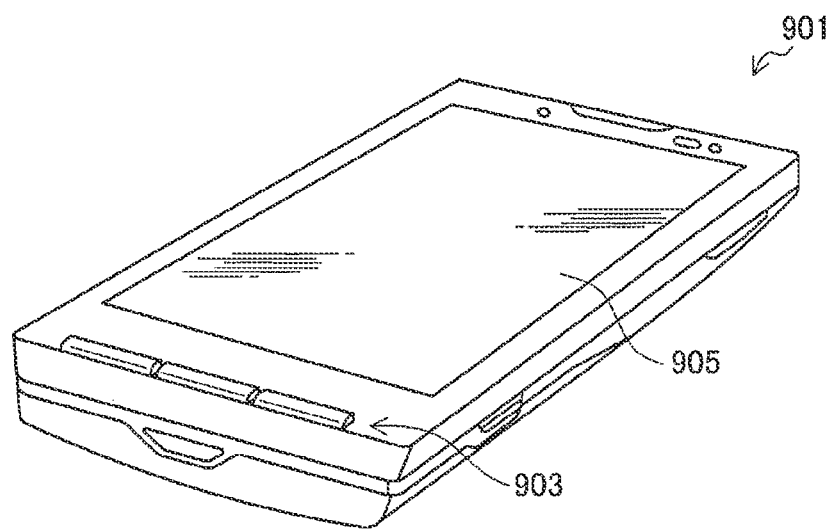
[ FIG. 16B ]
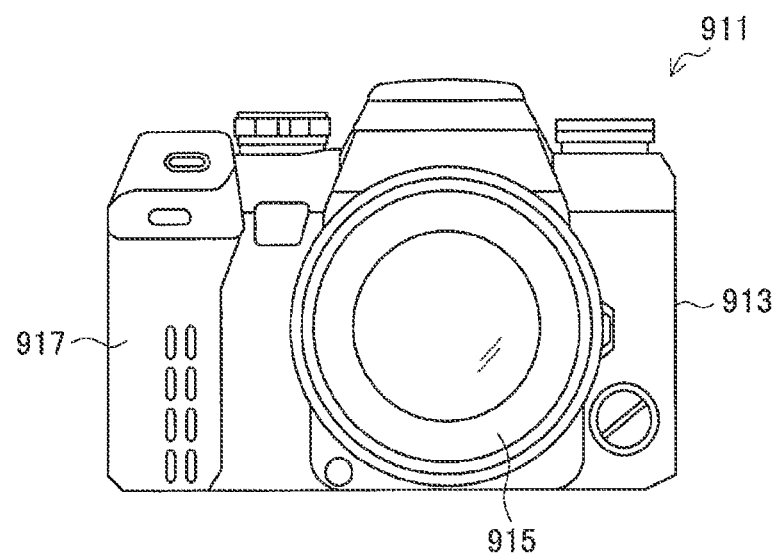

[ FIG. 16C ]
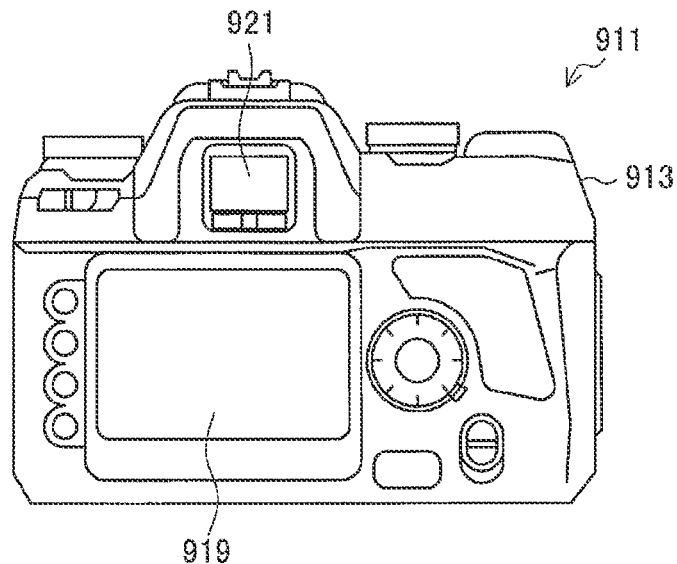
[ FIG. 17A ]
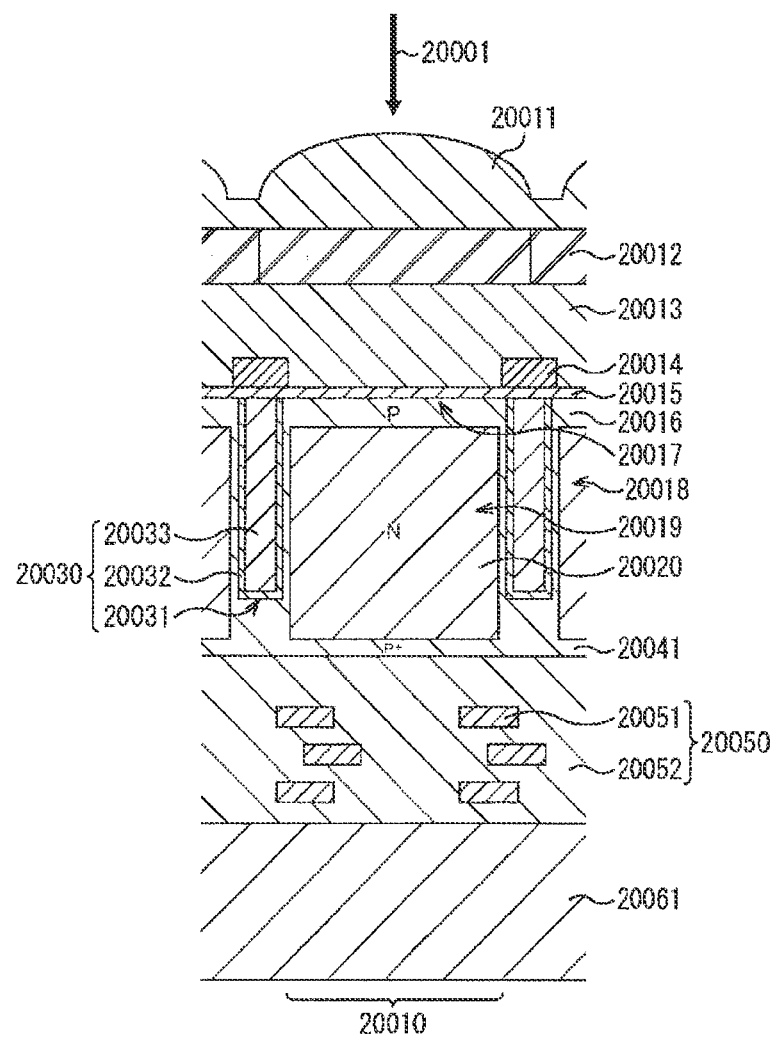

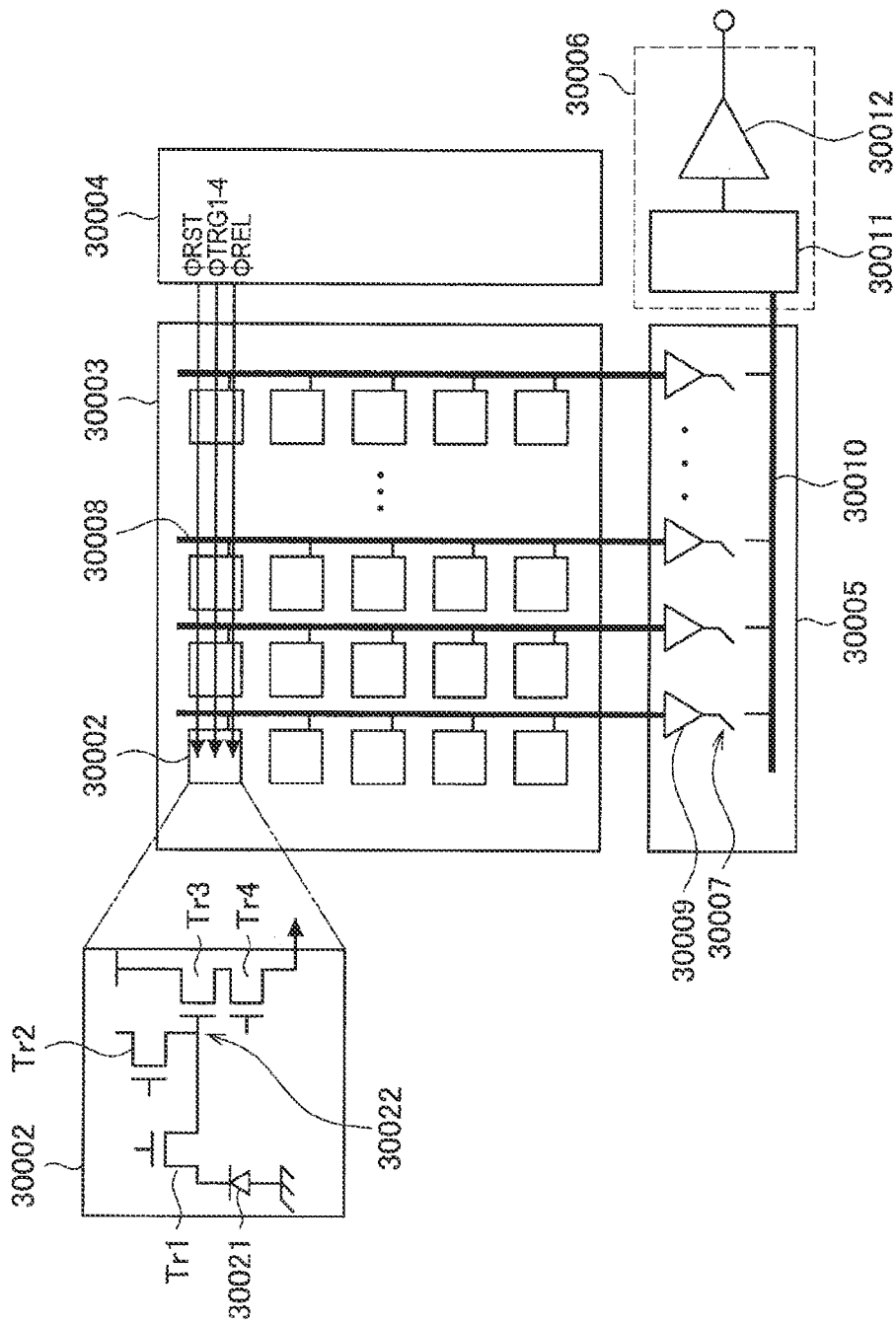
[FIG. 17B]

[ FIG. 17C ]
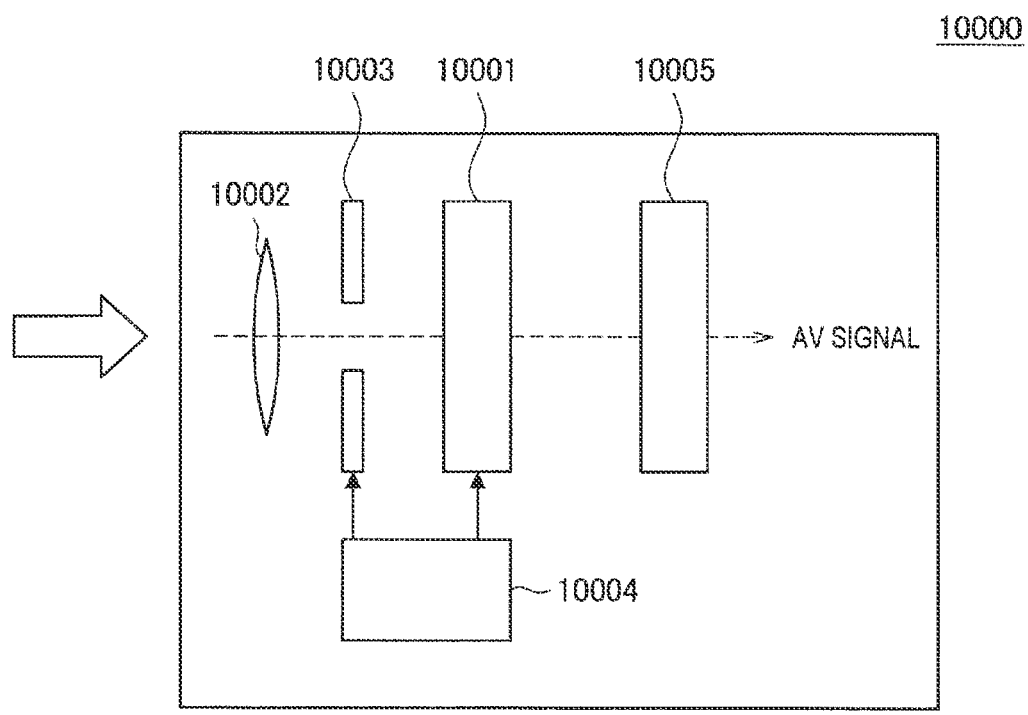

[ FIG. 17D ]
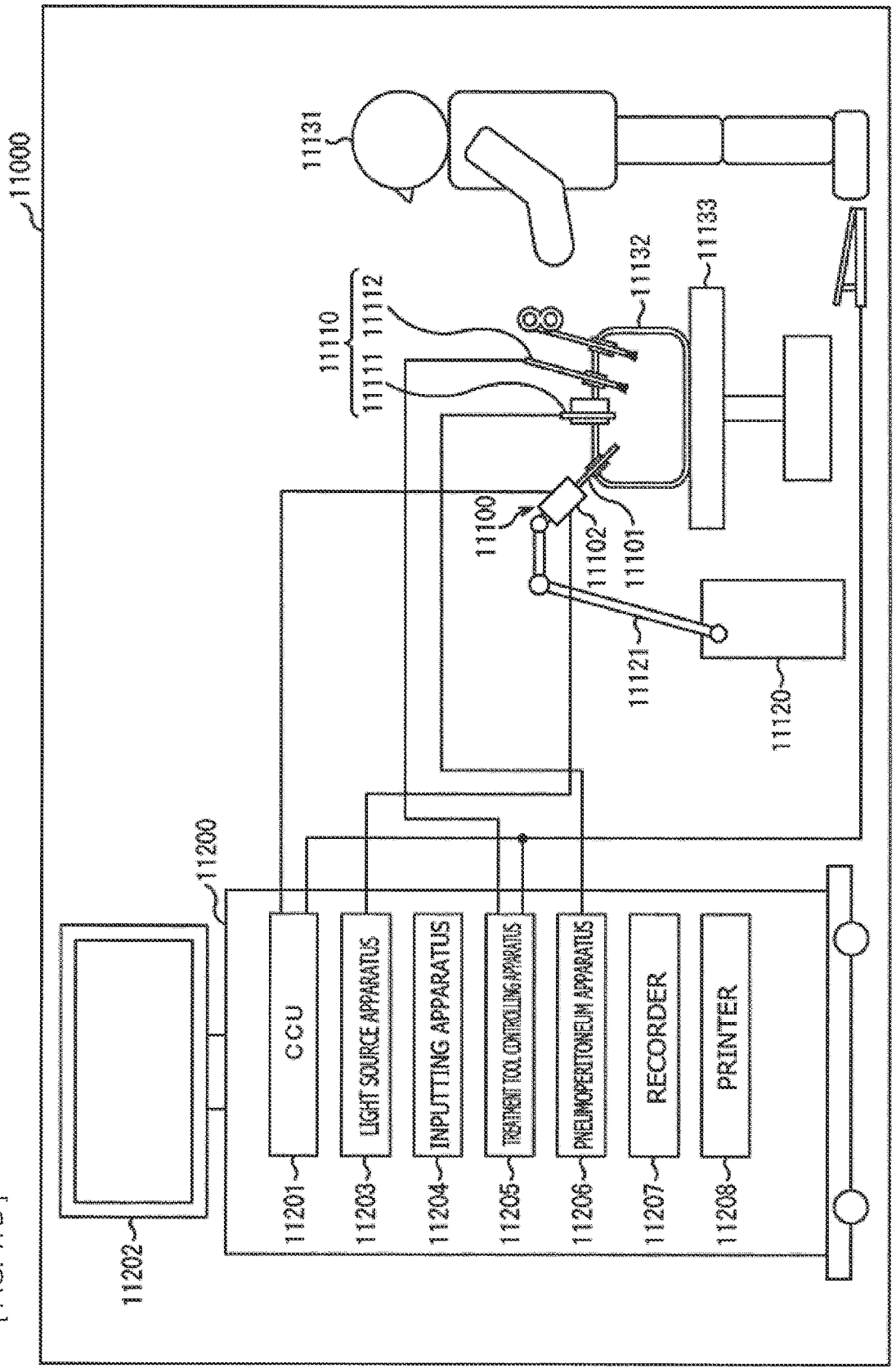

[ FIG. 17E ]
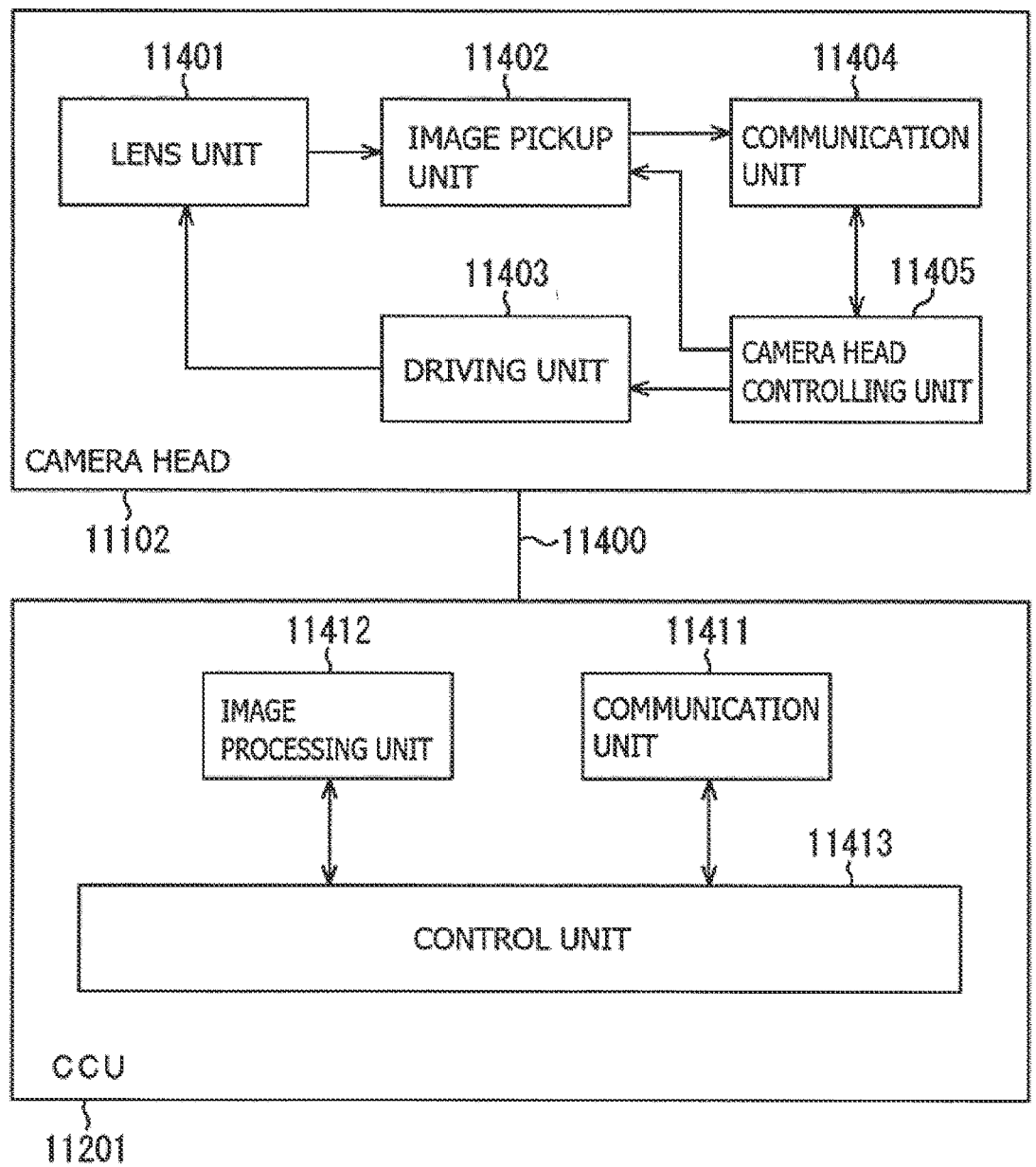

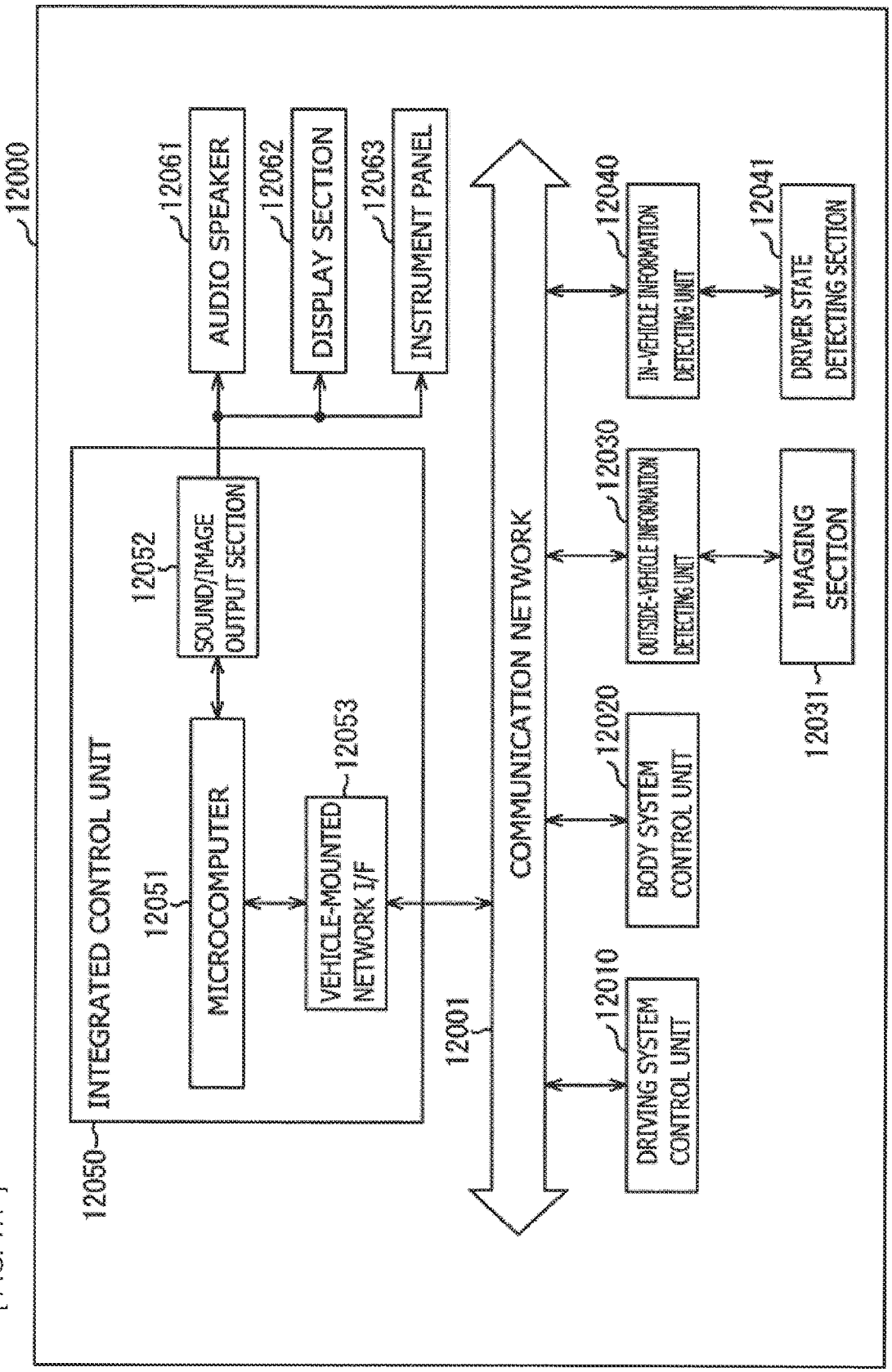
[FIG. 17F]

[FIG. 17G]
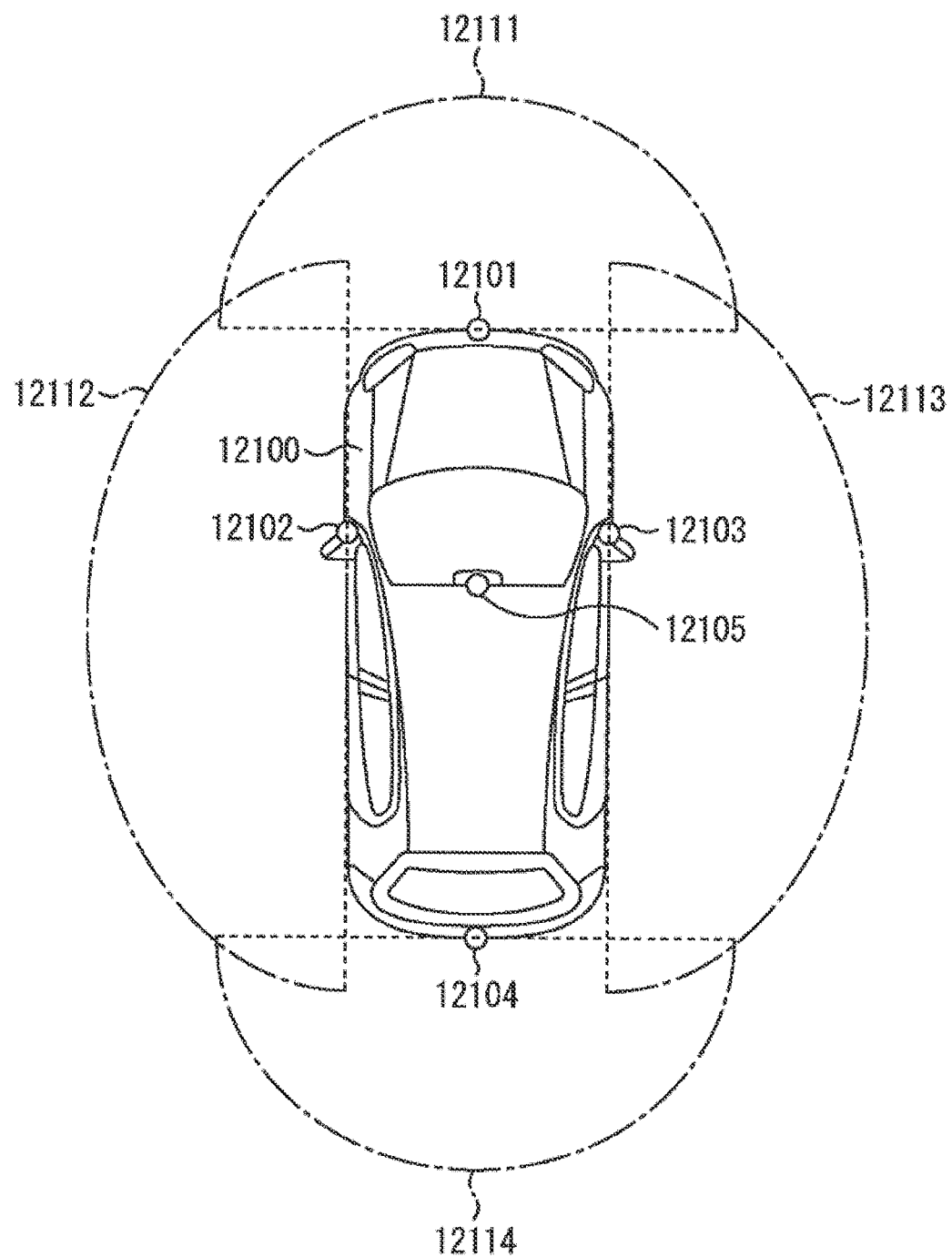

SOLID-STATE IMAGING DEVICE AND ELECTRONIC APPARATUS

CROSS REFERENCE TO RELATED APPLICATIONS

This Patent Application is a Continuation Application of U.S. patent application Ser. No. 16/495,335 filed on Sep. 18, 2019, which is a U.S. National Phase of International Patent Application No. PCT/JP2018/011571 filed on Mar. 23, 2018, which claims priority benefit of Japanese Patent Application No. JP 2017-130385 filed in the Japan Patent Office on Jul. 3, 2017 and also claims priority benefit of Japanese Patent Application No. JP 2017-074805 filed in the Japan Patent Office on Apr. 4, 2017. Each of the above-referenced applications is hereby incorporated herein by reference in its entirety.

TECHNICAL FIELD

The present disclosure relates to a solid-state imaging device and an electronic apparatus.

BACKGROUND ART

Solid-state imaging devices have been developed that each of which has a structure in which a pixel chip provided with a pixel unit, a logic chip mounted with a logic circuit, and the like are stacked. The logic circuit executes various kinds of signal processing related to the operation of the solid-state imaging device. For example, PTL 1 discloses a three-layer stacked solid-state imaging device in which a pixel chip, a logic chip, and a memory chip mounted with a memory circuit are stacked. The memory circuit holds a pixel signal acquired by a pixel unit of the pixel chip.

Note that, when describing the structure of a solid-state imaging device, this specification also refers, as "substrates," to components each including, in combination, a semiconductor substrate having a pixel chip, a logic chip, or a memory chip formed thereon, and a multi-layered wiring layer formed on the semiconductor substrate. The "substrates" are then referred to as "first substrate," "second substrate," "third substrate," . . . in order from the upper side (side from which observation light comes) to the lower side of the stack structure to distinguish the substrates from each other. Note that the stacked solid-state imaging device is manufactured by stacking the respective substrates in the wafer state, and then dicing the stacked substrates into a plurality of stacked solid-state imaging devices (stacked solid-state imaging device chips). This specification assumes for the sake of convenience that the "substrates" may mean the wafer state before dicing, or the chip state after dicing.

CITATION LIST

Patent Literature

PTL 1: Japanese Unexamined Patent Application Publication No. 2014-99582

SUMMARY OF THE INVENTION

Problem to be Solved by the Invention

Several methods have been devised of electrically coupling the respective signal lines included in the upper and lower substrates to each other and electrically coupling the respective power supply lines included in the upper and lower substrates to each other in a stacked solid-state imaging device as described in PTL 1. Examples of the methods include a method of coupling signal lines to each other and coupling power supply lines to each other outside chips through a pad, a method of coupling signal lines to each other and coupling power supply lines to each other inside chips with a TSV (Through-Silicon Via), and the like. It is not necessarily the case that variations of the methods of electrically coupling the signal lines included in the substrates to each other and electrically coupling the power supply lines included in the substrates to each other have been examined in detail so far. Detailed examination of such variations may possibly provide an insight into the appropriate structures to obtain a solid-state imaging device that exhibits higher performance.

Accordingly, the present disclosure proposes a novel and improved solid-state imaging device and electronic apparatus that allow performance to be further improved.

Means for Solving the Problem

According to the present disclosure, there is provided a solid-state imaging device including: a first substrate including a first semiconductor substrate and a first multi-layered wiring layer stacked on the first semiconductor substrate, the first semiconductor substrate having a pixel unit formed thereon, the pixel unit having pixels arranged thereon; a second substrate including a second semiconductor substrate and a second multi-layered wiring layer stacked on the second semiconductor substrate, the second semiconductor substrate having a circuit formed thereon, the circuit having a predetermined function; and a third substrate including a third semiconductor substrate and a third multi-layered wiring layer stacked on the third semiconductor substrate, the third semiconductor substrate having a circuit formed thereon, the circuit having a predetermined function, the first substrate, the second substrate, and the third substrate being stacked in this order, the first substrate and the second substrate being bonded together in a manner that the first multi-layered wiring layer and the second multi-layered wiring layer are opposed to each other, a first coupling structure for electrically coupling the first substrate and the second substrate to each other not existing, or not including a coupling structure formed from the first substrate as a base over bonding surfaces of the first substrate and the second substrate.

Moreover, according to the present disclosure, there is provided an electronic apparatus including: a solid-state imaging device that electronically shoots an image of a target to be observed, the solid-state imaging device including a first substrate including a first semiconductor substrate and a first multi-layered wiring layer stacked on the first semiconductor substrate, the first semiconductor substrate having a pixel unit formed thereon, the pixel unit having pixels arranged thereon, a second substrate including a second semiconductor substrate and a second multi-layered wiring layer stacked on the second semiconductor substrate, the second semiconductor substrate having a circuit formed thereon, the circuit having a predetermined function, and a third substrate including a third semiconductor substrate and a third multi-layered wiring layer stacked on the third semiconductor substrate, the third semiconductor substrate having a circuit formed thereon, the circuit having a predetermined function, the first substrate, the second substrate, and the third substrate being stacked in this order, the first substrate and the second substrate being bonded together in a manner that the first multi-layered wiring layer and the second multi-layered wiring layer are opposed to each other, a first coupling structure for electrically coupling the first substrate and the second substrate to each other not existing, or not including a coupling structure formed from the first substrate as a base over bonding surfaces of the first substrate and the second substrate.

According to the present disclosure, in the solid-state imaging device including three substrates that are stacked, the first substrate that is a pixel substrate and the second substrate are bonded together face-to-face (to be described in detail later), and the first coupling structure for electrically coupling respective signal lines included in the first substrate and the second substrate to each other and electrically coupling respective power supply lines included in the first substrate and the second substrate to each other does not exist, or does not include a coupling structure formed from the first substrate as a base over bonding surfaces of the first substrate and the second substrate. According to the configuration, various coupling structures are provided as a second coupling structure for electrically coupling respective signal lines included in the second substrate and the third substrate to each other and electrically coupling respective power supply lines included in the second substrate and the third substrate to each other, and/or as a third coupling structure for electrically coupling respective signal lines included in the first substrate and the third substrate to each other and electrically coupling respective power supply lines included in the first substrate and the third substrate to each other, which makes it possible to achieve many variations of the coupling structure. This makes it possible to achieve a superior solid-state imaging device that allow performance to be further improved.

Effects of the Invention

As described above, according to the present disclosure, it is possible to further improve the performance of the solid-state imaging device. It is noted that the effects described above are not necessarily limitative, and with or in the place of the above effects, there may be achieved any one of the effects described in this specification or other effects that may be grasped from this specification.

BRIEF DESCRIPTION OF DRAWINGS

FIG. 1 is a vertical cross-sectional view of a schematic configuration of a solid-state imaging device according to an embodiment of the present disclosure.

FIG. 2A is a diagram for describing an example of disposition of coupling structures of the solid-state imaging device in a horizontal plane.

FIG. 2B is a diagram for describing an example of disposition of the coupling structures of the solid-state imaging device in the horizontal plane.

FIG. 2C is a diagram for describing another example of disposition of the coupling structures of the solid-state imaging device in the horizontal plane.

FIG. 2D is a diagram for describing another example of disposition of the coupling structures of the solid-state imaging device in the horizontal plane.

FIG. 2E is a diagram for describing still another example of disposition of the coupling structures of the solid-state imaging device in the horizontal plane.

FIG. 2F is a diagram for describing still another example of disposition of the coupling structures of the solid-state imaging device in the horizontal plane.

FIG. 3A is a vertical cross-sectional view of a schematic configuration of the solid-state imaging device in which a first substrate and a second substrate are bonded together F-to-F.

FIG. 3B is a vertical cross-sectional view of a schematic configuration of the solid-state imaging device in which the first substrate and the second substrate are bonded together F-to-B.

FIG. 4A is a diagram for describing parasitic capacitance between a PWELL and a power supply wiring line in the solid-state imaging device illustrated in FIG. 3A.

FIG. 4B is a diagram for describing parasitic capacitance between a PWELL and a power supply wiring line in the solid-state imaging device illustrated in FIG. 3B.

FIG. 5A is a diagram schematically illustrating disposition of power supply wiring lines and GND wiring lines in the solid-state imaging device illustrated in FIG. 3A.

FIG. 5B is a diagram schematically illustrating disposition of power supply wiring lines and GND wiring lines in the solid-state imaging device illustrated in FIG. 3B.

FIG. 5C is a diagram illustrating a configuration example of the solid-state imaging device illustrated in FIG. 5A for decreasing impedance.

FIG. 6A is a vertical cross-sectional view of a schematic configuration of a solid-state imaging device according to a first configuration example of the present embodiment.

FIG. 6B is a vertical cross-sectional view of the schematic configuration of the solid-state imaging device according to the first configuration example of the present embodiment.

FIG. 7A is a vertical cross-sectional view of a schematic configuration of a solid-state imaging device according to a second configuration example of the present embodiment.

FIG. 7B is a vertical cross-sectional view of the schematic configuration of the solid-state imaging device according to the second configuration example of the present embodiment.

FIG. 7C is a vertical cross-sectional view of the schematic configuration of the solid-state imaging device according to the second configuration example of the present embodiment.

FIG. 7D is a vertical cross-sectional view of the schematic configuration of the solid-state imaging device according to the second configuration example of the present embodiment.

FIG. 7E is a vertical cross-sectional view of the schematic configuration of the solid-state imaging device according to the second configuration example of the present embodiment.

FIG. 7F is a vertical cross-sectional view of the schematic configuration of the solid-state imaging device according to the second configuration example of the present embodiment.

FIG. 8A is a vertical cross-sectional view of a schematic configuration of a solid-state imaging device according to a third configuration example of the present embodiment.

FIG. 8B is a vertical cross-sectional view of the schematic configuration of the solid-state imaging device according to the third configuration example of the present embodiment.

FIG. 8C is a vertical cross-sectional view of the schematic configuration of the solid-state imaging device according to the third configuration example of the present embodiment.

FIG. 8D is a vertical cross-sectional view of the schematic configuration of the solid-state imaging device according to the third configuration example of the present embodiment.

FIG. 9A is a vertical cross-sectional view of a schematic configuration of a solid-state imaging device according to a fourth configuration example of the present embodiment.

FIG. 9B is a vertical cross-sectional view of the schematic configuration of the solid-state imaging device according to the fourth configuration example of the present embodiment.

FIG. 9C is a vertical cross-sectional view of the schematic configuration of the solid-state imaging device according to the fourth configuration example of the present embodiment.

FIG. 9D is a vertical cross-sectional view of the schematic configuration of the solid-state imaging device according to the fourth configuration example of the present embodiment.

FIG. 9E is a vertical cross-sectional view of the schematic configuration of the solid-state imaging device according to the fourth configuration example of the present embodiment.

FIG. 9F is a vertical cross-sectional view of the schematic configuration of the solid-state imaging device according to the fourth configuration example of the present embodiment.

FIG. 10A is a vertical cross-sectional view of a schematic configuration of a solid-state imaging device according to a fifth configuration example of the present embodiment.

FIG. 10B is a vertical cross-sectional view of the schematic configuration of the solid-state imaging device according to the fifth configuration example of the present embodiment.

FIG. 10C is a vertical cross-sectional view of the schematic configuration of the solid-state imaging device according to the fifth configuration example of the present embodiment.

FIG. 10D is a vertical cross-sectional view of the schematic configuration of the solid-state imaging device according to the fifth configuration example of the present embodiment.

FIG. 11A is a vertical cross-sectional view of a schematic configuration of a solid-state imaging device according to a sixth configuration example of the present embodiment.

FIG. 11B is a vertical cross-sectional view of the schematic configuration of the solid-state imaging device according to the sixth configuration example of the present embodiment.

FIG. 11C is a vertical cross-sectional view of the schematic configuration of the solid-state imaging device according to the sixth configuration example of the present embodiment.

FIG. 12A is a vertical cross-sectional view of a schematic configuration of a solid-state imaging device according to a seventh configuration example of the present embodiment.

FIG. 12B is a vertical cross-sectional view of the schematic configuration of the solid-state imaging device according to the seventh configuration example of the present embodiment.

FIG. 12C is a vertical cross-sectional view of the schematic configuration of the solid-state imaging device according to the seventh configuration example of the present embodiment.

FIG. 12D is a vertical cross-sectional view of the schematic configuration of the solid-state imaging device according to the seventh configuration example of the present embodiment.

FIG. 12E is a vertical cross-sectional view of the schematic configuration of the solid-state imaging device according to the seventh configuration example of the present embodiment.

FIG. 12F is a vertical cross-sectional view of the schematic configuration of the solid-state imaging device according to the seventh configuration example of the present embodiment.

FIG. 12G is a vertical cross-sectional view of the schematic configuration of the solid-state imaging device according to the seventh configuration example of the present embodiment.

FIG. 13A is a vertical cross-sectional view of a schematic configuration of a solid-state imaging device according to an eighth configuration example of the present embodiment.

FIG. 13B is a vertical cross-sectional view of the schematic configuration of the solid-state imaging device according to the eighth configuration example of the present embodiment.

FIG. 13C is a vertical cross-sectional view of the schematic configuration of the solid-state imaging device according to the eighth configuration example of the present embodiment.

FIG. 13D is a vertical cross-sectional view of the schematic configuration of the solid-state imaging device according to the eighth configuration example of the present embodiment.

FIG. 13E is a vertical cross-sectional view of the schematic configuration of the solid-state imaging device according to the eighth configuration example of the present embodiment.

FIG. 13F is a vertical cross-sectional view of the schematic configuration of the solid-state imaging device according to the eighth configuration example of the present embodiment.

FIG. 14A is a vertical cross-sectional view of a schematic configuration of a solid-state imaging device according to a ninth configuration example of the present embodiment.

FIG. 14B is a vertical cross-sectional view of the schematic configuration of the solid-state imaging device according to the ninth configuration example of the present embodiment.

FIG. 14C is a vertical cross-sectional view of the schematic configuration of the solid-state imaging device according to the ninth configuration example of the present embodiment.

FIG. 14D is a vertical cross-sectional view of the schematic configuration of the solid-state imaging device according to the ninth configuration example of the present embodiment.

FIG. 14E is a vertical cross-sectional view of the schematic configuration of the solid-state imaging device according to the ninth configuration example of the present embodiment.

FIG. 14F is a vertical cross-sectional view of the schematic configuration of the solid-state imaging device according to the ninth configuration example of the present embodiment.

FIG. 15A is a vertical cross-sectional view of a schematic configuration of a solid-state imaging device according to a tenth configuration example of the present embodiment.

FIG. 15B is a vertical cross-sectional view of the schematic configuration of the solid-state imaging device according to the tenth configuration example of the present embodiment.

FIG. 15C is a vertical cross-sectional view of the schematic configuration of the solid-state imaging device according to the tenth configuration example of the present embodiment.

FIG. 15D is a vertical cross-sectional view of the schematic configuration of the solid-state imaging device according to the tenth configuration example of the present embodiment.

FIG. 15E is a vertical cross-sectional view of the schematic configuration of the solid-state imaging device according to the tenth configuration example of the present embodiment.

FIG. 16A is a diagram illustrating appearance of a smartphone that is an example of an electronic apparatus to which the solid-state imaging device according to the present embodiment may be applied.

FIG. 16B is a diagram illustrating appearance of a digital camera that is another example of the electronic apparatus to which the solid-state imaging device according to the present embodiment may be applied.

FIG. 16C is a diagram illustrating appearance of the digital camera that is another example of the electronic apparatus to which the solid-state imaging device according to the present embodiment may be applied.

FIG. 17A is a cross-sectional view of a configuration example of a solid-state imaging device to which the technology according to the present disclosure may be applied.

FIG. 17B is an explanatory diagram illustrating a schematic configuration of the solid-state imaging device to which the technology according to the present disclosure may be applied.

FIG. 17C is an explanatory diagram illustrating a configuration example of a video camera to which the technology according to the present disclosure may be applied.

FIG. 17D is a view depicting an example of a schematic configuration of an endoscopic surgery system.

FIG. 17E is a block diagram depicting an example of a functional configuration of a camera head and a camera control unit (CCU).

FIG. 17F is a block diagram depicting an example of schematic configuration of a vehicle control system.

FIG. 17G is a diagram of assistance in describing an example of installation positions of an outside-vehicle information detecting section and an imaging section.

MODES FOR CARRYING OUT THE INVENTION

Hereinafter, (a) preferred embodiment(s) of the present disclosure will be described in detail with reference to the appended drawings. Note that, in this specification and the appended drawings, components that have substantially the same function and configuration are denoted with the same reference numerals, thereby refraining from repeatedly describing these components.

In addition, in each of the drawings described below, sizes of some constituent members may be expressed exaggeratedly in some cases for description. Relative sizes of constituent members illustrated in the drawings do not necessarily accurately express size relations between actual constituent members.

Note that description is given in the following order.
1. Overall Configuration of Solid-state Imaging Device
2. Disposition of Coupling Structures
3. Direction of Second Substrate
3-1. Consideration Based on PWELL Area
3-2. Consideration Based on Power Consumption and Disposition of GND Wiring Lines
4. Variations of Configuration of Solid-state Imaging Device
4-1. First Configuration Example
4-2. Second Configuration Example
4-3. Third Configuration Example
4-4. Fourth Configuration Example
4-5. Fifth Configuration Example
4-6. Sixth Configuration Example
4-7. Seventh Configuration Example
4-8. Eighth Configuration Example
4-9. Ninth Configuration Example
4-10. Tenth Configuration Example
4-11. Summary
5. Application examples
6. Supplement

1. Overall Configuration of Solid-State Imaging Device

FIG. 1 is a vertical cross-sectional view of a schematic configuration of a solid-state imaging device according to an embodiment of the present disclosure. As illustrated in FIG. 1, a solid-state imaging device 1 according to the present embodiment is a three-layer stacked solid-state imaging device including a first substrate 110A, a second substrate 110B, and a third substrate 110C that are stacked. In the diagram, a broken line A-A indicates bonding surfaces of the first substrate 110A and the second substrate 110B, and a broken line B-B indicates bonding surfaces of the second substrate 110B and the third substrate 110C. The first substrate 110A is a pixel substrate provided with a pixel unit. The second substrate 110B and the third substrate 110C are provided with circuits for performing various kinds of signal processing related to an operation of the solid-state imaging device 1. The second substrate 110B and the third substrate 110C are, for example, a logic substrate provided with a logic circuit or a memory substrate provided with a memory circuit. The solid-state imaging device 1 is a back-illuminated CMOS (Complementary Metal-Oxide-Semiconductor) image sensor that photoelectrically converts, in the pixel unit, light coming from a back surface side of the first substrate 110A, which is described below. Note that the following describes, for the explanation of FIG. 1, a case where the second substrate 110B is a logic substrate, and the third substrate 110C is a memory substrate.

It is possible in the stacked solid-state imaging device 1, to more appropriately configure circuits to adapt to functions of the respective substrates. It is thus easier to allow the solid-state imaging device 1 to exhibit higher performance. It is possible in the illustrated configuration example to appropriately configure the pixel unit in the first substrate 110A, and the logic circuit or the memory circuit in the second substrate 110B and the third substrate 110C to adapt to the functions of the respective substrates. This makes it possible to achieve the solid-state imaging device 1 that exhibits high performance.

Note that the following also refers to a stacking direction of the first substrate 110A, second substrate 110B, and third substrate 110C as z-axis direction. In addition, a direction in which the first substrate 110A is positioned in the z-axis direction is defined as a positive direction of an z axis. Further, two directions orthogonal to each other on a plane (a horizontal plane) perpendicular to the z-axis direction are also referred to as x-axis direction and y-axis direction. In addition, one of opposed two surfaces of semiconductor substrates 101, 121, and 131 on the respective substrates in the directions of the substrate principal surfaces is provided with functional components such as transistors or is provided with multi-layered wiring layers 105, 125, and 135, and the following also refers to these surfaces as front surfaces (also referred to as front side surfaces). The multi-layered wiring layers 105, 125, and 135 bring the functional components into operation, and are described below. The semiconductor substrates 101, 121, and 131 are described below. The other surfaces opposed to the front surfaces are also referred to as back surfaces (back side surfaces). Further, in each of the substrates, a side on which the front surface is provided is also referred to as a front surface side (a front side), and a side on which the back surface is provided is also referred to as a back surface side (a back side).

The first substrate 110A mainly includes the semiconductor substrate 101 including, for example, silicon (Si), and the multi-layered wiring layer 105 formed on the semiconductor substrate 101. A pixel unit having pixels two-dimensionally arranged and a pixel signal-processing circuit that processes a pixel signal are mainly formed on the semiconductor substrate 101. Each pixel mainly includes a photodiode (PD) and a drive circuit. The PD receives light (observation light) from an observation target and performs photoelectric conversion, and the drive circuit includes a transistor or the like for reading out an electric signal (a pixel signal) corresponding to the observation light acquired by the PD. In the pixel signal processing circuit, for example, various kinds of signal processing such as analog-to-digital conversion (AD conversion) are executed on the pixel signal. Note that in the present embodiment, the pixel unit is not limited to a pixel unit having the pixels two-dimensionally arranged, and may be a pixel unit having the pixels three-dimensionally arranged. Further, in the present embodiment, a substrate formed using a material other than a semiconductor may be used instead of the semiconductor substrate 101. For example, a sapphire substrate may be used instead of the semiconductor substrate 101. In this case, a mode in which a pixel is formed by depositing a film (e.g., an organic photoelectric conversion film) that performs photoelectric conversion on the sapphire substrate may be applied.

An insulating film 103 is stacked on the front surface of the semiconductor substrate 101 on which the pixel unit and the pixel signal processing circuit are formed. The multi-layered wiring layer 105 is formed inside the insulating film 103. The multi-layered wiring layer 105 includes a signal line wiring line for transmitting various signals such as a pixel signal and a drive signal for driving a transistor of a drive circuit. The multi-layered wiring layer 105 further includes a power supply wiring line, a ground wiring line (a GND wiring line), and the like. Note that in the following, for the sake of simplicity, the signal line wiring line is sometimes simply referred to as signal line. In addition, the power supply wiring line and the GND wiring line are sometimes collectively referred to as power supply line. A lowermost wiring line of the multi-layered wiring layer 105 may be electrically coupled to the pixel unit or the pixel signal processing circuit by a contact 107 in which, for example, an electrically-conductive material such as tungsten (W) is embedded. Note that a plurality of wiring layers may be actually formed by repeating formation of an interlayer insulating film having a predetermined thickness and formation of a wiring layer, but FIG. 1 collectively refers to a plurality of the interlayer insulating films as insulating film 103, and collectively refers to a plurality of the wiring layers as multi-layered wiring layer 105 for the sake of simplicity.

Note that a pad 151 may be formed in the multi-layered wiring layer 105. The pad 151 functions as an external input/output unit (I/O unit) for exchanging various signals with the outside. The pad 151 may be provided along an outer periphery of a chip.

The second substrate 110B is, for example, a logic substrate. The second substrate 110B mainly includes the semiconductor substrate 121 including, for example, Si and the multi-layered wiring layer 125 formed on the semiconductor substrate 121. A logic circuit is formed on the semiconductor substrate 121. In the logic circuit, various kinds of signal processing related to the operation of the solid-state imaging device 1 are executed. For example, the logic circuit may control a drive signal for driving the pixel unit of the first substrate 110A (i.e., drive control of the pixel unit) and exchange of a signal with the outside. Note that, in the present embodiment, a substrate formed using a material other than a semiconductor may be used instead of the semiconductor substrate 121. For example, a sapphire substrate may be used instead of the semiconductor substrate 121. In this case, a mode in which a semiconductor film (e.g., an Si film) is deposited on the sapphire substrate to form a logic circuit in the semiconductor film may be applied.

A insulating film 123 is stacked on the front surface of the semiconductor substrate 121 on which the logic circuit is formed. The multi-layered wiring layer 125 for transmitting various signals related to an operation of the logic circuit is formed inside the insulating film 123. The multi-layered wiring layer 125 further includes a power supply wiring line, a GND wiring line, and the like. A lowermost wiring line of the multi-layered wiring layer 125 may be electrically coupled to the logic circuit by a contact 127 in which, for example, an electrically-conductive material such as W is embedded. Note that, similarly to the insulating film 103 and the multi-layered wiring layer 105 of the first substrate 110A, the insulating film 123 of the second substrate 110B may also be a collective term of a plurality of interlayer insulating films, and the multi-layered wiring layer 125 may also be a collective term of a plurality of wiring layers.

Note that the pad 151 may be formed in the multi-layered wiring layer 125. The pad 151 functions as an I/O unit for exchanging various signals with the outside. The pad 151 may be provided along the outer periphery of the chip.

The third substrate 110C is, for example, a memory substrate. The third substrate 110C mainly includes the semiconductor substrate 131 including, for example, Si, and the multi-layered wiring layer 135 formed on the semiconductor substrate 131. A memory circuit is formed on the semiconductor substrate 131. The memory circuit temporarily holds a pixel signal acquired by the pixel unit of the first substrate 110A and is subjected to AD conversion by the pixel signal processing circuit. Temporarily holding a pixel signal in the memory circuit enables a global shutter system and allows the pixel signal to be read out from the solid-state imaging device 1 to the outside at higher speed. This makes it possible to shoot an image of higher quality in which distortion is suppressed even at the time of high-speed shooting. Note that in the present embodiment, a substrate formed using a material other than a semiconductor may be used instead of the semiconductor substrate 131. For example, a sapphire substrate may be used instead of the semiconductor substrate 131. In this case, a mode in which a film (e.g., a phase-change material film) for forming a memory element is deposited on the sapphire substrate and a memory circuit is formed using the film may be applied.

An insulating film 133 is stacked on the front surface of the semiconductor substrate 131 on which the memory circuit is formed. The multi-layered wiring layer 135 for transmitting various signals related to an operation of the memory circuit is formed inside the insulating film 133. The multi-layered wiring layer 135 further includes a power supply wiring line, a GND wiring line, and the like. A lowermost wiring line of the multi-layered wiring layer 135 may be electrically coupled to the memory circuit by a contact 137 in which, for example, an electrically-conductive material such as W is embedded. Note that, similarly to the insulating film 103 and the multi-layered wiring layer 105 of the first substrate 110A, the insulating film 133 of the third substrate 110C may also be a collective term of a plurality of interlayer insulating films, and the multi-layered wiring layer 135 may also be a collective term of a plurality of wiring layers.

Note that the pad 151 may be formed in the multi-layered wiring layer 135. The pad 151 functions as an I/O unit for exchanging various signals with the outside. The pad 151 may be provided along the outer periphery of the chip.

Each of the first substrate 110A, the second substrate 110B, and the third substrate 110C is fabricated in a wafer state. Thereafter, these substrates are bonded together, and respective processes are performed for electrically coupling the respective signal lines included in the substrates to each other and electrically coupling the respective power supply lines included in the substrates to each other.

Specifically, the first substrate 110A in the wafer state and the second substrate 110B in the wafer state are first bonded together in a manner that the front surface (the surface provided with the multi-layered wiring layer 105) of the semiconductor substrate 101 of the first substrate 110A and the front surface (the surface provided with the multi-layered wiring layer 125) of the semiconductor substrate 121 of the second substrate 110B are opposed to each other. The following also refers to such a state in which two substrates are bonded together with the front surfaces opposed to each other as Face to Face (F-to-F).

Next, the third substrate 110C in the wafer state is further bonded to the stack of the first substrate 110A and the second substrate 110B in a manner that the back surface (the surface opposite to the side on which the multi-layered wiring layer 125 is provided) of the semiconductor substrate 121 of the second substrate 110B in the wafer state and the front surface (the surface on which the multi-layered wiring layer 135 is provided) of the semiconductor substrate 131 of the third substrate 110C are opposed to each other. Note that at this time, in the second substrate 110B, the semiconductor substrate 121 is thinned before a bonding process, and an insulating film 129 having a predetermined thickness is formed on the back surface of the semiconductor substrate 121. The following also refers to such a state in which two substrates are bonded together with the front surface and the back surface opposed to each other as Face to Back (F-to-B).

Next, the semiconductor substrate 101 of the first substrate 110A is thinned, and an insulating film 109 is formed on the back surface of the semiconductor substrate 101. Thereafter, a color filter layer 111 (CF layer 111) and a microlens array 113 (ML array 113) are formed on the back surface side of the semiconductor substrate 101 of the first substrate 110A with the insulating film 109 interposed therebetween.

The CF layer 111 includes a plurality of CFs arranged two-dimensionally. The ML array 113 includes a plurality of MLs arranged two-dimensionally. The CF layer 111 and the ML array 113 are formed directly above the pixel unit, and one CF and one ML are provided for the PD of a corresponding one of the pixels.

Each of the CFs of the CF layer 111 has, for example, any of red, green, and blue colors. The observation light that has passed through the CF enters the PD of the pixel, and a pixel signal is acquired. This allows a pixel signal of a color component of the color filter to be acquired for an observation target (i.e., this allows for color imaging). Actually, one pixel corresponding to one CF may function as a sub-pixel, and one pixel may include a plurality of sub-pixels. For example, in the solid-state imaging device 1, one pixel may include sub-pixels of four colors including a pixel provided with a red CF (i.e., a red pixel), a pixel provided with a green CF (i.e., a green pixel), a pixel provided with a blue CF (i.e., a blue pixel), and a pixel provided with no CF (i.e., a white pixel). This specification, however, also refers to a component corresponding to one sub-pixel simply as pixel without distinguishing a sub-pixel from a pixel for the convenience of explanation. Note that a method of arranging CFs is not particularly limited, but any type of arrangement may be adopted such as delta arrangement, stripe arrangement, diagonal arrangement, or rectangle arrangement.

The ML array 113 is formed to position each of the MLs directly above a corresponding one of the CFs. Providing the ML array 113 allows the observation light collected by the MLs to enter the PDs of the pixels through the CFs, which makes it possible to achieve effects of improving efficiency of collecting the observation light and improving sensitivity of the solid-state imaging device 1.

After the CF layer 111 and the ML array 113 are formed, pad openings 153a, 153b, and 153c are formed to expose the pads 151 provided in the multi-layered wiring layer 105 of the first substrate 110A, the multi-layered wiring layer 125 of the second substrate 110B and the multi-layered wiring layer 135 of the third substrate 110C. The pad opening 153a is formed from the back surface side of the first substrate 110A to reach a metallic surface of the pad 151 provided in the multi-layered wiring layer 105 of the first substrate 110A. The pad opening 153b is formed to penetrate the first substrate 110A from the back surface side of the first substrate 110A and reach the metallic surface of the pad 151 provided in the multi-layered wiring layer 125 of the second substrate 110B. The pad opening 153c is formed to penetrate the first substrate 110A and the second substrate 110B from the back surface side of the first substrate 110A and reach the metallic surface of the pad 151 provided in the multi-layered wiring layer 135 of the third substrate 110C. The pads 151 and other external circuits are electrically coupled to each other through the pad openings 153a, 153b, and 153c by, for example, wire bonding. That is, a wiring line coupled to the pad 151 of the first substrate 110A, a wiring line coupled to the pad 151 of the second substrate 110B, a wiring line coupled to the pad of the third substrate 110C may be electrically coupled to each other through the other external circuits. In this specification, for the sake of simplicity, electrically coupling a wiring line in one substrate and a wiring line in another substrate to each other is sometimes simply abbreviated to electrically coupling one substrate and another substrate to each other. At this time, wiring lines electrically coupled to each other upon electrically coupling the substrates to each other may be signal lines or power supply lines.

Note that in this specification, in a case where a plurality of pad openings 153 exists in the diagram as illustrated in FIG. 1, the plurality of pad openings 153 is distinguished by attaching different alphabets to ends of reference numerals such as the pad opening 153a and the pad opening 153b, for the sake of convenience.

Thereafter, a processed stack wafer structure including the substrates that are stacked in the wafer state is diced for each solid-state imaging device 1, thereby completing the solid-state imaging device 1.

The schematic configuration of the solid-state imaging device 1 has been described above. As described above, in the solid-state imaging device 1, the pads 151 exposed by the pad openings 153a, 153b, and 153c are coupled to each other through an electrical coupling means such as a wiring line provided outside the solid-state imaging device 1, which allows the respective signal lines included in the first substrate 110A, the second substrate 110B, and the third substrate 110C to be electrically coupled to each other, and allows the respective power supply lines included in the first substrate 110A, the second substrate 110B, and the third substrate 110C to be electrically coupled to each other. That is, the respective signal lines included in the first substrate 110A, the second substrate 110B, and the third substrate 110C may be electrically coupled to each other through the pads 151, and the pad openings 153a, 153b, and 153c, and the respective power supply lines included in the first substrate 110A, the second substrate 110B, and the third substrate 110C may be electrically coupled to each other through the pads 151, and the pad openings 153a, 153b, and 153c. Note that this specification also collectively refers, as coupling structures, to structures such as the pads 151, and the pad openings 153a, 153b, and 153c illustrated in FIG. 1, that allow respective signal lines included in the substrates to be electrically coupled to each other, and allow respective power supply lines included in the substrates to be electrically coupled to each other. Although not used in the configuration illustrated in FIG. 1, the coupling structures also encompass a TSV 157 to be described later (a twin contact type or shared contact type TSV to be described later) and an electrode junction structure 159 to be described later (a structure that exists on bonding surfaces of substrates and in which electrodes formed on the respective bonding surfaces are joined to each other in direct contact with each other). Note that in this specification, the TSV means a via provided by penetrating at least one of the semiconductor substrates 101, 121, and 131 from one surface of any of the first substrate 110A, the second substrate 110B, and the third substrate 110C. In the present embodiment, as described above, a substrate including a material other than a semiconductor may also be used instead of the semiconductor substrates 101, 121, and 131, but this specification also refers to a via provided by penetrating such a substrate including a material other than a semiconductor as TSV for the sake of convenience.

Note that the multi-layered wiring layer 105 of the first substrate 110A, the multi-layered wiring layer 125 of the second substrate 110B, and the multi-layered wiring layer 135 of the third substrate 110C may include a plurality of stacked first metal wiring layers 141 each including a first metal having relatively low resistance. The first metal is, for example, copper (Cu). Using a Cu wiring line makes it possible to exchange signals at higher speed. However, the pads 151 may each include a second metal that is different from the first metal in view of the adhesiveness and the like to wires for wire bonding. Accordingly, in an illustrated configuration example, the multi-layered wiring layer 105 of the first substrate 110A provided with the pad 151, the multi-layered wiring layer 125 of the second substrate 110B provided with the pad 151, and the multi-layered wiring layer 135 of the third substrate 110C provided with the pad 151 include a second metal wiring layer 143 including the second metal in the same layer as the pad 151. The second metal is, for example, aluminum (Al). In addition to the pads 151, an Al wiring line may be used, for example, as a power supply wiring line or a GND wiring line that is generally formed as a wide wiring line.

In addition, the first metal and the second metal are not limited to Cu and Al exemplified above. As the first metal and the second metal, various metals may be used. Alternatively, respective wiring layers of the multi-layered wiring layers 105, 125, and 135 may each include an electrically-conductive material other than metals. It is sufficient if these wiring layers each include an electrically-conductive material. The material is not limited. Alternatively, instead of using two types of electrically-conductive materials, all the multi-layered wiring layers 105, 125, and 135 including the pads 151 may include the same electrically-conductive material.

Further, in the present embodiment, the TSV 157 to be described later, and the electrodes and vias included in the electrode junction structure 159 to be described later each also include the first metal (e.g., Cu). For example, in a case where the first metal is Cu, these structures may be formed by a damascene method or a dual damascene method. The present embodiment is not, however, limited to such an example, and a portion or all of these structures may include another metal different from both the first metal and the second metal, or another non-metallic electrically-conductive material. For example, the TSV 157 and vias included in the electrode junction structure 159 may be formed by embedding, in an opening, a metal material having favorable embeddability such as W. In a case where a via diameter is relatively small, such a structure using W may be suitably applied in consideration of the embeddability. In addition, the TSV 157 may not necessarily be formed by embedding an electrically-conductive material in a through hole (an opening penetrating at least one semiconductor substrate), and may be formed by forming a film including an electrically-conductive material on an inner wall (a sidewall and a bottom) of the through hole.

Moreover, although not illustrated in FIG. 1 and some of respective subsequent diagrams, the solid-state imaging device 1 includes insulating materials for electrically insulating the electrically-conductive materials such as the first metal and the second metal from the semiconductor substrates 101, 121, and 131 in portions illustrated as if the electrically-conductive materials such as the first metal and the second metal are in contact with the semiconductor substrates 101, 121, and 131. The insulating materials may include, for example, various known materials such as silicon oxide ($SiO_2$) or silicon nitride (SiN). The insulating materials may be interposed between the electrically-conductive material and the semiconductor substrates 101, 121, and 131, or may exist inside the semiconductor substrates 101, 121, and 131 away from portions where the electrically-conductive materials are in contact with the semiconductor substrate 101, 121, and 131. For example, with respect to the TSV 157 to be described later and a TSV included in the electrode junction structure 159 to be described later, insulating materials may exist between inner walls of through holes provided in the semiconductor substrates 101, 121, and 131 and electrically-conductive materials embedded in the through holes (i.e., films including insulating materials may be formed on the inner walls of the through holes). Alternatively, with respect to the TSV 157 to be described later and the TSV included in the electrode junction structure 159 to be described later, insulating materials may exist in portions inside the semiconductor substrate 101, 121, and 131 and away from the through holes provided in the semiconductor substrates 101, 121, and 131 by predetermined distances in the direction of the horizontal plane. In addition, although not illustrated in FIG. 1 and some of respective subsequent diagrams, in a case where the first metal is Cu, a barrier metal for preventing diffusion of Cu exists in portions where Cu is in contact with the semiconductor substrates 101, 121, and 131 or the insulating films 103, 109, 123, 129, and 133. As the barrier metal, various known materials such as titanium nitride (TiN) or tantalum nitride (TaN) may be used.

In addition, specific configurations of respective components (the pixel unit and the pixel signal processing circuit provided to the first substrate 110A, the logic circuit provided to the second substrate 110B, and the memory circuit provided to the third substrate 110C), the multi-layered wiring layers 105, 125, and 135, and the insulating films 103, 109, 123, 129, and 133 that are formed in the semiconductor substrates 101, 121, and 131 of the respective substrates, and formation methods thereof may be similar to various known configurations and methods. The specific configurations and formation methods are not thus described here in detail.

For example, it is sufficient if the insulating films 103, 109, 123, 129, and 133 include materials having insulating properties, and the materials are not limited. The insulating film 103, 109, 123, 129, and 133 may include, for example, $SiO_2$, SiN, or the like. In addition, each of the insulating films 103, 109, 123, 129, and 133 does not have to include one type of insulating material, but may include a plurality of types of stacked insulating materials. Moreover, for example, in the insulating films 103, 123, and 133, a Low-k material having insulating properties may be used in a region where a wiring line demanding signal transmission at higher speed is formed. Using the Low-k materials allows parasitic capacitance between wiring lines to be decreased, which makes it possible to further contribute to high-speed signal transmission.

As the other specific configurations of the respective components formed on the semiconductor substrates 101, 121, and 131 of the respective substrates, the multi-layered wiring layers 105, 125, and 135, and the insulating films 103, 109, 123, 129, and 133, and the other formation methods thereof, it is possible to apply, as appropriate, what is described, for example, in PTL 1. PTL 1 is a prior application filed by the applicant of the present application.

In addition, in the configuration example described above, a pixel signal processing circuit that performs signal processing such as AD conversion on a pixel signal is mounted on the first substrate 110A, but the present embodiment is not limited to the example. A portion or all of the functions of the pixel signal processing circuit may be provided to the second substrate 110B. This case may achieve the solid-state imaging device 1 that performs so-called pixel-by-pixel analog-to-digital conversion (pixel ADC). In the pixel ADC, a pixel signal acquired by a PD provided to each pixel is transmitted to the pixel signal processing circuit of the second substrate 110B for each pixel, and AD conversion is performed for each pixel, for example, in a pixel array in which a plurality of pixels is arrayed in both a column direction and a row direction. This allows pixel signals to be subjected to AD conversion and read out at higher speed as compared with a solid-state imaging device that includes one AD conversion circuit for each column of the pixel array, and performs general column-by-column analog/digital conversion (column ADC). In the column ADC, a plurality of pixels included in a column is sequentially subjected to AD conversion. Note that, in a case where the solid-state imaging device 1 is configured be able to execute the pixel ADC, each pixel is provided with an electrode junction structure that electrically couples the respective signal lines included in the first substrate 110A and the second substrate 110B to each other.

In addition, in the configuration example described above, a case where the second substrate 110B is a logic substrate, and the third substrate 110C is a memory substrate has been described. The present embodiment is not, however, limited to such an example. It is sufficient if the second substrate 110B and the third substrate 110C are substrates having functions other than that of the pixel substrate, and the functions may be optionally determined. For example, the solid-state imaging device 1 does not have to include any memory circuit. In this case, for example, both the second substrate 110B and the third substrate 110C may function as logic substrates. Alternatively, a logic circuit and a memory circuit may be distributed in the second substrate 110B and the third substrate 110C, and these substrates may cooperate to achieve the functions of a logic substrate and a memory substrate. Alternatively, the second substrate 110B may be a memory substrate, and the third substrate 110C may be a logic substrate.

In addition, in the configuration example described above, Si substrates are used as the semiconductor substrates 101, 121, and 131 in the respective substrates, but the present embodiment is not limited to such an example. As the semiconductor substrates 101, 121, and 131, other types of semiconductor substrates may be used such as gallium arsenide (GaAs) substrates or silicon carbide (SiC) substrates, for example. Alternatively, instead of the semiconductor substrates 101, 121, and 131, substrates each including a material other than a semiconductor may be used such as sapphire substrates, as described above.

2. Disposition of Coupling Structures

As described above with reference to FIG. 1, in the solid-state imaging device 1, respective signal lines and/or respective power supply lines included in respective substrates may be electrically coupled to each other over a plurality of substrates through coupling structures. The disposition of these coupling structures in the horizontal plane may be determined as appropriate to improve the performance of the entire solid-state imaging device 1 by considering the configuration, performance, and the like of each of the substrates (chips). Several variations of the disposition of the coupling structures of the solid-state imaging device 1 in the horizontal plane are now described.

Each of FIGS. 2A and 2B is a diagram for describing an example of the disposition of the coupling structures of the solid-state imaging device 1 in the horizontal plane. FIGS. 2A and 2B each illustrate the disposition of the coupling structures in the solid-state imaging device 1 in a case where a pixel signal processing circuit that performs processing such as AD conversion on a pixel signal is mounted on the first substrate 110A, for example.

FIG. 2A schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line in a simulated manner, and electrical coupling between the lower surface (surface opposed to the third substrate 110C) of the second substrate 110B and the upper surface (surface opposed to the second substrate 110B) of the third substrate 110C through coupling structures is indicated by a solid line in a simulated manner.

On the upper surface of the first substrate 110A, positions of a pixel unit 206 and coupling structures 201 are illustrated. Each of the coupling structure 201 functions as an I/O unit for exchanging various signals such as a power supply signal and a GND signal with the outside. Specifically, each of the coupling structures 201 may be the pad 151 provided on the upper surface of the first substrate 110A. Alternatively, as illustrated in FIG. 1, in a case where the pad 151 is embedded in the multi-layered wiring layer 105 of the first substrate 110A, the multi-layered wiring layer 125 of the second substrate 110B, or the multi-layered wiring layer 135 of the third substrate 110C, the coupling structure 201 may be the pad opening 153 provided to expose the pad 151. Alternatively, the coupling structure 201 may be a lead line opening 155 to be described later. As illustrated in FIG. 2A, the first substrate 110A is provided with the pixel unit 206 in the middle of the chip, and the coupling structures 201 included in the I/O unit are disposed around the pixel unit 206 (i.e., along the outer periphery of the chip). In addition, although not illustrated, pixel signal processing circuits may also be disposed around the pixel unit 206.

FIG. 2B schematically illustrates positions of coupling structures 202 on the lower surface of the first substrate 110A, positions of coupling structures 203 on the upper surface of the second substrate 110B, positions of coupling structures 204 on the lower surface of the second substrate 110B, and positions of coupling structures 205 on the upper surface of the third substrate 110C. Each of the coupling structures 202 to 205 may be the TSV 157 to be described later or the electrode junction structure 159 described above provided between the substrates. Alternatively, as illustrated in FIG. 1, in a case where the pad 151 is embedded in the multi-layered wiring layer 125 of the second substrate 110B or the multi-layered wiring layer 135 of the third substrate 110C, it may be the pad opening 153, out of the coupling structures 202 to 205, that is positioned directly below the coupling structure 201. The pad opening 153 is provided to expose the pad 151. Alternatively, the coupling structures 202 to 205 may be the lead line openings 155 to be described later. Note that FIG. 2B illustrates the coupling structures 202 to 205 in accordance with the form of straight lines indicating electric coupling illustrated in FIG. 2A. That is, the coupling structure 202 on the lower surface of the first substrate 110A and the coupling structure 203 on the upper surface of the second substrate 110B are indicated by broken lines, and the coupling structure 204 on the lower surface of the second substrate 110B and the coupling structure 205 on the upper surface of the third substrate 110C are indicated by solid lines.

As described above, in the illustrated configuration example, pixel signal processing circuits are mounted around the pixel unit 206 of the first substrate 110A. Therefore, pixel signals acquired by the pixel unit 206 are subjected to processing such as AD conversion by the pixel signal processing circuits on the first substrate 110A, and then transmitted to a circuit included in the second substrate 110B. In addition, as described above, the coupling structures 201 included in the I/O unit are also disposed around the pixel unit 206 of the first substrate 110A of the first substrate 110A. Therefore, as illustrated in FIG. 2B, the coupling structures 202 on the lower surface of the first substrate 110A are disposed along the outer periphery of the chip in association with the regions where the pixel signal processing circuits and the I/O units exist in order to electrically couple the pixel signal processing circuits and the I/O units to a circuit included in the second substrate 110B. In addition, the coupling structures 203 on the upper surface of the second substrate 110B are also disposed accordingly along the outer periphery of the chip.

Meanwhile, a logic circuit or a memory circuit mounted on the second substrate 110B and the third substrate 110C may be formed on the entire surface of the chip. The coupling structures 204 on the lower surface of the second substrate 110B and the coupling structures 205 on the upper surface of the third substrate 110C are thus disposed over the entire surface of the chips in association with the position at which the logic circuit or the memory circuit is mounted, as illustrated in FIG. 2B.

Each of FIGS. 2C and 2D is a diagram for describing another example of the disposition of the coupling structures of the solid-state imaging device 1 in the horizontal plane. FIGS. 2C and 2D each illustrate the disposition of coupling structures in a case where, for example, the solid-state imaging device 1 is configured to be able to execute pixel ADC. In this case, a pixel signal processing circuit is mounted on not the first substrate 110A, but the second substrate 110B.

Similarly to FIG. 2A, FIG. 2C schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line or a dotted line in a simulated manner, and electrical coupling between the lower surface (surface opposed to the third substrate 110C) of the second substrate 110B and the upper surface (surface opposed to the second substrate 110B) of the third substrate 110C through coupling structures is indicated by a solid line in a simulated manner. Among the lines indicating electrical coupling between the lower surface of the first substrate 110A and the upper surface of the second substrate 110B, a broken line indicates electrical coupling related to an I/O unit, for example, which also exists in FIG. 2A, and a dotted line indicates electrical coupling related to pixel ADC, which does not exist in FIG. 2A.

Similarly to FIG. 2B, FIG. 2D schematically illustrates the positions of coupling structures 202 on the lower surface of the first substrate 110A, the positions of coupling structures 203 on the upper surface of the second substrate 110B, the positions of coupling structures 204 on the lower surface of the second substrate 110B, and the positions of coupling structures 205 on the upper surface of the third substrate 110C. Note that FIG. 2D illustrates the coupling structures 202 to 205 in accordance with the forms of straight lines indicating electrical coupling illustrated in FIG. 2C. That is, among the coupling structures 202 on the lower surface of the first substrate 110A and the coupling structures 203 on the upper surface of the second substrate 110B, those that correspond to, for example, electrical coupling related to I/O units, which also exists in FIG. 2A, are indicated by broken lines, and those that may correspond to electrical coupling related to pixel ADC are indicated by dotted lines. In contrast, the coupling structures 204 on the lower surface of the second substrate 110B and the coupling structures 205 on the upper surface of the third substrate 110C are indicated by solid lines.

As described above, in the illustrated configuration example, a pixel signal processing circuit is mounted on the second substrate 110B, and the pixel signal processing circuit is configured to be able to perform pixel ADC. That is, a pixel signal acquired by each pixel of the pixel unit 206 is transmitted to the pixel signal processing circuit mounted on the second substrate 110B directly below for each pixel, and the pixel signal processing circuit performs processing such as AD conversion. As illustrated in FIGS. 2C and 2D, in the configuration example, the coupling structures 202 on the lower surface of the first substrate 110A are thus disposed along the outer periphery of the chip (coupling structures 202 indicated by the broken lines in the diagram) in association with the regions where the I/O units exist in order to transmit signals from the I/O units to a circuit included in the second substrate 110B, and are disposed over the entire region where the pixel unit 206 exists (coupling structures 202 indicated by the dotted lines in the diagram) in order to transmit a pixel signal from each pixel of the pixel unit 206 to the circuit included in the second substrate 110B.

The respective signal lines included in the second substrate 110B and the third substrate 110C are electrically coupled to each other, and the respective power supply lines included in the second substrate 110B and the third substrate 110C are electrically coupled to each other similarly to the configuration example illustrated in FIGS. 2A and 2B. As illustrated in FIGS. 2C and 2D, the coupling structures 204 on the lower surface of the second substrate 110B and the coupling structures 205 on the upper surface of the third substrate 110C are thus disposed over the entire surfaces of the chips.

Each of FIGS. 2E and 2F is a diagram for describing still another example of the disposition of the coupling structures of the solid-state imaging device 1 in the horizontal plane. FIGS. 2E and 2F each illustrate the disposition of coupling structures in a case where, for example, a memory circuit is mounted on the second substrate 110B.

Similarly to FIG. 2A, FIG. 2E schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line or a dotted line in a simulated manner, and electrical coupling between the lower surface (surface opposed to the third substrate 110C) of the second substrate 110B and the upper surface (surface opposed to the second substrate 110B) of the third substrate 110C through coupling structures is indicated by a solid line or a dotted line in a simulated manner. Among the lines indicating electrical coupling between the lower surface of the first substrate 110A and the upper surface of the second substrate 110B, a broken line indicates electrical coupling related to an I/O unit, for example, which also exists in FIG. 2A, and a dotted line indicates electrical coupling related to a memory circuit, which does not exist in FIG. 2A. In addition, among the lines indicating electrical coupling between the lower surface of the second substrate 110B and the upper surface of the third substrate 110C, the solid lines indicate electrical coupling, which also exists in FIG. 2A, related to signals that are not directly related to an operation of a memory circuit, for example, and the dotted lines indicate electrical coupling, which does not exist in FIG. 2A, related to a memory circuit.

Similarly to FIG. 2B, FIG. 2F schematically illustrates the positions of coupling structures 202 on the lower surface of the first substrate 110A, the positions of coupling structures 203 on the upper surface of the second substrate 110B, the positions of coupling structures 204 on the lower surface of the second substrate 110B, and the positions of coupling structures 205 on the upper surface of the third substrate 110C. Note that FIG. 2F illustrates the coupling structures 202 to 205 in accordance with the forms of straight lines indicating electrical coupling illustrated in FIG. 2E. That is, among the coupling structures 202 on the lower surface of the first substrate 110A and the coupling structures 203 on the upper surface of the second substrate 110B, those that correspond to, for example, electrical coupling related to I/O units, which also exists in FIG. 2A, are indicated by broken lines, and those that may correspond to electrical coupling related to a memory circuit are indicated by dotted lines. In addition, among the coupling structures 204 on the lower surface of the second substrate 110B and the coupling structures 205 on the upper surface of the third substrate 110C, those that correspond to electrical coupling, which also exists in FIG. 2A, related to signals that are not directly related to an operation of a memory circuit, for example, are indicated by solid lines, and those that may correspond to electrical coupling related to a memory circuit are indicated by dotted lines.

As described above, in the illustrated configuration example, a memory circuit is mounted on the second substrate 110B. In this case, a pixel signal processing circuit is mounted on the first substrate 110A, and a pixel signal acquired by the pixel unit 206 and subjected to AD conversion by the pixel signal processing circuit of the first substrate 110A may be transmitted to the memory circuit of the second substrate 110B and held in the memory circuit. To read out the pixel signal held in the memory circuit of the second substrate 110B, for example, to the outside, signals are then transmitted between the memory circuit of the second substrate 110B and a logic circuit of the third substrate 110C.

Therefore, in the configuration example, as the coupling structures 202 on the lower surface of the first substrate 110A, the coupling structures 202 are disposed along the outer periphery of the chip (coupling structures 202 indicated by the broken lines in the diagram) in association with the regions where I/O units and pixel signal processing circuits are mounted in order to transmit signals from the I/O units and the pixel signal processing circuits to the second substrate 110B, and the coupling structures 202 are disposed (coupling structures 202 indicated by the dotted lines in the diagram) for transmitting the pixel signals subjected to AD conversion to a memory circuit of the second substrate 110B. At this time, in order to equalize the delay times, it is desirable that wiring lengths of transmission paths of the pixel signals from a circuit of the first substrate 110A to the memory circuit of the second substrate 110B and wiring lengths of transmission paths of the signals between the memory circuit of the second substrate 110B and a logic circuit of the third substrate 110C be each equal as much as possible. Thus, for example, as illustrated in FIG. 2F, the coupling structures 202 to 205 for exchanging signals between the circuit of the first substrate 110A and the memory circuit of the second substrate 110B and between the memory circuit of the second substrate 110B and a circuit of the third substrate 110C may be provided to concentrate in the vicinity of the middle of the horizontal plane. However, as long as it is possible to make the wiring lengths substantially uniform, the coupling structures 202 to 205 do not necessarily have to be provided in the vicinity of the middle of the horizontal plane as in the illustrated example.

Several examples of the disposition of coupling structures of the solid-state imaging device 1 in the horizontal plane have been described above. Note that the present embodiment is not limited to the examples described above. Components mounted on the respective substrates of the solid-state imaging device 1 may be determined as appropriate, and the disposition of coupling structures of the solid-state imaging device 1 in the horizontal plane may also be determined as appropriate in accordance with the components. As components mounted on each substrate and the corresponding disposition of coupling structures in the horizontal plane, various known components and disposition may be applied. In addition, in the examples illustrated in FIGS. 2A, 2B, 2C, 2D, 2E, and 2F, the coupling structures 201 included in I/O units are disposed along three sides of the outer periphery of the chip, but the present embodiment is not limited to the examples. Various known disposition may also be applied as the disposition of I/O units. For example, the coupling structures 201 included in I/O units may be disposed along one side, two sides, or four sides of the outer periphery of the chip.

3. Direction of Second Substrate

In the configuration example illustrated in FIG. 1, in the solid-state imaging device 1, the first substrate 110A and the second substrate 110B are bonded together F-to-F (that is, the front surface side of the second substrate 110B is directed toward the first substrate 110A). Meanwhile, the solid-state imaging device 1 may include the first substrate 110A and the second substrate 110B that are bonded together F-to-B (that is, the front surface side of the second substrate 110B may be directed toward the third substrate 110C).

The direction of the second substrate 110B may be determined as appropriate to improve the performance of the entire solid-state imaging device 1 by considering, for example, the configuration, performance, and the like of each of the substrates (each of the chips). Here, two concepts for determining the direction of the second substrate 110B are described as an example.

3-1. Consideration Based on PWELL Area

FIG. 3A is a vertical cross-sectional view of a schematic configuration of the solid-state imaging device 1 in which the first substrate 110A and the second substrate 110B are bonded together F-to-F, similarly to the configuration example illustrated in FIG. 1. FIG. 3B is a vertical cross-sectional view of a schematic configuration of a solid-state imaging device 1a in which the first substrate 110A and the second substrate 110B are bonded together F-to-B, unlike the configuration example illustrated in FIG. 1. The configuration of the solid-state imaging device 1a is similar to that of the solid-state imaging device 1 illustrated in FIG. 1 except that the direction of the second substrate 110B is reversed.

In FIG. 3A and FIG. 3B, functions of the wiring lines (the signal line, the GND wiring lines, or the power supply wiring lines) included in the multi-layered wiring layers 105, 125, and 135 are represented by superimposing different kinds of hatching on these wiring lines (that is, hatching of the wiring lines illustrated in FIGS. 3A and 3B is expressed by superimposing hatching representing the functions of the wiring lines illustrated in legends in FIGS. 3A and 3B on hatching of the respective wiring lines illustrated in FIG. 1 (the same applies to FIG. 4A and FIG. 4B to be described later)). As illustrated, in the solid-state imaging devices 1 and 1a, terminals (corresponding to the pads 151 described above) for drawing out signal lines, the GND wiring lines, and the power supply wiring lines to the outside are provided along the outer periphery of the chip. These respective terminals are provided in pairs at positions sandwiching the pixel unit 206 in the horizontal plane. Therefore, inside the solid-state imaging devices 1 and 1a, the signal lines, the GND wiring lines, and the power supply wiring lines extend to couple these terminals to each other, and spread in the horizontal plane.

In FIGS. 3A and 3B, "P" is attached to PWELLs, and "N" is attached to NWELLs provided to the first substrate 110A, the second substrate 110B, and the third substrate 110C. For example, in the illustrated configuration, the PDs included in the respective pixels of the pixel unit are PDs in which N-type diffused regions are formed in the PWELLs in order to read out an electron generated resulting from photoelectric conversion, and a transistor of a drive circuit included in each pixel in order to read out an electron generated in the PD is an N-type MOS transistor. Therefore, WELLs of the pixel unit are PWELLs. In contrast, a logic circuit and a memory circuit provided to the second substrate 110B and the third substrate 110C include CMOS circuits, and PMOSs and NMOSs are thus mixed. Accordingly, PWELLs and NWELLs exist that are substantially the same in area, for example. Therefore, in the illustrated configuration example, the first substrate 110A has a larger PWELL area than the second substrate 110B and the third substrate 110C.

Here, in the solid-state imaging devices 1 and 1a, a GND potential may be imparted to a PWELL. Any configuration in which a PWELL and a power supply wiring line are opposed to each other with an insulator interposed therebetween causes parasitic capacitance to be formed therebetween.

The parasitic capacitance formed between a PWELL and a power supply wiring line is described with reference to FIGS. 4A and 4B. FIG. 4A is a diagram for describing the parasitic capacitance between the PWELL and the power supply wiring line in the solid-state imaging device 1 illustrated in FIG. 3A. In FIG. 4A, the parasitic capacitance between the PWELL and the power supply wiring line is represented by a two-dot chain line in a simulated manner with respect to the solid-state imaging device 1 illustrated in FIG. 3A. As illustrated in FIG. 4A, in the solid-state imaging device 1, the first substrate 110A and the second substrate 110B are bonded together F-to-F. The PWELLs of the pixel unit of the first substrate 110A and the power supply wiring lines in the multi-layered wiring layer 125 of the second substrate 110B are therefore opposed to each other with insulators interposed therebetween, as illustrated in the diagram. The insulators are included in the insulating films 103 and 123. This may cause parasitic capacitance to be formed therebetween in a corresponding region.

Meanwhile, FIG. 4B is a diagram for describing the parasitic capacitance between a PWELL and a power supply wiring line in the solid-state imaging device 1a illustrated in FIG. 3B. In FIG. 4B, the parasitic capacitance between the PWELL and the power supply wiring line is represented by a two-dot chain line in a simulated manner with respect to the solid-state imaging device 1a illustrated in FIG. 3B. As illustrated in FIG. 4B, in the solid-state imaging device 1a, the second substrate 110B and the third substrate 110C are bonded together F-to-F. The PWELLs of the logic circuit or memory circuit of the third substrate 110C and the power supply wiring lines in the multi-layered wiring layer 125 of the second substrate 110B are therefore opposed to each other with insulators interposed therebetween. The insulators are included in the insulating films 123 and 133. This may cause parasitic capacitance to be formed therebetween in a corresponding region.

The parasitic capacitance described above is considered to increase as the PWELL area increases. This causes larger parasitic capacitance in the configuration illustrated in FIG. 4A in which the first substrate 110A and the second substrate 110B are bonded together F-to-F than in the configuration illustrated in FIG. 4B in which the first substrate 110A and the second substrate 110B are bonded together F-to-B among the configuration examples illustrated in FIGS. 4A and 4B.

If the parasitic capacitance related to the power supply wiring lines in the second substrate 110B is large, the impedance of the current paths between the power supply and the GND in the second substrate 110B is decreased. It is thus possible to further stabilize the power supply system in the second substrate 110B. Specifically, for example, even in a case where the power consumption fluctuates in accordance with fluctuations in the operation of the circuits on the second substrate 110B, fluctuations in the power supply levels caused by the fluctuations in the power consumption may be suppressed. Even in a case where the circuits related to the second substrate 110B are operated at high speed, it is thus possible to further stabilize the operation, and improve the performance of the entire solid-state imaging device 1.

In this way, when PWELL area is brought into focus, in the configuration examples illustrated in FIGS. 3A, 3B, 4A, and 4B, the solid-state imaging device 1 in which the first substrate 110A and the second substrate 110B are bonded together F-to-F forms larger parasitic capacitance with respect to the power supply wiring lines of the second substrate 110B than the solid-state imaging device 1a in which the first substrate 110A and the second substrate 110B are bonded together F-to-B does, making it possible to achieve higher stability at the time of high-speed operation. That is, it is possible to say that the solid-state imaging device 1 has a more preferable configuration.

Some designs of the respective substrates may, however, cause the third substrate 110C to have a larger PWELL area than that of the first substrate 110A. In this case, the configuration of the solid-state imaging device 1a in which larger parasitic capacitance is formed between the power supply wiring lines of the second substrate 110B and the PWELLs of the third substrate 110C is considered to make it possible to obtain higher stability at the time of high-speed operation than the solid-state imaging device 1 does.

In summary, when considering the direction of the second substrate 110B on the basis of the PWELL area, it is preferable that the solid-state imaging device 1 be configured in a manner that the front surface side of the second substrate 110B is directed toward the first substrate 110A in a case where the PWELL area of the first substrate 110A is larger than the PWELL area of the third substrate 110C. That is, it is preferable that the solid-state imaging device 1 be configured in a manner that the first substrate 110A and the second substrate 110B are bonded together F-to-F. Conversely, it is preferable that the solid-state imaging device 1a be configured in a manner that the front surface side of the second substrate 110B is directed toward the third substrate 110C in a case where the PWELL area of the third substrate 110C is larger than the PWELL area of the first substrate 110A. That is, it is preferable that the solid-state imaging device 1a be configured in a manner that the first substrate 110A and the second substrate 110B are bonded together F-to-B.

In the present embodiment, the direction of the second substrate 110B may be determined from such a viewpoint based on PWELL area. The solid-state imaging devices 1 to 11e according to the present embodiment illustrated in FIG. 1 and FIGS. 6A, 6B, 7A, 7B, 7C, 7D, 7E, 7F, 8A, 8B, 8C, 8D, 9A, 9B, 9C, 9D, 9E, 9F, 10A, 10B, 10C, 10D, 11A, 11B, 11C, 12A, 12B, 12C, 12D, 12E, 12F, 12G, 13A, 13B, 13C, 13D, 13F, 14A, 14B, 14C, 14D, 14E, 14F, 15A, 15B, 15C, 15D, and 15E described below are each configured, for example, to have the PWELL area of the first substrate 110A larger than the PWELL area of the third substrate 110C, and have the first substrate 110A and the second substrate 110B accordingly bonded together F-to-F. The solid-state imaging devices 1 to 11e thus make it possible to obtain high operation stability even at the time of high-speed operation.

Note that examples of a case where the PWELL area of the first substrate 110A is larger than the PWELL area of the third substrate 110C include a case where only a pixel unit including, in a PWELL, a PD for reading out an electron generated resulting from photoelectric conversion and an NMOS transistor for reading out an electron from the PD is mounted on the first substrate 110A, and various circuits (such as a pixel signal processing circuit, a logic circuit, and a memory circuit) are mounted on the second substrate 110B and the third substrate 110C. Meanwhile, examples of a case in which the PWELL area of the third substrate 110C is larger than the PWELL area of the first substrate 110A include a case in which a pixel unit and various circuits are mounted together on the first substrate 110A and the area of the first substrate 110A occupied by the various circuits is relatively large.

3-2. Consideration Based on Power Consumption and Disposition of GND Wiring Lines The above focuses on PWELL area for the solid-state imaging device 1 illustrated in FIG. 3A and the solid-state imaging device 1a illustrated in FIG. 3B, but power consumption and the disposition of GND wiring lines in each substrate are now brought into focus.

FIG. 5A is a diagram schematically illustrating the disposition of power supply wiring lines and GND wiring lines in the solid-state imaging device 1 illustrated in FIG. 3A. FIG. 5B is a diagram schematically illustrating the disposition of power supply wiring lines and GND wiring lines in the solid-state imaging device 1a illustrated in FIG. 3B. FIGS. 5A and 5B simply illustrate the structures of the solid-state imaging devices 1 and 1a, and represent the schematic disposition of power supply wiring lines and GND wiring lines by illustrating the power supply wiring lines by two-dot chain lines and illustrating the GND wiring lines by one-dot chain lines. In addition, the size of the arrows in the diagrams represents the amount of currents flowing through the power supply wiring lines and the GND wiring lines in a simulated manner.

It is possible as illustrated in FIGS. 5A and 5B to consider that the power supply wiring lines mainly include vertical power supply wiring lines 303 extending in the z-axis direction from power supply terminals (VCCs) provided to the upper surface of the first substrate 110A (i.e., upper surfaces of the solid-state imaging devices 1 and 1a), and horizontal power supply wiring lines 304 extending in the horizontal direction in the multi-layered wiring layer 105 of the first substrate 110A, the multi-layered wiring layer 125 of the second substrate 110B, and the multi-layered wiring layer 135 of the third substrate 110C. The following also refers collectively to the vertical power supply wiring lines 303 and the horizontal power supply wiring lines 304 as power supply wiring lines 303 and 304. Note that the horizontal power supply wiring lines 304 may also exist actually in the multi-layered wiring layer 105 of the first substrate 110A and the multi-layered wiring layer 125 of the second substrate 110B, but are not illustrated in FIGS. 5A and 5B for the sake of simplicity. FIGS. 5A and 5B each illustrate only the horizontal power supply wiring line 304 in the multi-layered wiring layer 135 of the third substrate 110C.

In addition, it is possible to consider that the GND wiring lines mainly include vertical GND wiring lines 305 extending in the z-axis direction from GND terminals provided to the upper surface of the first substrate 110A, and horizontal GND wiring lines 306 extending in the horizontal direction in the multi-layered wiring layer 105 of the first substrate 110A, the multi-layered wiring layer 125 of the second substrate 110B, and the multi-layered wiring layer 135 of the third substrate 110C. The following also refers collectively to the vertical GND wiring lines 305 and the horizontal GND wiring lines 306 as GND wiring lines 305 and 306. Note that the horizontal GND wiring line 306 of the first substrate 110A is also referred to as horizontal GND wiring line 306a, the horizontal GND wiring line 306 of the second substrate 110B is also referred to as horizontal GND wiring line 306b, and the horizontal GND wiring line 306 of the third substrate 110C is also referred to as horizontal GND wiring line 306c to distinguish them.

Here, a case where the power consumption of the third substrate 110C is greater than the power consumption of the first substrate 110A is examined as an example. For example, it is assumed that the third substrate 110C is a logic substrate. The logic circuit is divided into a plurality of circuit blocks, and the circuit blocks that operate may change depending on processing content. That is, during a series of operations in the solid-state imaging devices 1 and 1a, the locations of the logic circuit that mainly operate may change. Therefore, the locations of the logic circuit through which the power supply currents flow are biased (e.g., the power supply currents are generated due to the charging and discharging of the transistor gate capacitance and the wiring capacitance associated with the operation of the circuit), and moreover the locations may change.

As illustrated in FIGS. 5A and 5B, two circuit blocks 301 and 302 in the logic circuit of the third substrate 110C are now brought into focus. When these two circuit blocks 301 and 302 operate, the current path is formed that passes by the power supply terminal, the power supply wiring lines 303 and 304, the circuit blocks 301 and 302, the GND wiring lines 305 and 306, and the GND terminal.

Here, it is assumed that the power consumption of the circuit block 301 at certain timing is greater than that of the circuit block 302. In this case, as illustrated in FIGS. 5A and 5B, more currents are supplied at this timing from the power supply wiring lines 303 and 304 to the circuit block 301 than to the circuit block 302. This difference in power consumption causes the vertical GND wiring line 305 (that is also referred to as vertical GND wiring line 305a to distinguish the vertical GND wiring lines 305) near the circuit block 301 to have a larger amount of currents flowing to the vertical GND wiring line 305 through the circuit blocks 301 and 302 than that of the vertical GND wiring line 305 (that is also referred to as vertical GND wiring 305b to distinguish the vertical GND wiring lines 305) near the circuit block 302.

The first substrate 110A and the second substrate 110B include the horizontal GND wiring lines 306a and 306b, and the imbalance of the amount of currents between the vertical GND wiring lines 305a and 305b is thus corrected by the horizontal GND wiring lines 306a and 306b of the first substrate 110A and the second substrate 110B on the way to the GND terminals on the upper surface of the first substrate 110A. That is, currents flow to the horizontal GND wiring lines 306a and 306b of the first substrate 110A and the second substrate 110B to correct the imbalance of the amount of currents between the vertical GND wiring lines 305a and 305b. Accordingly, as illustrated by the solid-line arrows in each of FIGS. 5A and 5B, a loop-shaped current path passing by the horizontal power supply wiring line 304, the circuit blocks 301 and 302, the horizontal GND wiring line 306c, the vertical GND wiring line 305a, and the horizontal GND wiring lines 306a and 306b is formed in each of the solid-state imaging devices 1 and 1a.

At this time, as illustrated in FIG. 5A, in the solid-state imaging device 1 in which the first substrate 110A and the second substrate 110B are bonded together F-to-F, the horizontal GND wiring lines 306a and 306b of the first substrate 110A and the second substrate 110B are both disposed relatively far from the horizontal power supply wiring line 304 of the third substrate 110C. Therefore, in the loop-shaped current path described above, the opening width of the loop is increased. This increases the inductance of the loop-shaped current path. That is, the impedance becomes high. The stability of the power supply currents may be thus decreased, and the performance of the entire solid-state imaging device 1 may be decreased.

Meanwhile, as illustrated in FIG. 5B, in the solid-state imaging device 1a in which the first substrate 110A and the second substrate 110B are bonded together F-to-B, the horizontal GND wiring line 306a of the first substrate 110A is disposed relatively far from the horizontal power supply wiring line 304 of the third substrate 110C, but the horizontal GND wiring line 306b of the second substrate 110B is disposed relatively close to the horizontal power supply wiring line 304 of the third substrate 110C. Therefore, in the loop-shaped current path described above, the opening width of the loop is decreased. This decreases the inductance of the loop-shaped current path. That is, the impedance becomes low. It is thus possible to further stabilize the power supply currents, and further improve the performance of the entire solid-state imaging device 1.

In this way, when the power consumption and the disposition of GND wiring lines are brought into focus, the solid-state imaging device 1a in which the first substrate 110A and the second substrate 110B are bonded together F-to-B is considered to achieve a more stable operation than the solid-state imaging device 1 in which the first substrate 110A and the second substrate 110B are bonded together F-to-F does in a case where the power consumption of the third substrate 110C is greater than the power consumption of the first substrate 110A. The solid-state imaging device 1a allows the horizontal GND wiring line 306b of the second substrate 110B to be disposed closer to the horizontal power supply wiring line 304 of the third substrate 110C. That is, it is possible to say that the solid-state imaging device 1a has a more preferable configuration.

Some designs of the respective substrates may, however, cause the first substrate 110A to consume more power than the third substrate 110C does. In this case, a more stable operation is considered expectable from the configuration of the solid-state imaging device 1 that allows the distance to be decreased between the horizontal power supply wiring line of the first substrate 110A and the horizontal GND wiring line 306b of the second substrate 110B rather than the solid-state imaging device 1a.

In summary, when considering the direction of the second substrate 110B on the basis of the power consumption and the disposition of the GND wiring lines, it is preferable that the solid-state imaging device 1 be configured in a manner that the front surface side of the second substrate 110B is directed toward the first substrate 110A in a case where the power consumption of the first substrate 110A is greater than the power consumption of the third substrate 110C. That is, it is preferable that the solid-state imaging device 1 be configured in a manner that the first substrate 110A and the second substrate 110B are bonded together F-to-F. Conversely, it is preferable that the solid-state imaging device 1a be configured in a manner that the front surface side of the second substrate 110B is directed toward the third substrate 110C in a case where the power consumption of the third substrate 110C is greater than the power consumption of the first substrate 110A. That is, it is preferable that the solid-state imaging device 1a be configured in a manner that the first substrate 110A and the second substrate 110B are bonded together F-to-B.

In the present embodiment, the direction of the second substrate 110B may be determined from such a viewpoint based on the power consumption and the disposition of GND wiring lines. The solid-state imaging devices 1 to 11e according to the present embodiment illustrated in FIG. 1 and FIGS. 6A, 6B, 7A, 7B, 7C, 7D, 7E, 7F, 8A, 8B, 8C, 8D, 9A, 9B, 9C, 9D, 9E, 9F, 10A, 10B, 10C, 10D, 11A, 11B, 11C, 12A, 12B, 12C, 12D, 12E, 12F, 12G, 13A, 13B, 13C, 13D, 13E, 13F, 14A, 14B, 14C, 14D, 14E, 14F, 15A, 15B, 15C, 15D, and 15E described below are each configured, for example, to have the power consumption of the first substrate 110A greater than the power consumption of the third substrate 110C, and have the first substrate 110A and the second substrate 110B accordingly bonded together F-to-F. The solid-state imaging devices 1 to 11e may thus achieve a more stable operation.

Note that examples of a case where the power consumption of the third substrate 110C is greater than the power consumption of the first substrate 110A include a case where only a pixel unit is mounted on the first substrate 110A and many circuits (such as a pixel signal processing circuit, a logic circuit, and a memory circuit, for example) are mounted on the second substrate 110B and the third substrate 110C. Specific examples of such a configuration include a configuration in which only a pixel unit is mounted on the first substrate 110A, a pixel signal processing circuit and a memory circuit are mounted on the second substrate 110B, and a logic circuit is mounted on the third substrate 110C. At this time, a digital circuit (such as a digital circuit that, for example, generates a reference voltage for AD conversion) in the pixel signal processing circuit may be mounted on the third substrate 110C. Alternatively, in a case where a memory circuit that is more frequently accessed (e.g., memory circuit into or from which pixel signals are written or read out a plurality of times per frame) is mounted on the third substrate 110C, the third substrate 110C is considered to consume more power.

Meanwhile, examples of a case in which the power consumption of the first substrate 110A is greater than the power consumption of the third substrate 110C include a case in which a pixel unit and various circuits are mounted together on the first substrate 110A and the area of the first substrate 110A occupied by the various circuits is relatively large. Alternatively, in a case where a memory circuit that is less frequently accessed (e.g., memory circuit into or from which pixel signals are written or read out only once per frame) is mounted on the third substrate 110C, the third substrate 110C is considered to consume less power and the first substrate 110A is considered to relatively consume more power.

Note that, when the power consumption of the first substrate 110A and the power consumption of the third substrate 110C are compared with each other, the power consumption itself may be compared, or other indices that may represent the magnitude of the power consumption may be compared. Examples of the other indices include the number of gates (e.g., 100 gates and 1M gates) mounted on the circuits of each substrate, the operating frequencies (e.g., 100 MHz and 1 GHz) of the circuits of each substrate, and the like.

Here, as a method of decreasing impedance in the loop-shaped current path in the solid-state imaging device 1 illustrated in FIG. 5A in which the first substrate 110A and the second substrate 110B are bonded together F-to-F, a method of coupling the horizontal GND wiring line 306a of the first substrate 110A and the horizontal GND wiring line 306b of the second substrate 110B to each other by using a plurality of wiring lines (i.e., vertical GND wiring lines) extending in the z-axis direction is considered as illustrated in FIG. 5C. FIG. 5C is a diagram illustrating a configuration example for decreasing impedance in the solid-state imaging device 1 illustrated in FIG. 5A. Note that a solid-state imaging device 1b illustrated in FIG. 5C corresponds to the solid-state imaging device 1 illustrated in FIG. 5A in which the horizontal GND wiring line 306a of the first substrate 110A and the horizontal GND wiring line 306b of the second substrate 110B are coupled to each other by using a plurality of vertical GND wiring lines, and the other components are similar to those of the solid-state imaging device 1.

Adopting the configuration illustrated in FIG. 5C strengthens the horizontal GND wiring lines 306a and 306b, and allows the impedance to be decreased in the loop-shaped current path. It is thus considered possible to further improve the performance of the entire solid-state imaging device 1b. Note that FIG. 5C illustrates, as an example, a configuration that may allow the impedance of the loop-shaped current path to be decreased in a case where the power consumption of the third substrate 110C is greater than the power consumption of the first substrate 110A, and the first substrate 110A and the second substrate 110B are bonded together F-to-F. Meanwhile, it is sufficient if the horizontal GND wiring line 306b of the second substrate 110B and the horizontal GND wiring line 306c of the third substrate 110C are coupled to each other by using a plurality of vertical GND wiring lines in order to decrease the impedance of the loop-shaped current path in a case where the power consumption of the first substrate 110A is greater than the power consumption of the third substrate 110C, and the first substrate 110A and the second substrate 110B are bonded together F-to-B.

However, to achieve the configuration illustrated in FIG. 5C, the multi-layered wiring layer 105 of the first substrate 110A and the multi-layered wiring layer 125 of the second substrate 110B have to be provided with coupling structures for coupling the GND wiring lines thereof to each other. This imposes a constraint that takes into consideration the coupling structures to be provided on the disposition of the GND wiring lines and the disposition of the other wiring lines in the multi-layered wiring layers 105 and 125. Specifically, in the configuration illustrated in FIG. 5C, in the first substrate 110A and the second substrate 110B, the vertical GND wiring lines and the coupling structures for coupling the vertical GND wiring lines between the substrates to each other are distributed not only in outer peripheral portions of the chips, but also more in middle portions of the chips in the horizontal plane. The respective wiring lines thus have to be disposed by taking this distribution into consideration. That is, the degree of flexibility in designing the respective wiring lines in the multi-layered wiring layers 105 and 125 is decreased.

In contrast, as described above, in the present embodiment, the impedance of the loop-shaped current path is decreased by adjusting the direction of the second substrate 110B. This makes it possible, unlike the configuration illustrated in FIG. 5C, to dispose vertical GND wiring lines to distribute more vertical GND wiring lines in the outer peripheral portions of the chips in the horizontal plane. It is thus possible to decrease the impedance in the current path without decreasing the degree of flexibility in designing the wiring lines in the multi-layered wiring layers 105 and 125. That is, it is possible to stabilize the operations of the solid-state imaging devices 1 and 1*a*.

Note that it is possible to determine the density of the vertical GND wiring lines disposed in the outer peripheral portions of the chips and in the middle portions of the chips in the horizontal plane, for example, as follows. For example, in a case where the number of vertical GND wiring lines existing in the one middle region of nine regions obtained by equally dividing a chip as a 3×3 region in the horizontal plane is larger than the number of vertical GND wiring lines existing in the eight peripheral regions, it is possible to determine that the number of vertical GND wiring lines in the middle portion of the chip is large (i.e., it is possible to determine that the configuration of the solid-state imaging device 1*b* illustrated in FIG. 5C may be possibly applied). In contrast, in a case where the number of vertical GND wiring lines existing in the one middle region is smaller than the number of vertical GND wiring lines existing in the eight peripheral regions, it is possible to determine that the number of vertical GND wiring lines in the outer peripheral portion of the chip is large (i.e., it is possible to determine that the configurations of the solid-state imaging devices 1 and 1*a* illustrated in FIGS. 5A and 5B may be possibly applied).

Here, as an example, a case where a chip is equally divided into nine regions in the horizontal plane has been described, but the number of regions obtained by dividing a chip is not limited to the example. The number of regions obtained by dividing a chip may be changed as appropriate into the 16 regions of a 4×4 region, the 25 regions of a 5×5 region, or the like. It is sufficient if, for example, in a case where a chip is divided into 16 regions as a 4×4 region, the density is determined from the number of vertical GND wiring lines in the four middle regions and the 12 peripheral regions. Alternatively, it is sufficient if, in a case where a chip is divided into 25 regions as a 5×5 region, the density is determined from the number of vertical GND wiring lines in the one middle region and the 24 peripheral regions, or in the nine middle regions and the 16 peripheral regions.

4. Variations of Configuration of Solid-State Imaging Device

The configuration of the solid-state imaging device 1 is an example of the solid-state imaging device according to the present embodiment. The solid-state imaging device according to the present embodiment may have a coupling structure different from those illustrated in FIG. 1. Herein, description is given of other configuration examples having different coupling structures of the solid-state imaging device according to the present embodiment. Note that the components of the respective solid-state imaging devices described below correspond to the components of the solid-state imaging device 1 illustrated in FIG. 1 in which a portion of the components is changed. The components that have already been described with reference to FIG. 1 are not thus described in detail. In addition, each of the diagrams illustrating a schematic configuration of each solid-state imaging device described below does not have a portion of the reference numerals attached in FIG. 1 in order to avoid complicating the diagram. In addition, FIG. 1 and each of the subsequent diagrams illustrate that members having the same type of hatching include the same material.

Here, the solid-state imaging device according to the present embodiment is classified into 10 categories (a first configuration example to a tenth configuration example).

The solid-state imaging device according to the present embodiment has, in any of configurations, a characteristic that a "coupling structure for electrically coupling the respective signal lines included in the first substrate 110A and the second substrate 110B to each other and electrically coupling the respective power supply lines included in the first substrate 110A and the second substrate 110B to each other" does not exist, or does not include a "coupling structure formed from the first substrate as a base over bonding surfaces of the first substrate 110A and the second substrate 110B". Here, the coupling structure formed from the first substrate 110A as a base refers to a coupling structure formed by forming an opening from the back surface side or the front surface side of the first substrate 110A. In addition, the "coupling structure over the bonding surfaces of the first substrate 110A and the second substrate 110B" refers to a coupling structure that exists over the bonding surfaces, and electrically couples the respective signal lines included in the first substrate 110A and the second substrate 110B to each other directly (i.e. not through the I/O unit) and electrically couples the respective power supply lines included in the first substrate 110A and the second substrate 110B to each other directly. Examples of the coupling structure over the bonding surfaces of the first substrate 110A and the second substrate 110B may include the TSV 157 to be described later and the electrode junction structure 159 to be described later. In other words, in the respective configuration examples to be described later, "the coupling structure for electrically coupling the respective signal lines included in the first substrate 110A and the second substrate 110B to each other and electrically coupling the respective power supply lines included in the first substrate 110A and the second substrate 110B to each other does not include the coupling structure formed from the first substrate as a base over bonding surfaces of the first substrate 110A and the second substrate 110B" may mean that the TSV 157 formed from the back surface side of the first substrate 110A, and the electrode junction structure 159 are not provided to the first substrate 110A.

Meanwhile, in the solid-state imaging device, it is necessary to electrically couple the respective signal lines included in the first substrate 110A, the second substrate 110B, and the third substrate 110C to each other and electrically couple the respective power supply lines included in the first substrate 110A, the second substrate 110B, and the third substrate 110C to each other. Accordingly, the solid-state imaging device according to the present embodiment may have the following configurations, for example.

A coupling structure for electrically coupling the respective signal lines included in the first substrate 110A and the second substrate 110B to each other and electrically coupling the respective power supply lines included in the first substrate 110A and the second substrate 110B to each other does not exist, and a coupling structure for electrically coupling the respective signal lines included in the first substrate 110A and the third substrate 110C to each other and electrically coupling the respective power supply lines included in the first substrate 110A and the third substrate 110C to each other, and a coupling structure for electrically coupling the respective signal lines included in the second substrate 110B and the third substrate 110C each other and electrically coupling the respective power supply lines included in the second substrate 110B and the third substrate 110C to each other exist.

As the coupling structure for electrically coupling the respective signal lines included in the first substrate 110A and the second substrate 110B to each other and electrically coupling the respective power supply lines included in the first substrate 110A and the second substrate 110B to each other, the pad 151 is provided to the first substrate 110A and the second substrate 110B (i.e., electrical coupling between the respective signal lines included in the first substrate 110A and the second substrate 110B and between the respective power supply lines included in the first substrate 110A and the second substrate 110B is achieved through the I/O units), and in addition, a coupling structure for electrically coupling the respective signal lines included in the first substrate 110A and the third substrate 110C to each other and electrically coupling the respective power supply lines included in the first substrate 110A and the third substrate 110C to each other and a coupling structure for electrically coupling the respective signal lines included in the second substrate 110B and the third substrate 110C to each other and electrically coupling the respective power supply lines included in the second substrate 110B and the third substrate 110C to each other exist. For example, the solid-state imaging device 1 illustrated in FIG. 1 has such a configuration.

As the coupling structure for electrically coupling the respective signal lines included in the first substrate 110A and the second substrate 110B to each other and electrically coupling the respective power supply lines included in the first substrate 110A and the second substrate 110B to each other, the TSV 157 formed from the third substrate 110C (i.e., formed from the back surface side of the third substrate 110C) (the twin contact type or shared contact type three-layer TSV 157) is provided, and in addition, a coupling structure for electrically coupling the respective signal lines included in the first substrate 110A and the third substrate 110C to each other and electrically coupling the respective power supply lines included in the first substrate 110A and the third substrate 110C to each other and a coupling structure for electrically coupling the respective signal lines included in the second substrate 110B and the third substrate 110C to each other and electrically coupling the respective power supply lines included in the second substrate 110B and the third substrate 110C to each other exist.

In the present embodiment, the solid-state imaging device is classified into 10 categories according to the types of specific structures of these coupling structures.

The first configuration example (FIGS. 6A and 6B) is a configuration example in which the twin contact type or shared contact type TSV 157 to be described later and the electrode junction structure 159 to be described later do not exist as the coupling structures. Therefore, in the solid-state imaging device according to the first configuration example, electrical coupling between the respective signal lines included in the first substrate 110A and the second substrate 110B and between the respective power supply lines included in the first substrate 110A and the second substrate 110B, electrical coupling between the respective signal lines included in the second substrate 110B and the third substrate 110C and between the respective power supply lines included in the second substrate 110B and the third substrate 110C, and/or electrical coupling between the respective signal lines included in the first substrate 110A and the third substrate 110C and between the respective power supply lines included in the first substrate 110A and the third substrate 110C are achieved through the I/O units. In other words, the solid-state imaging device according to the first configuration example includes the pad 151 that allows for electrical coupling between the respective signal lines included in the first substrate 110A and the second substrate 110B and between the respective power supply lines included in the first substrate 110A and the second substrate 110B, the pad 151 that allows for electrical coupling between the respective signal lines included in the second substrate 110B and the third substrate 110C and between the respective power supply lines included in the second substrate 110B and the third substrate 110C, and/or the pad 151 that allows for electrical coupling between the respective signal lines included in the first substrate 110A and the third substrate 110C and between the respective power supply lines included in the first substrate 110A and the third substrate 110C. Note that the solid-state imaging device 1 illustrated in FIG. 1 is also included in the first configuration example.

The second configuration example (FIGS. 7A, 7B, 7C, 7D, 7E, and 7F) is a configuration example in which at least the twin contact type two-layer TSV 157 to be described later is provided as a coupling structure for electrically coupling the respective signal lines included in the second substrate 110B and the third substrate 110C to each other and electrically coupling the respective power supply lines included in the second substrate 110B and the third substrate 110C to each other. Here, the twin contact refers to a via having a structure in which electrically-conductive materials are embedded in a first through hole that exposes a predetermined wiring line and a second through hole that is different from the first through hole and exposes another wiring line different from the predetermined wiring line, or a structure in which films including electrically-conductive materials are formed on inner walls of the first through hole and the second through hole. Moreover, in this specification, the two-layer TSV means a TSV provided to allow for electrical coupling between respective signal lines included in two adjacent substrates of the first substrate 110A, the second substrate 110B, and the third substrate 110C and between respective power supply lines included in the two adjacent substrates. In this configuration example, the pad 151 may be further provided to the first substrate 110A and the second substrate 110B or to the first substrate 110A and the third substrate 110C in order to electrically couple the respective signal lines, not electrically coupled to each other through the TSV 157 and included in the first substrate 110A and the second substrate 110B, to each other and electrically couple the respective power supply lines, not electrically coupled to each other through the TSV 157 and included in the first substrate 110A and the second substrate 110B, to each other, or in order to electrically couple the respective signal lines, not electrically coupled to each other through the TSV 157 and included in the first substrate 110A and the third substrate 110C, to each other and electrically couple the respective power supply lines, not electrically coupled to each other through the TSV 157 and included in the first substrate 110A and the third substrate 110C, to each other.

The third configuration example (FIGS. 8A, 8B, 8C, and 8D) is a configuration example in which at least the twin contact type three-layer TSV 157 to be described later is provided as the coupling structure. Note that in this specification, the three-layer TSV refers to a TSV extending over all of the first substrate 110A, the second substrate 110B, and the third substrate 110C. The twin contact type three-layer TSV 157 formed from the back surface side of the first substrate 110A toward the third substrate 110C structurally allows for electrical coupling between the respective signal lines included in the first substrate 110A and the third substrate 110C and between the respective power supply lines included in the first substrate 110A and the third substrate 110C, or electrical coupling between the respective signal lines included in the second substrate 110B and the third substrate 110C and between the respective power supply lines included in the second substrate 110B and the third substrate 110C. Moreover, the twin contact type three-layer TSV 157 formed from the back surface side of the third substrate 110C toward the first substrate 110A structurally allows for electrical coupling between the respective signal lines included in the first substrate 110A and the second substrate 110B and between the respective power supply lines included in the first substrate 110A and the second substrate 110B, or electrical coupling between the respective signal lines included in the first substrate 110A and the third substrate 110C and between the respective power supply lines included in the first substrate 110A and the third substrate 110C (but, as described above, the solid-state imaging device according to the present embodiment has the characteristic that the coupling structure for electrically coupling the respective signal lines included in the first substrate 110A and the second substrate 110B to each other and electrically coupling the respective power supply lines included in the first substrate 110A and the second substrate 110B to each other does not include the coupling structure over bonding surfaces of the first substrate 110A and the second substrate 110B; therefore, the TSV 157 is not provided that electrically couples the respective signal lines included in the first substrate 110A and the second substrate 110B to each other and electrically couples the respective power supply lines included in the first substrate 110A and the second substrate 110B to each other). In this configuration example, in order to electrically couple signal lines not electrically coupled to each other through the TSV 157 to each other and electrically couple power supply lines not electrically coupled to each other through the TSV 157 to each other, the pad 151 may be further provided to substrates including these signal lines and these power supply lines.

The fourth configuration example (FIGS. 9A, 9B, 9C, 9D, 9E, and 9F) is a configuration example in which at least the shared contact type two-layer TSV 157 to be described later is provided as the coupling structure for electrically coupling the respective signal lines included in the second substrate 110B and the third substrate 110C to each other and electrically coupling the power supply lines included in the second substrate 110B and the third substrate 110C to each other. Here, the shared contact refers to a via having a structure in which an electrically-conductive material is embedded in one through hole provided to expose, while exposing a portion of a predetermined wiring line in one substrate, a predetermined wiring line in another substrate, or a structure in which a film including an electrically-conductive material is formed on an inner wall of the through hole. In this configuration example, the pad 151 may be further provided to the first substrate 110A and the second substrate 110B or to the first substrate 110A and the third substrate 110C in order to electrically couple the respective signal lines, not electrically coupled to each other through the TSV 157 and included in the first substrate 110A and the second substrate 110B, to each other and electrically couple the respective power supply lines, not electrically coupled to each other through the TSV 157 and included in the first substrate 110A and the second substrate 110B, to each other, or in order to electrically couple the respective signal lines, not electrically coupled to each other through the TSV 157 and included in the first substrate 110A and the third substrate 110C, to each other and electrically couple the respective power supply lines, not electrically coupled to each other through the TSV 157 and included in the first substrate 110A and the third substrate 110C, to each other.

For example, in a case where the shared contact type TSV 157 that electrically couples the respective signal lines included in the first substrate 110A and the second substrate 110B to each other and electrically couples the respective power supply lines included in the first substrate 110A and the second substrate 110B to each other is formed from the back surface side of the first substrate 110A, first, a through hole is formed from the back surface side of the first substrate 110A for two wiring lines having an equal electric potential disposed side by side at a predetermined interval in the multi-layered wiring layer 105 of the first substrate 110A, and a wiring line located immediately below a space between the two wiring lines having an equal electric potential in the multi-layered wiring layer 105 of the first substrate 110A in the multi-layered wiring layer 125 of the second substrate 110B. The through hole has a diameter larger than that of the space between the two wiring lines having an equal electric potential, and is formed from immediately above the two wiring lines having an equal electric potential by dry etching. At this time, the through hole having the large diameter is formed not to expose the two wiring lines having an equal electric potential. Next, by photolithography and dry etching, a through hole having a diameter smaller than that of the space between the two wiring lines having an equal electric potential is formed to expose the wiring line in the multi-layered wiring layer 125 of the second substrate 110B located immediately below the space between the two wiring lines having an equal electric potential. Next, the through hole having the large diameter is grown by etch-back, thereby exposing a portion of the two wiring lines having an equal electric potential in the multi-layered wiring layer 105 of the first substrate 110A. As a result, through the above processes, the through-hole has a shape in which the wiring line located immediately below the space between the two wiring lines in the multi-layered wiring layer 125 of the second substrate 110B is exposed while a portion of the two wiring lines having an equal electric potential in the multi-layered wiring layer 105 of the first substrate 110A is exposed. Thereafter, an electrically-conductive material is embedded in the through hole, or a film including an electrically-conductive material is formed on an inner wall of the through hole, which makes it possible to form the shared contact type TSV. According to this method, the dry etching is not performed on the two wiring lines having an equal electric potential to form the through hole having the large diameter and the through hole having the small diameter, which makes it possible to suppress a situation in which corners of the two wiring lines having an equal electric potential are shaved and occurrence of contamination. This makes it possible to achieve a more reliable solid-state imaging device 1.

Note that in the above-described example, a case where the shared contact type TSV 157 that electrically couples the respective signal lines included in the first substrate 110A and the second substrate 110B to each other and electrically couples the respective power supply lines included in the first substrate 110A and the second substrate 110B to each other is formed from the back surface side of the first substrate 110A has been described, but the same applies to a case where the shared contact type TSV 157 that electrically couples the respective signal lines included in the second substrate 110B and the third substrate 110C to each other and electrically couples the respective power supply lines included in the second substrate 110B and the third substrate 110C to each other is formed from the front surface side of the second substrate 110B or from the back surface side of the third substrate 110C, and a case where the shared contact type three-layer TSV 157 to be described later is formed from the back surface side of the first substrate 110A or from the back surface side of the third substrate 110C. Further, in the above-described example, the through hole is provided to pass through the space between two wiring lines disposed side by side with a predetermined interval, but, for example, a ring-shaped wiring line having an opening may be formed, and the through hole may be provided to pass through the opening of the wiring line.

Alternatively, it is possible to form the shared contact type TSV 157 by a method other than the method described above. For example, similarly to the case described above, in a case where the shared contact type TSV 157 that electrically couples the respective signal lines in the first substrate 110A and the second substrate 110B to each other and electrically couples the respective power supply lines included in the first substrate 110A and the second substrate 110B to each other is formed from the back surface side of the first substrate 110A, when a through hole having a diameter larger than that of the space between the two wiring lines having an equal electric potential in the multi-layered wiring layer 105 of the first substrate 110A is formed from the back surface side of the first substrate 110A from immediately above the two wiring lines having an equal electric potential by dry etching, the dry etching may be continued as it is without stopping the dry etching in the middle to prevent the two wiring lines having an equal electric potential from being exposed, while exposing a portion of the two wiring lines having an equal electric potential. In this case, for the through hole, etching of the two wiring lines having an equal electric potential hardly proceeds by etching selectivity between an electrically-conductive material (e.g., Cu) included in the two wiring lines having an equal electric potential and an insulating material (e.g., $SiO_2$) included in the insulating film 103, and the etching of the insulating film 103 may proceed in the space between the two wiring lines having an equal electric potential. As a result, the through hole has a shape in which the wiring line located immediately below the space between the two wiring lines in the multi-layered wiring layer 125 of the second substrate 110B is exposed while a portion of the two wiring lines having an equal electric potential in the multi-layered wiring layer 105 of the first substrate 110A is exposed. The shared contact type TSV 157 may be formed by embedding an electrically-conductive material in the through hole thus formed or by forming a film including an electrically-conductive material on the inner wall of the through hole.

Moreover, the shared contact type TSV 157 is not necessarily provided to pass through the space between the two wiring lines having an equal electric potential or the opening of the ring-shaped wiring line. For example, in a case where the through hole is formed, the number of wiring lines located in an upper layer (in the above-described example, the wiring line in the multi-layered wiring layer 105 of the first substrate 110A) may be one. Specifically, for example, in a case where the shared contact type TSV 157 that electrically couples the respective signal lines included in the first substrate 110A and the second substrate 110B to each other and electrically couples the respective power supply lines included in the first substrate 110A and the second substrate 110B to each other is formed from the back surface side of the first substrate 110A as described above, the through hole may be formed to have a shape in which the wiring line in the multi-layered wiring layer 125 of the second substrate 110B is exposed while a portion of one wiring line in the multi-layered wiring layer 105 of the first substrate 110A is exposed. Then, the shared contact type TSV 157 may be formed by embedding an electrically-conductive material in the through hole or by forming a film including an electrically-conductive material on the inner wall of the through hole. However, in this mode, there is one wiring line in the upper layer, which causes a concern that the through hole is formed without exposing the wiring line in the upper layer due to, for example, misalignment or the like, as compared with a case where the number of wiring lines in the upper layer is two, or a case where the wiring line in the upper layer has a ring shape having an opening, and a contact defect is thus likely to occur. Therefore, the mode in which the number of wiring lines is one is preferably applied to a case where it is possible to have a margin enough for overlap between the through hole and the one wiring line to be able to ensure contactability between the TSV 157 and the one wiring line.

The fifth configuration example (FIGS. 10A, 10B, 10C, and 10D) is a configuration example in which at least the shared contact type three-layer TSV 157 to be described later is provided as the coupling structure. The shared contact type three-layer TSV 157 structurally allow for electrical coupling between respective signal lines included on at least two substrates of the first substrate 110A, the second substrate 110B, and the third substrate 110C and between respective power supply lines included on the at least two substrates of the first substrate 110A, the second substrate 110B, and the third substrate 110C. In this configuration example, in order to electrically couple signal lines not electrically coupled to each other through the TSV 157 to each other and electrically couple power supply lines not electrically coupled to each other through the TSV 157 to each other, the pad 151 may be further provided to substrates including these signal lines and these power supply lines.

Note that in description of the second to fifth configuration examples and the seventh to tenth configuration examples, a plurality of twin contact type or shared contact type TSVs 157 may exist in the diagrams. In such a case, the plurality of TSVs 157 is distinguished by attaching different alphabets to ends of reference numerals such as the TSV 157a and the TSV 157b.

The sixth configuration example (FIGS. 11A, 11B, and 11C) is a configuration example in which at least the electrode junction structure 159 is provided between the second substrate 110B and the third substrate 110C as the coupling structure for electrically coupling the respective signal lines included in the second substrate 110B and the third substrate 110C to each other and electrically coupling the respective power supply lines included in the second substrate 110B and the third substrate 110C to each other. Here, in this specification, the electrode junction structures 159 refers to a structure in which electrodes formed on respective bonding surfaces of two substrates are joined to each other in direct contact with each other. In this configuration example, in order to electrically couple signal lines not electrically coupled to each other through the electrode junction structure 159 to each other and electrically couple power supply lines not electrically coupled to each other through the electrode junction structure 159 to each other, the pad 151 may be further provided to the first substrate 110A and the second substrate 110B including these signal lines and these power supply lines or the first substrate 110A and the third substrate 110C including these signal lines and these power supply lines.

The seventh configuration example (FIGS. 12A, 12B, 12C, 12D, 12E, 12F, and 12G) is a configuration example in which at least the electrode junction structure 159 and the twin contact type two-layer TSV 157 to be described later are provided as the coupling structures. The electrode junction structure 159 is provided between the second substrate 110B and the third substrate 110C. The twin contact type two-layer TSV 157 electrically couples respective signal lines included in the second substrate 110B and the third substrate 110C to each other and electrically couples the respective power supply lines included in the second substrate 110B and the third substrate 110C to each other. In this configuration example, in order to electrically couple signal lines not electrically coupled to each other through the electrode junction structure 159 and the TSV 157 to each other and electrically couple power supply lines not electrically coupled to each other through the electrode junction structure 159 and the TSV 157 to each other, the pad 151 may be further provided to the first substrate 110A and the second substrate 110B including these signal lines and these power supply lines or the first substrate 110A and the third substrate 110C including these signal lines and these power supply lines.

The eighth configuration example (FIGS. 13A, 13B, 13C, 13D, 13E, and 13F) is a configuration example in which at least the electrode junction structure 159 and the twin contact type three-layer TSV 157 to be described later are provided as the coupling structures. The electrode junction structure 15 is provided between the second substrate 110B and the third substrate 110C.

The ninth configuration example (FIGS. 14A, 14B, 14C, 14D, 14E, and 14F) is a configuration example in which at least the electrode junction structure 159 and the shared contact type two-layer TSV 157 to be described later are provided as the coupling structures. The electrode junction structure 159 provided between the second substrate 110B and the third substrate 110C. The shared contact type two-layer TSV 157 electrically couples the respective signal lines included in the second substrate 110B and the third substrate 110C to each other and electrically couples the respective power supply lines included in the second substrate 110B and the third substrate 110C to each other. In this configuration example, in order to electrically couple signal lines not electrically coupled to each other through the electrode junction structure 159 and the TSV 157 to each other and electrically couple power supply lines not electrically coupled to each other through the electrode junction structure 159 and the TSV 157 to each other, the pad 151 may be further provided to the first substrate 110A and the second substrate 110B including these signal lines and these power supply lines or the first substrate 110A and the third substrate 110C including these signal lines and these power supply lines.

The tenth configuration example (FIGS. 15A, 15B, 15C, 15D, and 15E) is a configuration example in which at least the electrode junction structure 159 provided between the second substrate 110B and the third substrate 110C, and the shared contact type three-layer TSV 157 to be described later are provided as the coupling structures.

Hereinafter, the first to tenth configuration examples will be described in order. Note that in the following respective diagrams, examples of coupling structures at least included in the solid-state imaging device according to the present embodiment are illustrated. The configurations illustrated in the following diagrams do not mean that the solid-state imaging device according to the present embodiment has only the illustrated coupling structures, and the solid-state imaging device may appropriately have a coupling structure other than the illustrated coupling structures. In the following description of the respective diagrams, the first metal wiring layer is, for example, a Cu wiring layer, and the second metal wiring layer is, for example, an Al wiring layer.

4-1. First Configuration Example

FIGS. 6A and 6B are vertical cross-sectional views of a schematic configuration of a solid-state imaging device according to the first configuration example of the present embodiment. The solid-state imaging device according to the present embodiment may have any of configurations illustrated in FIGS. 6A and 6B.

A solid-state imaging device 2a illustrated in FIG. 6A includes, as coupling structures, the lead line opening 155a drawing a predetermined wiring line in the multi-layered wiring layer 105 of the first substrate 110A, the lead line opening 155b drawing a predetermined wiring line in the multi-layered wiring layer 125 of the second substrate 110B, the lead line opening 155c drawing a predetermined wiring line in the multi-layered wiring layer 135 of the third substrate 110C, and the pad 151 disposed on a surface on the back side of the first substrate 110A and electrically coupled to the predetermined wiring lines by an electrically-conductive material included in the lead line openings 155a, 155b, and 155c.

Here, each of the lead line openings 155a, 155b, and 155c is an opening drawing a predetermined wiring line in a corresponding one of the substrates 110A, 110B, and 110C to the outside. Each of the lead line openings 155a, 155b, and 155c has a structure in which a film including an electrically-conductive material (e.g., W) is formed on an inner wall of an opening formed to expose a wiring line that is a target to be drawn. This film including the electrically-conductive material extends from the inside of each of the lead line openings 155a, 155b, and 155c onto the surface on the back side of the first substrate 110A as illustrated in the diagram. The pad 151 is formed on the extended film including the electrically-conductive material, and is electrically coupled to the wiring lines in the substrates drawn by the lead line openings 155a, 155b, and 155c by the film including the electrically-conductive material. In the configuration illustrated in FIG. 6A, the lead line openings 155a, 155b, and 155c are configured to draw the predetermined wiring line of the first metal wiring layer in the multi-layered wiring layer 105 of the first substrate 110A, the predetermined wiring line of the first metal wiring layer in the multi-layered wiring layer 125 of the second substrate 110B, and the predetermined wiring line of the first metal wiring layer in the multi-layered wiring layer 135 of the third substrate 110C. Note that the electrically-conductive material formed on the inner wall of the opening in the lead line opening 155 is not limited to W, and any of various known electrically-conductive materials may be used as the electrically-conductive material.

In this specification, as illustrated in FIG. 6A, this specification also refers, as lead pad structure, to the structure in which the pad 151 disposed on the back surface side of the first substrate 110A is electrically coupled to the wiring lines drawn by the lead line openings 155*a*, 155*b*, and 155*c*. Moreover, this specification also refers, as embedded pad structure in contrast to the lead line pad structure, to a structure in which the pad opening 153*a*, 153*b*, or 153*c* is provided for the pad 151 formed in the substrate as illustrated in FIG. 1, for example. It can be said that the lead pad structure is a structure in which the pad 151 formed in the substrate in the embedded pad structure is drawn to the outside of the substrate (onto the surface on the back side of the first substrate 110A).

Moreover, in the configuration illustrated in FIG. 6A, the respective wiring lines drawn by the three lead line openings 155*a*, 155*b*, and 155*c* are electrically coupled to the same pad 151. In other words, one pad 151 is shared among three lead line openings 155*a*, 155*b*, and 155*c*. The present embodiment is not, however, limited to such an example, and a plurality of pads 151 may be provided corresponding to the respective three lead line openings 155*a*, 155*b*, and 155*c*. In other words, the pads 151 may be formed on a film that is extended on the surface on the back side of the first substrate 110A and includes the electrically-conductive material included in the lead line opening 155*a*, on a film that is extended on the surface on the back side of the first substrate 110A and includes the electrically-conductive material included in the lead line opening 155*b*, and on a film that is extended on the surface on the back side of the first substrate 110A and includes the electrically-conductive material included in the lead line opening 155*c*. At this time, the film including the electrically-conductive material included in the lead line opening 155*a*, the film including the electrically-conductive material included in the lead line opening 155*b*, and the film the electrically-conductive material included in the lead line opening 155*c* are not brought into conduction with each other. Alternatively, one pad 151 shared between two of the three lead line openings 155*a*, 155*b*, and 155*c* and one pad 151 corresponding the remaining one may be provided.

A solid-state imaging device 2*b* illustrated in FIG. 6B corresponds to the solid-state imaging device 2*a* illustrated in FIG. 6A in which the configuration of the lead pad structure is changed. Specifically, in the configuration illustrated in FIG. 6B, the lead pad structure has a structure in which films including the electrically-conductive materials included in the lead line openings 155*a*, 155*b*, and 155*c* and the pad formed on these films are both embedded in the insulating film 109 in a region where the pad 151 is provided.

Note that this specification also refers, as embedded lead pad structure, to the lead pad structure in which the pad 151 is embedded in the insulating film 109 on the surface on the back side of the first substrate 110A as illustrated in FIG. 6B. In addition, in contrast to the embedded lead pad structure, a lead pad structure in which the pad 151 is disposed on the surface on the back side of the first substrate 110A without being embedded in the insulating film 109, as illustrated in FIG. 6A, is also referred to as a non-embedded lead pad structure.

In the configuration illustrated in FIG. 6B, similarly to the configuration illustrated in FIG. 6A, one pad 151 is shared among the three lead line openings 155*a*, 155*b*, and 155*c*. The configuration is not, however, limited to such an example. Similarly to the non-embedded lead pad structure illustrated in FIG. 6A, even in the embedded lead pad structure, a plurality of pads 151 may be provided corresponding to the respective three lead line openings 155*a*, 155*b*, and 155*c*. Alternatively, one pad shared between two of the three lead line openings 155*a*, 155*b*, and 155*c*, and one pad corresponding to the remaining one may be provided.

5-2. Second Configuration Example

FIGS. 7A, 7B, 7C, 7D, 7E, and 7F are vertical cross-sectional views of a schematic configuration of a solid-state imaging device according to the second configuration example of the present embodiment. The solid-state imaging device according to the present embodiment may have any of configurations illustrated in FIGS. 7A, 7B, 7C, 7D, 7E, and 7F.

A solid-state imaging device 3*a* illustrated in FIG. 7A includes, as coupling structures, the twin contact type two-layer TSV 157, an embedded pad structure for the first substrate 110A (i.e., the pad 151 provided in the multi-layered wiring layer 105 of the first substrate 110A, and the pad opening 153*a* exposing the pad 151), and an embedded pad structure for the second substrate 110B (i.e., the pad 151 provided in the multi-layered wiring layer 125 of the second substrate 110B, and the pad opening 153*b* exposing the pad 151). The TSV 157 is provided from the front surface side of the second substrate 110B toward the third substrate 110C to electrically couple the respective signal lines included in the second substrate 110B and the third substrate 110C to each other and electrically couple the respective power supply lines included in the second substrate 110B and the third substrate 110C to each other. In the configuration illustrated in FIG. 7A, the TSV 157 electrically couples a predetermined wiring line of the second metal wiring layer in the multi-layered wiring layer 125 of the second substrate 110B and a predetermined wiring line of the first metal wiring layer in the multi-layered wiring layer 135 of the third substrate 110C to each other. In addition, two embedded pad structures may electrically couple the respective signal lines included in the first substrate 110A and the second substrate 110B to each other and electrically couple the respective power supply lines included in the first substrate 110A and the second substrate 110B to each other.

A solid-state imaging device 3*b* illustrated in FIG. 7B corresponds to the solid-state imaging device 3*a* illustrated in FIG. 7A in which the configuration of the twin contact type two-layer TSV 157 is changed. Specifically, in the configuration illustrated in FIG. 7B, the TSV 157 is provided from the back surface side of the third substrate 110C to electrically couple the respective signal lines included in the second substrate 110B and the third substrate 110C to each other and electrically couple the respective power supply lines included in the second substrate 110B and the third substrate 110C to each other. In the configuration illustrated in FIG. 7B, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 3*c* illustrated in FIG. 7C corresponds to the solid-state imaging device 3*a* illustrated in FIG. 7A in which the embedded pad structure and the types (the first metal wiring layer or the second metal wiring layer) of wiring lines electrically coupled to each other by the twin contact type two-layer TSV 157 are changed. Specifically, in the configuration illustrated in FIG. 7C, a non-embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155b for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155a and 155b is provided. In addition, in the configuration illustrated in FIG. 7C, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 3d illustrated in FIG. 7D corresponds to the solid-state imaging device 3b illustrated in FIG. 7B in which the embedded pad structure is changed. Specifically, in the configuration illustrated in FIG. 7D, a non-embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155b for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155a and 155b is provided.

A solid-state imaging device 3e illustrated in FIG. 7E corresponds to the solid-state imaging device 3c illustrated in FIG. 7C in which the configuration of the lead pad structure is changed. Specifically, in the configuration illustrated in FIG. 7E, embedded lead pad structures are provided instead of the non-embedded lead pad structures. In addition, in the configuration illustrated in FIG. 7E, an embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and an embedded lead pad structure for a predetermined wiring line in the multi-layered wiring layer 135 of the third substrate 110C (i.e., the lead line opening 155b for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155a and 155b is provided.

A solid-state imaging device 3f illustrated in FIG. 7F corresponds to the solid-state imaging device 3d illustrated in FIG. 7D in which the configuration of the lead pad structure is changed. Specifically, in the configuration illustrated in FIG. 7F, as the lead pad structures, embedded lead pad structures are provided instead of the non-embedded lead pad structures. In addition, in the configuration illustrated in FIG. 7F, an embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and an embedded lead pad structure for a predetermined wiring line in the multi-layered wiring layer 135 of the third substrate 110C (i.e., the lead line opening 155b for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155a and 155b is provided.

Note that in the respective configurations illustrated in FIGS. 7A, 7B, 7C, 7D, 7E, and 7F, the types of wiring lines to which the twin contact type two-layer TSV 157 is coupled are not limited. The TSV 157 may be coupled to a predetermined wiring line of the first metal wiring layer or may be coupled to a predetermined wiring line of the second metal wiring layer. In addition, each of the multi-layered wiring layers 105, 125, and 135 may include only the first metal wiring layer, may include only the second metal wiring layer, or may include both the first metal wiring layer and the second metal wiring layer.

In addition, in the respective configuration illustrated in FIGS. 7A, 7B, 7C, and 7D, in the illustrated examples, the pad 151 is provided to the first substrate 110A and the second substrate 110B, but the present embodiment is not limited to such an example. In the second configuration example, the TSV 157 electrically couples the respective signal lines included in the second substrate 110B and the third substrate 110C to each other and electrically couples the respective power supply lines included in the second substrate 110B and the third substrate 110C to each other; therefore, in order to electrically couple signal lines not electrically coupled to each other by the TSV 157 to each other and electrically couple power supply lines not electrically coupled to each other by the TSV 157 to each other, it is sufficient if the pad 151 is provided to the first substrate 110A and the second substrate 110B including these signal lines and these power supply lines or the first substrate 110A and the third substrate 110C including these signal lines and the these power supply lines. In other words, in the respective configurations illustrated in FIGS. 7A, 7B, 7C, and 7D, the pad 151 may be provided to the first substrate 110A and the third substrate 110C instead of the illustrated configuration example of the pad 151. Similarly, in the respective configurations illustrated in FIGS. 7E and 7F, in the illustrated examples, the pad 151 is provided to the first substrate 110A and the third substrate 110C, but the pad 151 may be provided to the first substrate 110A and the second substrate 110B instead of this.

Further, in the respective configurations illustrated in FIGS. 7C, 7D, 7E, and 7F, in the illustrated examples, one pad 151 is shared between two lead line openings 155a and 155b, but the present embodiment is not limited to such an example. In each of these configurations, similarly to a case described with reference to FIGS. 5A and 5B, a plurality of pads may be provided corresponding to the respective wiring lines drawn by the respective lead line openings 155a and 155b.

4-3. Third Configuration Example

FIGS. 8A, 8B, 8C, and 8D are vertical cross-sectional views of a schematic configuration of a solid-state imaging device according to the third configuration example of the present embodiment. The solid-state imaging device according to the present embodiment may have any of configurations illustrated in FIGS. 8A, 8B, 8C, and 8D.

A solid-state imaging device 4a illustrated in FIG. 8A has, as coupling structures, the twin contact type three-layer TSV 157, an embedded pad structure for the first substrate 110A (i.e., the pad 151 provided in the multi-layered wiring layer 105 of the first substrate 110A, and the pad opening 153a exposing the pad 151), and an embedded pad structure for the second substrate 110B (i.e., the pad 151 provided in the multi-layered wiring layer 125 of the second substrate 110B, and the pad opening 153b exposing the pad 151). The TSV 157 is formed from the back surface side of the third substrate 110C, and is provided to electrically couple the respective signal lines included in the first substrate 110A and the third substrate 110C to each other and electrically couple the respective power supply lines included in the first substrate 110A and the third substrate 110C to each other. In the configuration illustrated in FIG. 8A, the TSV 157 electrically couples a predetermined wiring line of the second metal wiring layer in the multi-layered wiring layer 105 of the first substrate 110A and a predetermined wiring line of the first metal wiring layer in the multi-layered wiring layer 135 of the third substrate 110C to each other. In addition, the two embedded pad structures may electrically couple the respective signal lines included in the first substrate 110A and the second substrate 110B to each other and electrically couple the respective power supply lines included in the first substrate 110A and the second substrate 110B to each other.

A solid-state imaging device 4b illustrated in FIG. 8B corresponds to the solid-state imaging device 4a illustrated in FIG. 8A in which the configuration of the embedded pad structure and the configuration of the twin contact type three-layer TSV 157 are changed. Specifically, in the configuration illustrated in FIG. 8B, an embedded pad structure for the first substrate 110A (i.e., the pad 151 provided in the multi-layered wiring layer 105 of the first substrate 110A and the pad opening 153b exposing the pad 151) and an embedded pad structure for the third substrate 110C (i.e., the pad 151 provided in the multi-layered wiring layer 135 of the third substrate 110C and the pad opening 153a exposing the pad 151) are provided as the embedded pad structures. In addition, in the configuration illustrated in FIG. 8B, the TSV 157 is formed from the back surface side of the third substrate 110C, and is provided to electrically couple the respective signal lines included in the first substrate 110A and the second substrate 110B to each other and electrically couple the respective power supply lines included in the first substrate 110A and the second substrate 110B to each other. Moreover, in the configuration illustrated in FIG. 8B, the TSV 157 electrically couples a predetermined wiring line of the second metal wiring layer in the multi-layered wiring layer 105 of the first substrate 110A and a predetermined wiring line of the first metal wiring layer in the multi-layered wiring layer 125 of the second substrate 110B to each other.

A solid-state imaging device 4c illustrated in FIG. 8C corresponds to the solid-state imaging device 4a illustrated in FIG. 8A in which the embedded pad structure and the types of wiring lines electrically coupled to each other by the twin contact type three-layer TSV 157 are changed. Specifically, in the configuration illustrated in FIG. 8C, a non-embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155b for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155a and 155b is provided. In addition, in the configuration illustrated in FIG. 8C, the TSV 157 electrically couples a predetermined wiring line of the first metal wiring layer in the multi-layered wiring layer 105 of the first substrate 110A and a predetermined wiring line of the first metal wiring layer in the multi-layered wiring layer 135 of the third substrate 110C to each other.

A solid-state imaging device 4d illustrated in FIG. 8D corresponds to the solid-state imaging device 4c illustrated in FIG. 8C in which the configuration of the lead pad structure is changed. Specifically, in the configuration illustrated in FIG. 8D, as the lead pad structures, embedded lead pad structures are provided instead of the non-embedded lead pad structures. In addition, in the configuration illustrated in FIG. 8D, an embedded lead pad structure for a predetermined wiring line in the multi-layered wiring layer 125 of the second substrate 110B (i.e., the lead line opening 155b for the predetermined wiring line in the multi-layered wiring layer 125 of the second substrate 110B and the pad 151 on the surface on the back side of the first substrate 110A) and an embedded lead pad structure for a predetermined wiring line in the multi-layered wiring layer 135 of the third substrate 110C (i.e., the lead line opening 155a for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155a and 155b is provided.

Note that in the respective configurations illustrated in FIGS. 8A, 8B, 8C, and 8D, the types of wiring lines to which the TSV 157 is coupled are not limited. The TSV 157 may be coupled to a predetermined wiring line of the first metal wiring layer, or may be coupled to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

In addition, in the respective configurations illustrated in FIGS. 8A and 8C, in the illustrated examples, the pad 151 is provided to the first substrate 110A and the second substrate 110B, but the present embodiment is not limited to such an example. In these configurations, the TSV 157 electrically couples the respective signal lines included in the first substrate 110A and the third substrate 110C to each other and electrically couples the respective power supply lines included in the first substrate 110A and the third substrate 110C to each other; therefore, in order to electrically couple signal lines not electrically coupled to each other by the TSV 157 to each other and electrically couple power supply lines not electrically coupled to each other by the TSV 157 to each other, it is sufficient if the pad 151 is provided to the first substrate 110A and the second substrate 110B including these signal lines and these power supply lines or the second substrate 110B and the third substrate 110C including these signal lines and the these power supply lines. In other words, in the respective configurations illustrated in FIGS. 8A and 8C, instead of the illustrated configuration example of the pad 151, the pad 151 may be provided to the second substrate 110B and the third substrate 110C.

Similarly, in the configuration illustrated in FIG. 8B, in the illustrated example, the pad 151 is provided to the first substrate 110A and the third substrate 110C, but the present embodiment is not limited to such an example. In this configuration, the TSV 157 electrically couples the respective signal lines included in the first substrate 110A and the second substrate 110B to each other and electrically couples the respective power supply lines included in the first substrate 110A and the second substrate 110B to each other; therefore, in order to electrically couple signal lines not electrically coupled to each other by the TSV 157 to each other and electrically couple power supply lines not electrically coupled to each other by the TSV 157 to each other, it is sufficient if the pad 151 is provided to the second substrate 110B and the third substrate 110C including these signal lines and these power supply lines or the first substrate 110A and the third substrate 110C including these signal lines and the these power supply lines. In other words, in the configuration illustrated in FIG. 8B, instead of the illustrated configuration example of the pad 151, the pad 151 may be provided to the second substrate 110B and the third substrate 110C.

Similarly, in the configuration illustrated in FIG. 8D, in the illustrated example, the pad 151 is provided to the second substrate 110B and the third substrate 110C, but the present embodiment is not limited to such an example. In this configuration, the TSV 157 electrically couples the respective signal lines included in the first substrate 110A and the third substrate 110C to each other and electrically couples the respective power supply lines included in the first substrate 110A and the third substrate 110C to each other; therefore, in order to electrically couple signal lines not electrically coupled to each other by the TSV 157 to each other and electrically couple power supply lines not electrically coupled to each other by the TSV 157 to each other, it is sufficient if the pad 151 is provided to the first substrate 110A and the second substrate 110B including these signal lines and these power supply lines or the second substrate 110B and the third substrate 110C including these signal lines and the these power supply lines. In other words, in the configuration illustrated in FIG. 8D, instead of the illustrated configuration example of the pad 151, the pad 151 may be provided to the first substrate 110A and the second substrate 110B.

Further, in the respective configurations illustrated in FIGS. 8C and 8D, in the illustrated example, one pad 151 is shared between two lead line openings 155a and 155b, but the present embodiment is not limited to such an example. In each of these configurations, similarly to a case described with reference to FIGS. 6A and 6B, a plurality of pads may be provided corresponding to the respective wiring lines drawn by the respective lead line openings 155a and 155b.

4-4. Fourth Configuration Example

FIGS. 9A, 9B, 9C, 9D, 9E, and 9F are vertical cross-sectional views of a schematic configuration of a solid-state imaging device according to the fourth configuration example of the present embodiment. The solid-state imaging device according to the present embodiment may have any of configurations illustrated in FIGS. 9A, 9B, 9C, 9D, 9E and 9F.

A solid-state imaging device 5a illustrated in FIG. 9A includes, as coupling structures, the shared contact type two-layer TSV 157, an embedded pad structure for the first substrate 110A (i.e., the pad 151 provided in the multi-layered wiring layer 105 of the first substrate 110A, and the pad opening 153a exposing the pad 151), and an embedded pad structure for the second substrate 110B (i.e., the pad 151 provided in the multi-layered wiring layer 125 of the second substrate 110B, and the pad opening 153 exposing the pad 151). The TSV 157 is formed from the front surface side of the second substrate 110B toward the third substrate 110C, and is provided to electrically couple the respective signal lines included in the second substrate 110B and the third substrate 110C to each other and electrically couple the respective power supply lines included in the second substrate 110B and the third substrate 110C to each other. In the configuration illustrated in FIG. 9A, the TSV 157 electrically couples a predetermined wiring line of the second metal wiring layer in the multi-layered wiring layer 125 of the second substrate 110B and a predetermined wiring line of the first metal wiring layer in the multi-layered wiring layer 135 of the third substrate 110C to each other. In addition, the two embedded pad structure may electrically couple the respective signal lines included in the first substrate 110A and the second substrate 110B to each other and electrically couple the respective power supply lines in the first substrate 110A and the second substrate 110B.

A solid-state imaging device 5b illustrated in FIG. 9B corresponds to the solid-state imaging device 5a illustrated in FIG. 9A in which the configuration of the shared contact type two-layer TSV 157 is changed. Specifically, in the configuration illustrated in FIG. 9B, the TSV 157 is formed from the back surface side of the third substrate 110C, and is provided to electrically couple the respective signal lines included in the second substrate 110B and the third substrate 110C to each other and electrically couple the power supply lines included in the second substrate 110B and the third substrate 110C to each other. In addition, in the configuration illustrated in FIG. 9B, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 5c illustrated in FIG. 9C corresponds to the solid-state imaging device 5a illustrated in FIG. 9A in which the embedded pad structure and the types of wiring lines electrically coupled to each other by the shared contact type two-layer TSV 157 are changed. Specifically, in the configuration illustrated in FIG. 9C, a non-embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155b for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155a and 155b is provided. In addition, in the configuration illustrated in FIG. 9C, the TSV 157 electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 5d illustrated in FIG. 9D corresponds to the solid-state imaging device 5b illustrated in FIG. 9B in which the embedded pad structure is changed. Specifically, in the configuration illustrated in FIG. 9D, a non-embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155b for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155a and 155b is provided.

A solid-state imaging device 5e illustrated in FIG. 9E corresponds to the solid-state imaging device 5c illustrated in FIG. 9C in which the configuration of the lead pad structure is changed. Specifically, in the configuration illustrated in FIG. 9E, as the lead pad structures, embedded lead pad structures are provided instead of the non-embedded lead pad structures. In addition, in the configuration illustrated in FIG. 9E, an embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and an embedded lead pad structure for a predetermined wiring line in the multi-layered wiring layer 135 of the second substrate 110C (i.e., the lead line opening 155b for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155a and 155b is provided.

A solid-state imaging device 5f illustrated in FIG. 9F corresponds to the solid-state imaging device 5d illustrated in FIG. 9D in which the configuration of the lead pad structure is changed. Specifically, in the configuration illustrated in FIG. 9F, as the lead pad structures, embedded lead pad structures are provided instead of the non-embedded lead pad structures. In addition, in the configuration illustrated in FIG. 9F, an embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and an embedded lead pad structure for a predetermined wiring line in the multi-layered wiring layer 135 of the second substrate 110C (i.e., the lead line opening 155b for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155a and 155b is provided.

Note that in the respective configurations illustrated in FIGS. 9A, 9B, 9C, 9D, 9E, and 9F, the types of wiring lines to which the TSV 157 is coupled are not limited. The TSV 157 may be coupled to a predetermined wiring line of the first metal wiring layer or may be coupled to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

In addition, in the respective configurations illustrated in FIGS. 9A, 9B, 9C, and 9D, in the illustrated examples, the pad 151 is provided to the first substrate 110A and the second substrate 110B, but the present embodiment is not limited to such an example. In the fourth configuration example, the TSV 157 electrically couples the respective signal lines included in the second substrate 110B and the third substrate 110C to each other and electrically couples the respective power supply lines included in the second substrate 110B and the third substrate 110C to each other; therefore, in order to electrically couple signal lines not electrically coupled to each other by the TSV 157 to each other and electrically couple power supply lines not electrically coupled to each other by the TSV 157 to each other, it is sufficient if the pad 151 is provided to the first substrate 110A and the second substrate 110B including these signal lines and these power supply lines or the first substrate 110A and the third substrate 110C including these signal lines and the these power supply lines. In other words, in the respective configurations illustrated in FIGS. 9A, 9B, 9C, and 9D, instead of the illustrated configuration examples of the pad 151, the pad 151 may be provided to the first substrate 110A and the third substrate 110C. Similarly, in the respective configurations illustrated in FIGS. 9E and 9F, in the illustrated examples, the pad 151 is provided to the first substrate 110A and the third substrate 110C, but the pad 151 may be provided to the first substrate 110A and the second substrate 110B instead of this.

In addition, in the respective configurations illustrated in FIGS. 9C, 9D, 9E, and 9F, in the illustrated examples, one pad 151 is shared between two lead line openings 155a and 155b, but the present embodiment is not limited to such an example. In each of these configurations, similarly to a case described with reference to FIGS. 6A and 6B, a plurality of pads 151 may be provided corresponding to the respective wiring lines drawn by the respective lead line openings 155a and 155b.

4-5. Fifth Configuration Example

FIGS. 10A, 10B, 10C, and 10D are vertical cross-sectional views of a schematic configuration of a solid-state imaging device according to the fifth configuration example of the present embodiment. The solid-state imaging device according to the present embodiment may have any of configurations illustrated in FIGS. 10A, 10B, 10C, and 10D.

A solid-state imaging device 6a illustrated in FIG. 10A includes, as coupling structures, the shared contact type three-layer TSV 157, an embedded pad structure for the first substrate 110A (i.e., the pad 151 provided in the multi-layered wiring layer 105 of the first substrate 110A, and the pad opening 153a exposing the pad 151) and an embedded pad structure for the second substrate 110B (i.e., the pad 151 provided in the multi-layered wiring layer 125 of the second substrate 110B, and the pad opening 153b exposing the pad 151). The TSV 157 is formed from the back surface side of the third substrate 110C, and is provided to electrically couple the respective signal lines included in the first substrate 110A and the third substrate 110C to each other and electrically couple the respective power supply lines included in the first substrate 110A and the third substrate 110C to each other. In the configuration illustrated in FIG. 10A, the TSV 157 electrically couples a predetermined wiring line of the second metal wiring layer in the multi-layered wiring layer 125 of the first substrate 110A and a predetermined wiring line of the first metal wiring layer in the multi-layered wiring layer 135 of the third substrate 110C to each other. In addition, the two embedded pad structures may electrically couple the respective signal lines included in the first substrate 110A and the second substrate 110B to each other and electrically couple the respective power supply liens included in the first substrate 110A and the second substrate 110B to each other.

A solid-state imaging device 6b illustrated in FIG. 10B corresponds to the solid-state imaging device 6a illustrated in FIG. 10A in which the configuration of the embedded pad structure and the configuration of the shared contact type three-layer TSV 157 are changed. Specifically, in the configuration illustrated in FIG. 10B, only an embedded pad structure for the second substrate 110B (i.e., the pad 151 provided in the multi-layered wiring layer 125 of the second substrate 110B and the pad opening 153 exposing the pad 151) is provided as the embedded pad structure. In addition, in the configuration illustrated in FIG. 10B, the TSV 157 is formed from the back surface side of the third substrate 110C, and is provided to electrically couple the respective signal lines included in the first substrate 110A, the second substrate 110B, and the third substrate 110C to each other and electrically couple the respective power supply lines included in the first substrate 110A, the second substrate 110B, and the third substrate 110C to each other. Further, in the configuration illustrated in FIG. 10B, the TSV 157 electrically couples a predetermined wiring line of the first metal wiring layer in the multi-layered wiring layer 105 of the first substrate 110A, a predetermined wiring line of the first metal wiring layer in the multi-layered wiring layer 125 of the second substrate 110B, and a predetermined wiring line of the first metal wiring layer in the multi-layered wiring layer 135 of the third substrate 110C to each other.

A solid-state imaging device 6c illustrated in FIG. 10C corresponds to the solid-state imaging device 6a illustrated in FIG. 10A in which the embedded pad structure and the types of wiring lines electrically coupled to each other by the shared contact type three-layer TSV 157 are changed. Specifically, in the configuration illustrated in FIG. 10C, a non-embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155b for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155a and 155b is provided. In addition, in the configuration illustrated in FIG. 10C, the TSV 157 electrically couples a predetermined wiring line of the first metal wiring layer in the multi-layered wiring layer 105 of the first substrate 110A and a predetermined wiring line of the first metal wiring layer in the multi-layered wiring layer 135 of the third substrate 110C to each other.

A solid-state imaging device 6d illustrated in FIG. 10D corresponds to the solid-state imaging device 6c illustrated in FIG. 10C in which the configuration of the lead pad structure is changed. Specifically, in the configuration illustrated in FIG. 10D, as the lead pad structures, embedded lead pad structures are provided instead of the non-embedded lead pad structures. In addition, in the configuration illustrated in FIG. 10D, an embedded lead pad structure for a predetermined wiring line in the multi-layered wiring layer 125 of the second substrate 110B (i.e., the lead line opening 155b for the predetermined wiring line in the multi-layered wiring layer 125 of the second substrate 110B and the pad 151 on the surface on the back side of the first substrate 110A) and an embedded lead pad structure for a predetermined wiring line in the multi-layered wiring layer 135 of the second substrate 110C (i.e., the lead line opening 155a for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155a and 155b is provided.

Note that in the respective configurations illustrated in FIGS. 10A, 10B, 10C, and 10D, the types of wiring lines to which the TSV 157 is coupled are not limited. The TSV 157 may be coupled to a predetermined wiring line of the first metal wiring layer or may be coupled to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

In addition, in the respective configuration illustrated in FIGS. 10A and 10C, in the illustrated examples, the pad 151 is provided to the first substrate 110A and the second substrate 110B, but the present embodiment is not limited to such an example. In the these configurations, the TSV 157 electrically couples the respective signal lines included in the first substrate 110A and the third substrate 110C to each other and electrically couples the respective power supply lines included in the first substrate 110A and the third substrate 110C to each other; therefore, in order to electrically couple signal lines not electrically coupled to each other by the TSV 157 to each other and electrically couple power supply lines not electrically coupled to each other by the TSV 157 to each other, it is sufficient if the pad 151 is provided to the first substrate 110A and the second substrate 110B including these signal lines and these power supply lines or the second substrate 110B and the third substrate 110C including these signal lines and the these power supply lines. In other words, in the respective configurations illustrated in FIGS. 10A and 10C, instead of the illustrated configuration examples of the pad 151, the pad 151 may be provided to the second substrate 110B and the third substrate 110C. Similarly, in the configuration illustrated in FIG. 10D, in the illustrated example, the pad 151 is provided to the second substrate 110B and the third substrate 110C, but the pad 151 may be provided to the first substrate 110A and the second substrate 110B instead of this.

Note that in the configuration illustrated in FIG. 10B, the TSV 157 electrically couples the respective signal lines included in the first substrate 110A, the second substrate 110B, and the third substrate 110C to each other and electrically couples the respective power supply lines included in the first substrate 110A, the second substrate 110B, and the third substrate 110C to each other. Accordingly, in the illustrated example, the pad 151 is provided to the second substrate 110B, but in this configuration, the pad 151 as the coupling structure may not be provided. Alternatively, the pad 151 may be provided to any of the substrates 100A, 110B, and 110C in order to extract a desired signal.

In addition, in the respective configurations illustrated in FIGS. 10C and 10D, in the illustrated examples, one pad 151 is shared between two lead line openings 155a and 155b, but the present embodiment is not limited to such an example. In each of these configurations, similarly to a case described with reference to FIGS. 6A and 6B, a plurality of pads 151 may be provided corresponding to the respective wiring lines drawn by the respective lead line openings 155a and 155b.

Further, it is sufficient if the TSV 157 electrically couples the respective signal lines included in at least two substrates of the first substrate 110A, the second substrate 110B, and the third substrate 110C to each other and electrically couples the respective power supply lines included in the at least two substrates of the first substrate 110A, the second substrate 110B, and the third substrate 110C to each other, and the substrates including the signal lines electrically coupled to each other by the TSV 157 and the power supply lines electrically coupled to each other by the TSV 157 may be optionally changed.

4-6. Sixth Configuration Example

FIGS. 11A, 11B, and 11C are vertical cross-sectional views of a schematic configuration of a solid-state imaging device according to the sixth configuration example of the present embodiment. The solid-state imaging device according to the present embodiment may have any of configurations illustrated in FIGS. 11A, 11B, and 11C.

A solid-state imaging device 7a illustrated in FIG. 11A includes, as coupling structures, the electrode junction structure 159 provided between the second substrate 110B and the third substrate 110C, an embedded pad structure for the first substrate 110A (i.e., the pad 151 provided in the multi-layered wiring layer 105 of the first substrate 110A and the pad opening 153a exposing the pad 151), and an embedded pad structure for the second substrate 110B (i.e., the pad 151 provided in the multi-layered wiring layer 125 of the second substrate 110B and the pad opening 153b exposing the pad 151). The electrode junction structure 159 electrically couples the respective signal lines included in the second substrate 110B and the third substrate 110C to each other and electrically couples the respective power supply lines included in the second substrate 110B and the third substrate 110C to each other. Further, the two embedded pad structures electrically couple the respective signal lines included in the first substrate 110A and the second substrate 110B to each other and electrically couple the respective power supply lines included in the first substrate 110A and the second substrate 110B to each other.

Specifically, the electrode junction structure 159 here may be formed by performing heat treatment on the second substrate 110B and the third substrate 110C that are bonded together in a manner that an electrode provided on the bonding surface of the second substrate 110B and an electrode provided on the bonding surface of the third substrate 110C are in contact with each other, thereby joining the electrodes to each other. The electrode junction structure 159 includes an electrode formed on the bonding surface in the second substrate 110B, a via for electrically coupling the electrode to a predetermined wiring line in the multi-layered wiring layer 125, an electrode formed on the bonding surface in the third substrate 110C, and a via for electrically coupling the electrode to a predetermined wiring line in the multi-layered wiring layer 135. Note that, at this time, the second substrate 110B and the third substrate 110C are bonded together F-to-B; therefore, the via provided on the second substrate 110B side is formed as a via (i.e., a TSV) penetrating the semiconductor substrate 121.

A solid-state imaging device 7b illustrated in FIG. 11B corresponds to the solid-state imaging device 7a illustrated in FIG. 11A in which the embedded pad structure is changed. Specifically, in the configuration illustrated in FIG. 11B, a non-embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155b for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155a and 155b is provided.

A solid-state imaging device 7c illustrated in FIG. 11C corresponds to the solid-state imaging device 7b illustrated in FIG. 11B in which the configuration of the lead pad structure is changed. Specifically, in the configuration illustrated in FIG. 11C, as the lead pad structures, embedded lead pad structures are provided instead of the non-embedded lead pad structure. In addition, in the configuration illustrated in FIG. 11C, an embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and an embedded lead pad structure for a predetermined wiring line in the multi-layered wiring layer 135 of the second substrate 110C (i.e., the lead line opening 155b for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155a and 155b is provided.

Note that in the respective configurations illustrated in FIGS. 11A, 11B, and 11C, each of the multi-layered wiring layers 105, 125, and 135 may include only the first metal wiring layer, may include only the second metal wiring layer, or may include both the first metal wiring layer and the second metal wiring layer.

In addition, in the respective configurations illustrated in FIGS. 11A and 11B, in the illustrated examples, the pad 151 is provided to the first substrate 110A and the second substrate 110B, but the present embodiment is not limited to such an example. In these configurations, the electrode junction structure 159 electrically couples the respective signal lines included in the second substrate 110B and the third substrate 110C to each other and electrically couples the respective power supply lines included in the second substrate 110B and the third substrate 110C to each other;

therefore, in order to electrically couple signal lines not electrically coupled to each other by the electrode junction structure 159 to each other and electrically couple power supply lines not electrically coupled to each other by the electrode junction structure 159 to each other, it is sufficient if the pad 151 is provided to the first substrate 110A and the second substrate 110B including these signal lines and these power supply lines or the first substrate 110A and the third substrate 110C including these signal lines and the these power supply lines. In other words, in the respective configurations illustrated in FIGS. 11A and 11B, instead of the illustrated configuration examples of the pad 151, the pad 151 may be provided to the first substrate 110A and the third substrate 110C. Similarly, in each configuration illustrated in FIG. 11C, in the illustrated example, the pad 151 is provided to the first substrate 110A and the third substrate 110C, but the pad 151 may be provided to the first substrate 110A and the second substrate 110B instead of this.

In addition, in the respective configurations illustrated in FIGS. 11B and 11C, in the illustrated examples, one pad 151 is shared between two lead line openings 155a and 155b, but the present embodiment is not limited to such an example. In each of these configurations, similarly to a case described with reference to FIGS. 6A and 6B, a plurality of pads 151 may be provided corresponding to the respective wiring lines drawn by the respective lead line openings 155a and 155b.

4-7. Seventh Configuration Example

FIGS. 12A, 12B, 12C, 12D, 12E, 12F, and 12G are vertical cross-sectional views of a schematic configuration of a solid-state imaging device according to the seventh configuration example of the present embodiment. The solid-state imaging device according to the present embodiment may have any of configurations illustrated in FIGS. 12A, 12B, 12C, 12D, 12E, 12F, and 12G.

A solid-state imaging device 8a illustrated in FIG. 12A include, as coupling structures, the electrode junction structure 159 provided between the second substrate 110B and the third substrate 110C, twin contact type two-layer TSVs 157a and 157b, an embedded pad structure for the first substrate 110A (i.e., the pad 151 provided in the multi-layered wiring layer 105 of the first substrate 110A and the pad opening 153a exposing the pad 151) and an embedded pad structure for the second substrate 110B (i.e., the pad 151 provided in the multi-layered wiring layer 125 of the second substrate 110B and the pad opening 153b exposing the pad 151). The electrode junction structure 159b electrically couples the respective signal lines included in the second substrate 110B and the third substrate 110C to each other and electrically couples the respective power supply lines included in the second substrate 110B and the third substrate 110C to each other. In addition the TSVs 157a and 157b are formed from the front surface side of the second substrate 110B toward the third substrate 110C, and are provided to electrically couple the respective signal lines included in the second substrate 110B and the third substrate 110C to each other and electrically couple the respective power supply lines included in the second substrate 110B and the third substrate 110C to each other. Further, the two embedded pad structures may electrically couple the respective signal lines included in the first substrate 110A and the second substrate 110B to each other and electrically couple the respective power supply lines included in the first substrate 110A and the second substrate 110B to each other.

In the configuration illustrated in FIG. 12A, the TSV 157a that is one of the TSVs is provided to electrically couple a predetermined wiring line of the second metal wiring layer in the multi-layered wiring layer 125 of the second substrate 110B and an electrode in the multi-layered wiring layer 135 of the third substrate 110C to each other. This electrode is formed in a manner that a metallic surface of the electrode is exposed from the insulating film 133 in the multi-layered wiring layer 135. In other words, this electrode is formed similarly to the electrode included in the electrode junction structure 159. This specification also refers, as one-side electrode, to an electrode that is formed in a manner that a metallic surface of the electrode is exposed from any of the insulating films 103, 123, and 133 in the multi-layered wiring layers 105, 125, and 135 and is not included in the electrode junction structure 159, similarly to this electrode for the sake of convenience. In contrast to this, this specification also refers, as both-side electrode, to an electrode that is formed in a manner that a metallic surface of the electrode is exposed from any of the insulating films 103, 123, and 133 in the multi-layered wiring layers 105, 125, and 135 and is included in the electrode junction structure 159 for the sake of convenience. That is, in the configuration illustrated in FIG. 12A, the TSV 157a is provided to electrically couple a predetermined wiring line in the multi-layered wiring layer 125 of the second substrate 110B and the one-side electrode in the multi-layered wiring layer 135 of the third substrate 110C to each other.

In addition, the TSV 157b that is the other one of the TSVs is provided to electrically couple a predetermined wiring line of the second metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 8b illustrated in FIG. 12B corresponds to the solid-state imaging device 8a illustrated in FIG. 12A in which the configuration of the twin contact type two-layer TSV 157 is changed. Specifically, in the configuration illustrated in FIG. 12B, the TSV 157a is provided to electrically couple a predetermined wiring line of the second metal wiring layer in the multi-layered wiring layer 125 of the second substrate 110B and the both-side electrode included in the electrode junction structure 159 to each other. In other words, in the configuration illustrated in FIG. 12B, the TSV 157a also has a function as a via included in the electrode junction structure 159.

A solid-state imaging device 8c illustrated in FIG. 12C corresponds to the solid-state imaging device 8a illustrated in FIG. 12A in which the configurations of the twin contact type two-layer TSVs 157a and 157b are changed. Specifically, in the configuration illustrated in FIG. 12C, each of the TSVs 157a and 157b is provided from the back surface side of the third substrate 110C to electrically couple the respective signal lines included in the second substrate 110B and the third substrate 110C to each other and electrically couple the respective power supply lines included in the second substrate 110B and the third substrate 110C to each other.

In the configuration illustrated in FIG. 12C, the TSV 157a electrically couples the one-side electrode provided in the insulating film 129 on the back surface side of the second substrate 110B and a predetermined wiring line of the first metal wiring layer in the multi-layered wiring layer 135 of the third substrate 110C to each other. In addition, the TSV 157b electrically couples a predetermined wiring layer of the first metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 8*d* illustrated in FIG. 12D corresponds to the solid-state imaging device 8*a* illustrated in FIG. 12A in which the embedded pad structure and the types of wiring lines electrically coupled to each other by the twin contact type two-layer TSVs 157*a* and 157*b* are changed. Specifically, in the configuration illustrated in FIG. 12D, a non-embedded lead pad structure for a predetermined wiring line in the multi-layered wiring layer 105 of the first substrate 110A (i.e., the lead line opening 155*a* for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155*b* for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155*a* and 155*b* is provided. In addition, in the configuration illustrated in FIG. 12D, the TSV 157*a* electrically couples a predetermined wiring line of the first metal wiring layer in the multi-layered wiring layer 125 of the second substrate 110B and the one-side electrode in the multi-layered wiring layer 135 of the third substrate 110C to each other. In addition, the TSV 157*b* electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 8*e* illustrated in FIG. 12E corresponds to the solid-state imaging device 8*c* illustrated in FIG. 12C in which the embedded pad structure is changed. Specifically, in the configuration illustrated in FIG. 12E, a non-embedded lead pad structure for a predetermined wiring line in the multi-layered wiring layer 105 of the first substrate 110A (i.e., the lead line opening 155*a* for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155*b* for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155*a* and 155*b* is provided.

A solid-state imaging device 8*f* illustrated in FIG. 12F corresponds to the solid-state imaging device 8*d* illustrated in FIG. 12D in which the configuration of the lead pad structure is changed. Specifically, in the configuration illustrated in FIG. 12F, as the lead pad structures, embedded lead pad structures are provided instead of the non-embedded lead pad structures. In addition, in the configuration illustrated in FIG. 12F, an embedded lead pad structure for a predetermined wiring line in the multi-layered wiring layer 105 of the first substrate 110A (i.e., the lead line opening 155*a* for the predetermined wiring line in the multi-layered wiring layer 105 of the first substrate 110A and the pad 151 on the surface on the back side of the first substrate 110A) and an embedded lead pad structure for a predetermined wiring line in the multi-layered wiring layer 135 of the second substrate 110C (i.e., the lead line opening 155*b* for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155*a* and 155*b* is provided.

A solid-state imaging device 8*g* illustrated in FIG. 12G corresponds to the solid-state imaging device 8*e* illustrated in FIG. 12E in which the configuration of the lead pad structure is changed. Specifically, in the configuration illustrated in FIG. 12G, as the lead pad structures, embedded lead pad structures are provided instead of the non-embedded lead pad structures. In addition, in the configuration illustrated in FIG. 12G, an embedded lead pad structure for a predetermined wiring line in the multi-layered wiring layer 105 of the first substrate 110A (i.e., the lead line opening 155*a* for the predetermined wiring line in the multi-layered wiring layer 105 of the first substrate 110A and the pad 151 on the surface on the back side of the first substrate 110A) and an embedded lead pad structure for a predetermined wiring line in the multi-layered wiring layer 135 of the second substrate 110C (i.e., the lead line opening 155*b* for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155*a* and 155*b* is provided.

Note that in the respective configurations illustrated in FIGS. 12A, 12B, 12C, 12D, 12E, 12F, and 12G, the types of wiring lines to which the TSVs 157*a* and 157*b* are coupled are not limited. The TSVs 157*a* and 157*b* may be coupled to a predetermined wiring line of the first metal wiring layer or may be coupled to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

In addition, in the respective configurations illustrated in FIGS. 12A, 12B, 12C, 12D, and 12E, in the illustrated examples, the pad 151 is provided to the first substrate 110A and the second substrate 110B, but the present embodiment is not limited to such an example. In the seventh configuration example, the electrode junction structure 159 and the TSVs 157*a* and 157*b* electrically couple the respective signal lines included in the second substrate 110B and the third substrate 110C to each other and electrically couple the respective power supply lines included in the second substrate 110B and the third substrate 110C to each other; therefore, in order to electrically couple signal lines not electrically coupled to each other by the electrode junction structure 159 and the TSVs 157*a* and 157*b* to each other and electrically couple power supply lines not electrically coupled to each other by the electrode junction structure 159 and the TSVs 157*a* and 157*b* to each other, it is sufficient if the pad 151 is provided to the first substrate 110A and the second substrate 110B including these signal lines and these power supply lines or the first substrate 110A and the third substrate 110C including these signal lines and the these power supply lines. In other words, in the respective configurations illustrated in FIGS. 12A, 12B, 12C, 12D, and 12E, instead of the illustrated configuration examples of the pad 151, the pad 151 may be provided to the first substrate 110A and the third substrate 110C. Similarly, in the respective configurations illustrated in FIGS. 12F and 12G, in the illustrated examples, the pad 151 is provided to the first substrate 110A and the third substrate 110C, but the pad 151 may be provided to the first substrate 110A and the second substrate 110B instead of this.

In addition, in the respective configurations illustrated in FIGS. 12D, 12E, 12F, and 12G, in the illustrated examples, one pad 151 is shared between two lead line openings 155a and 155b, but the present embodiment is not limited to such an example. In each of these configurations, similarly to a case described with reference to FIGS. 6A and 6B, a plurality of pads 151 may be provided corresponding to the respective wiring lines drawn by the respective lead line openings 155a and 155b.

In addition, in the respective configurations illustrated in FIGS. 12C, 12D, 12E, 12F, and 12G, in the illustrated examples, the TSV 157a is in contact with the one-side electrode, but the present embodiment is not limited to such an example. In each of these configurations, similarly to the configuration illustrated in FIG. 12B, the TSV 157a may be in contact with a both-side electrode. In a case where the TSV 157a is in contact with the both-side electrode, the TSV 157a has a function as a via included in the electrode junction structure 159.

4-8. Eighth Configuration Example

FIGS. 13A, 13B, 13C, 13D, 13E, and 13F are vertical cross-sectional views of a schematic configuration of a solid-state imaging device according to the eighth configuration example of the present embodiment. The solid-state imaging device according to the present embodiment may have any of configurations illustrated in FIGS. 13A, 13B, 13C, 13D, 13E, and 13F.

A solid-state imaging device 9a illustrated in FIG. 13A includes, as coupling structures, the electrode junction structure 159 provided between the second substrate 110B and the third substrate 110C, the twin contact type three-layer TSV 157, and an embedded pad structure for the first substrate 110A (i.e., the pad 151 provided in the multi-layered wiring layer 105 of the first substrate 110A and the pad opening 153 exposing the pad 151). The electrode junction structure 159 electrically couples the respective signal lines included in the second substrate 110B and the third substrate 110C to each other and electrically couples the respective power supply lines included in the second substrate 110B and the third substrate 110C to each other. In addition, the TSV 157 is formed from the back surface side of the third substrate 110C, and is provided to electrically couple the respective signal lines included in the first substrate 110A and the third substrate 110C to each other and electrically couple the respective power supply lines included in the first substrate 110A and the third substrate 110C to each other. In the configuration illustrated in FIG. 13A, the TSV 157 electrically couples a predetermined wiring line of the second metal wiring layer in the multi-layered wiring layer 105 of the first substrate 110A and a predetermined wiring line of the first metal wiring layer in the multi-layered wiring layer 135 of the third substrate 110C to each other.

A solid-state imaging device 9b illustrated in FIG. 13B corresponds to the solid-state imaging device 9a illustrated in FIG. 13A in which the configuration of the multi-layered wiring layer 135 of the third substrate 110C is changed. Specifically, in the configuration illustrated in FIG. 13A described above, the multi-layered wiring layer 135 includes both the first metal wiring layer and the second wiring layer, but in the configuration illustrated in FIG. 13B, the multi-layered wiring layer 135 includes only the first metal wiring layer.

A solid-state imaging device 9c illustrated in FIG. 13C corresponds to the solid-state imaging device 9b illustrated in FIG. 13B in which the configuration of the embedded pad structure and the configuration of the twin contact type three-layer TSV 157 are changed. Specifically, in the configuration illustrated in FIG. 13C, an embedded pad structure for the second substrate 110B (i.e., the pad 151 provided in the multi-layered wiring layer 125 of the second substrate 110B and the pad opening 153 exposing the pad 151) is provided as the embedded pad structure. In addition, in the configuration illustrated in FIG. 13C, the TSV 157 is formed from the back surface side of the third substrate 110C, and is provided to electrically couple the respective signal lines included in the first substrate 110A and the second substrate 110B to each other and electrically couple the power supply lines included in the first substrate 110A and the second substrate 110B to each other. In addition, in the configuration illustrated in FIG. 13C, the TSV 157 electrically couples a predetermined wiring line of the first metal wiring layer in the multi-layered wiring layer 105 of the first substrate 110A and a predetermined wiring line of the first metal wiring layer in the multi-layered wiring layer 125 of the second substrate 110B to each other.

A solid-state imaging device 9d illustrated in FIG. 13D corresponds to the solid-state imaging device 9c illustrated in FIG. 13C in which the configuration of the twin contact type three-layer TSV 157 is changed. Specifically, in the configuration illustrated in FIG. 13D, the TSV 157 electrically couples a predetermined wiring line of the first metal wiring layer in the multi-layered wiring layer 105 of the first substrate 110A and the one-side electrode provided in the insulating film 129 on the back surface side of the second substrate 110B to each other.

A solid-state imaging device 9e illustrated in FIG. 13E corresponds to the solid-state imaging device 9c illustrated in FIG. 13C in which the embedded pad structure and the configuration of the twin contact type three-layer TSV 157 are changed. Specifically, in the configuration illustrated in FIG. 13E, a non-embedded lead pad structure for a predetermined wiring line in the multi-layered wiring layer 125 of the second substrate 110B (i.e., the lead line opening 155 for the predetermined wiring line in the multi-layered wiring layer 125 of the second substrate 110B and the pad 151 on the surface on the back side of the first substrate 110A) is provided instead of the embedded lead pad structure. In addition, the TSV 157 is formed from the back surface side of the third substrate 110C, and is provided to electrically couple the respective signal lines included in the first substrate 110A and the third substrate 110C to each other and electrically couple the power supply lines included in the first substrate 110A and the third substrate 110C to each other. In addition, in the configuration illustrated in FIG. 13E, the TSV 157 electrically couples a predetermined wiring line of the first metal wiring layer in the multi-layered wiring layer 105 of the first substrate 110A and a predetermined wiring line of the first metal wiring layer in the multi-layered wiring layer 135 of the third substrate 110C to each other.

A solid-state imaging device 9f illustrated in FIG. 13F corresponds to the solid-state imaging device 9e illustrated in FIG. 13E in which the configuration of the lead pad structure is changed. Specifically, in the configuration illustrated in FIG. 13F, as the lead pad structure, an embedded lead pad structure is provided instead of the non-embedded lead pad structure. In addition, in the configuration illustrated in FIG. 13F, an embedded lead pad structure for a predetermined wiring line in the multi-layered wiring layer 135 of the third substrate 110C (i.e., the lead line opening 155 for the predetermined wiring line in the multi-layered wiring layer 135 of the third substrate 110C and the pad 151 on the surface on the back side of the first substrate 110A) is provided as the embedded lead pad structure.

Note that in the respective configurations illustrated in FIGS. 13A to 13E, the types of wiring lines to which the TSV 157 is coupled are not limited. The TSV 157 may be coupled to a predetermined wiring line of the first metal wiring layer or may be coupled to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

In addition, in the respective configurations illustrated in FIGS. 13A and 13B, in the illustrated examples, the pad 151 is provided to the first substrate 110A. Further, in the respective configurations illustrated in FIGS. 13C, 13D, and 13E, in the illustrated examples, the pad 151 is provided to the second substrate 110B. In addition, in the configuration illustrated in FIG. 13F, in the illustrated example, the pad 151 is provided to the third substrate 110C. The present embodiment is not, however, limited to such examples. In these configurations, the electrode junction structure 159 electrically couples the respective signal lines included in the second substrate 110B and the third substrate 110C to each other and electrically couples the power supply lines included in the second substrate 110B and the third substrate 110C to each other, and the TSV 157 electrically couples the respective signal lines included in the first substrate 110A and the third substrate 110C to each other and electrically couples the power supply lines included in the first substrate 110A and the third substrate 110C to each other. Accordingly, the electrode junction structure 159 and the TSV 157 electrically couple the respective signal lines included in the first substrate 110A, the second substrate 110B, and the third substrate 110C to each other and electrically couple the power supply lines included in the first substrate 110A, the second substrate 110B, and the third substrate 110C to each other. Accordingly, in the configurations illustrated in FIGS. 13A, 13B, 13C, 13D, 13E, and 13F, the pad 151 as the coupling structure may not be provided. Alternatively, the pad 151 may be provided to any of the substrates 100A, 110B, and 110C in order to extract a desired signal.

In addition, in the configuration illustrated in FIG. 13D, in the illustrated example, the TSV 157 is in contact with the one-side electrode, but the present embodiment is not limited to such an example. In this configuration, similarly to the TSV 157a illustrated in FIG. 12B, the TSV 157 may be in contact with a both-side electrode. In a case where the TSV 157 is in contact with the both-side electrode, the TSV 157 has a function as a via included in the electrode junction structure 159.

4-9. Ninth Configuration Example

FIGS. 14A, 14B, 14C, 14D, 14E, and 14F are vertical cross-sectional views of a schematic configuration of a solid-state imaging device according to the ninth configuration example of the present embodiment. The solid-state imaging device according to the present embodiment may have any of configurations illustrated in FIGS. 14A, 14B, 14C, 14D, 14E, and 14F.

A solid-state imaging device 10a illustrated in FIG. 14A includes, as coupling structures, the electrode junction structure 159 provided between the second substrate 110B and the third substrate 110C, the shared contact type two-layer TSVs 157a and 157b, an embedded pad structure for the first substrate 110A (i.e., the pad 151 provided in the multi-layered wiring layer 105 of the first substrate 110A and the pad opening 153a exposing the pad 151), and an embedded pad structure for the second substrate 110B (i.e., the pad 151 provided in the multi-layered wiring layer 125 of the second substrate 110B and the pad opening 153b exposing the pad 151). The electrode junction structure 159 electrically couples the respective signal lines included in the second substrate 110B and the third substrate 110C to each other and electrically couples the respective power supply lines included in the second substrate 110B and the third substrate 110C to each other.

In addition, each of the TSVs 157a and 157b is formed from the front surface side of the second substrate 110B toward the third substrate, and is provided to electrically couple the respective signal lines included in the second substrate 110B and the third substrate 110C to each other and electrically couple the respective power supply lines included in the second substrate 110B and the third substrate 110C to each other. Specifically, the TSV 157a is provided to electrically couple a predetermined wiring line of the second metal wiring layer in the multi-layered wiring layer 125 of the second substrate 110B and the one-side electrode in the multi-layered wiring layer 135 of the third substrate 110C to each other. The TSV 157b is provided to electrically couple a predetermined wiring line of the second metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 10b illustrated in FIG. 14B corresponds to the solid-state imaging device 10a illustrated in FIG. 14A in which the configurations of the shared contact type two-layer TSVs 157a and 157b are changed. Specifically, in the configuration illustrated in FIG. 14B, each of the TSVs 157a and 157b is provided from the back surface side of the third substrate 110C, and is provided to electrically couple the respective signal lines included in the second substrate 110B and the third substrate 110C to each other and electrically couple the respective power supply lines included in the second substrate 110B and the third substrate 110C to each other. The TSV 157a electrically couples the one-side electrode provided in the insulating film 129 on the back surface side of the second substrate 110B and a predetermined wiring line of the first metal wiring layer in the multi-layered wiring layer 135 of the third substrate 110C to each other. In addition, the TSV 157b electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 10c illustrated in FIG. 14C corresponds to the solid-state imaging device 10a illustrated in FIG. 14A in which the embedded pad structure and the types of wiring lines electrically coupled to each other by the shared contact type three-layer TSVs 157a and 157b are changed. Specifically, in the configuration illustrated in FIG. 14C, a non-embedded lead pad structure for a predetermined wiring line in the multi-layered wiring layer 105 of the first substrate 110A (i.e., the lead line opening 155a for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155*b* for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155*a* and 155*b* is provided.

In addition, in the configuration illustrated in FIG. 14C, the TSV 157*a* electrically couples a predetermined wiring line of the first metal wiring layer in the multi-layered wiring layer 125 of the second substrate 110B and the one-side electrode in the multi-layered wiring layer 135 of the third substrate 110C to each other. In addition, the TSV 157*b* electrically couples a predetermined wiring line of the first metal wiring layer in the multi-layered wiring layer 125 of the second substrate 110B and a predetermined wiring line of the first metal wiring layer in the multi-layered wiring layer 135 of the third substrate 110C to each other.

A solid-state imaging device 10*d* illustrated in FIG. 14D corresponds to the solid-state imaging device 10*b* illustrated in FIG. 14B in which the embedded pad structure is changed. Specifically, in the configuration illustrated in FIG. 14D, a non-embedded lead pad structure for a predetermined wiring line in the multi-layered wiring layer 105 of the first substrate 110A (i.e., the lead line opening 155*a* for the predetermined wiring line in the multi-layered wiring layer 105 of the first substrate 110A and the pad 151 on the surface on the back side of the first substrate 110A) and a non-embedded lead pad structure for a predetermined wiring line in the multi-layered wiring layer 125 of the second substrate 110B (i.e., the lead line opening 155*b* for the predetermined wiring line in the multi-layered wiring layer 125 of the second substrate 110B and the pad 151 on the surface on the back side of the first substrate 110A) are provided instead of the embedded pad structures. In the illustrated example, one pad 151 shared between two lead line openings 155*a* and 155*b* is provided.

A solid-state imaging device 10*e* illustrated in FIG. 14E corresponds to the solid-state imaging device 10*c* illustrated in FIG. 14C in which the configuration of the lead pad structure is changed. Specifically, in the configuration illustrated in FIG. 14E, as the lead pad structures, embedded lead pad structures are provided instead of the non-embedded lead pad structures. In addition, in the configuration illustrated in FIG. 14E, an embedded lead pad structure for a predetermined wiring line in the multi-layered wiring layer 105 of the first substrate 110A (i.e., the lead line opening 155*a* for the predetermined wiring line in the multi-layered wiring layer 105 of the first substrate 110A and the pad 151 on the surface on the back side of the first substrate 110A) and an embedded lead pad structure for a predetermined wiring line in the multi-layered wiring layer 135 of the third substrate 110C (i.e., the lead line opening 155*b* for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155*a* and 155*b* is provided.

A solid-state imaging device 10*f* illustrated in FIG. 14F corresponds to the solid-state imaging device 10*d* illustrated in FIG. 14D in which the configuration of the lead pad structure is changed. Specifically, in the configuration illustrated in FIG. 14F, as the lead pad structures, embedded lead pad structures are provided instead of the non-embedded lead pad structures. In addition, in the configuration illustrated in FIG. 14F, an embedded lead pad structure for a predetermined wiring line in the multi-layered wiring layer 105 of the first substrate 110A (i.e., the lead line opening 155*a* for the predetermined wiring line in the multi-layered wiring layer 105 of the first substrate 110A and the pad 151 on the surface on the back side of the first substrate 110A) and an embedded lead pad structure for a predetermined wiring line in the multi-layered wiring layer 135 of the third substrate 110C (i.e., the lead line opening 155*b* for the predetermined wiring line in the multi-layered wiring layer 135 of the third substrate 110C and the pad 151 on the surface on the back side of the first substrate 110A) are provided as the embedded lead pad structures. In the illustrated example, one pad 151 shared between two lead line openings 155*a* and 155*b* is provided.

Note that in the respective configurations illustrated in FIGS. 14A, 14B, 14C, 14D, 14E, and 14F, the types of wiring lines to which the TSVs 157*a* and 157*b* are coupled are not limited. The TSVs 157*a* and 157*b* may be coupled to a predetermined wiring line of the first metal wiring layer or may be coupled to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

In addition, in the respective configurations illustrated in FIGS. 14A, 14B, 14C, and 14D, in the illustrated examples, the pad 151 is provided to the first substrate 110A and the second substrate 110B, but the present embodiment is not limited to such an example. In the ninth configuration example, the electrode junction structure 159 and the TSVs 157*a* and 157*b* electrically couple the respective signal lines included in the second substrate 110B and the third substrate 110C to each other and electrically couple the respective power supply lines included in the second substrate 110B and the third substrate 110C to each other; therefore, in order to electrically couple signal lines, not electrically coupled to each other by the electrode junction structure 159 and the TSVs 157*a* and 157*b* to each other and electrically couple power supply lines not electrically coupled to each other by the electrode junction structure 159 and the TSVs 157*a* and 157*b* to each other, it is sufficient if the pad 151 is provided to the first substrate 110A and the second substrate 110B including these signal lines and these power supply lines or the first substrate 110A and the third substrate 110C including these signal lines and the these power supply lines. In other words, in the respective configurations illustrated in FIGS. 14A, 14B, 14C, and 14D, instead of the illustrated configuration example of the pad 151, the pad 151 may be provided to the first substrate 110A and the third substrate 110C. Similarly, in the respective configurations illustrated in FIGS. 14E and 14F, in the illustrated examples, the pad 151 is provided to the first substrate 110A and the third substrate 110C, but the pad 151 may be provided to the first substrate 110A and the second substrate 110B instead of this.

In addition, in the respective configurations illustrated in FIGS. 14C, 14D, 14E, and 14F, in the illustrated examples, one pad 151 is shared between two lead line openings 155*a* and 155*b*, but the present embodiment is not limited to such an example. In each of these configurations, similarly to a case described with reference to FIGS. 6A and 6B, a plurality of pads 151 may be provided corresponding to the respective wiring lines drawn by the respective lead line openings 155a and 155b.

In addition, in the respective configurations illustrated in FIGS. 14A, 14B, 14C, 14D, 14E, and 14F, in the illustrated examples, the TSV 157a is in contact with the one-side electrode, but the present embodiment is not limited to such an example. In each of these configurations, similarly to the configuration illustrated in FIG. 12B, the TSV 157a may be in contact with a both-side electrode. In a case where the TSV 157a is in contact with the both-side electrode, the TSV 157a has a function as a via included in the electrode junction structure 159.

4-10. Tenth Configuration Example

FIGS. 15A, 15B, 15C, 15D, and 15E are vertical cross-sectional views of a schematic configuration of a solid-state imaging device according to the tenth configuration example of the present embodiment. The solid-state imaging device according to the present embodiment may have any of configurations illustrated in FIGS. 15A, 15B, 15C, 15D, and 15E.

The solid-state imaging device 11a illustrated in FIG. 15A include, as coupling structures, the electrode junction structure 159 provided between the second substrate 110B and the third substrate 110C, the shared contact type three-layer TSV 157, and an embedded pad structure for the first substrate 110A (i.e., the pad 151 provided in the multi-layered wiring layer 105 of the first substrate 110A and the pad opening 153 exposing the pad 151). The electrode junction structure 159 electrically couples the respective signal lines included in the second substrate 110B and the third substrate 110C to each other and electrically couples the respective power supply lines included in the second substrate 110B and the third substrate 110C to each other. Further, the TSV 157 is formed from the back surface side of the third substrate 110C, and is provided to electrically couple the respective signal lines included in the first substrate 110A and the third substrate 110C to each other and electrically couple the respective power supply lines included in the first substrate 110A and the third substrate 110C to each other. In the configuration illustrated in FIG. 15A, the TSV 157 electrically couples a predetermined wiring line of the second metal wiring layer in the multi-layered wiring layer 125 of the first substrate 110A and a predetermined wiring line of the first metal wiring layer in the multi-layered wiring layer 135 of the third substrate 110C to each other.

A solid-state imaging device 11b illustrated in FIG. 15B corresponds to the solid-state imaging device 11a illustrated in FIG. 15A in which the configuration of the multi-layered wiring layer 135 of the third substrate 110C is changed. Specifically, in the configuration illustrated in FIG. 15A described above, the multi-layered wiring layer 135 includes both the first metal wiring layer and the second wiring layer, but in the configuration illustrated in FIG. 13B, the multi-layered wiring layer 135 includes only the first metal wiring layer.

A solid-state imaging device 11c illustrated in FIG. 15C corresponds to the solid-state imaging device 11b illustrated in FIG. 15B in which the configuration of the embedded pad structure and the configuration of the shared contact type three-layer TSV 157 are changed. Specifically, in the configuration illustrated in FIG. 15C, as the embedded pad structure, an embedded pad structure for the second substrate 110B (i.e., the pad 151 provided in the multi-layered wiring layer 125 of the second substrate 110B and the pad opening 153 exposing the pad 151) is provided instead of the embedded pad structure for the first substrate 110A illustrated in FIG. 15B described above. In addition, in the configuration illustrated in FIG. 15C, the TSV 157 is formed from the back surface side of the third substrate 110C, and is provided to electrically couple the respective signal lines included in the first substrate 110A, the second substrate 110B, and the third substrate 110C to each other and electrically couple the power supply lines included in the first substrate 110A, the second substrate 110B, and the third substrate 110C to each other. In the configuration illustrated in FIG. 15C, the TSV 157 electrically couples a predetermined wiring line of the first metal wiring layer in the multi-layered wiring layer 105 of the first substrate 110A, a predetermined wiring line of the first metal wiring layer in the multi-layered wiring layer 125 of the second substrate 110B, and a predetermined wiring line of the first metal wiring layer in the multi-layered wiring layer 135 of the third substrate 110C to each other.

A solid-state imaging device 11d illustrated in FIG. 15D corresponds to the solid-state imaging device 11b illustrated in FIG. 15B in which the embedded pad structure and the types of wiring lines electrically coupled to each other by the shared contact type three-layer TSV 157 are changed. Specifically, in the configuration illustrated in FIG. 15D, a non-embedded lead pad structure for a predetermined wiring line in the multi-layered wiring layer 125 of the second substrate 110B (i.e., the lead line opening 155 for the predetermined wiring line in the multi-layered wiring layer 125 of the second substrate 110B and the pad 151 on the surface on the back side of the first substrate 110A) is provided instead of the embedded pad structure. In addition, in the configuration illustrated in FIG. 15D, the TSV 157 electrically couples a predetermined wiring line of the first metal wiring layer in the multi-layered wiring layer 105 of the first substrate 110A and a predetermined wiring line of the first metal wiring layer in the multi-layered wiring layer 135 of the third substrate 110C to each other.

A solid-state imaging device 11e illustrated in FIG. 15E corresponds to the solid-state imaging device 11d illustrated in FIG. 15D in which the configuration of the lead pad structure is changed. Specifically, in the configuration illustrated in FIG. 15E, as the lead pad structure, an embedded lead pad structure is provided instead of the non-embedded lead pad structure. In addition, in the configuration illustrated in FIG. 15E, an embedded lead pad structure for a predetermined wiring line in the multi-layered wiring layer 135 of the third substrate 110C (i.e., the lead line opening 155 for the predetermined wiring line in the multi-layered wiring layer 135 of the third substrate 110C and the pad 151 on the surface on the back side of the first substrate 110A) is provided as the embedded lead pad structure.

Note that in the respective configurations illustrated in FIGS. 15A, 15B, 15C, 15D, and 15E, the types of wiring lines to which the TSV 157 is coupled are not limited. The TSV 157 may be coupled to a predetermined wiring line of the first metal wiring layer or may be coupled to a predetermined wiring line of the second metal wiring layer. Moreover, each of the multi-layered wiring layers 105, 125, and 135 may include only the first metal wiring layer, may include only the second metal wiring layer, or may include both the first metal wiring layer and the second metal wiring layer.

In addition, in the respective configurations illustrated in FIGS. 15A and 15B, in the illustrated examples, the pad 151 is provided to the first substrate 110A. Further, in the respective configurations illustrated in FIGS. 15C and 15D, in the illustrated examples, the pad 151 is provided to the second substrate 110B. In addition, in the configuration illustrated in FIG. 15E, in the illustrated example, the pad 151 is provided to the third substrate 110C. The present embodiment is not, however, limited to such examples. In these configurations, the electrode junction structure 159 electrically couples the respective signal lines included in the second substrate 110B and the third substrate 110C to each other and electrically couples the power supply lines included in the second substrate 110B and the third substrate 110C to each other, and the TSV 157 electrically couples the respective signal lines included in the first substrate 110A and the third substrate 110C to each other and electrically couples the power supply lines included in the first substrate 110A and the third substrate 110C to each other. Accordingly, the electrode junction structure 159 and the TSV 157 electrically couple the respective signal lines included in the first substrate 110A, the second substrate 110B, and the third substrate 110C to each other and electrically couple the power supply lines included in the first substrate 110A, the second substrate 110B, and the third substrate 110C to each other. Accordingly, in the configurations illustrated in FIGS. 15A, 15B, 15C, 15D, and 15E, the pad 151 as the coupling structure may not be provided. Alternatively, the pad 151 may be provided to any of the substrates 100A, 110B, and 110C in order to extract a desired signal.

Further, it is sufficient if the TSV 157 electrically couples the respective signal lines included in at least two substrates of the first substrate 110A, the second substrate 110B, and the third substrate 110C to each other and electrically couples the respective power supply lines included in the at least two substrates of the first substrate 110A, the second substrate 110B, and the third substrate 110C to each other, and the substrates including the signal lines electrically coupled to each other by the TSV 157 and the power supply lines electrically coupled to each other by the TSV 157 may be optionally changed.

4-11. Summary

Several configuration examples of the solid-state imaging device according to the present embodiment have been described above.

Note that in the second to fourth configuration examples and the seventh to tenth configuration examples of the respective configuration examples described above, it is possible to form the TSV 157 in a manner that an upper end of the TSV 157 is exposed on the back surface side of the third substrate 110C. It is possible for the thus-exposed upper end of the TSV 157 to function as an electrode for electrically coupling a circuit included in the solid-state imaging device and an external circuit to each other. For example, a solder bump or the like may be provided on the exposed upper end of the TSV 157 to electrically couple the solid-state imaging device and an external device to each other through the solder bump or the like.

In addition, in the respective configuration examples described above, the TSV 157 is a through hole in which an electrically-conductive material is embedded, but the present embodiment is not limited to such an example. The TSV 157 may be formed by forming a film including an electrically-conductive material (e.g., W or the like) on an inner wall of a through hole.

In addition, in the respective configuration examples described above, in a case where the pad 151 is provided for each of the substrates 110A, 110B, and 110C, an embedded pad structure or a lead pad structure may be applied. Further, as for the lead pad structure, a non-embedded lead pad structure or an embedded lead pad structure may be applied.

5. Application Examples (Application to Electronic Apparatus)

Application examples of the solid-state imaging devices 1 to 11e according to the present embodiment described above will be described. Several examples of an electronic apparatus to which the solid-state imaging devices 1 to 11e may be applied will be described here.

FIG. 16A is a diagram illustrating appearance of a smartphone that is an example of an electronic apparatus to which the solid-state imaging devices 1 to 11e according to the present embodiment may be applied. As illustrated in FIG. 16A, a smartphone 901 includes an operation unit 903 that includes a button to receive an operation input mode by a user, a display unit 905 that displays various kinds of information, and an imaging unit (not illustrated) that is provided in a housing and electronically shoots an image of an object to be observed. The imaging unit may include the solid-state imaging devices 1 to 11e.

FIGS. 16B and 16C are diagram illustrating appearance of a digital camera that is another example of the electronic apparatus to which the solid-state imaging devices 1 to 11e according to the present embodiment may be applied. FIG. 16B illustrates appearance of a digital camera 911 as viewed from the front (subject side), and FIG. 16C illustrates appearance of the digital camera 911 as viewed from the back. As illustrated in FIGS. 16B and 16C, the digital camera 911 includes a main body (camera body) 913, an interchangeable lens unit 915, a grip unit 917 that is grasped by a user at the time of shooting, a monitor 919 that displays various kinds of information, an EVF 921 that displays a through image observed by a user at the time of shooting, and an imaging unit (not illustrated) that is provided in a housing and electronically shoots an image of an object to be observed. The imaging unit may include the solid-state imaging devices 1 to 11e.

Several examples of an electronic apparatus to which the solid-state imaging devices 1 to 11e according to the present embodiment may be applied have been described above. Note that an electronic apparatus to which the solid-state imaging devices 1 to 11e may be applied is not limited to those exemplified above, but the solid-state imaging devices 1 to 11e are applicable as an imaging unit mounted on any electronic apparatus such as a video camera, a spectacle-type wearable device, an HMD (Head Mounted Display), a tablet PC, or a game console.

(Application to Another Structure of Solid-State Imaging Device)

Note that the technology according to the present disclosure may be applied to the solid-state imaging device illustrated in FIG. 17A. FIG. 17A is a cross-sectional view of a configuration example of a solid-state imaging device to which the technology according to the present disclosure may be applied.

In the solid-state imaging device, a PD (photodiode) 20019 receives incident light 20001 coming from the back surface (upper surface in the diagram) side of a semiconductor substrate 20018. Above the PD 20019, a planarization film 20013, a CF (color filter) 20012, and a microlens 20011 are provided, and the incident light 20001 sequentially passing through the respective units is received by a light-receiving surface 20017 to be subjected to photoelectric conversion.

For example, in the PD 20019, an n-type semiconductor region 20020 is formed as a charge accumulation region that accumulates charges (electrons). In the PD 20019, the n-type semiconductor region 20020 is provided inside p-type semiconductor regions 20016 and 20041 of the semiconductor substrate 20018. The front surface (lower surface) side of the semiconductor substrate 20018 of the n-type semiconductor region 20020 is provided with the p-type semiconductor region 20041 having higher impurity concentration than that of the back surface (upper surface) side. That is, the PD 20019 has an HAD (Hole-Accumulation Diode) structure, and the p-type semiconductor regions 20016 and 20041 are formed to suppress the generation of dark currents at the respective interfaces with the upper surface side and the lower surface side of the n-type semiconductor region 20020.

A pixel separation unit 20030 that electrically separates a plurality of pixels 20010 from each other is provided inside the semiconductor substrate 20018, and the PD 20019 is provided in a region defined by the pixel separation unit 20030. In the diagram, in a case where the solid-state imaging device is viewed from the upper surface side, the pixel separation unit 20030 is formed in the shape of a grid to be interposed between the plurality of pixels 20010, for example, and the PD 20019 is formed in a region defined by this pixel separation unit 20030.

In each PD 20019, the anode is grounded. In the solid-state imaging device, signal charges (e.g., electrons) accumulated by the PD 20019 are read out through a transfer Tr (MOS FET) or the like that is not illustrated and outputted as electric signals to a VSL (vertical signal line) that is not illustrated.

A wiring layer 20050 is provided on the front surface (lower surface) of the semiconductor substrate 20018 that is opposed to the back surface (upper surface) on which respective units such as a light-shielding film 20014, the CF 20012, and the microlens 20011 are provided.

The wiring layer 20050 includes a wiring line 20051 and an insulating layer 20052, and the wiring line 20051 is formed in the insulating layer 20052 to be electrically coupled to each element. The wiring layer 20050 is a so-called multi-layered wiring layer, and is formed by alternately stacking interlayer insulating films and the wiring lines 20051 a plurality of times. The interlayer insulating films are included in the insulating layer 20052. Here, as the wiring line 20051, wiring lines to a Tr such as the transfer Tr for reading out charges from the PD 20019, and respective wiring lines such as the VSL are stacked with the insulating layer 20052 interposed therebetween.

The wiring layer 20050 is provided with a support substrate 20061 on the surface opposite to the side on which the PD 20019 is provided. For example, a substrate including a silicon semiconductor and having a thickness of several hundreds of μm is provided as the support substrate 20061.

The light-shielding film 20014 is provided to the back surface (upper surface in the diagram) side of the semiconductor substrate 20018.

The light-shielding film 20014 is configured to block a portion of the incident light 20001 from above the semiconductor substrate 20018 toward the back surface of the semiconductor substrate 20018.

The light-shielding film 20014 is provided above the pixel separation unit 20030 provided inside the semiconductor substrate 20018. Here, the light-shielding film 20014 is provided on the back surface (upper surface) of the semiconductor substrate 20018 to protrude in the shape of a projection through the insulating film 20015 such as a silicon oxide film. In contrast, to make the incident light 20001 enter the PD 20019, the light-shielding film 20014 is not provided, but there is an opening above the PD 20019 provided inside the semiconductor substrate 20018.

That is, in a case where the solid-state imaging device is viewed from the upper surface side in the diagram, the light-shielding film 20014 has a grid shape in a plan view, and an opening through which the incident light 20001 passes to the light-receiving surface 20017 is formed.

The light-shielding film 20014 includes a light-shielding material that blocks light. For example, titanium (Ti) films and tungsten (W) films are sequentially stacked to form the light-shielding film 20014. In addition, it is possible to form the light-shielding film 20014 by sequentially stacking, for example, titanium nitride (TiN) films and tungsten (W) films.

The light-shielding film 20014 is covered with the planarization film 20013. The planarization film 20013 is formed using an insulating material that transmits light.

The pixel separation unit 20030 includes a groove 20031, a fixed-charge film 20032, and an insulating film 20033.

The fixed-charge film 20032 is formed on the back surface (upper surface) side of the semiconductor substrate 20018 to cover the groove 20031 that defines the space between the plurality of pixels 20010.

Specifically, the fixed-charge film 20032 is provided to cover the inner surface of the groove 20031 formed on the back surface (upper surface) side of the semiconductor substrate 20018 with a predetermined thickness. The insulating film 20033 is then provided to be embedded in (loaded into) the inside of the groove 20031 covered with the fixed-charge film 20032.

Here, the fixed-charge film 20032 is formed using a high dielectric material having a negative fixed charge to form a positive-charge (hole) accumulation region at the interface with the semiconductor substrate 20018 and suppress the generation of dark currents. The fixed charge film 20032 is formed to have a negative fixed charge. This causes the negative fixed charge to apply an electric field to the interface with the semiconductor substrate 20018, and forms a positive-charge (hole) accumulation region.

It is possible to form the fixed-charge film 20032 by using, for example, a hafnium oxide film ($HfO_2$ film). In addition, it is possible to form the fixed-charge film 20032 to additionally include at least one of oxides of hafnium, zirconium, aluminum, tantalum, titanium, magnesium, yttrium, lanthanide elements, or the like, for example.

In addition, the technology according to the present disclosure may also be applied to a solid-state imaging device illustrated in FIG. 17B. FIG. 17B illustrates a schematic configuration of a solid-state imaging device to which the technology according to the present disclosure may be applied.

A solid-state imaging device 30001 includes an imaging unit (so-called pixel unit) 30003 in which a plurality of pixels 30002 is regularly arranged two-dimensionally, and peripheral circuits, that is, a vertical driving unit 30004, a horizontal transfer unit 30005, and an output unit 30006 disposed around the imaging unit 30003. The pixels 30002 each include a photodiode 30021 that is one photoelectric conversion element, and a plurality of pixel transistors (MOS transistors) Tr1, Tr2, Tr3, and Tr4.

The photodiode 30021 has a region in which signal charges that are photoelectrically converted by using incoming light and are generated by the photoelectric conversion are accumulated. In this example, the plurality of pixel transistors includes the four MOS transistors of a transfer transistor Tr1, a reset transistor Tr2, an amplifying transistor Tr3, and a selection transistor Tr4. The transfer transistor Tr1 is a transistor that reads out the signal charges accumulated in the photodiode 30021 into a floating diffusion (FD) region 30022 described below. The reset transistor Tr2 is a transistor for setting a prescribed value as the electric potential of the FD region 30022. The amplifying transistor Tr3 is a transistor for electrically amplifying the signal charges read out to the FD region 30022. The selection transistor Tr4 is a transistor for selecting one row of pixels and reading out a pixel signal to the vertical signal line 30008.

Note that, although not illustrated, it is also possible to include the three transistors excluding the selection transistor Tr4 and the photodiode PD in a pixel.

In the circuit configuration of the pixel 30002, the source of the transfer transistor Tr1 is coupled to the photodiode 30021, and the drain thereof is coupled to the source of the reset transistor Tr2. The FD region 30022 (corresponding to the drain region of the transfer transistor and the source region of the reset transistor) serving as a charge-voltage conversion means between the transfer transistor Tr1 and the reset transistor Tr2 is coupled to the gate of the amplifying transistor Tr3. The source of the amplifying transistor Tr3 is coupled to the drain of the selection transistor Tr4. The drain of the reset transistor Tr2 and the drain of the amplifying transistor Tr3 are coupled to a power supply voltage supplying unit. In addition, the source of the selection transistor Tr4 is coupled to the vertical signal line 30008.

Row reset signals ϕRST commonly applied to the gates of the reset transistors Tr2 of the pixels arranged in one row, row transfer signals ϕTRG commonly applied in the same manner to the gates of the transfer transistors Tr1 of the pixels in one row, and row select signals ϕSEL commonly applied in the same manner to the gates of the selection transistors Tr4 in one row are each supplied from the vertical driving unit 30004.

The horizontal transfer unit 30005 includes an amplifier or an analog/digital converter (ADC) coupled to the vertical signal line 30008 of each column, which is, in this example, an analog/digital converter 30009, a column selection circuit (switch means) 30007, and a horizontal transfer line (e.g., bus wiring including the same number of wiring lines as the number of data bit lines) 30010. The output unit 30006 includes an amplifier or an analog/digital converter and/or a signal processing circuit, which is, in this example, a signal processing circuit 30011 that processes an output from the horizontal transfer line 30010, and an output buffer 30012.

In this solid-state imaging device 30001, the signals of the pixels 30002 in each row are subjected to analog/digital conversion by each analog/digital converter 30009, read out through the sequentially selected column selection circuit 30007 into horizontal transfer lines 30010, and horizontally transferred sequentially. The image data read out to the horizontal transfer line 30010 is outputted by the output buffer 30012 through the signal processing circuit 30011.

As the general operation of the pixel 3002, the gate of the transfer transistor Tr1 and the gate of the reset transistor Tr2 are first turned on to empty all the charges in the photodiode 30021. The gate of the transfer transistor Tr1 and the gate of the reset transistor Tr2 are then turned off to accumulate charges. Next, the gate of the reset transistor Tr2 is turned on immediately before the charges of the photodiode 30021 are read out, and the electric potential of the FD region 30022 is reset. Afterwards, the gate of the reset transistor Tr2 is turned off, and the gate of the transfer transistor Tr1 is turned on to transfer the charges from the photodiodes 30021 to the FD region 30022. The amplifying transistor Tr3 electrically amplifies signal charges in response to the application of the charges to the gate. Meanwhile, only the selection transistor Tr4 in a pixel to be read is turned on at the time of FD resetting immediately before the reading, and an image signal, subjected to charge-to-voltage conversion, from the amplifying transistor Tr3 in the pixel is read out to the vertical signal line 30008.

Other structural examples of a solid-state imaging device to which the technology according to the present disclosure may be applied have been described above.

(Example of Application to Camera)

The solid-state imaging device described above is applicable to an electronic apparatus such as a camera system such as a digital camera or a video camera, a mobile phone having an imaging function, or another device having an imaging function, for example. As a configuration example of an electronic apparatus, the following makes description by using a camera as an example. FIG. 17C is an explanatory diagram illustrating a configuration example of a video camera to which the technology according to the present disclosure may be applied.

A camera 10000 in this example includes a solid-state imaging device 10001, an optical system 10002 that guides incident light to a light-receiving sensor unit of the solid-state imaging device 10001, a shutter device 10003 provided between the solid-state imaging device 10001 and the optical system 10002, and a drive circuit 10004 that drives the solid-state imaging device 10001. Further, the camera 10000 includes a signal processing circuit 10005 that processes an output signal of the solid-state imaging device 10001.

The optical system (optical lenses) 10002 forms an image of image light (incident light) from a subject on an imaging surface (not illustrated) of the solid-state imaging device 10001. This causes signal charges to be accumulated in the solid-state imaging device 10001 for a predetermined period. Note that the optical system 10002 may include an optical lens group including a plurality of optical lenses. In addition, the shutter device 10003 controls a light irradiating period and a light shielding period of incident light on the solid-state imaging device 10001.

The drive circuit 10004 supplies drive signals to the solid-state imaging device 10001 and the shutter device 10003. The drive circuit 10004 then controls the operation of the solid-state imaging device 10001 to output signals to the signal processing circuit 10005 and the shutter operation of the shutter device 10003 on the basis of the supplied drive signals. That is, in this example, the operation of transferring signals from the solid-state imaging device 10001 to the signal processing circuit 10005 is performed on the basis of drive signals (timing signals) supplied from the drive circuit 10004.

The signal processing circuit 10005 performs various kinds of signal processing on the signals transferred from the solid-state imaging device 10001. The signals (AV-SIGNAL) subjected to the various kinds of signal processing are stored in a storage medium (not illustrated) such as a memory, or is outputted to a monitor (not illustrated).

An example of a camera to which the technology according to the present disclosure may be applied has been described above.

(Example of Application to Endoscopic Surgery System)

For example, the technology according to the present disclosure may be applied to an endoscopic surgery system.

FIG. 17D is a view depicting an example of a schematic configuration of an endoscopic surgery system to which the technology according to an embodiment of the present disclosure (present technology) can be applied.

In FIG. 17D, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 17E is a block diagram depicting an example of a functional configuration of the camera head 11102 and the CCU 11201 depicted in FIG. 17D.

The camera head 11102 includes a lens unit 11401, an image pickup unit 11402, a driving unit 11403, a communication unit 11404 and a camera head controlling unit 11405. The CCU 11201 includes a communication unit

11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure may be applied has been described above. The technology according to the present disclosure may be applied to, for example, the image pickup unit 11402 of the camera head 11102 out of the components described above. Applying the technology according to the present disclosure to the image pickup unit 11402 makes it possible to obtain a clearer image of a surgical region. This allows a surgeon to check the surgical region with certainty.

Note that the endoscopic surgery system has been described here as an example, but the technology according to the present disclosure may be additionally applied to, for example, a microscopic surgery system or the like.
(Example of Application to Mobile Body)

For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a vessel, or a robot.

FIG. 17F is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 17F, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 17F, an audio speaker 12061, a display section 12062, and an instrument panel 12063 are illustrated as the output device. The display section 12062 may, for example, include at least one of an on-board display and a head-up display.

FIG. 17G is a diagram depicting an example of the installation position of the imaging section 12031.

In FIG. 17G, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17G depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle.

In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure may be applied has been described above. The technology according to the present disclosure may be applied to the imaging section 12031 and the like out of the components described above. Applying the technology according to the present disclosure to the imaging section 12031 makes it possible to obtain a captured image that is easier to see. This makes it possible to reduce fatigue of a driver. In addition, it is possible to obtain a captured image that is easier to recognize, which makes it possible to improve the accuracy of driving assistance.

6. Supplement

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, the respective configurations of the solid-state imaging device according to the present embodiment described above (for example, the respective components of the solid-state imaging devices 1 to 11e illustrated in FIG. 1 and FIGS. 6A, 6B, 7A, 7B, 7C, 7D, 7E, 7F, 8A, 8B, 8C, 8D, 9A, 9B, 9C, 9D, 9E, 9F, 10A, 10B, 10C, 10D, 11A, 11B, 11C, 12A, 12B, 12C, 12D, 12E, 12F, 12G, 13A, 13B, 13C, 13D, 13E, 13F, 13G, 14A, 14B, 14C, 14D, 14E, 14F, 15A, 15B, 15C, 15D, and 15E) may be combined within a possible range. The solid-state imaging device according to the present embodiment may also encompass a solid-state imaging device having such a combination of the respective configurations.

Moreover, the configurations of the respective solid-state imaging devices according to the present embodiment described above are only examples of the technology according to the present disclosure. In the present disclosure, as another embodiment, a solid-state imaging device may be provided that has various coupling structures that are not included in the embodiment described above.

Further, the effects described in this specification are merely illustrative or exemplified effects, and are not limitative. That is, with or in the place of the above effects, the technology according to the present disclosure may achieve other effects that are clear to those skilled in the art from the description of this specification.

Note that the technical scope of the present disclosure also includes the following configurations.

(1)
A solid-state imaging device including:
a first substrate including a first semiconductor substrate and a first multi-layered wiring layer stacked on the first semiconductor substrate, the first semiconductor substrate having a pixel unit formed thereon, the pixel unit having pixels arranged thereon;
a second substrate including a second semiconductor substrate and a second multi-layered wiring layer stacked on the second semiconductor substrate, the second semiconductor substrate having a circuit formed thereon, the circuit having a predetermined function; and
a third substrate including a third semiconductor substrate and a third multi-layered wiring layer stacked on the third semiconductor substrate, the third semiconductor substrate having a circuit formed thereon, the circuit having a predetermined function,
the first substrate, the second substrate, and the third substrate being stacked in this order,
the first substrate and the second substrate being bonded together in a manner that the first multi-layered wiring layer and the second multi-layered wiring layer are opposed to each other,
a first coupling structure for electrically coupling the first substrate and the second substrate to each other not existing, or not including a coupling structure formed from the first substrate as a base over bonding surfaces of the first substrate and the second substrate.

(2)
The solid-state imaging device according to (1), in which the first coupling structure includes an opening provided from a back surface side of the first substrate to expose a predetermined wiring line in the first multi-layered wiring layer, and an opening provided by penetrating at least the first substrate from the back surface side of the first substrate to expose a predetermined wiring line in the second multi-layered wiring layer.

(3)
The solid-state imaging device according to (1) or (2), further including a second coupling structure for electrically coupling the second substrate and the third substrate to each other,
in which the second coupling structure includes an opening provided by penetrating at least the first substrate from the back surface side of the first substrate to expose a predetermined wiring line in the second multi-layered wiring layer, and an opening provided by penetrating at least the first substrate and the second substrate from the back surface side of the first substrate to expose a predetermined wiring line in the third multi-layered wiring layer.

(4)
The solid-state imaging device according to (3), in which the predetermined wiring line in the second multi-layered wiring layer that is exposed by the opening and the predetermined wiring line in the third multi-layered wiring layer that is exposed by the opening include pads that function as I/O units.

(5)
The solid-state imaging device according to (3),
in which pads that function as I/O units exist on a surface on a back side of the first substrate,
a film including an electrically-conductive material is formed on an inner wall of the opening, and
the predetermined wiring line in the second multi-layered wiring layer that is exposed by the opening and the predetermined wiring line in the third multi-layered wiring layer that is exposed by the opening are electrically coupled to the pads by the electrically-conductive material.

(6)
The solid-state imaging device according to (5), in which the predetermined wiring line in the second multi-layered wiring layer and the predetermined wiring line in the third multi-layered wiring layer are electrically coupled to the same pad by the electrically-conductive material.

(7)
The solid-state imaging device according to (5), in which the predetermined wiring line in the second multi-layered wiring layer and the predetermined wiring line in the third multi-layered wiring layer are electrically coupled to the pads by the electrically-conductive material, the pads being different from each other.

(8)
The solid-state imaging device according to any one of (1) to (7), further including a second coupling structure for electrically coupling the second substrate and the third substrate to each other,
in which the second substrate and the third substrate are bonded together in a manner that the second semiconductor substrate and the third multi-layered wiring layer are opposed to each other, and
the second coupling structure includes a via that is provided by penetrating at least the second substrate from a front surface side of the second substrate and electrically couples a predetermined wiring line in the second multi-layered wiring layer and a predetermined wiring line in the third multi-layered wiring layer to each other, or a via that is provided by penetrating at least the third substrate from a back surface side of the third substrate and electrically couples a predetermined wiring line in the second multi-layered wiring layer and a predetermined wiring line in the third multi-layered wiring layer to each other.

(9)
The solid-state imaging device according to (8), in which the via has a structure in which electrically-conductive materials are embedded in a first through hole that exposes the predetermined wiring line in the second multi-layered wiring layer and a second through hole that exposes the predetermined wiring line in the third multi-layered wiring layer and is different from the first through hole, or a structure in which films including electrically-conductive materials are formed on inner walls of the first through hole and the second through hole.

(10)
The solid-state imaging device according to (8), in which the via has a structure in which an electrically-conductive material is embedded in one through hole provided to expose the predetermined wiring line in the third multi-layered wiring layer while exposing a portion of the predetermined wiring line in the second multi-layered wiring layer, or one through hole provided to expose the predetermined wiring line in the second multi-layered wiring layer while exposing a portion of the predetermined wiring line in the third multi-layered wiring layer, or a structure in which a film including an electrically-conductive material is formed on an inner wall of the through hole.

(11)

The solid-state imaging device according to any one of (1) to (10), further including a third coupling structure for electrically coupling the first substrate and the third substrate to each other,
  in which the second substrate and the third substrate are bonded together in a manner that the second semiconductor substrate and the third multi-layered wiring layer are opposed to each other, and
  the third coupling structure includes a via that is provided by penetrating at least the first substrate and the second substrate from a back surface side of the first substrate and electrically couples a predetermined wiring line in the first multi-layered wiring layer and a predetermined wiring line in the third multi-layered wiring layer to each other, or a via that is provided by penetrating at least the third substrate and the second substrate from a back surface side of the third substrate and electrically couples a predetermined wiring line in the first multi-layered wiring layer and a predetermined wiring line in the third multi-layered wiring layer to each other.

(12)

The solid-state imaging device according to (11), in which the via has a structure in which electrically-conductive materials are embedded in a first through hole that exposes the predetermined wiring line in the first multi-layered wiring layer, and a second through hole that exposes the predetermined wiring line in the third multi-layered wiring layer and is different from the first through hole, or a structure in which films including electrically-conductive materials are formed on inner walls of the first through hole and the second through hole.

(13)

The solid-state imaging device according to (11), in which the via has a structure in which an electrically-conductive material is embedded in one through hole provided to expose the predetermined wiring line in the third multi-layered wiring layer while exposing a portion of the predetermined wiring line in the first multi-layered wiring layer, or one through hole provided to expose the predetermined wiring line in the first multi-layered wiring layer while exposing a portion of the predetermined wiring line in the third multi-layered wiring layer, or a structure in which a film including an electrically-conductive material is formed on an inner wall of the through hole.

(14)

The solid-state imaging device according to any one of (1) to (13), further including a second coupling structure for electrically coupling the first substrate and the second substrate to each other,
  in which the second coupling structure exists on bonding surfaces of the second substrate and the third substrate, and includes an electrode junction structure in which electrodes formed on the respective bonding surfaces are joined to each other in direct contact with each other.

(15)

The solid-state imaging device according to any one of (1) to (14), in which the second substrate and the third substrate include at least one of a logic circuit or a memory circuit, the logic circuit executing various kinds of signal processing related to an operation of the solid-state imaging device, the memory circuit temporarily holding a pixel signal acquired by each of the pixels of the first substrate.

(16)

An electronic apparatus including:
  a solid-state imaging device that electronically shoots an image of a target to be observed,
  the solid-state imaging device including
  a first substrate including a first semiconductor substrate and a first multi-layered wiring layer stacked on the first semiconductor substrate, the first semiconductor substrate having a pixel unit formed thereon, the pixel unit having pixels arranged thereon,
  a second substrate including a second semiconductor substrate and a second multi-layered wiring layer stacked on the second semiconductor substrate, the second semiconductor substrate having a circuit formed thereon, the circuit having a predetermined function, and
  a third substrate including a third semiconductor substrate and a third multi-layered wiring layer stacked on the third semiconductor substrate, the third semiconductor substrate having a circuit formed thereon, the circuit having a predetermined function,
  the first substrate, the second substrate, and the third substrate being stacked in this order,
  the first substrate and the second substrate being bonded together in a manner that the first multi-layered wiring layer and the second multi-layered wiring layer are opposed to each other,
  a first coupling structure for electrically coupling the first substrate and the second substrate to each other not existing, or not including a coupling structure formed from the first substrate as a base over bonding surfaces of the first substrate and the second substrate.

REFERENCE NUMERALS LIST 1, 1a to 1c, 2a, 2b, 3a to 3f, 4a to 4d, 5a to 5f, 6a to 6d, 7a to 7c, 8a to 8g, 9a to 9f,
10a to 10f, 11a to 11e solid-state imaging device
101, 121, 131 semiconductor substrate
103, 109, 123, 129, 133 insulating film
105, 125, 135 multi-layered wiring layer
110A first substrate
110B second substrate
110C third substrate
111 CF layer
113 ML array
151 pad
153, 153a, 153b, 153c pad opening
155, 155a, 155b, 155c lead line opening
157, 157a, 157b TSV
159 electrode junction structure
901 smartphone (electronic apparatus)
911 digital camera (electronic apparatus)

What is claimed is:

1. A light detecting device, comprising:
  a first substrate that includes a first semiconductor substrate and a first multi-layered wiring layer on the first semiconductor substrate, wherein the first semiconductor substrate has pixels;
  a second substrate that includes a second semiconductor substrate, a second multi-layered wiring layer on a first side of the second semiconductor substrate, and an insulating layer on a second side of the second semiconductor substrate, wherein the second side of the second semiconductor substrate is opposite to the first side of the second semiconductor substrate;

a third substrate that includes a third semiconductor substrate and a third multi-layered wiring layer on the third semiconductor substrate, wherein each of the second semiconductor substrate and the third semiconductor substrate includes a circuit, the second substrate is between the first substrate and the third substrate, the first multi-layered wiring layer is opposite to the second multi-layered wiring layer, the insulating layer is opposite to the third multi-layered wiring layer, the first substrate is electrically connected to the second substrate, and wherein the insulating layer includes a first electrode, the third multi-layered wiring layer includes a second electrode, the second substrate includes a first bonding surface, the third substrate includes a second bonding surface, the first electrode is joined to the second electrode at the first bonding surface of the second substrate and the second bonding surface of the third substrate;

a first via that penetrates the second semiconductor substrate, wherein the first via electrically connects the first electrode to a first wiring in the second multi-layered wiring layer; and a second via that electrically connects the second electrode to a second wiring in the third multi-layered wiring layer.

2. The light detecting device according to claim 1, further comprising:

a third via; and a fourth via, wherein the second semiconductor substrate is opposite to the third multi-layered wiring layer, and wherein one of:

the third via penetrates at least the second substrate from a front surface side of the second substrate and electrically connects a second determined wiring line in the second multi-layered wiring layer to a third determined wiring line in the third multi-layered wiring layer, or the fourth via penetrates at least the third substrate from a back surface side of the third substrate and electrically connects the second determined wiring line in the second multi-layered wiring layer to the third determined wiring line in the third multi-layered wiring layer.

3. The light detecting device according to claim 2, further comprising:

a plurality of vias;

a first through hole; and a second through hole, wherein one of:

each via of the plurality of vias has a first structure, wherein the first structure includes first electrically-conductive materials, the first electrically-conductive materials are embedded in the first through hole and the second through hole, the first through hole exposes the second determined wiring line in the second multi-layered wiring layer, the second through hole exposes the third determined wiring line in the third multi-layered wiring layer, and the second through hole is different from the first through hole, or each via of the plurality of vias has a second structure, wherein the second structure includes films, the films include second electrically-conductive materials, and the films are on inner walls of the first through hole and the second through hole, and wherein the plurality of vias includes at least the first via, the second via, the third via, and the fourth via.

4. The light detecting device according to claim 2, further comprising:

a plurality of vias;

a first through hole; and a second through hole, wherein one of:

each via of the plurality of vias has a first structure, wherein the first structure includes a first electrically-conductive material, and the first electrically-conductive material is embedded in one of:

the first through hole to expose the third determined wiring line in the third multi-layered wiring layer, wherein the first through hole exposes a first portion of the second determined wiring line in the second multi-layered wiring layer, or the second through hole to expose the second determined wiring line in the second multi-layered wiring layer, wherein the second through hole exposes a second portion of the third determined wiring line in the third multi-layered wiring layer, or each via of the plurality of vias has a second structure, wherein the second structure includes a film, the film includes a second electrically-conductive material, and the film is on an inner wall of the first through hole, and wherein the plurality of vias includes at least the first via, the second via, the third via, and the fourth via.

5. The light detecting device according to claim 2, further comprising:

a first opening that penetrates at least the first substrate from a back surface side of the first substrate and exposes the second determined wiring line in the second multi-layered wiring layer; and a second opening that penetrates at least the first substrate and the second substrate from the back surface side of the first substrate and exposes the third determined wiring line in the third multi-layered wiring layer.

6. The light detecting device according to claim 5, further comprising: pads that function as input/output (1/0) units and exist on a surface on a back side of the first substrate, wherein the second determined wiring line in the second multi-layered wiring layer that is exposed by the first opening and the third determined wiring line in the third multi-layered wiring layer that is exposed by the second opening comprise the pads that function as the 1/0 units.

7. The light detecting device according to claim 2, wherein each of the first multi-layered wiring layer, the second multi-layered wiring layer, and the third multi-layered wiring layer includes a plurality of first metal wiring layers,
the plurality of first metal wiring layers includes that include a first metal and a plurality of pads,
each pad of the plurality of pads includes a second metal, and
the second metal has a material that is different from a material of the first metal.

8. The light detecting device according to claim 6, further comprising:
a film that includes an electrically-conductive material and is formed on an inner wall of the first opening that penetrates at least the first substrate from the back surface side of the first substrate and exposes the second determined wiring line in the second multi-layered wiring layer, and the second opening that penetrates at least the first substrate and the second substrate from the back surface side of the first substrate and exposes the third determined wiring line in the third multi-layered wiring layer,
wherein the second determined wiring line in the second multi-layered wiring layer that is exposed by the first opening and the third determined wiring line in the third multi-layered wiring layer that is exposed by the second opening are electrically coupled to the pads by the electrically-conductive material.

9. The light detecting device according to claim 7, wherein
the second determined wiring line in the second multi-layered wiring layer and the third determined wiring line in the third multi-layered wiring layer are electrically connected to a pad of the plurality of pads by an electrically-conductive material.

10. The light detecting device according to claim 7, wherein
the second determined wiring line in the second multi-layered wiring layer is electrically connected to a first pad of the plurality of pads by an electrically-conductive material,
the third determined wiring line in the third multi-layered wiring layer is electrically connected to a second pad of the plurality of pads by the electrically-conductive material, and
the second pad is different from the first pad.

11. The light detecting device according to claim 7, further comprising:
an insulating film on a back surface of the first substrate, wherein
each pad of the plurality of pads is on the back surface,
the back surface is on a back side of the first substrate, and
the plurality of pads is on the insulating film.

12. The light detecting device according to claim 7, further comprising:
an insulating film on a back surface of the first substrate, wherein
each pad of the plurality of pads exists on the back surface,
the back surface is on a back side of the first substrate, and
each pad of the plurality of pads is embedded in the insulating film.

13. The light detecting device according to claim 1, further comprising a coupling structure, wherein the coupling structure electrically connects the first substrate to the third substrate,
the second semiconductor substrate is opposite to the third multi-layered wiring layer, and
the coupling structure includes one of:
a fifth via that penetrates at least the first substrate and the second substrate from a back surface side of the first substrate, wherein the fifth via electrically couples connects a first determined wiring line in the first multi-layered wiring layer to a third determined wiring line in the third multi-layered wiring layer, or
a sixth via that penetrates at least the third substrate and the second substrate from a back surface side of the third substrate, wherein the sixth via electrically connects the first determined wiring line in the first multi-layered wiring layer to the third determined wiring line in the third multi-layered wiring layer.

14. The light detecting device according to claim 13, further comprising:
a plurality of vias,
a first through hole; and
a second through hole, wherein one of:
each via of the plurality of vias has a first structure, wherein
the first structure includes first electrically-conductive materials,
the first electrically-conductive materials are embedded in the first through hole and the second through hole,
the first through hole exposes the first determined wiring line in the first multi-layered wiring layer,
the second through hole exposes the third determined wiring line in the third multi-layered wiring layer, and
the second through hole is different from the first through hole, or
each via of the plurality of vias has a second structure, wherein
the second structure includes films,
the films include second electrically-conductive materials,
the films are on inner walls of the first through hole and the second through hole, and
wherein the plurality of vias includes at least the first via, the second via, the fifth via, and the sixth via.

15. The light detecting device according to claim 13, further comprising:
a plurality of vias;
a first through hole; and
a second through hole, wherein
each via of the plurality of vias has a first structure, wherein
the first structure includes a first electrically-conductive material,
the first electrically-conductive material is embedded in one of:
the first through hole provided to expose the third determined wiring line in the third multi-layered wiring layer, wherein the first through hole exposes a first portion of the first determined wiring line in the first multi-layered wiring layer, or
the second through hole to expose the first determined wiring line in the first multi-layered wiring layer, wherein the second through hole exposes a second portion of the third determined wiring line in the third multi-layered wiring layer, or each via of the plurality of vias has a second structure, wherein
the second structure includes a film,
the film includes a second electrically-conductive material, and
the film is on an inner wall of the first through hole, and wherein the plurality of vias include at least the first via, the second via, the fifth via, and the sixth via.

16. The light detecting device according to claim 1, wherein
the circuit corresponds to at least one of a logic circuit or a memory circuit,
the logic circuit is configured to execute signal processing related to an operation of the light detecting device, and
the memory circuit is configured to temporarily hold a pixel signal acquired by each of the pixels.

17. The light detecting device according to claim 1, wherein
the first semiconductor substrate includes a first semiconductor region,
the second semiconductor substrate includes a second semiconductor region,
the first semiconductor region is larger than the second semiconductor region, and
the first semiconductor region and the second semiconductor region have same impurity type.

18. The light detecting device according to claim 1, wherein
the first semiconductor substrate includes a first semiconductor region,
the third semiconductor substrate includes a third semiconductor region,
the first semiconductor region is larger than the third semiconductor region, and
the first semiconductor region and the third semiconductor region have same impurity type.

19. The light detecting device according to claim 18, wherein the first semiconductor region and the third semiconductor region are a PWELL.

20. An electronic apparatus, comprising:
a light detecting device configured to electronically shoot an image of a target, the light detecting device comprising:
a first substrate that includes a first semiconductor substrate and a first multi-layered wiring layer on the first semiconductor substrate, wherein the first semiconductor substrate has pixels;
a second substrate that includes a second semiconductor substrate, a second multi-layered wiring layer on a first side of the second semiconductor substrate, and an insulating layer on a second side of the second semiconductor substrate, wherein the second side of the second semiconductor substrate is opposite to the first side of the second semiconductor substrate;
a third substrate that includes a third semiconductor substrate and a third multi-layered wiring layer on the third semiconductor substrate, wherein
each of the second semiconductor substrate and the third semiconductor substrate includes a circuit,
the second substrate is between the first substrate and the third substrate,
the first multi-layered wiring layer is opposite to the second multi-layered wiring layer,
the insulating layer is opposite to the third multi-layered wiring layer,
the first substrate is electrically connected to the second substrate, wherein
the insulating layer includes a first electrode,
the third multi-layered wiring layer includes a second electrode,
the second substrate includes a first bonding surface,
the third substrate includes a second bonding surface, and
the first electrode is joined to the second electrode at the first bonding surface of the second substrate and the second bonding surface of the third substrate;
a first via that penetrates the second semiconductor substrate, wherein the first via electrically connects the first electrode to a first wiring in the second multi-layered wiring layer; and
a second via that electrically connects the second electrode to a second wiring in the third multi-layered wiring layer.

21. The light detecting device according to claim 1, wherein the second via is within the third multi-layered wiring layer.

22. The light detecting device according to claim 1, wherein the first via has a greater depth than the second via.

23. The light detecting device according to claim 1, wherein
the insulating layer further includes a third electrode,
the third multi-layered wiring layer further includes a fourth electrode, and
the third electrode is joined to the fourth electrode at the first bonding surface of the second substrate and the second bonding surface of the third substrate.

* * * * *